US009184178B2

(12) United States Patent
Jang et al.

(10) Patent No.: US 9,184,178 B2
(45) Date of Patent: Nov. 10, 2015

(54) VERTICAL MEMORY DEVICES AND METHODS OF MANUFACTURING THE SAME

(71) Applicant: SAMSUNG ELECTRONICS CO., LTD., Suwon-si, Gyeonggi-do (KR)

(72) Inventors: Kyung-Tae Jang, Seoul (KR); Myoung-Bum Lee, Seoul (KR); Ji-Youn Seo, Gyeonggi-do (KR); Chang-Won Lee, Gyeonggi-do (KR); Yong-Chae Jung, Suwon-si (KR); Woong-Hee Sohn, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/564,364

(22) Filed: Dec. 9, 2014

(65) Prior Publication Data

US 2015/0091078 A1 Apr. 2, 2015

Related U.S. Application Data

(62) Division of application No. 13/724,187, filed on Dec. 21, 2012, now Pat. No. 8,916,922.

(30) Foreign Application Priority Data

Sep. 13, 2012 (KR) ........................ 10-2012-0101471

(51) Int. Cl.
*H01L 21/336* (2006.01)
*H01L 27/115* (2006.01)
*H01L 29/792* (2006.01)
*H01L 29/66* (2006.01)

(52) U.S. Cl.
CPC ...... *H01L 27/11582* (2013.01); *H01L 27/1157* (2013.01); *H01L 27/11565* (2013.01); *H01L 29/66666* (2013.01); *H01L 29/66833* (2013.01); *H01L 29/7926* (2013.01)

(58) Field of Classification Search
CPC ............... H01L 27/11582; H01L 27/11565; H01L 27/1157; H01L 29/66666; H01L 29/66833; H01L 29/7926
USPC .......... 438/287, 261; 257/324, 319, 401, 411, 257/E29.309
See application file for complete search history.

(56) References Cited

U.S. PATENT DOCUMENTS 8,084,819 B2 12/2011 Kim et al.
8,445,347 B2 5/2013 Alsmeier

FOREIGN PATENT DOCUMENTS

KR 1020110001594 1/2011

*Primary Examiner* — Tu-Tu Ho
(74) *Attorney, Agent, or Firm* — F. Chau & Associates, LLC

(57) ABSTRACT

A semiconductor device includes a substrate, a plurality of insulating layers vertically stacked on the substrate, a plurality of channels arranged in vertical openings formed through at least some of the plurality of insulating layers, and a plurality of portions alternatingly positioned with the plurality of insulating layers in the vertical direction. At least some of the portions are adjacent corresponding channels of the plurality of channels. Each of the portions includes a conductive barrier pattern formed on an inner wall of the portion, a filling layer pattern positioned in the portion on the conductive barrier pattern, and a gate electrode positioned in a remaining area of the portion not occupied by the conductive barrier or filling layer pattern.

17 Claims, 118 Drawing Sheets

(56) References Cited

U.S. PATENT DOCUMENTS

| | | | |
|---|---|---|---|
| 8,937,346 B2 * | 1/2015 | Aritome | 257/314 |
| 2010/0117141 A1 | 5/2010 | Shin et al. | |
| 2010/0163968 A1 | 7/2010 | Kim et al. | |
| 2010/0258852 A1 | 10/2010 | Lim et al. | |
| 2011/0223731 A1 | 9/2011 | Chung et al. | |
| 2012/0256247 A1 | 10/2012 | Alsmeier | |
| 2012/0280303 A1 | 11/2012 | Kiyotoshi et al. | |
| 2013/0056698 A1 | 3/2013 | Satoh et al. | |

* cited by examiner

FIG. 3
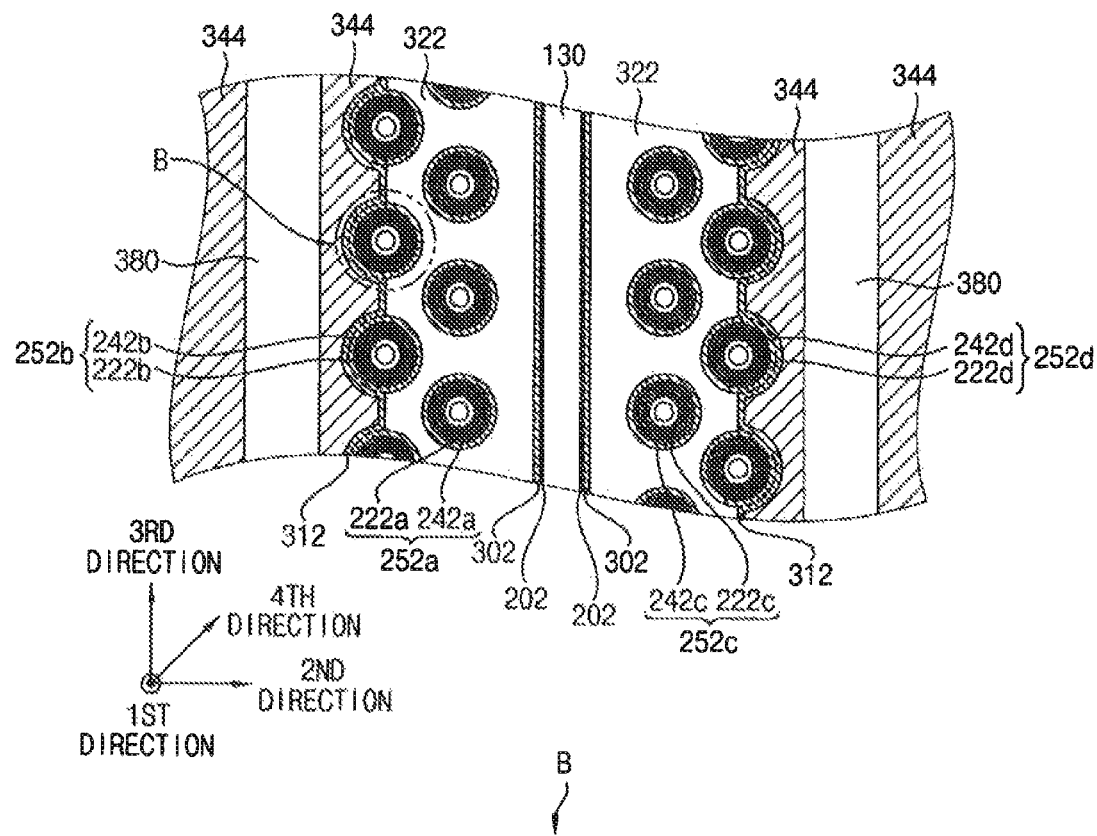
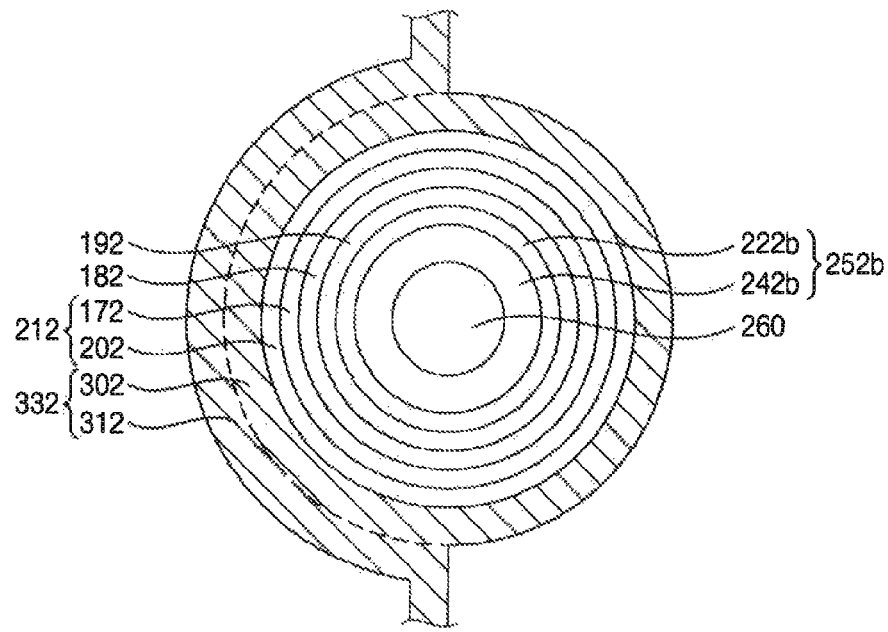

FIG. 5
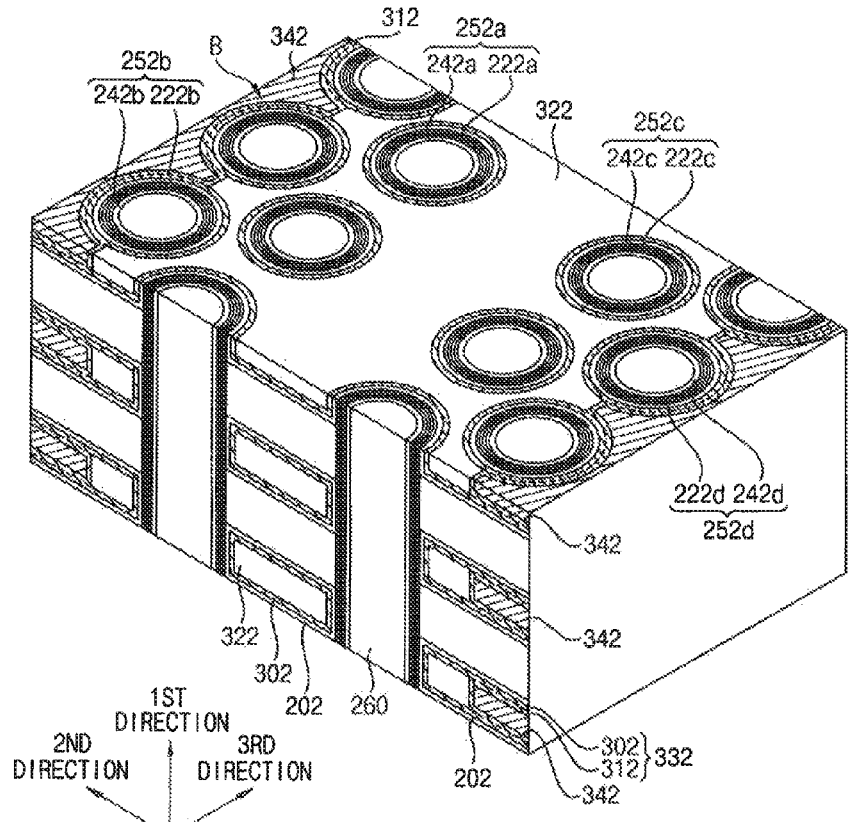
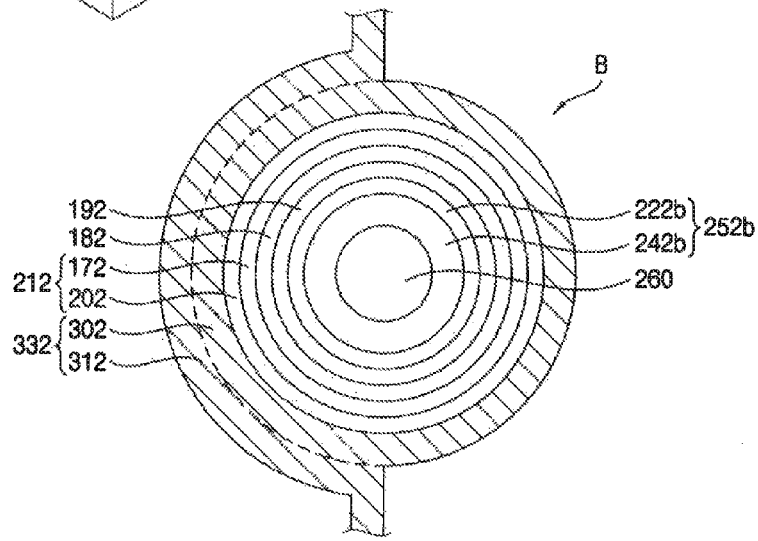

FIG. 12B
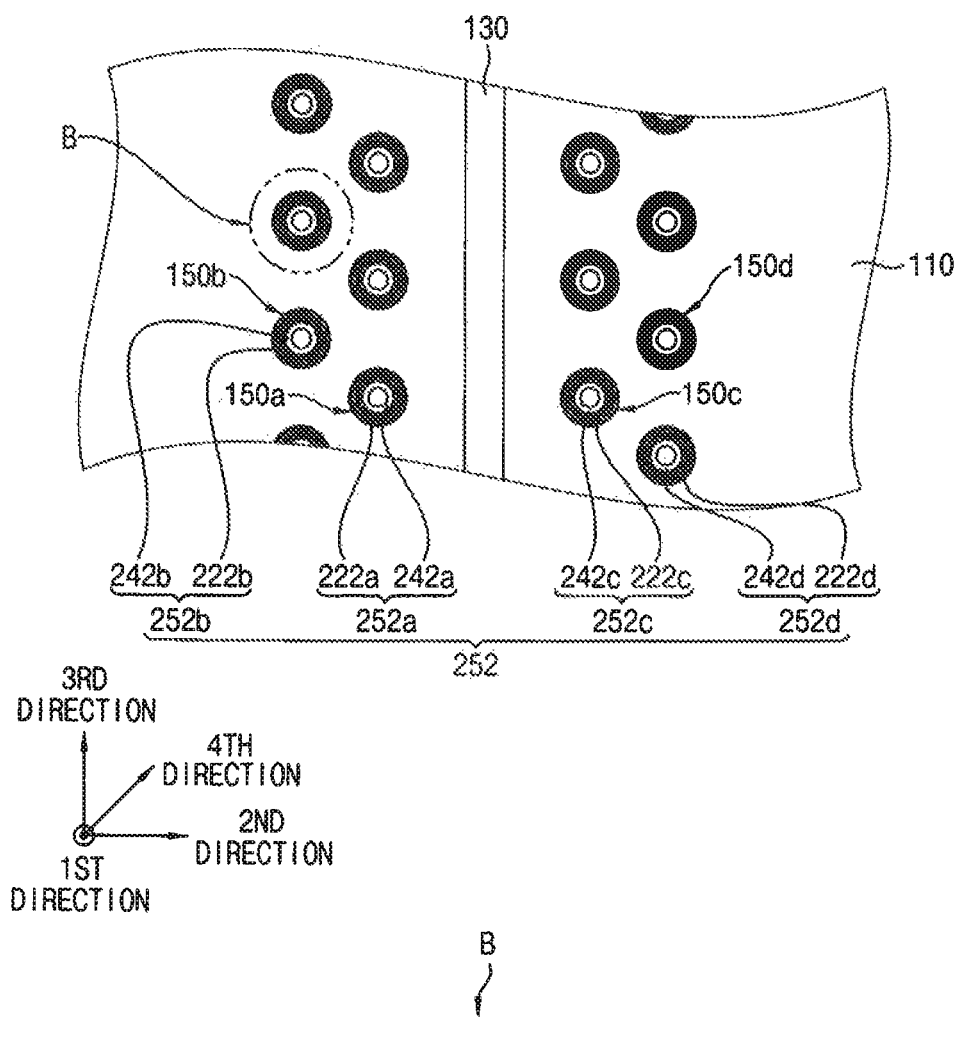
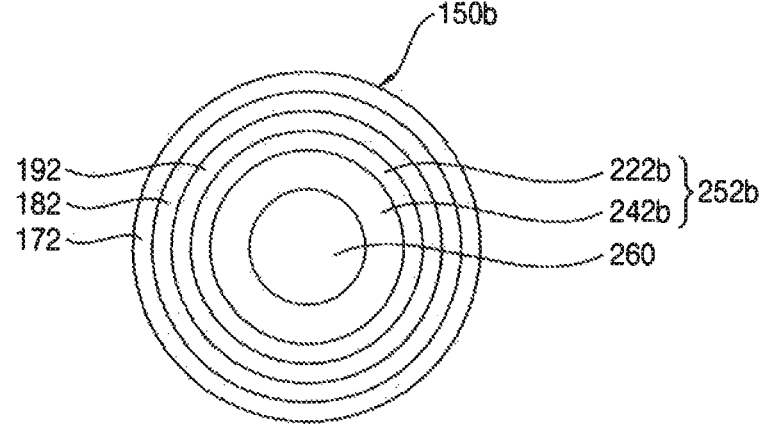

FIG. 25
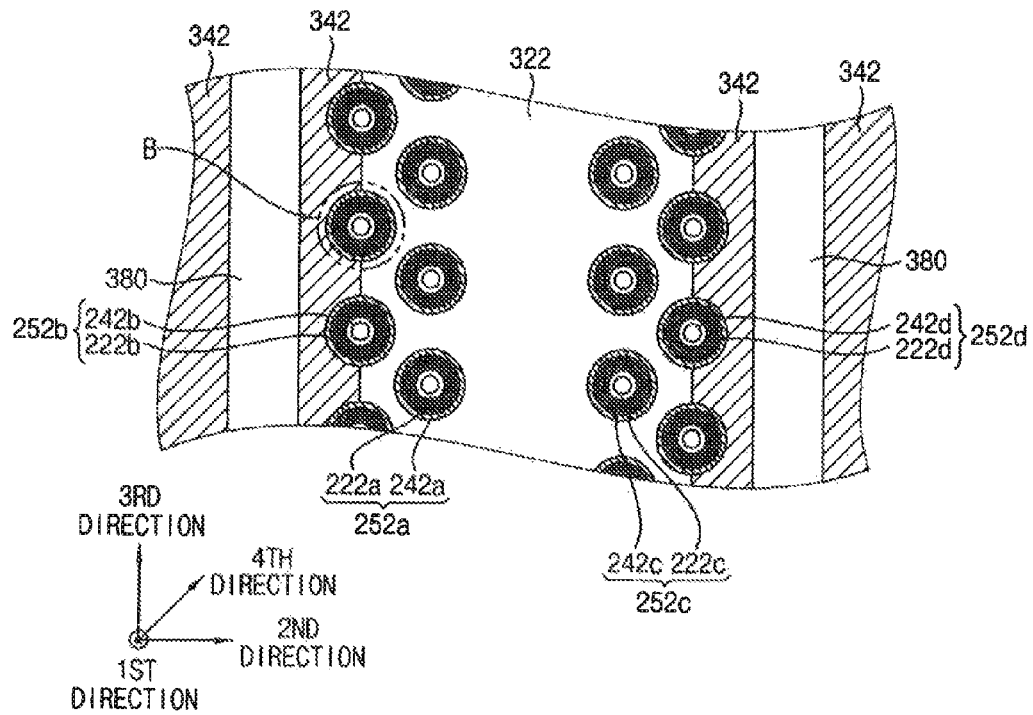
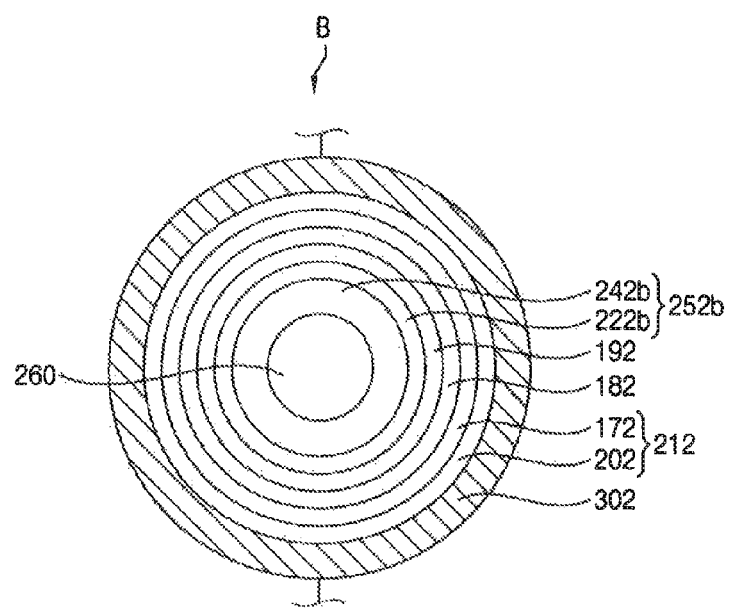

FIG. 30
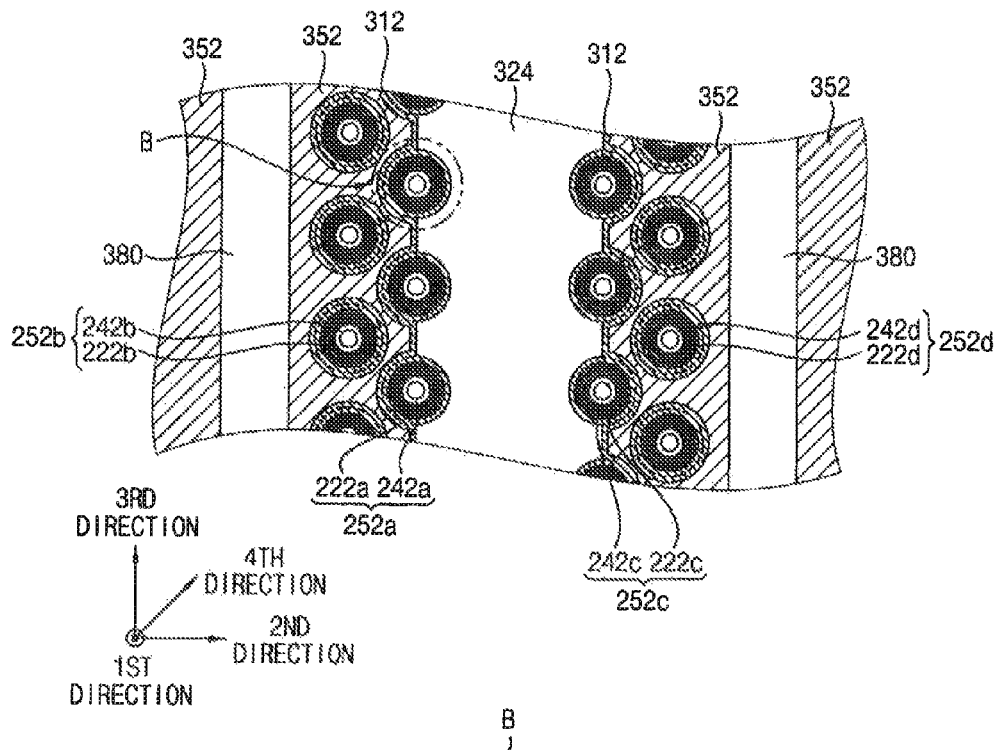
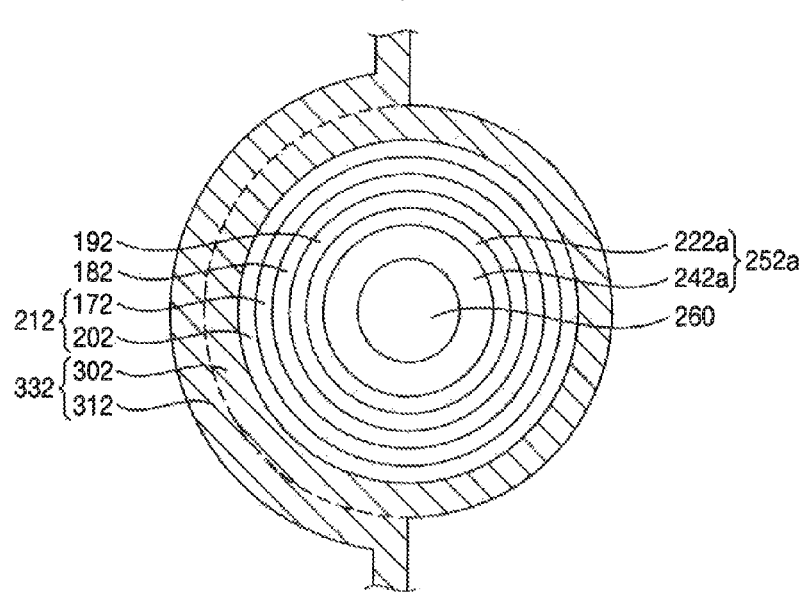

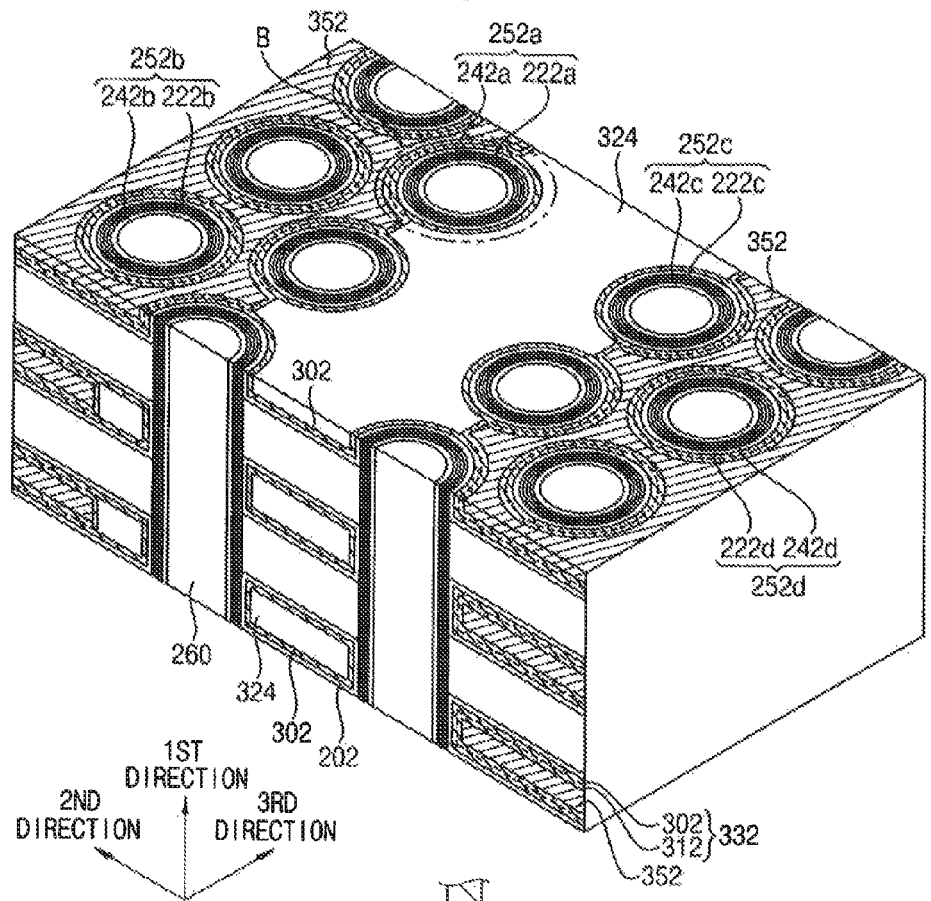
FIG. 31
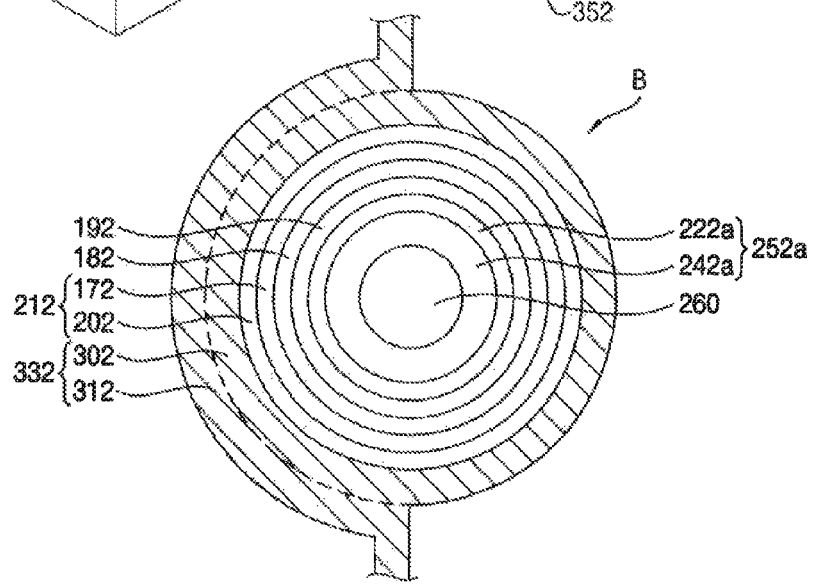

FIG. 35
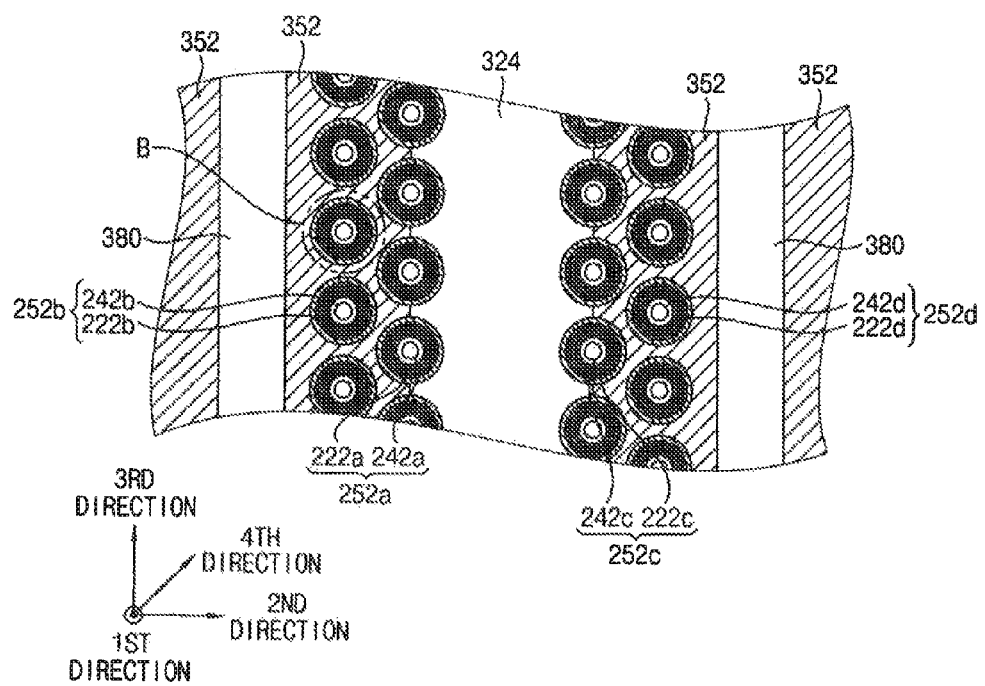
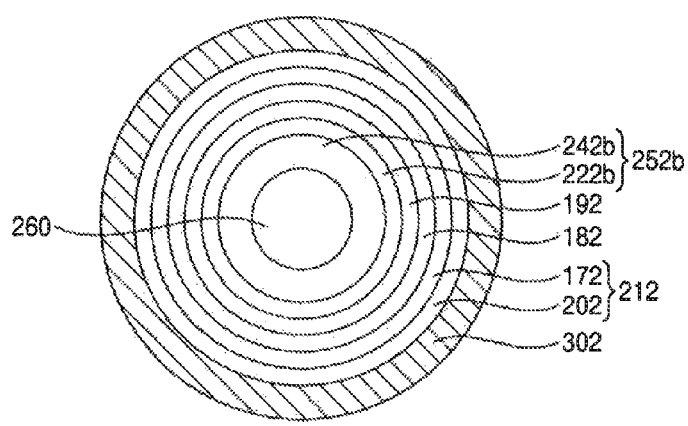

FIG. 36
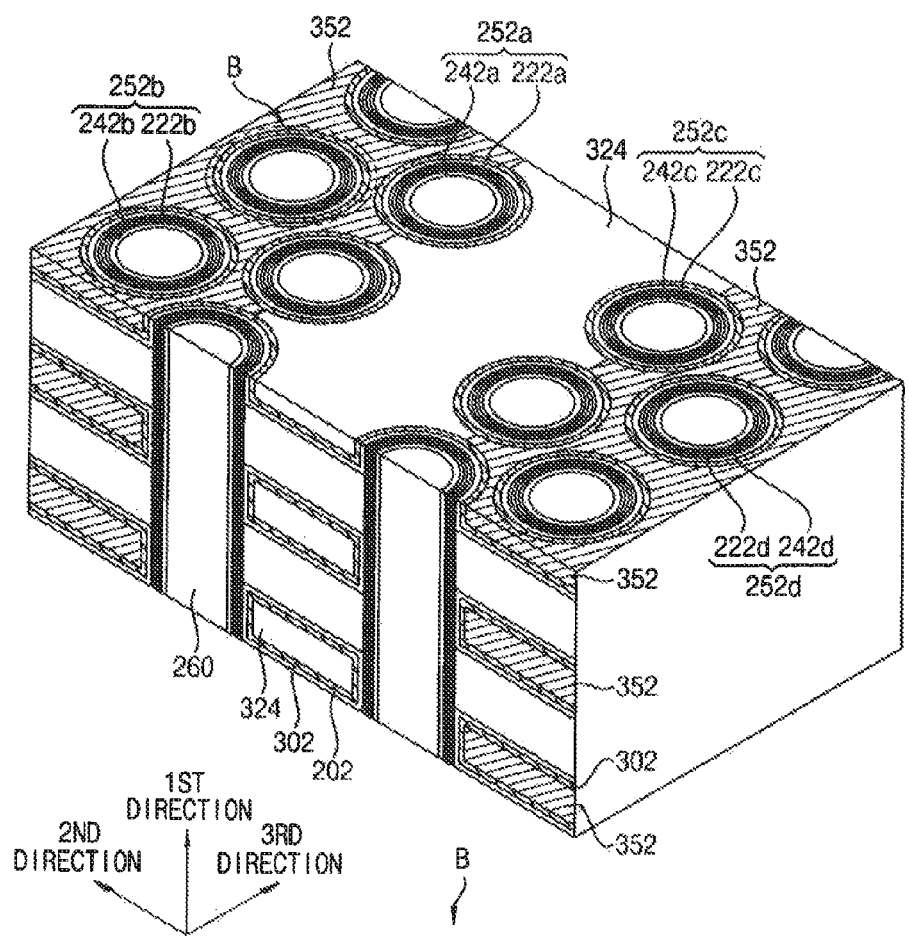
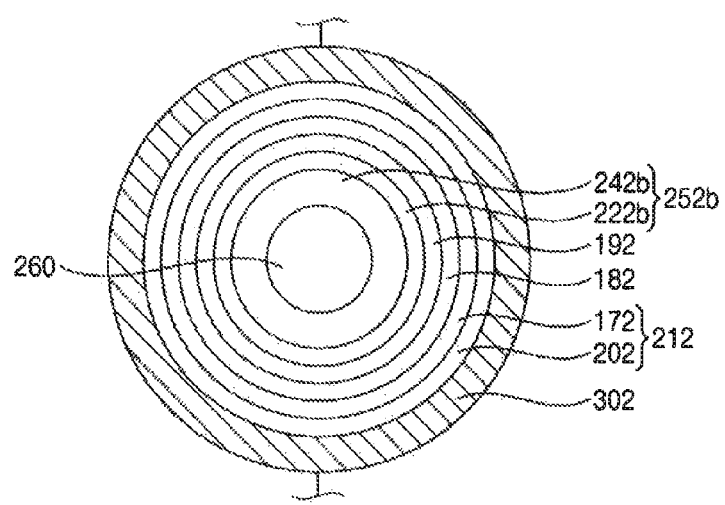

FIG. 39
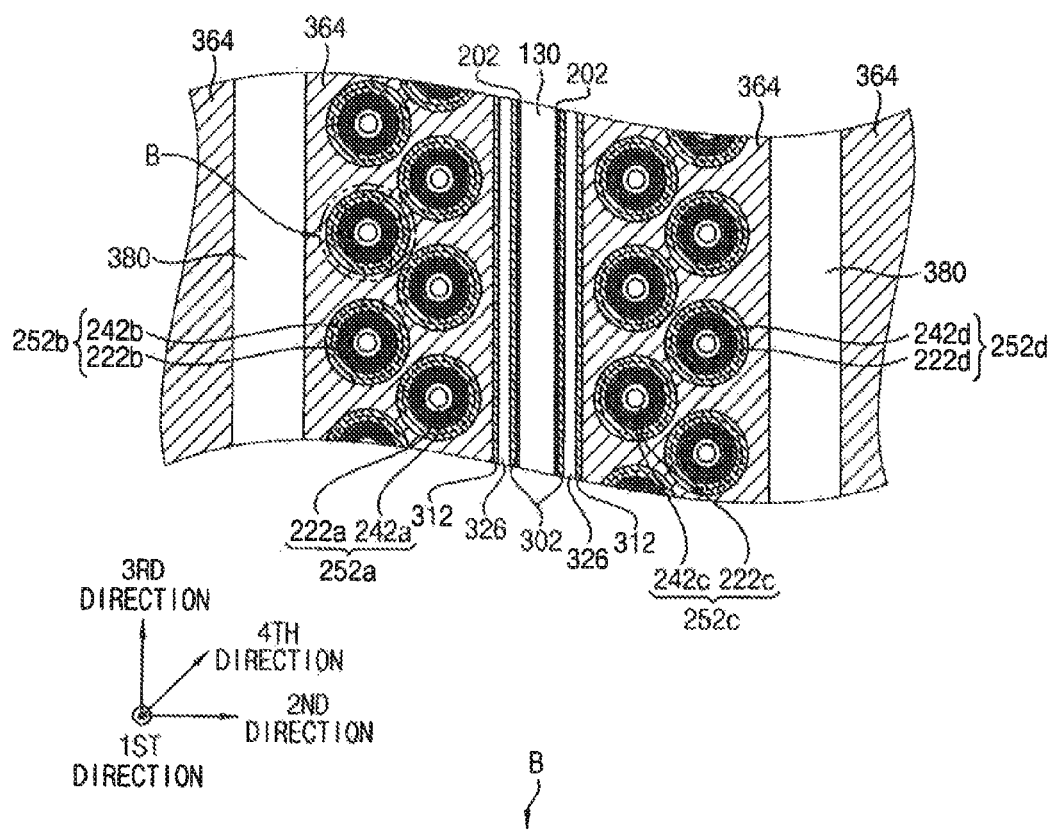
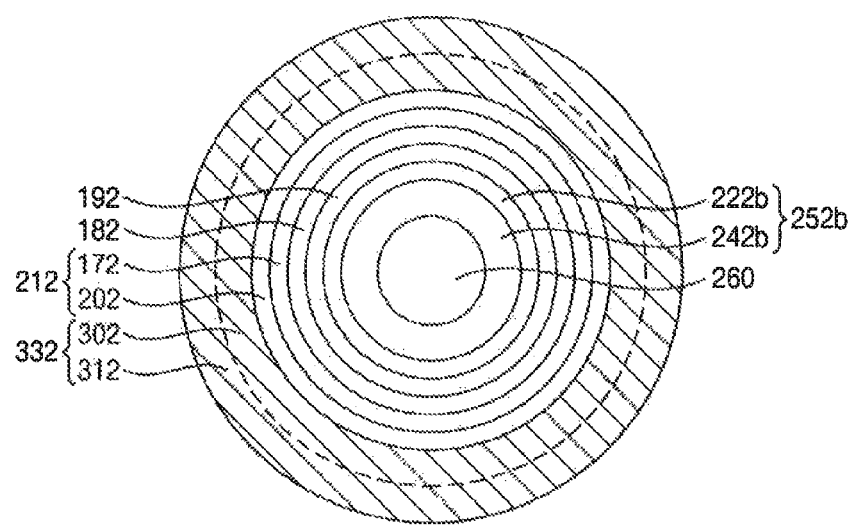

FIG. 40
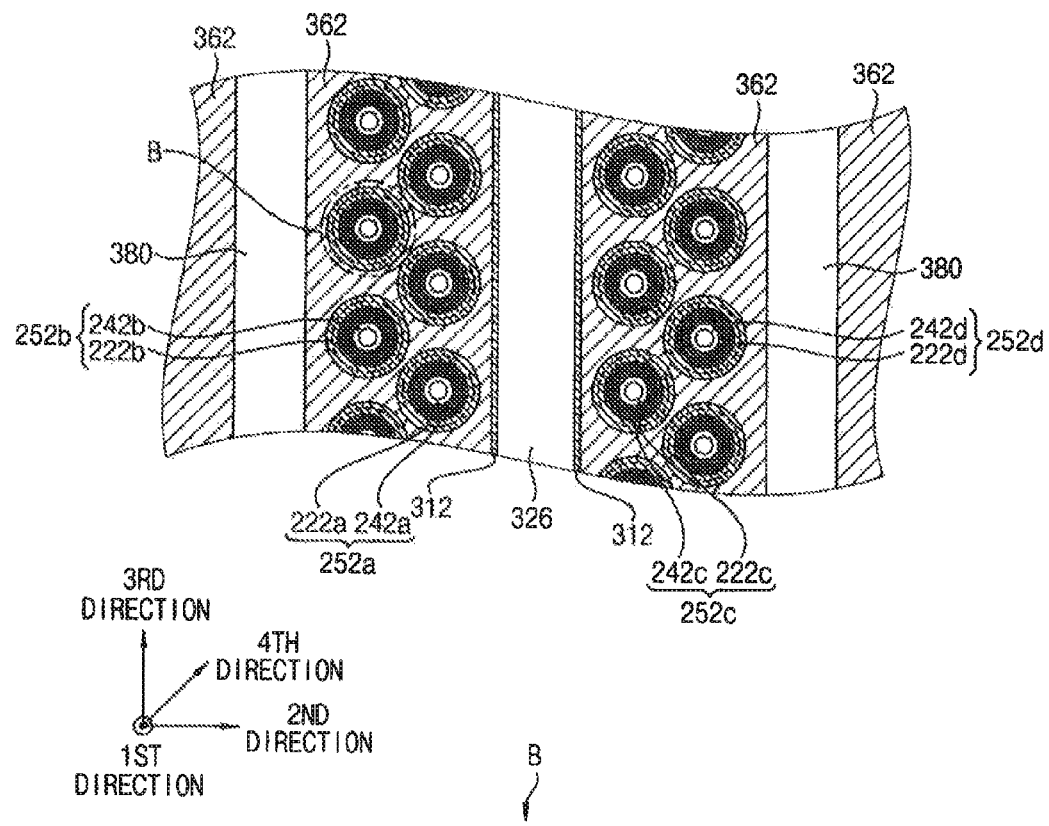
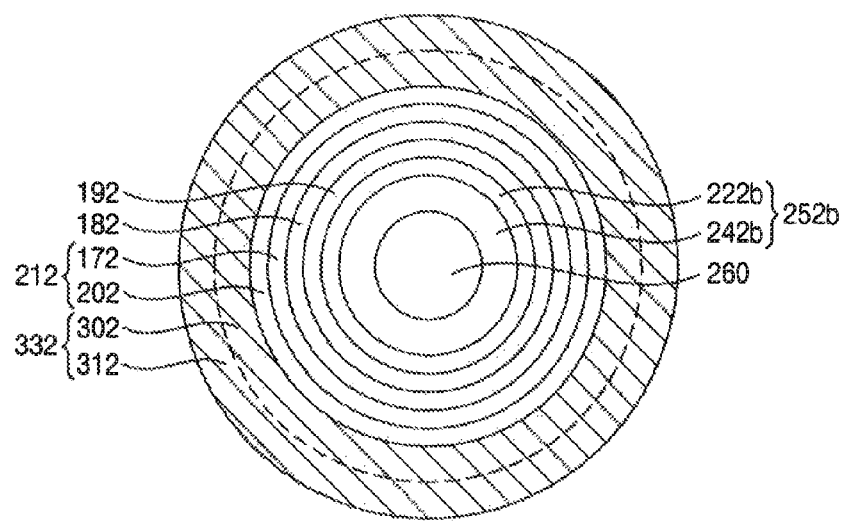

FIG. 41
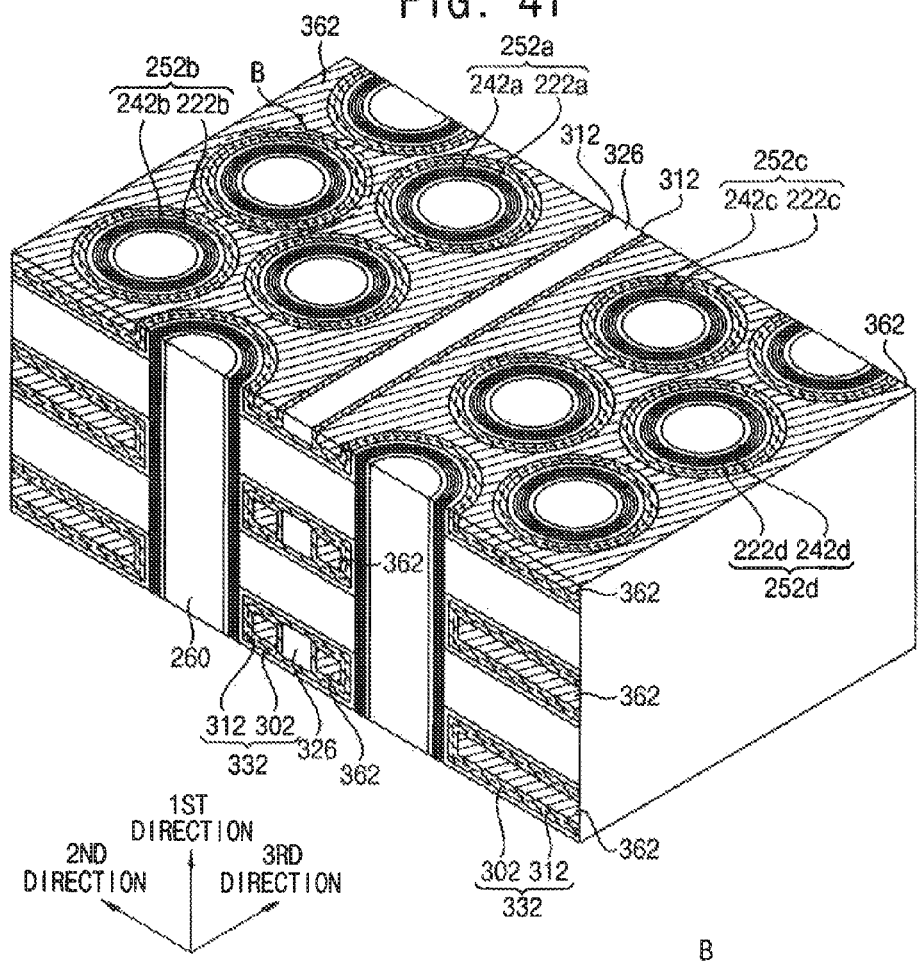
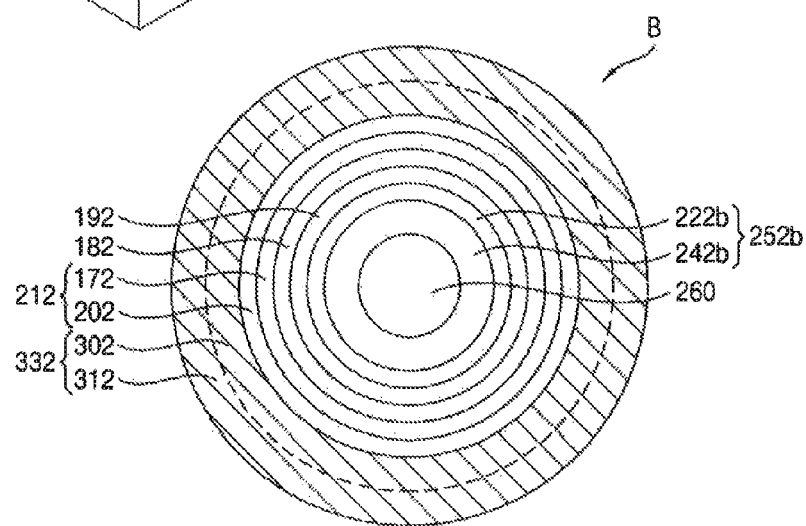

FIG. 44
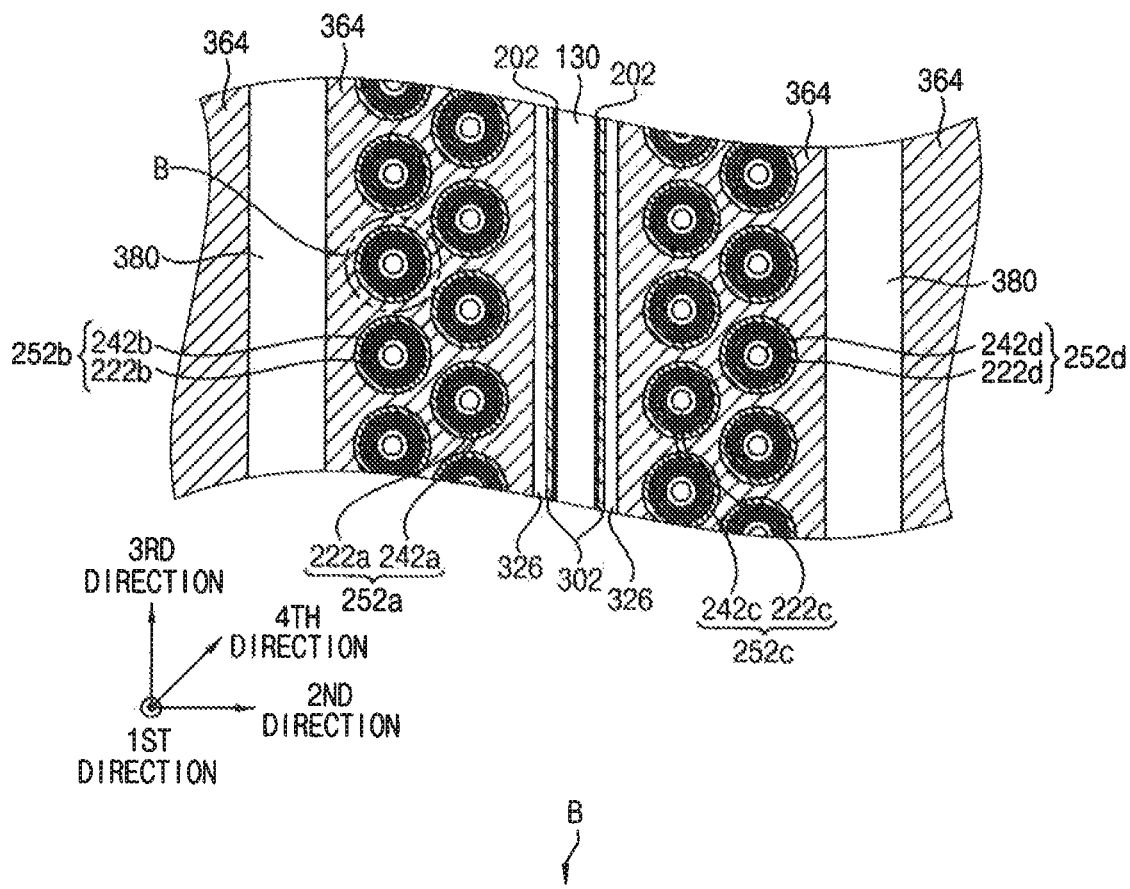
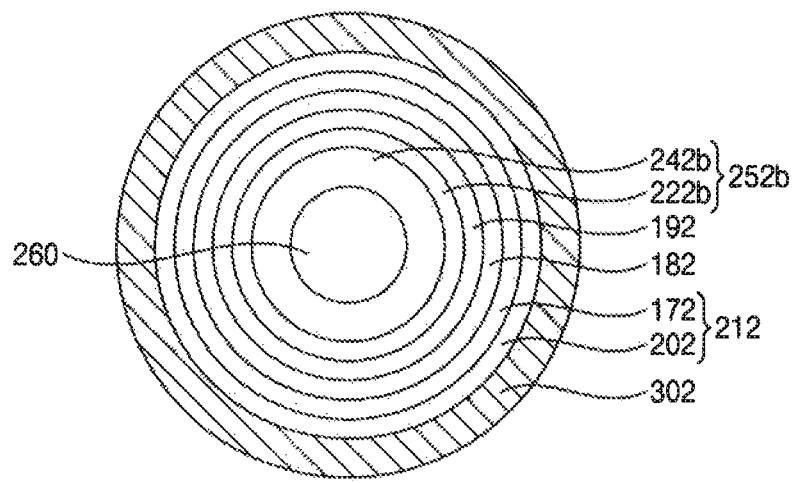

FIG. 45
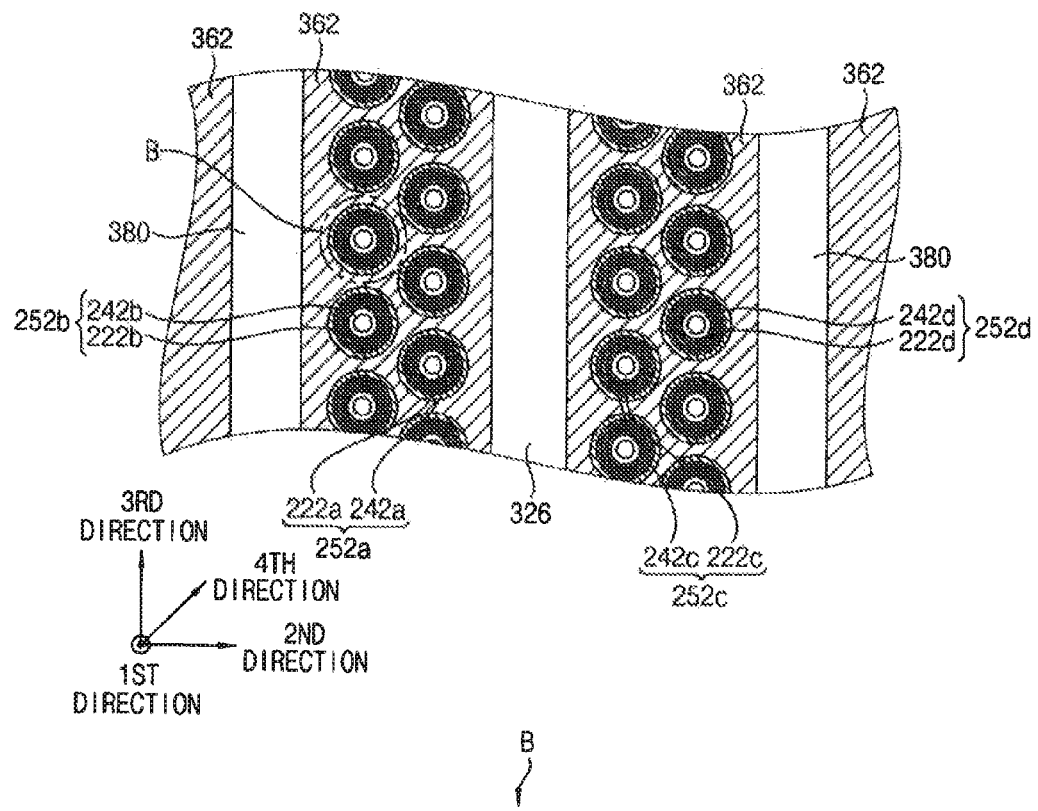
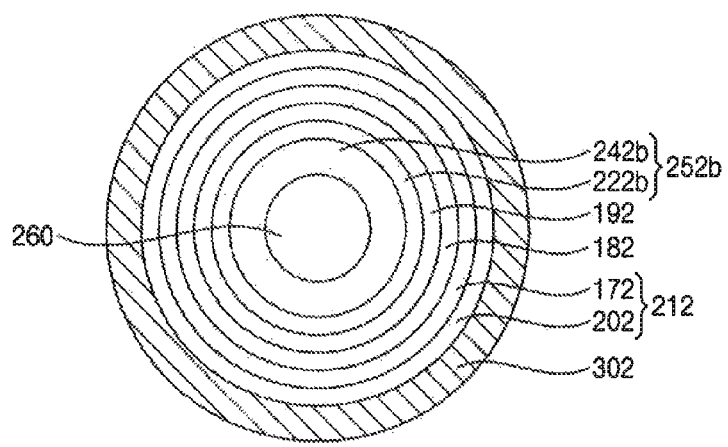

FIG. 46
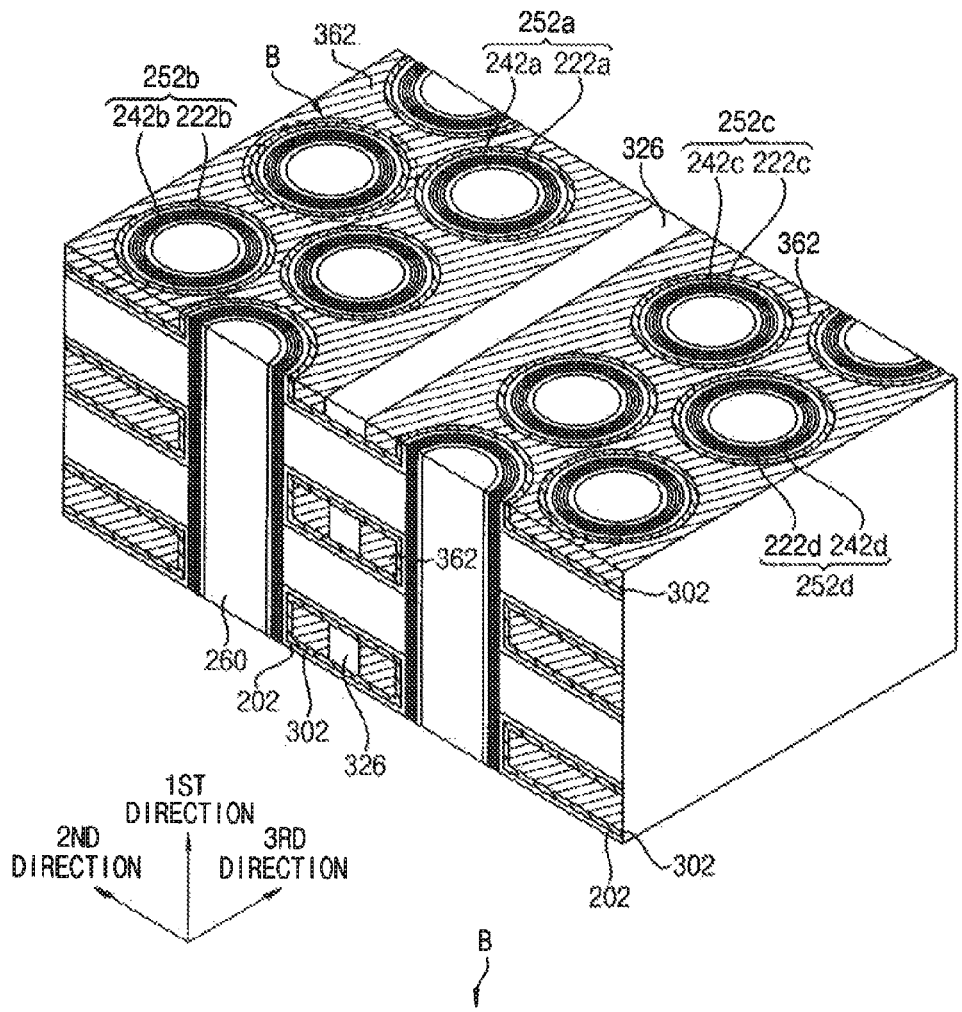
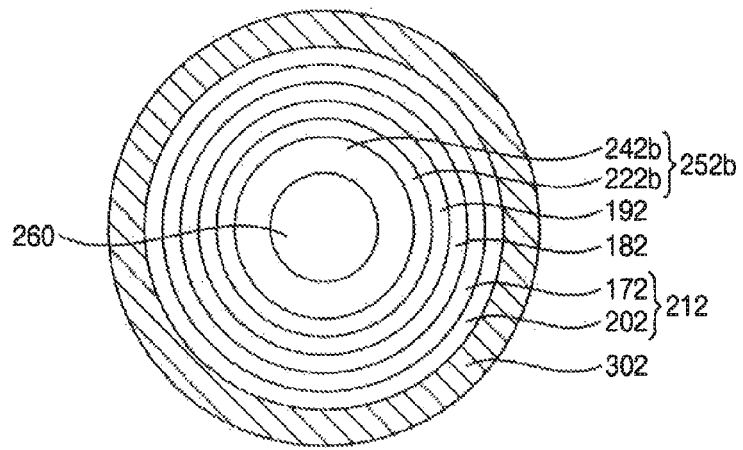

FIG. 48
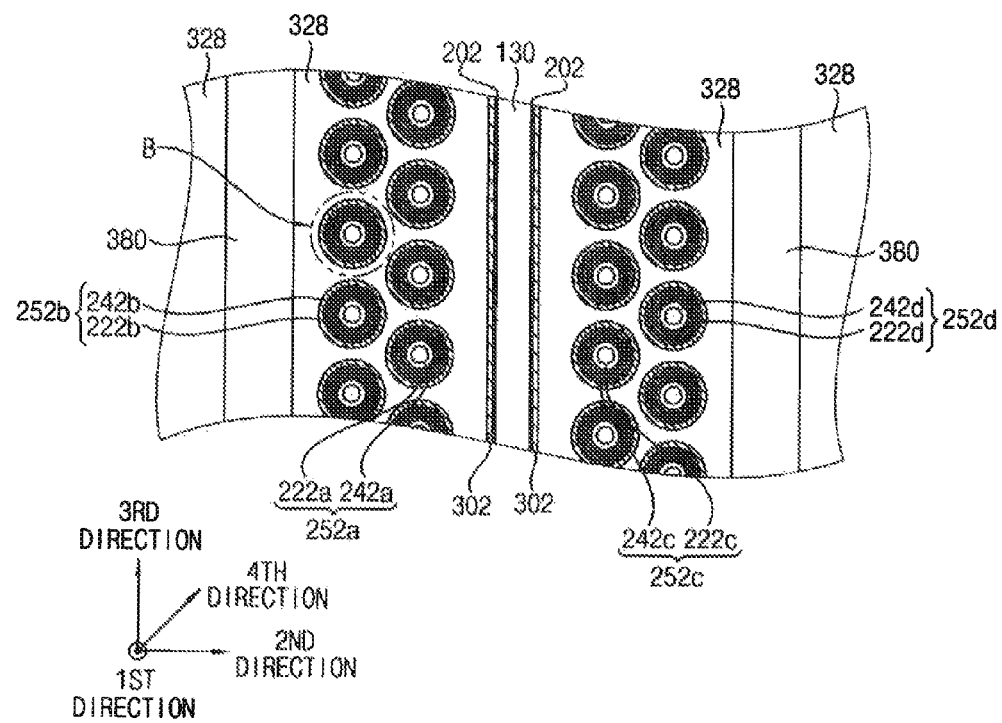
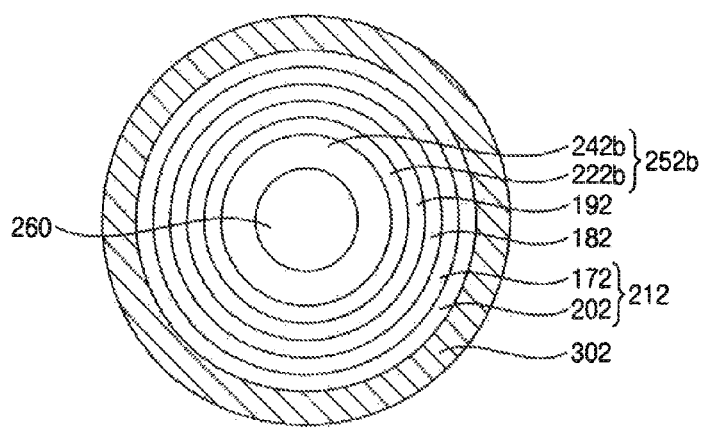

FIG. 50
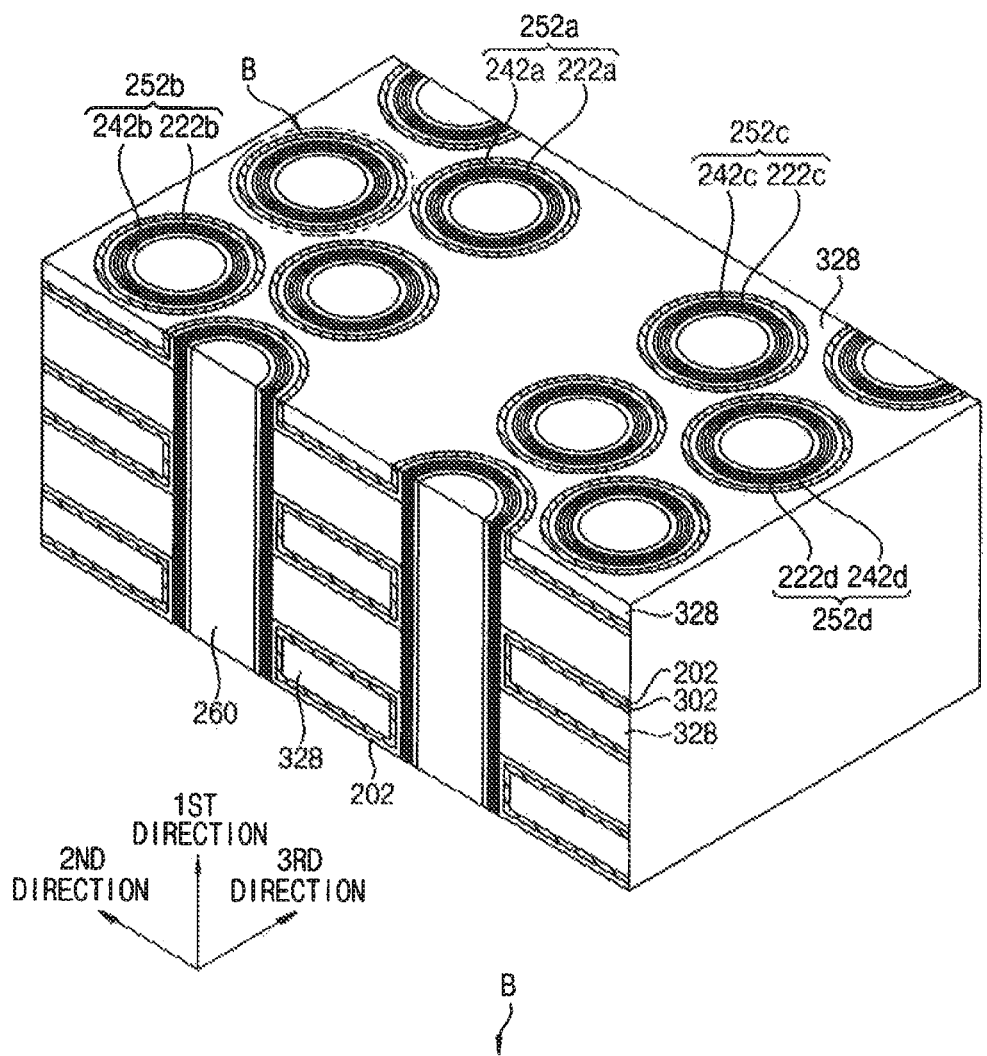
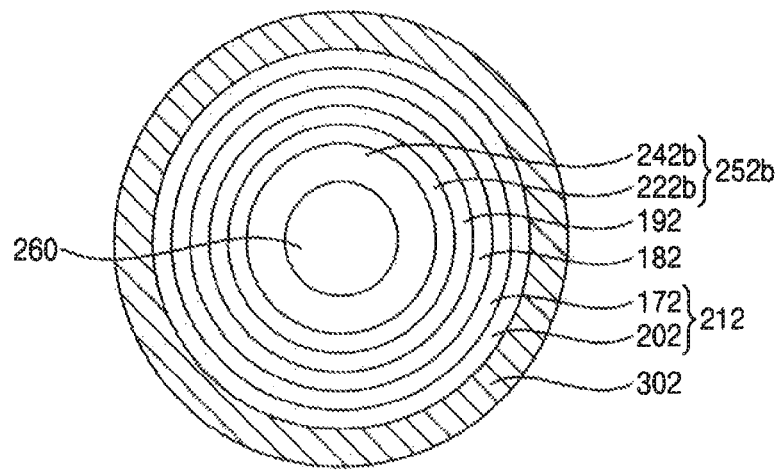

FIG. 52
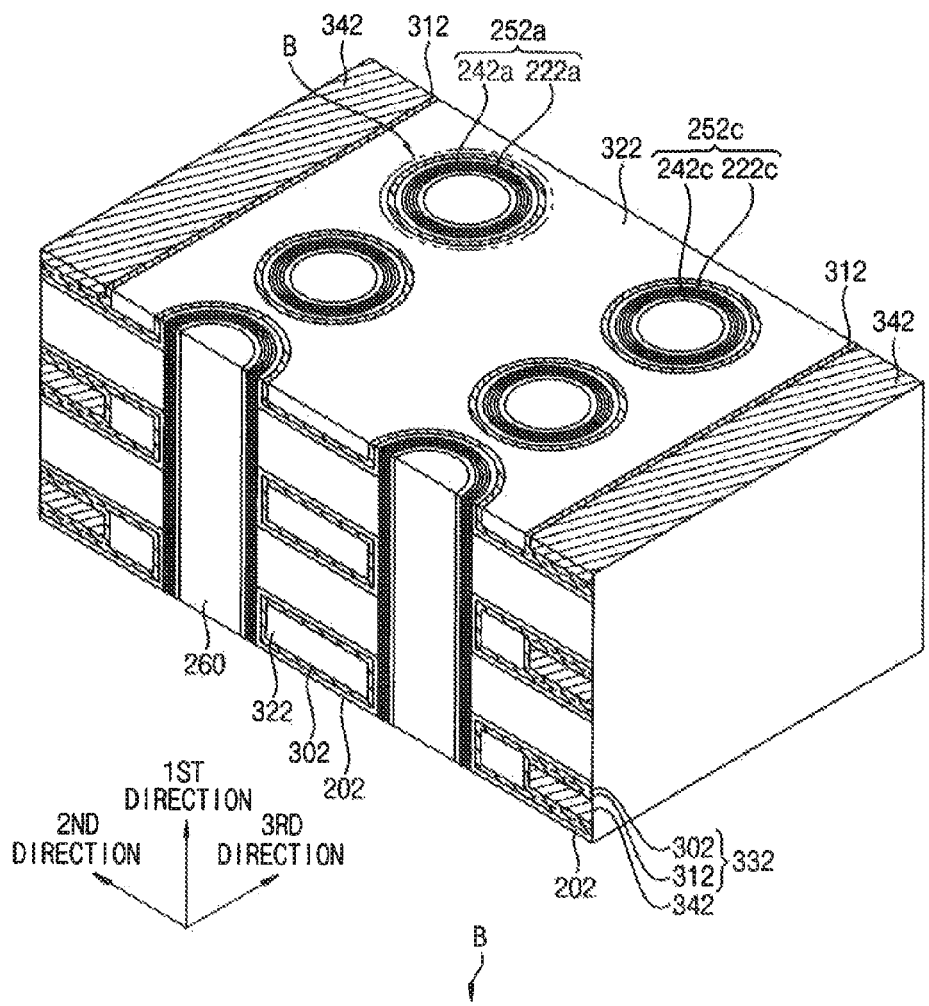
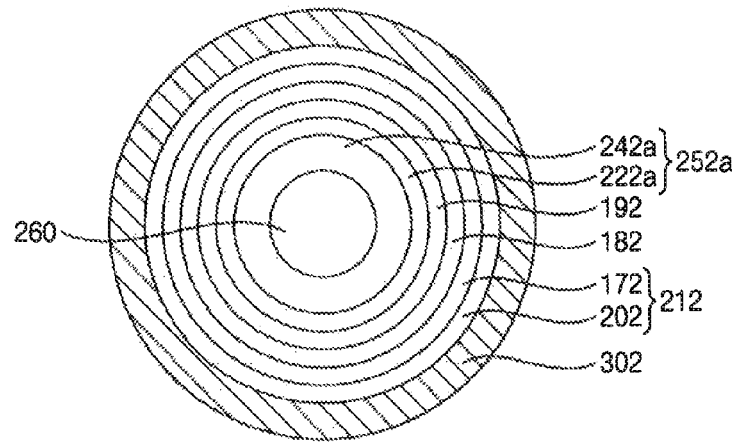

FIG. 53
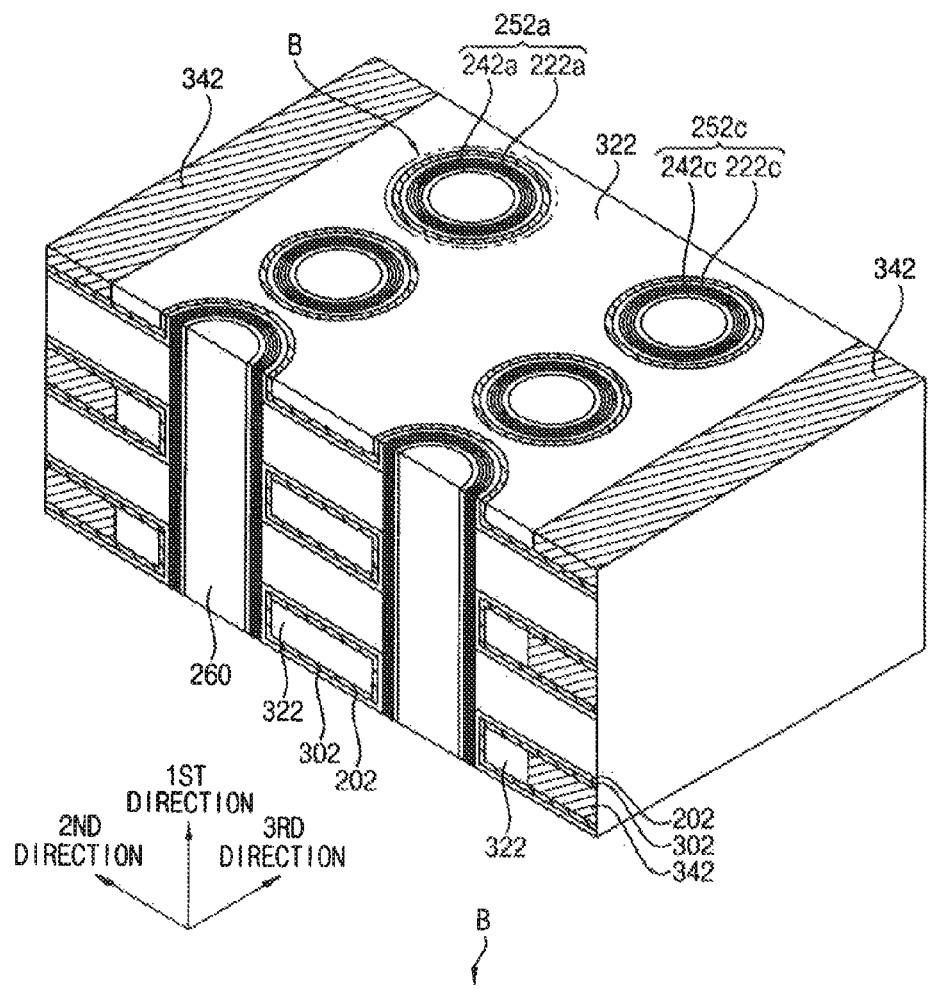
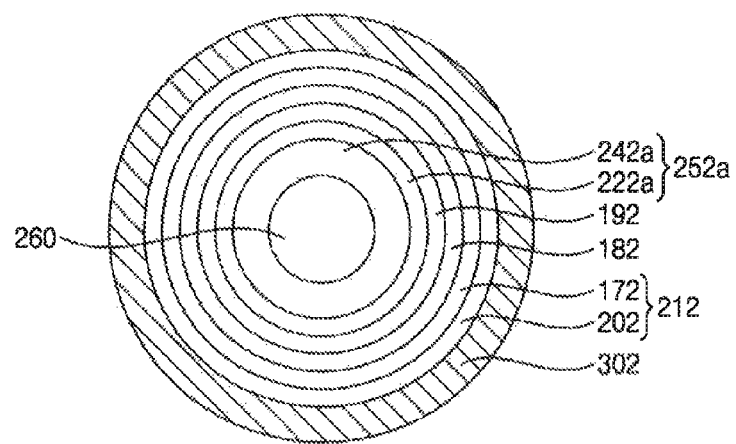

FIG. 55
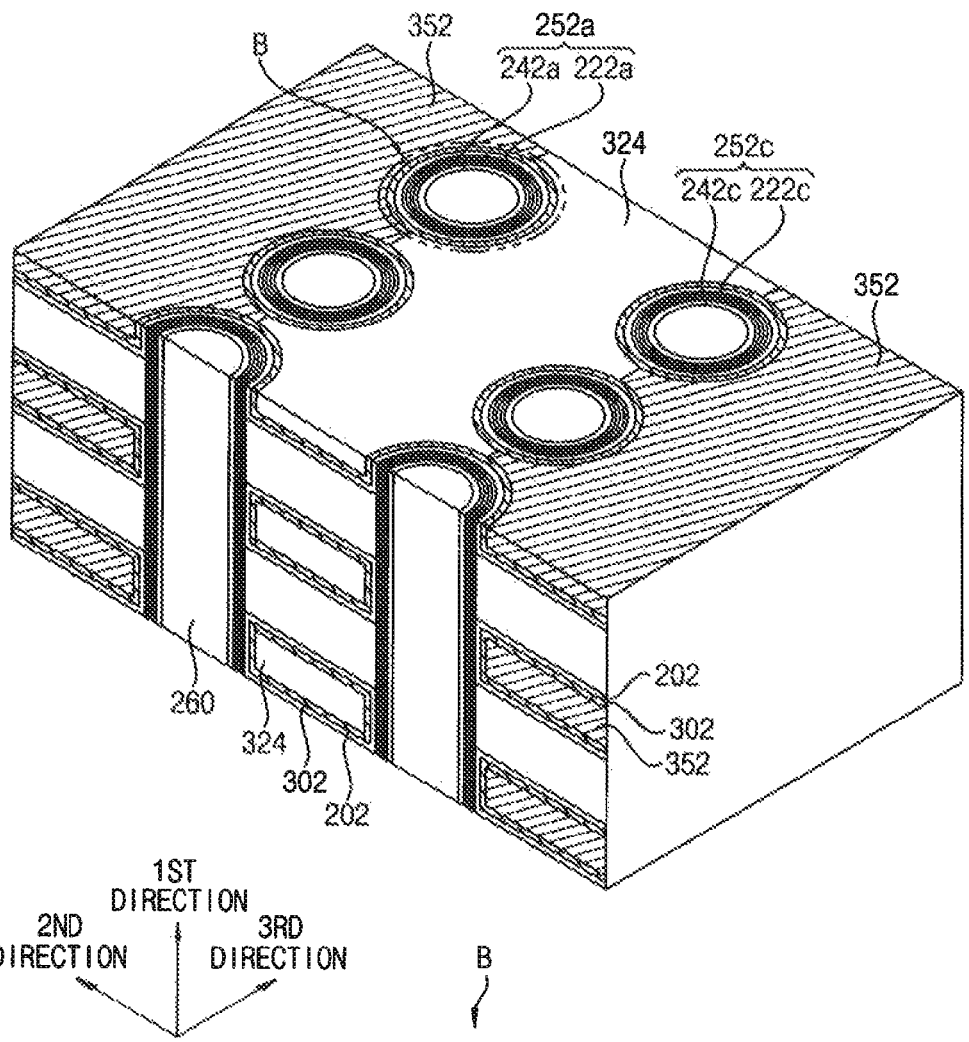
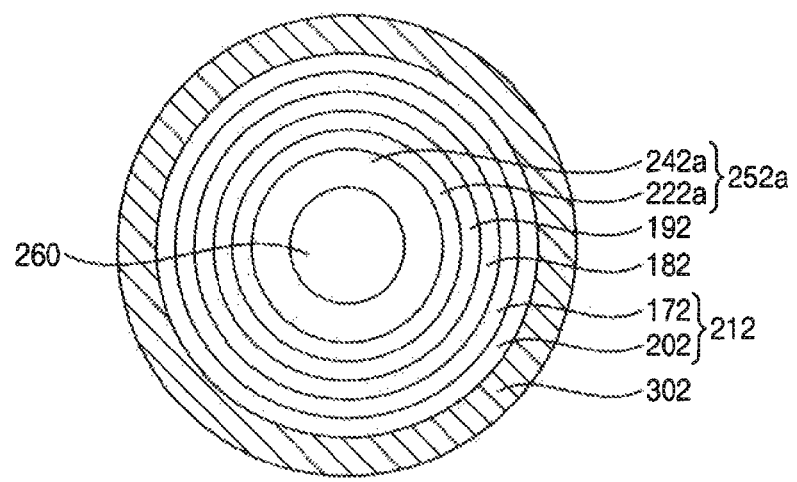

FIG. 56
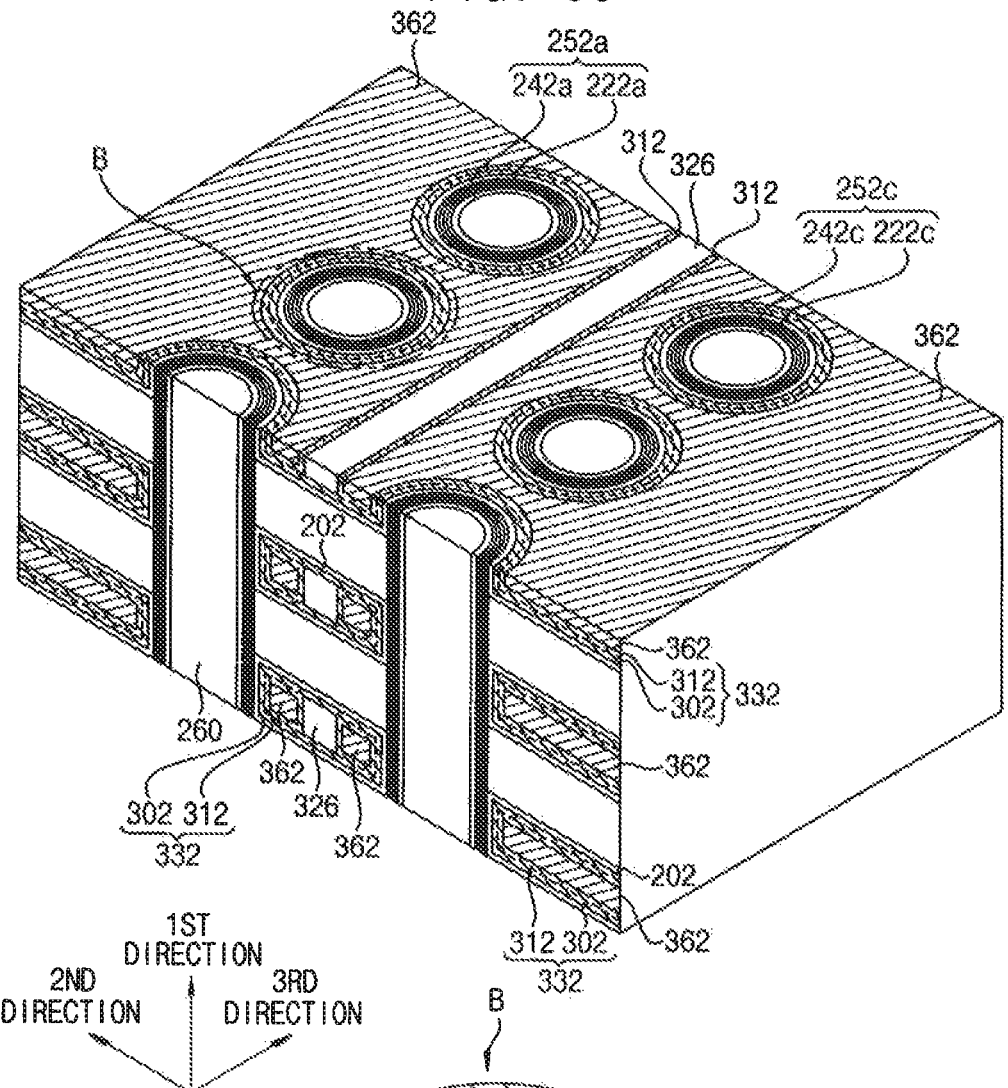
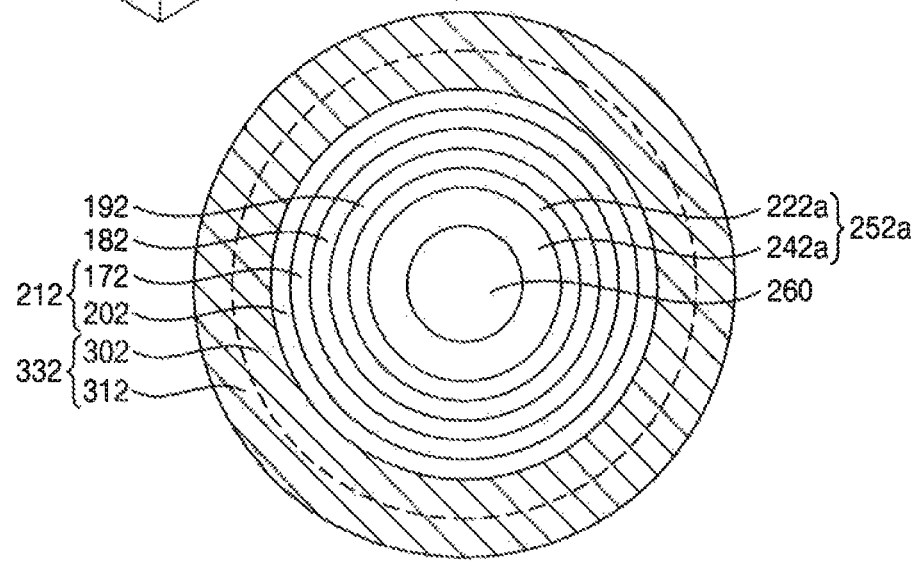

FIG. 57
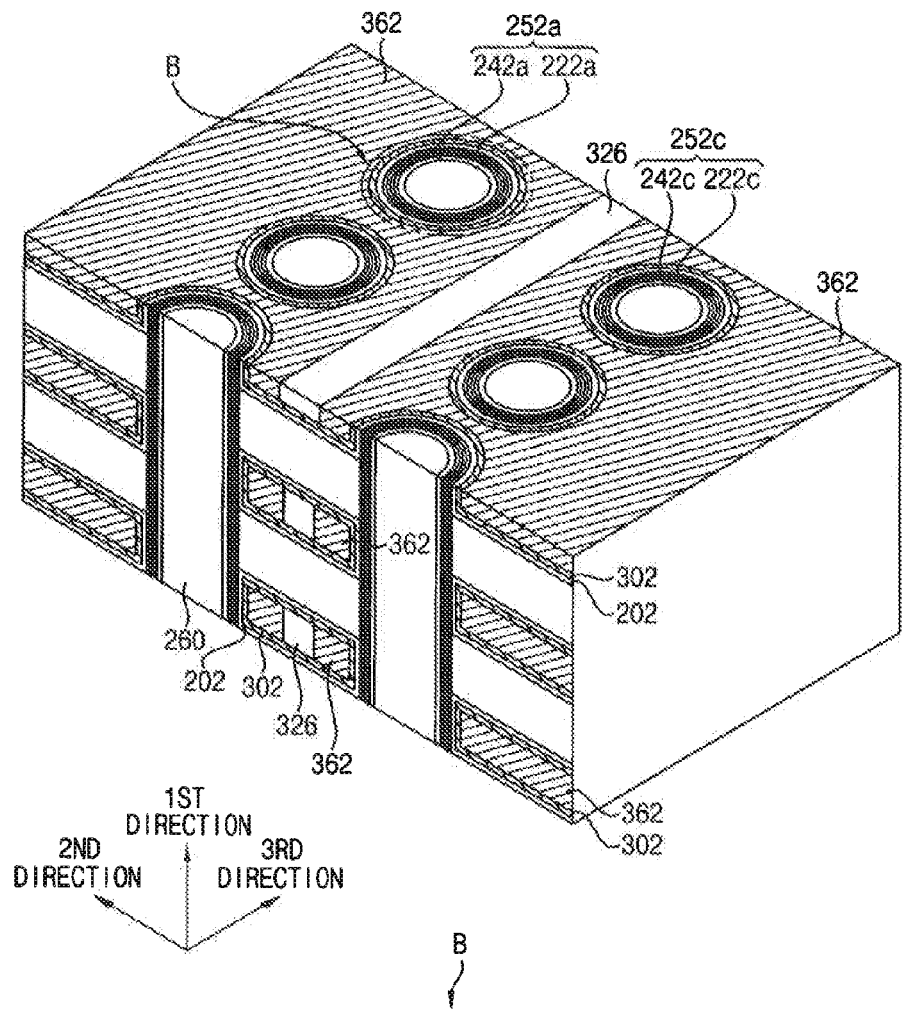
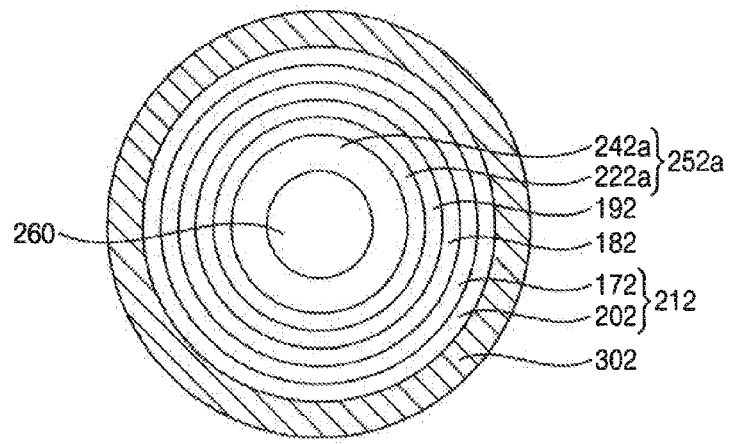

FIG. 58
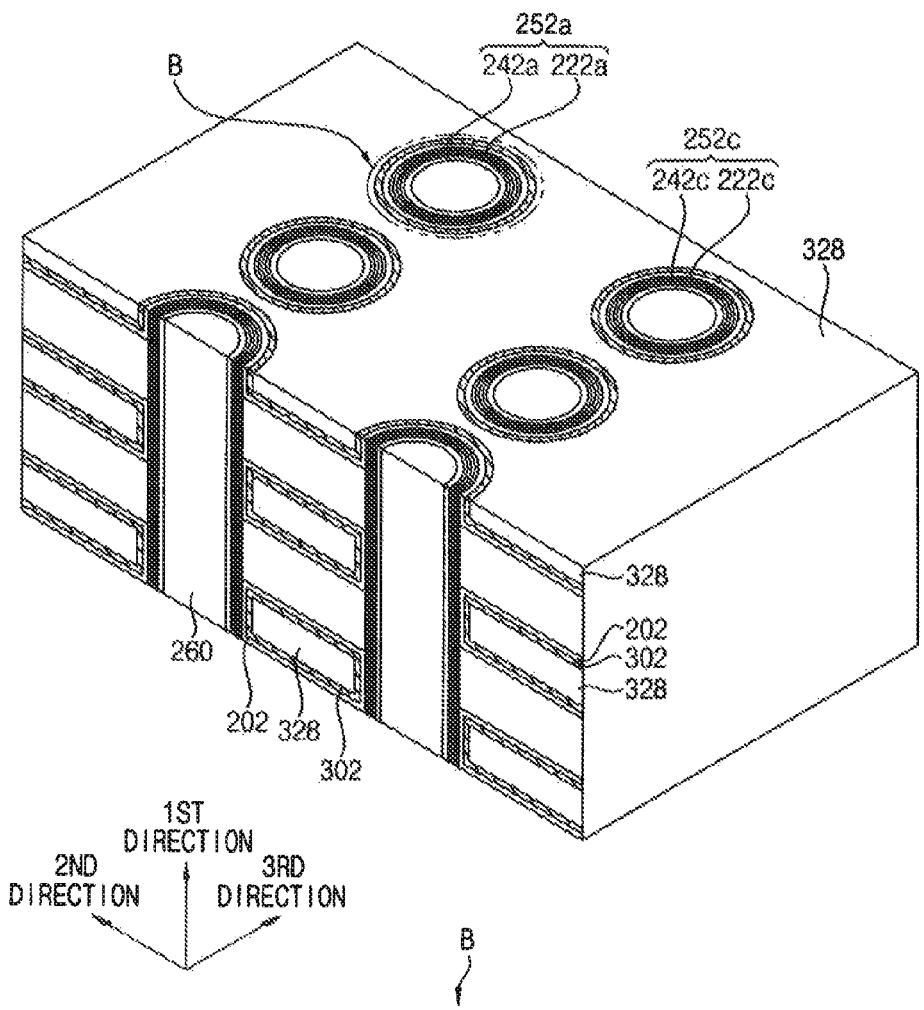
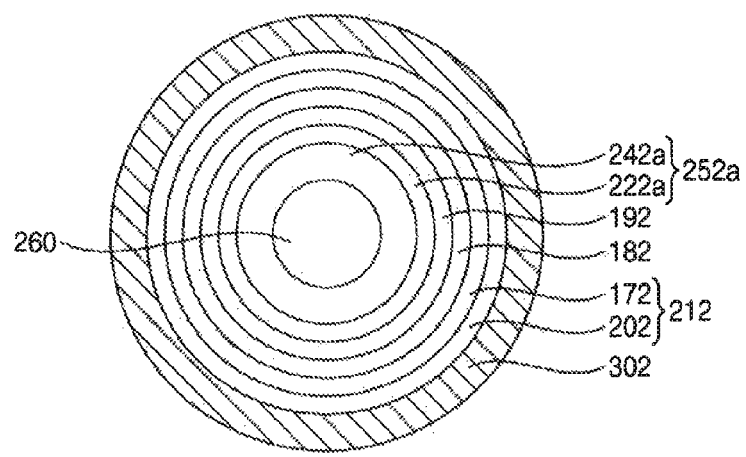

FIG. 61
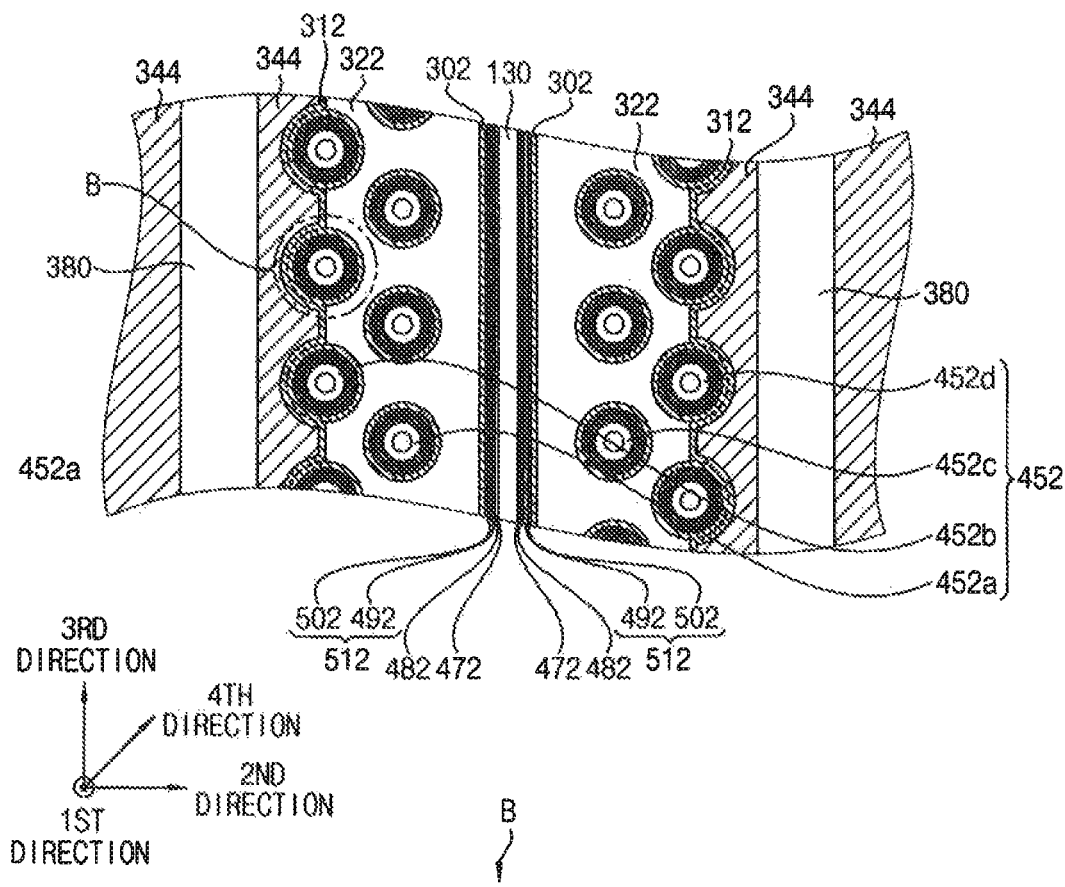
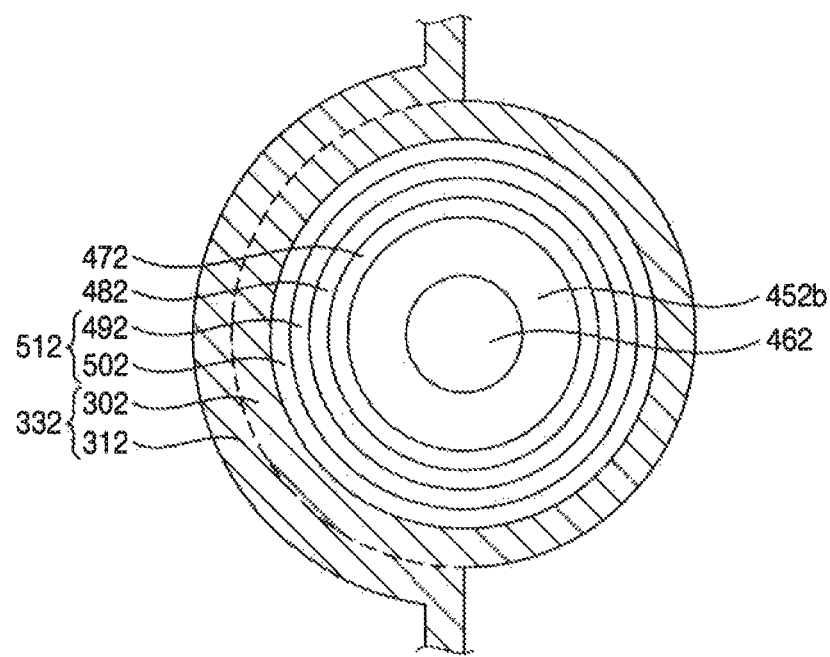

FIG. 62
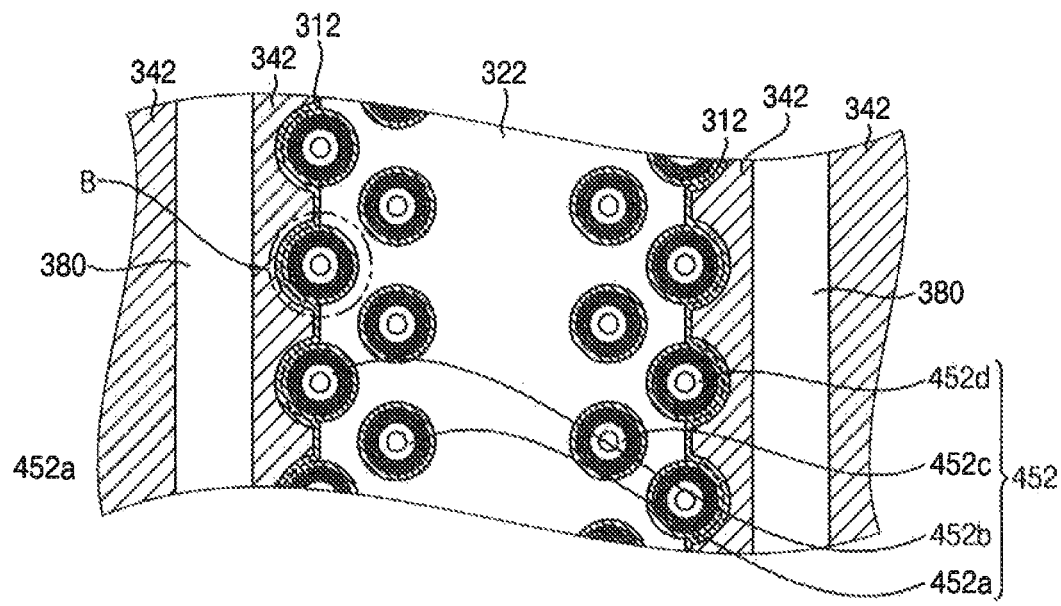
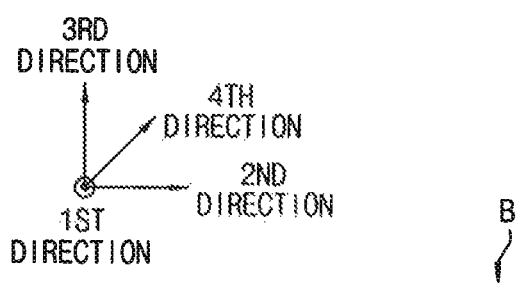
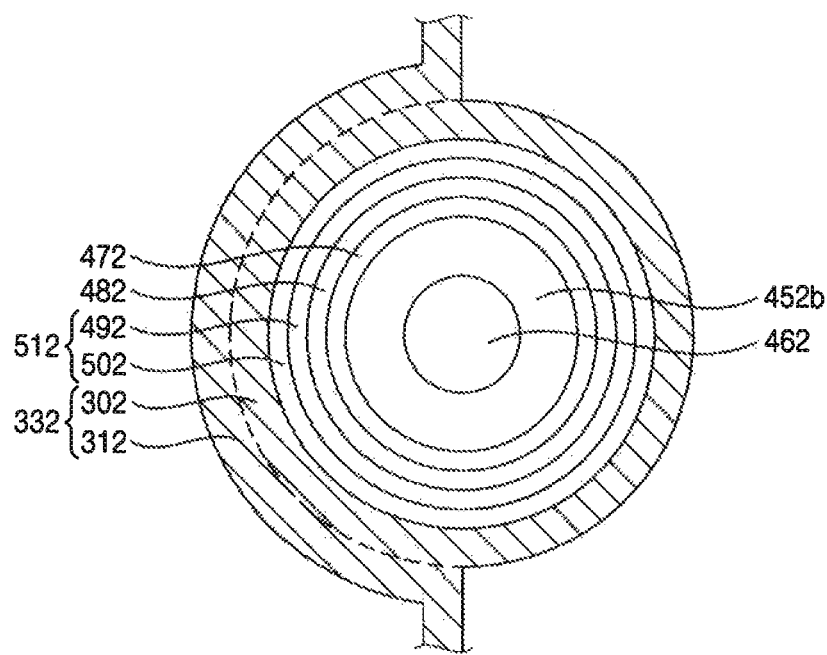

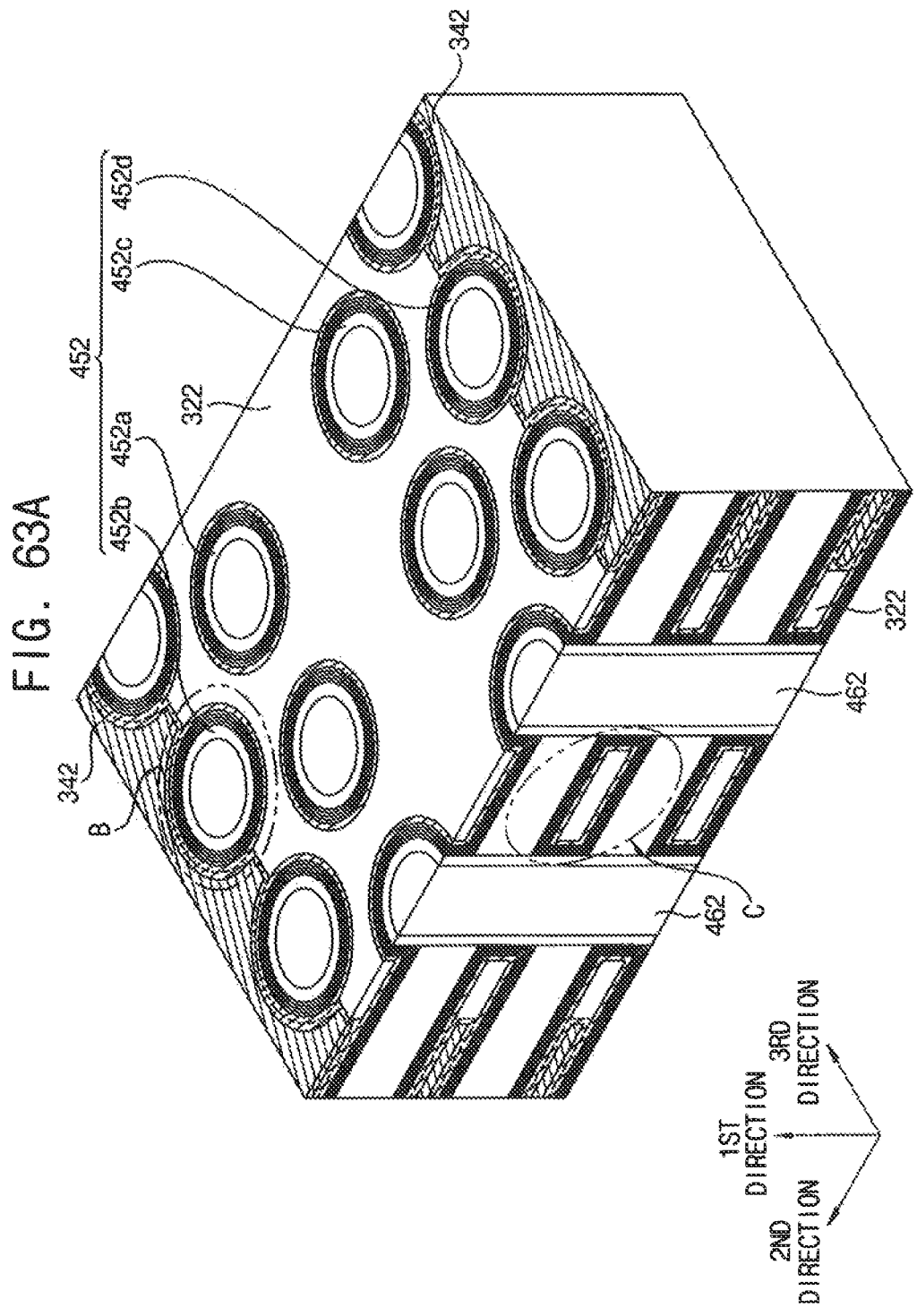

FIG. 73B
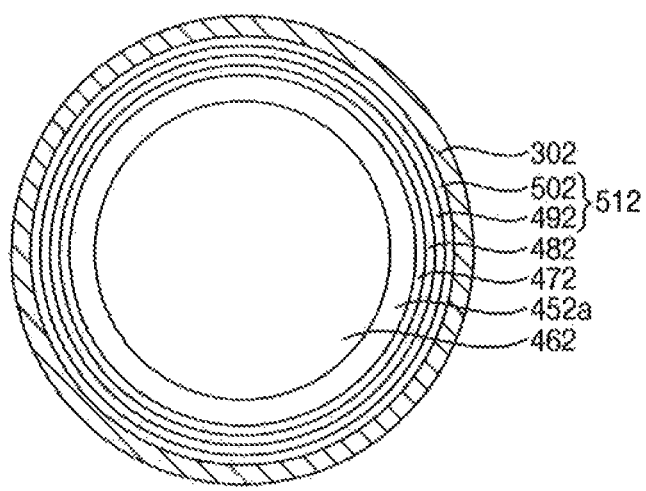
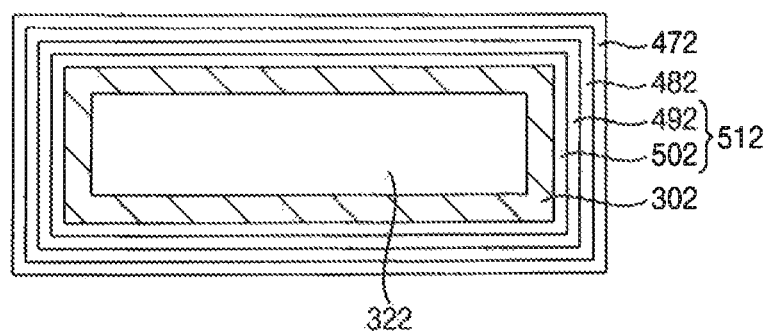

FIG. 75
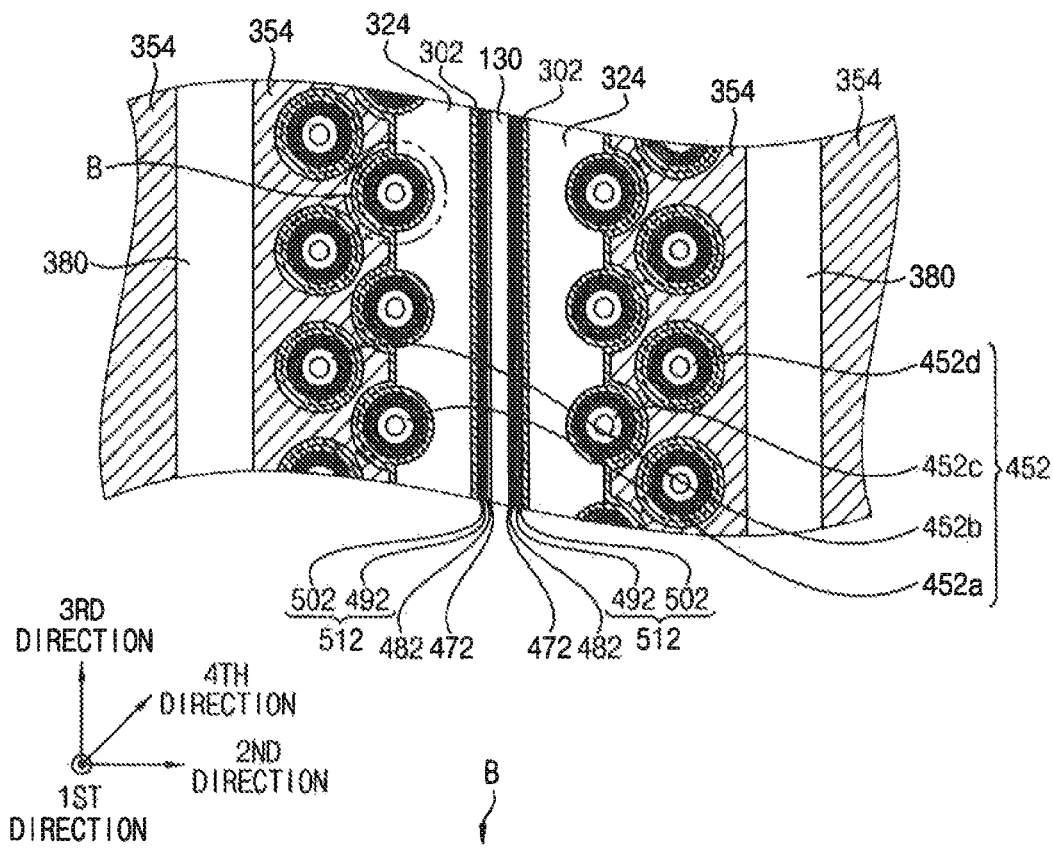
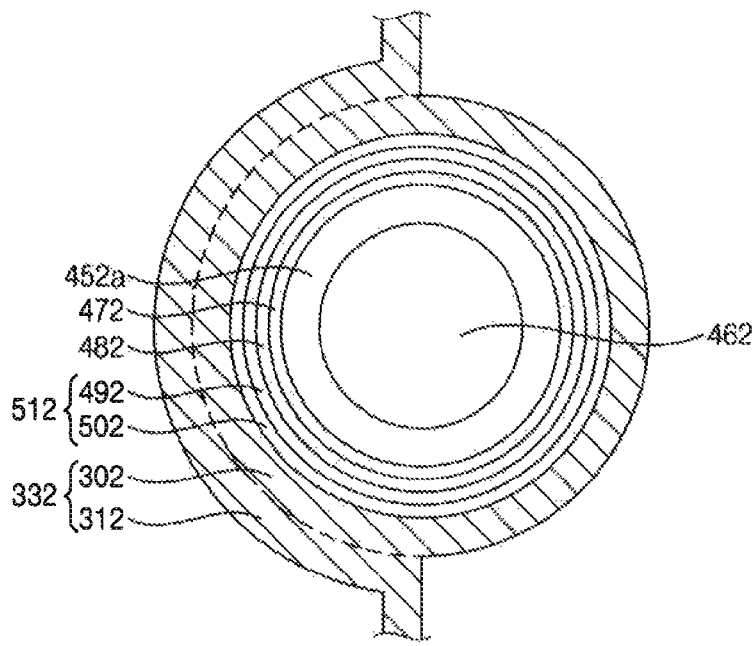

FIG. 77B
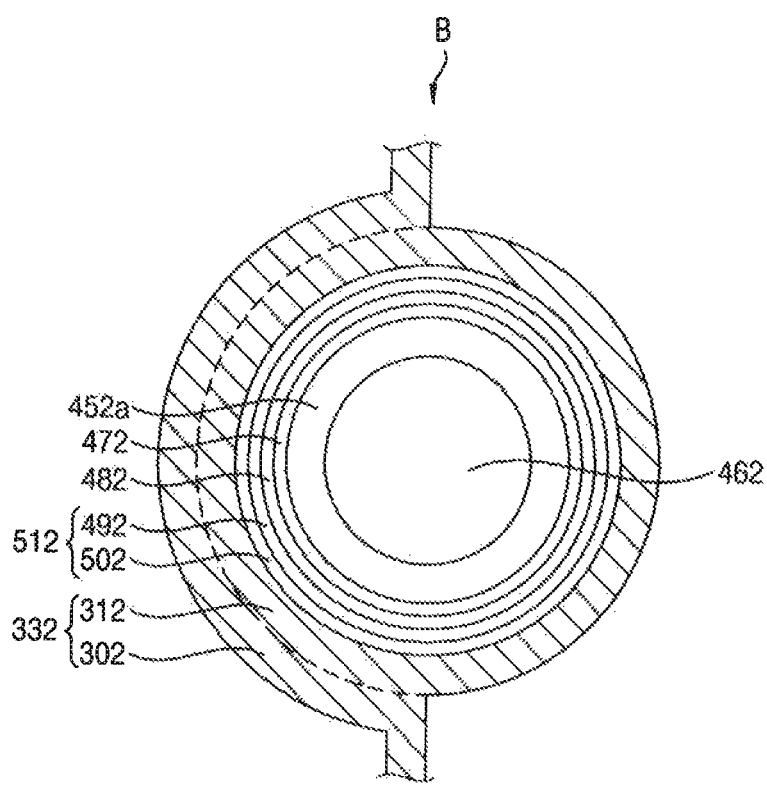
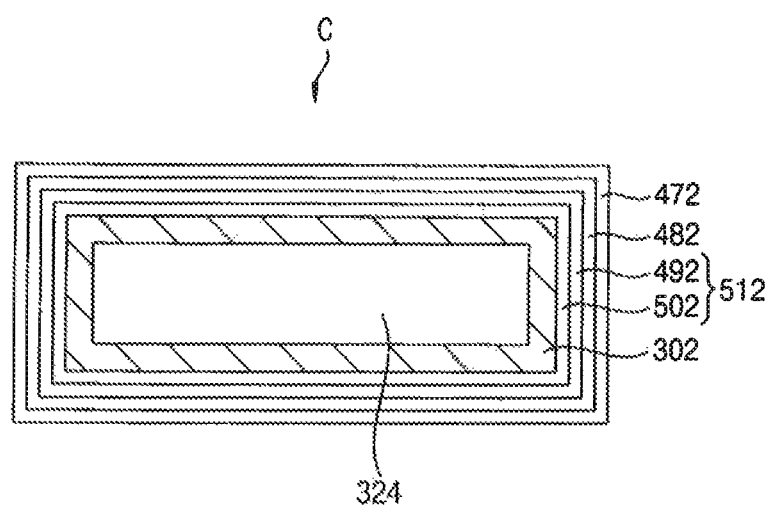

FIG. 80
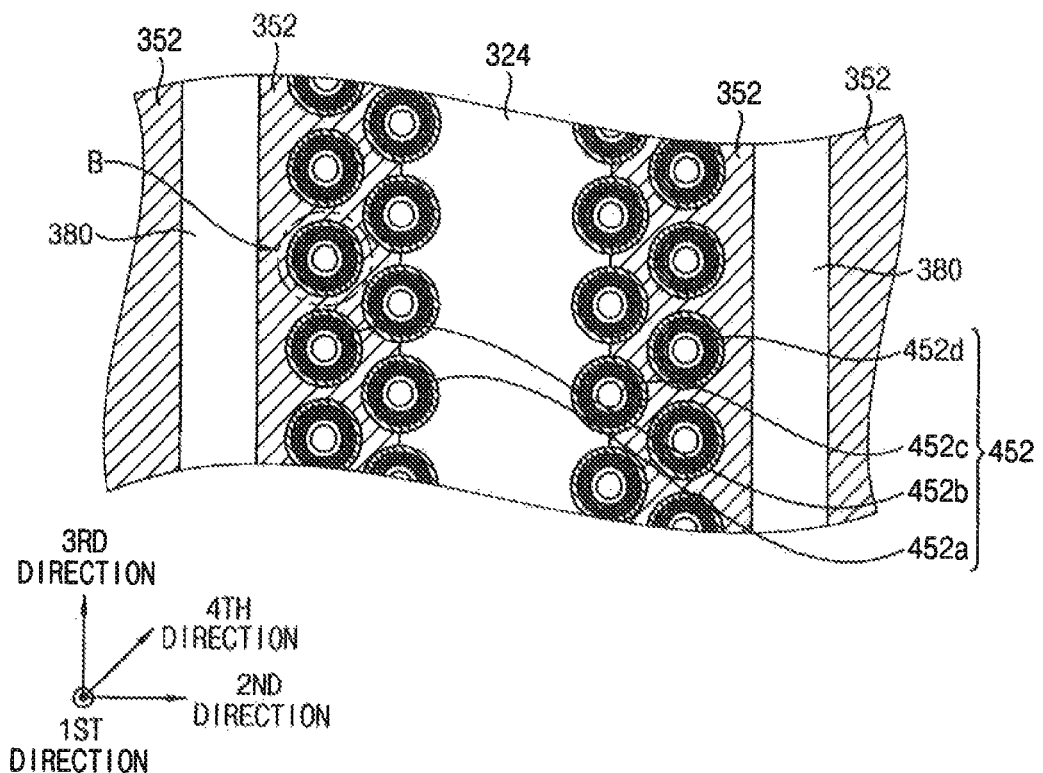
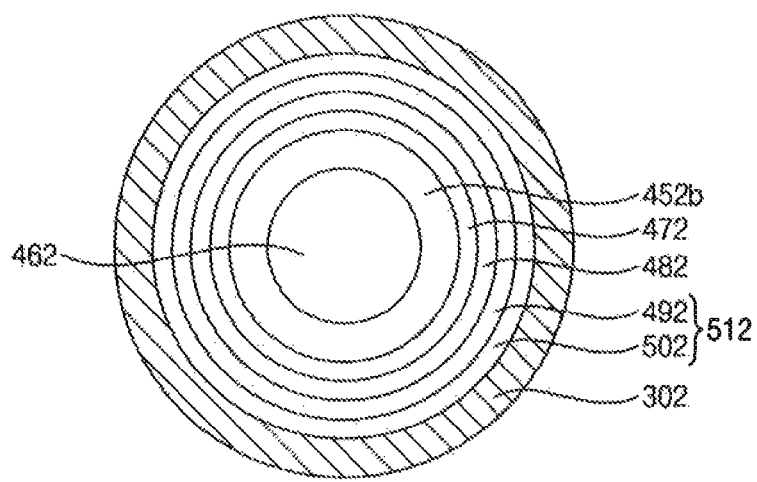

FIG. 81B
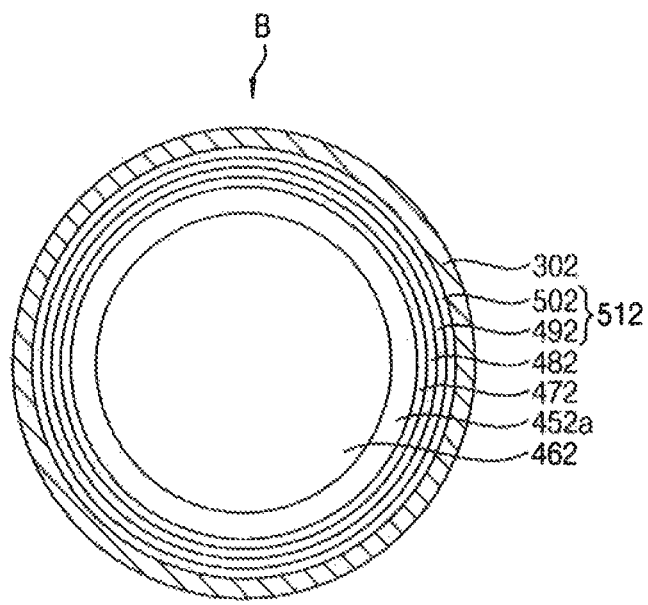
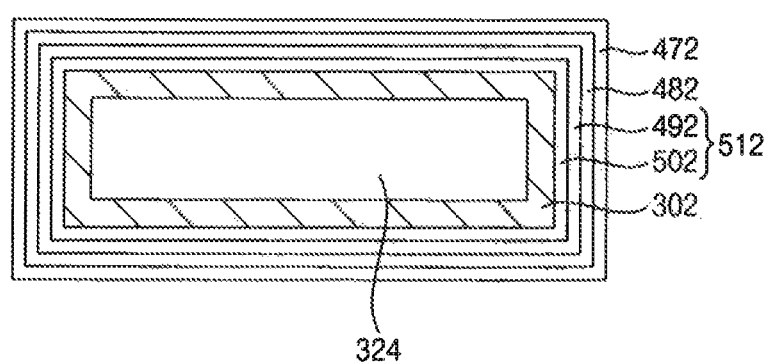

FIG. 83
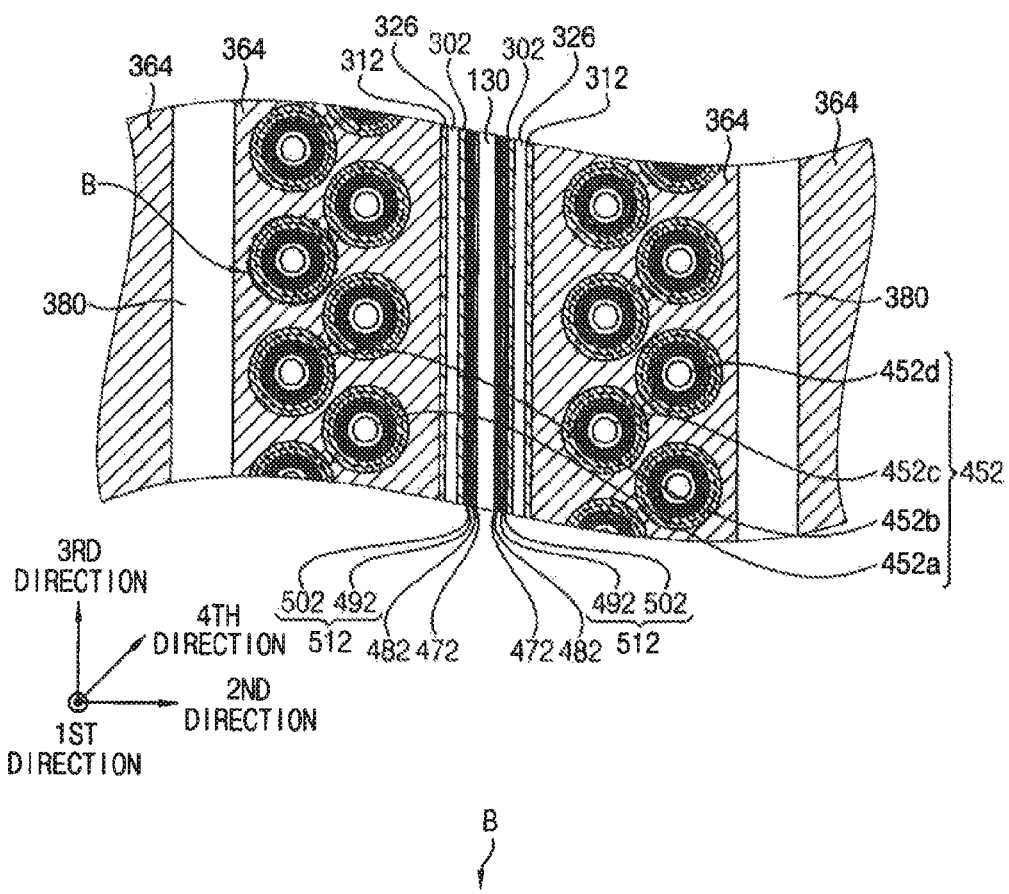
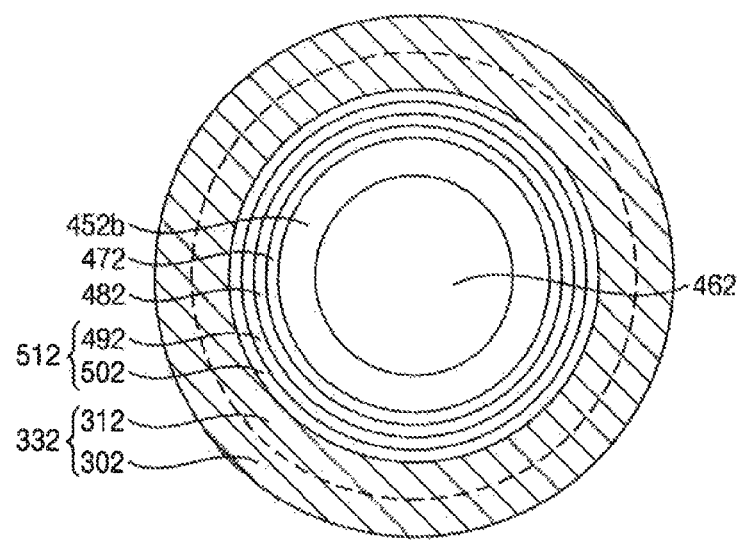

FIG. 84
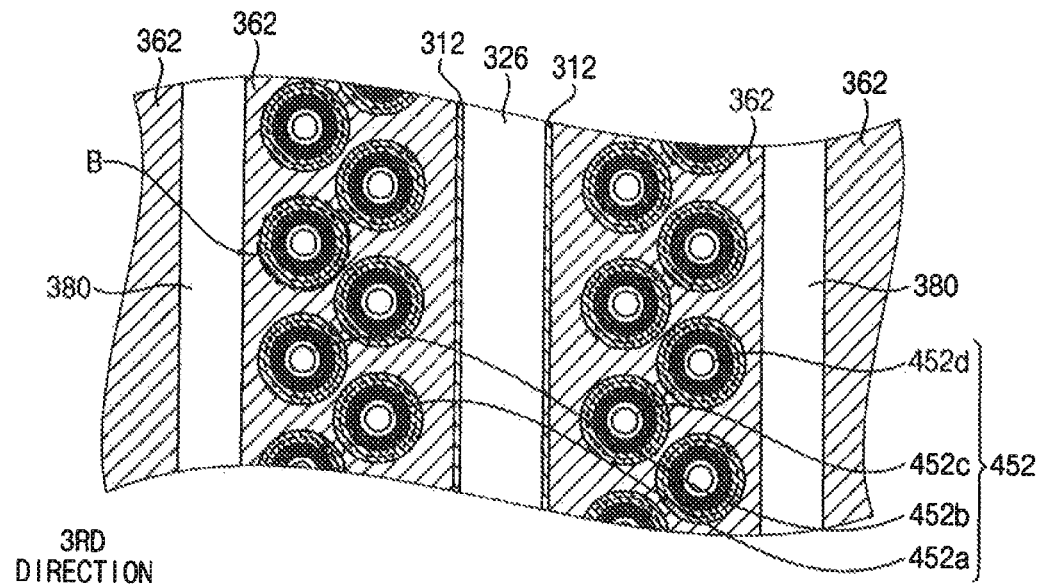
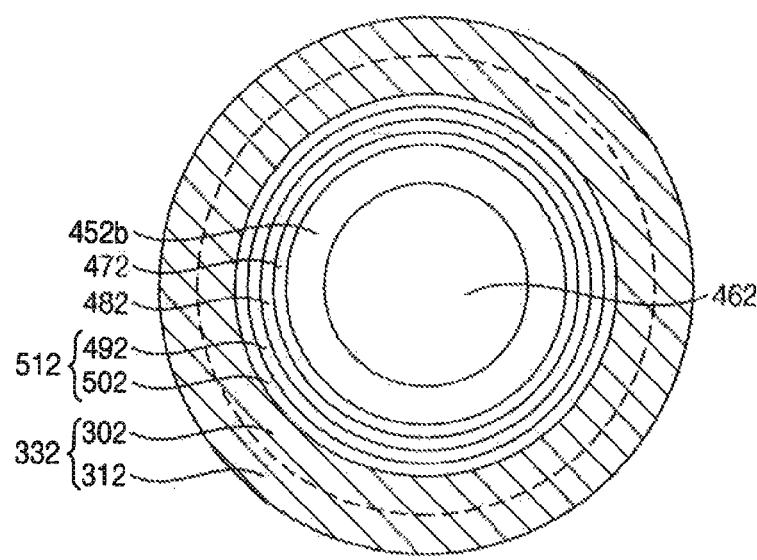

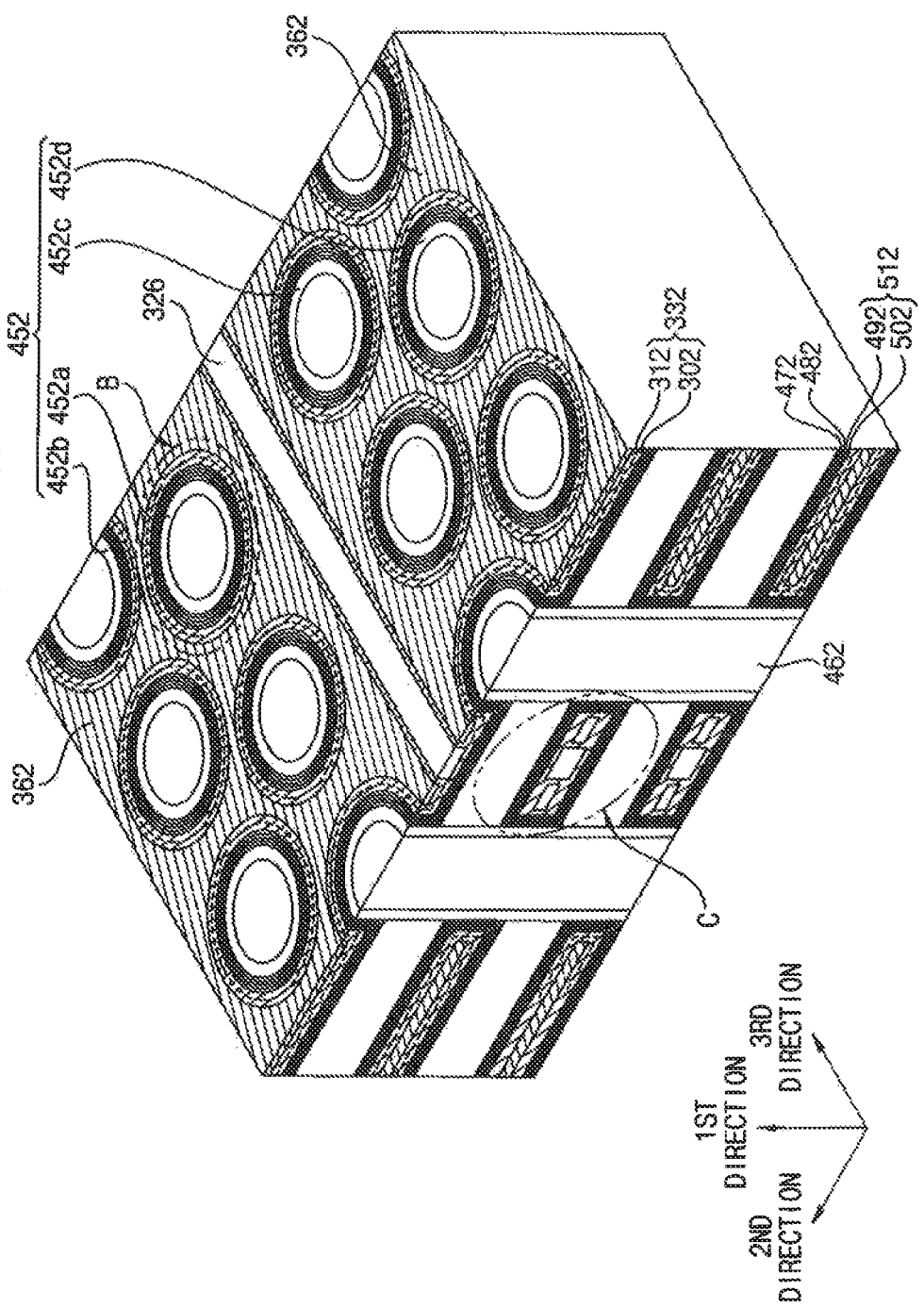

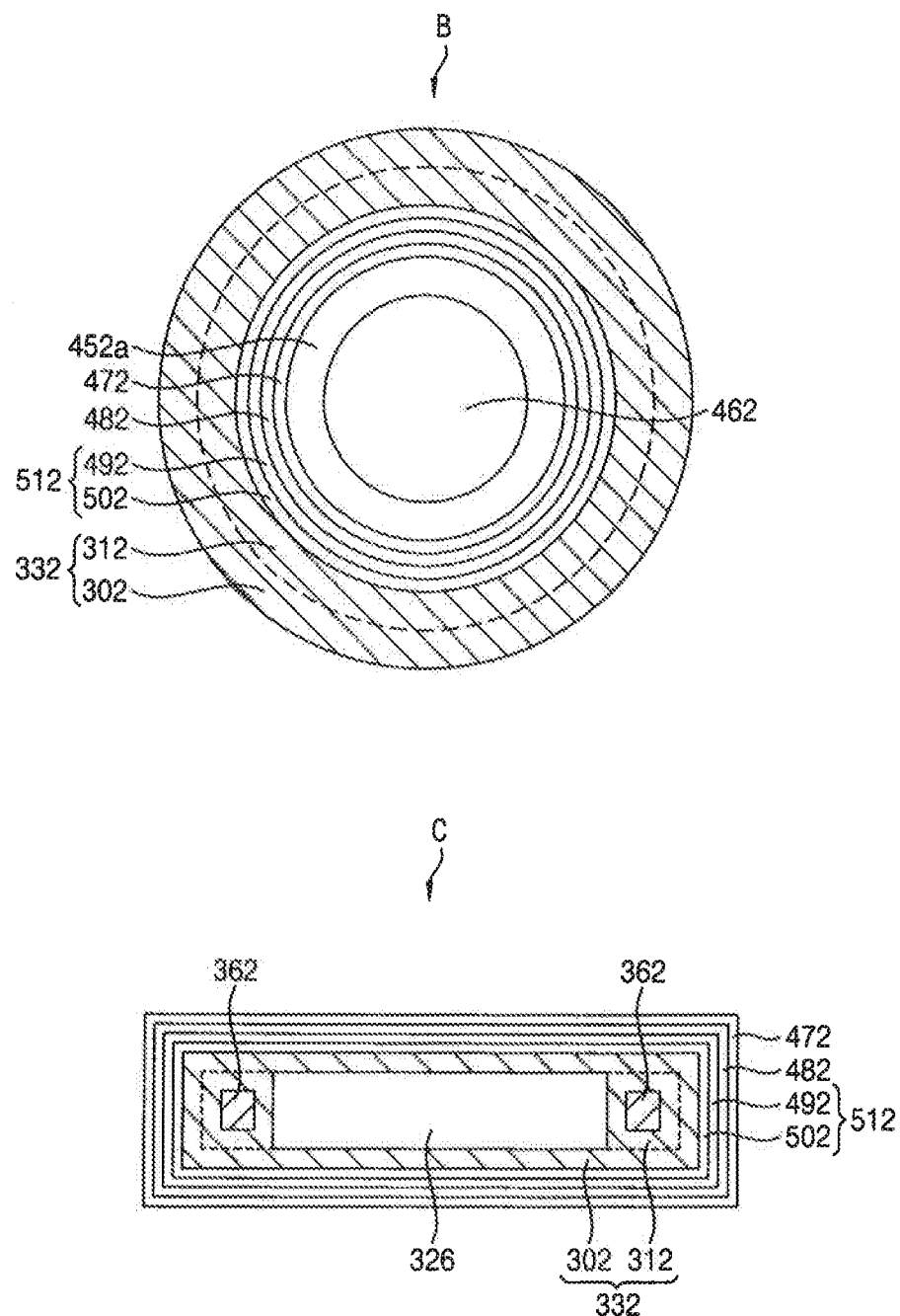

FIG. 87
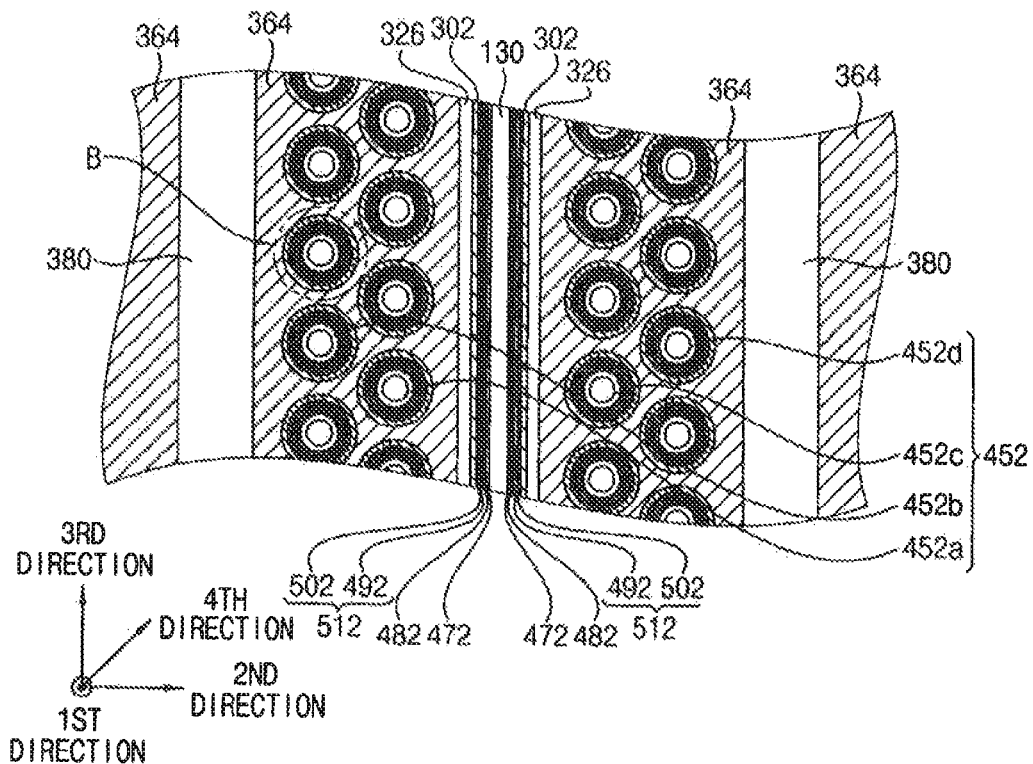
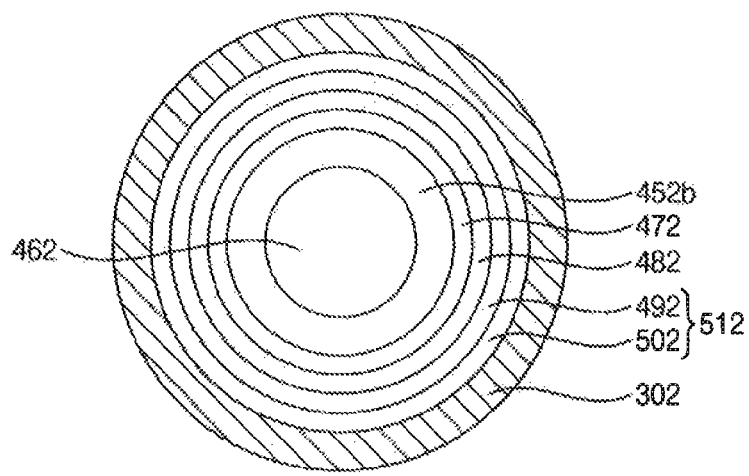

FIG. 88
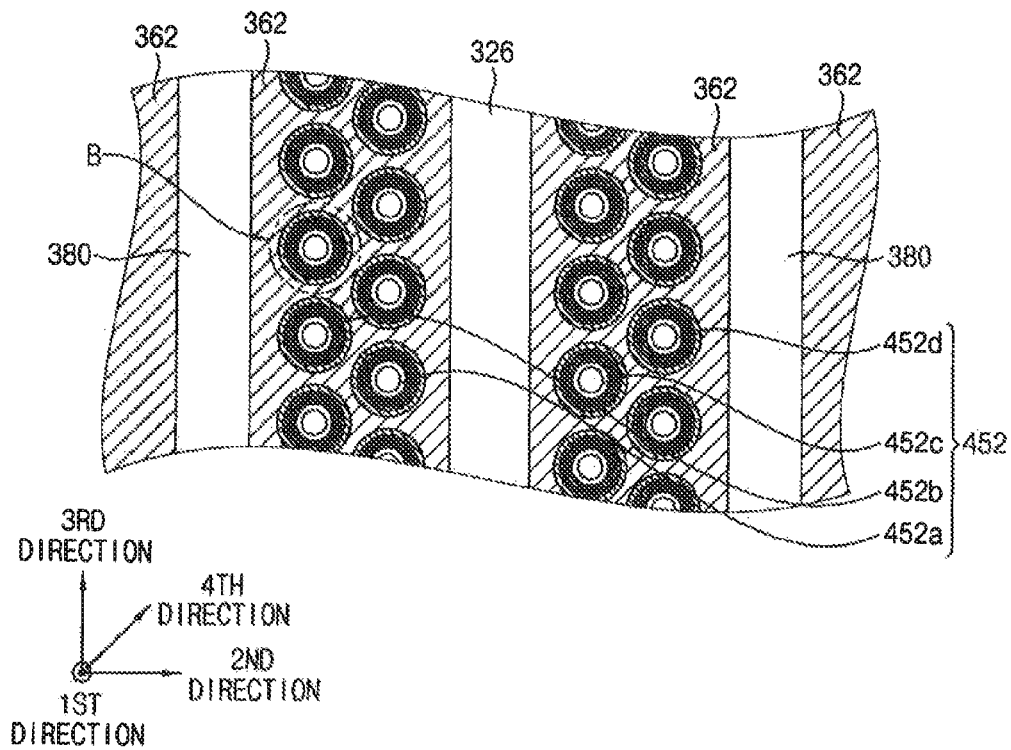
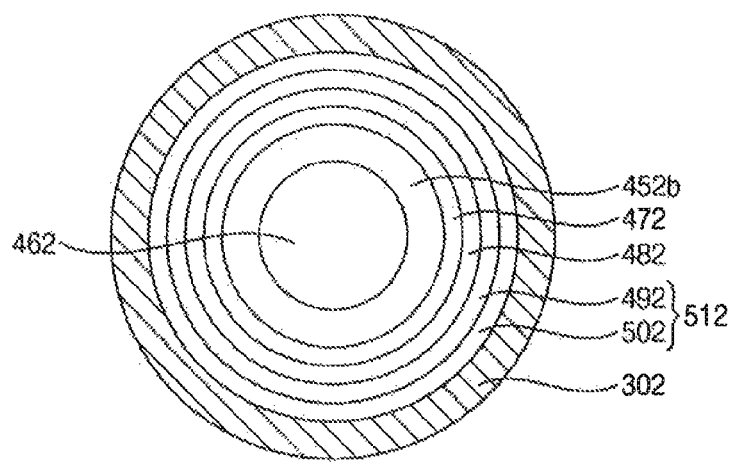

FIG. 89B
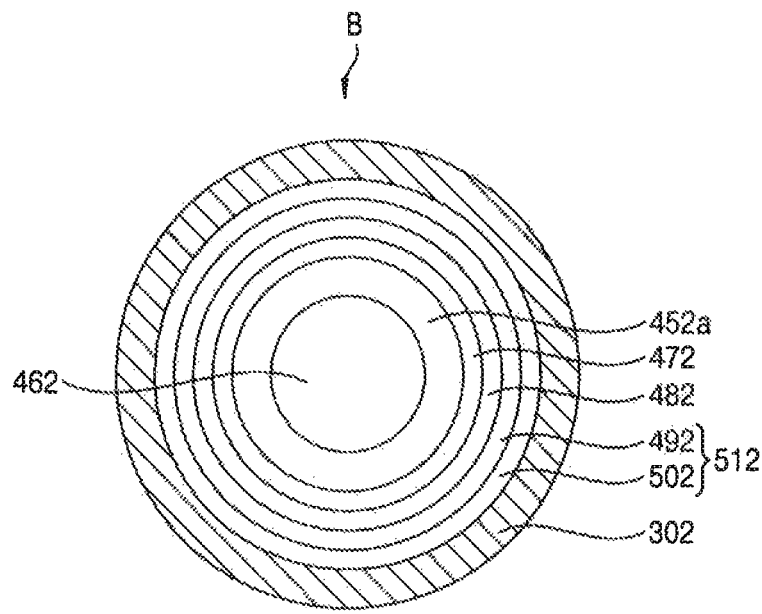
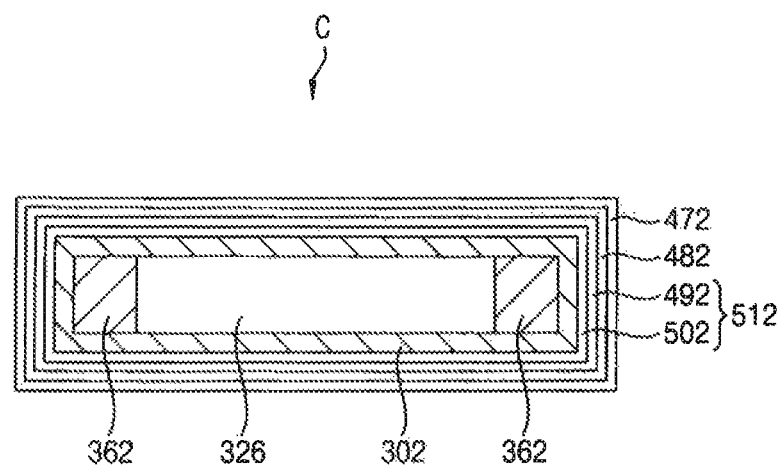

FIG. 91
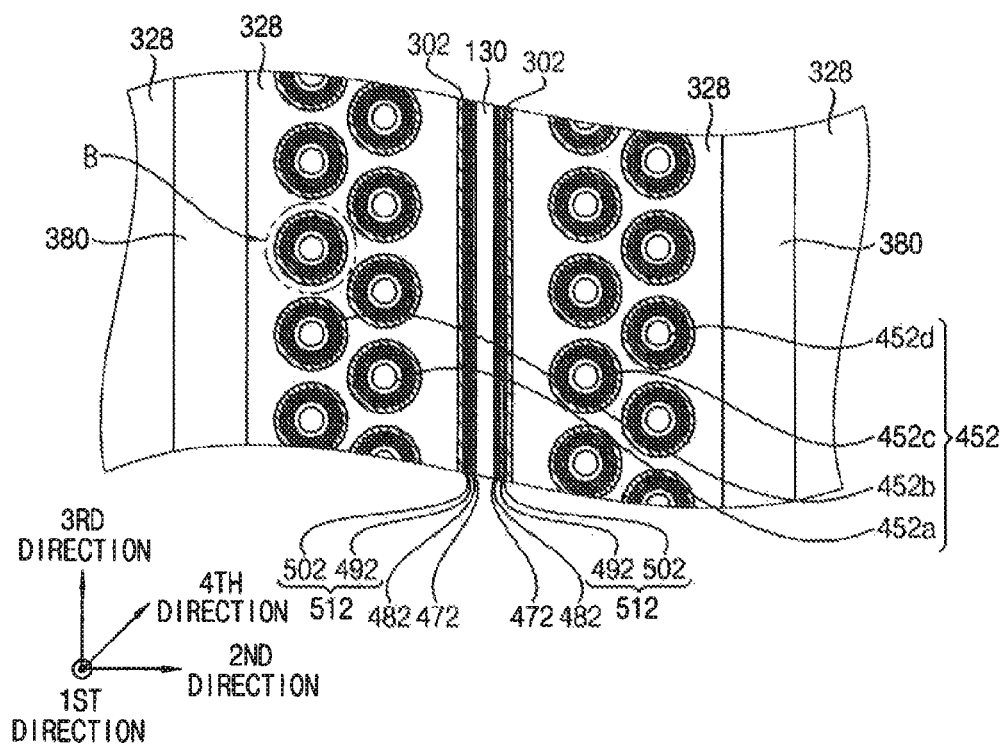
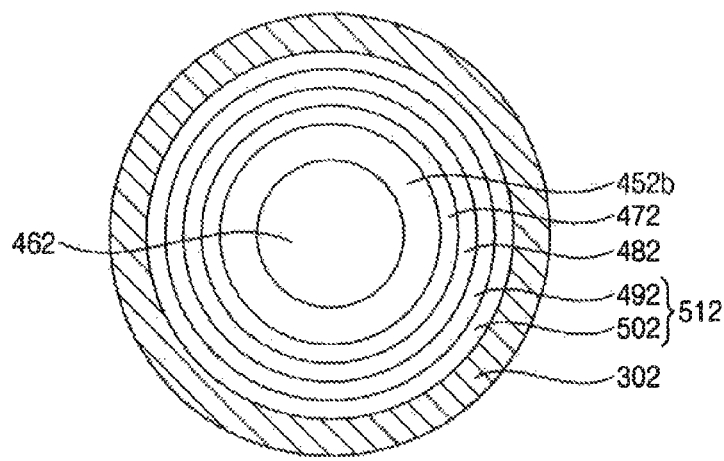

FIG. 93B
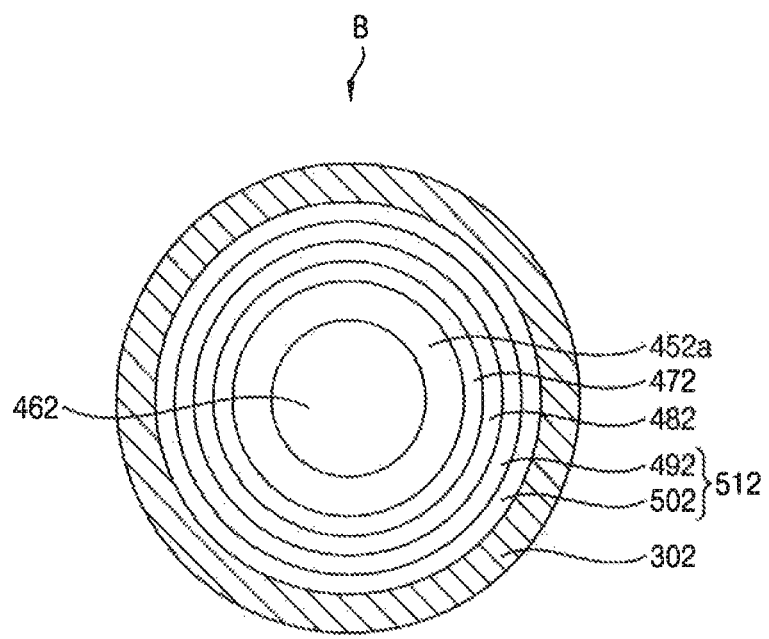
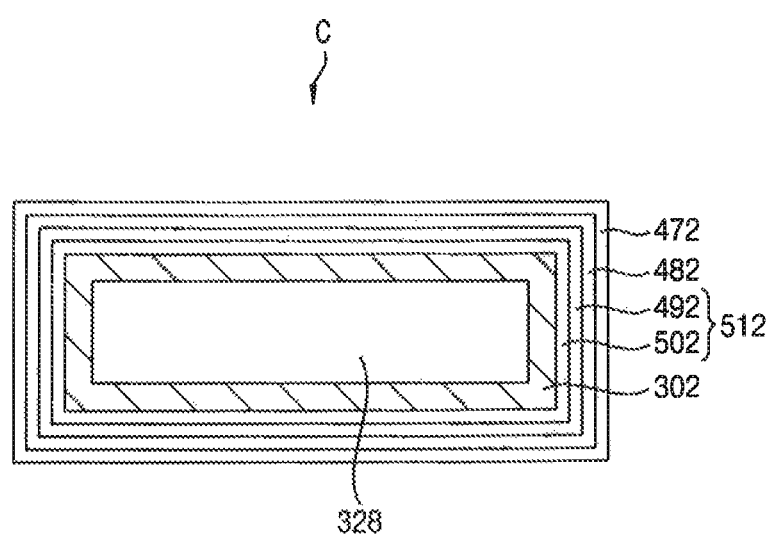

FIG. 95B
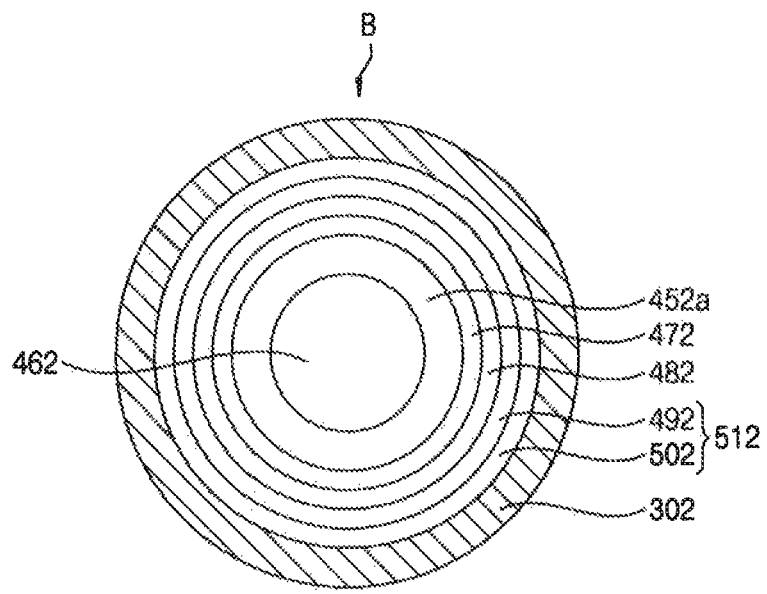
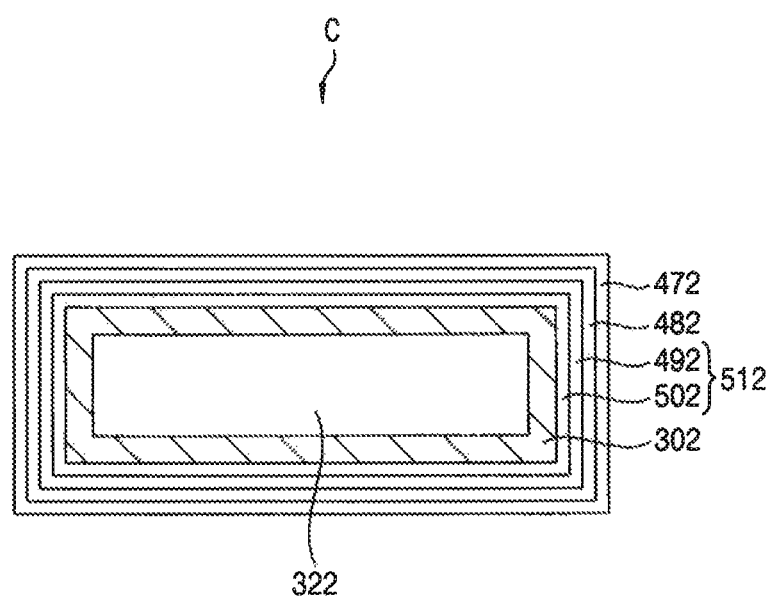

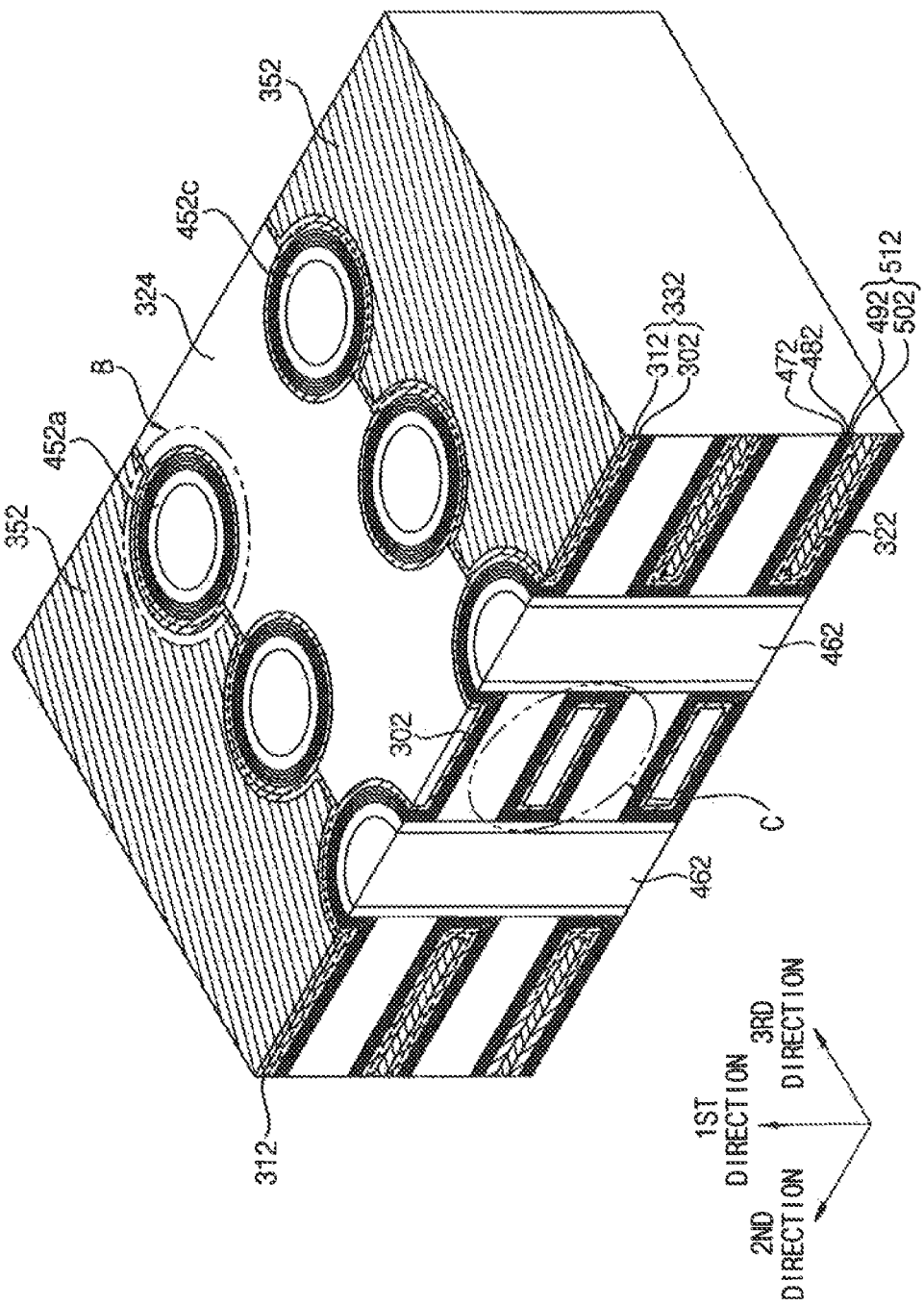

FIG. 96B
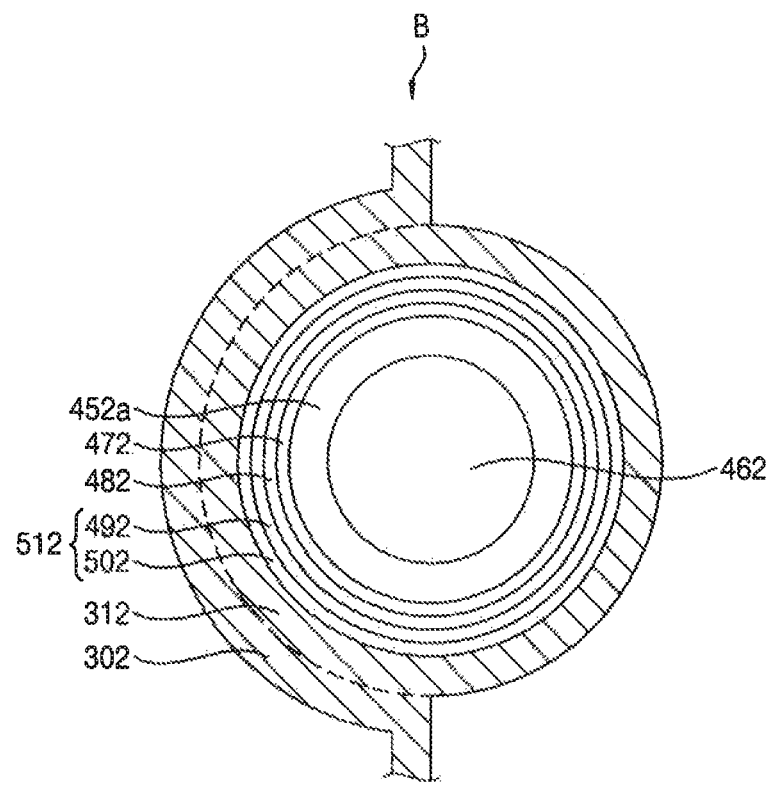
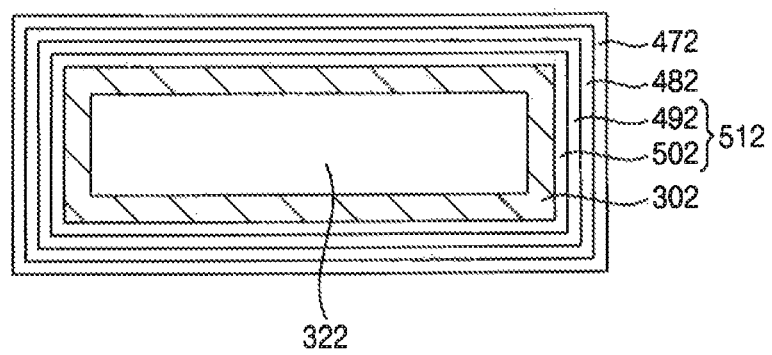

FIG. 97B
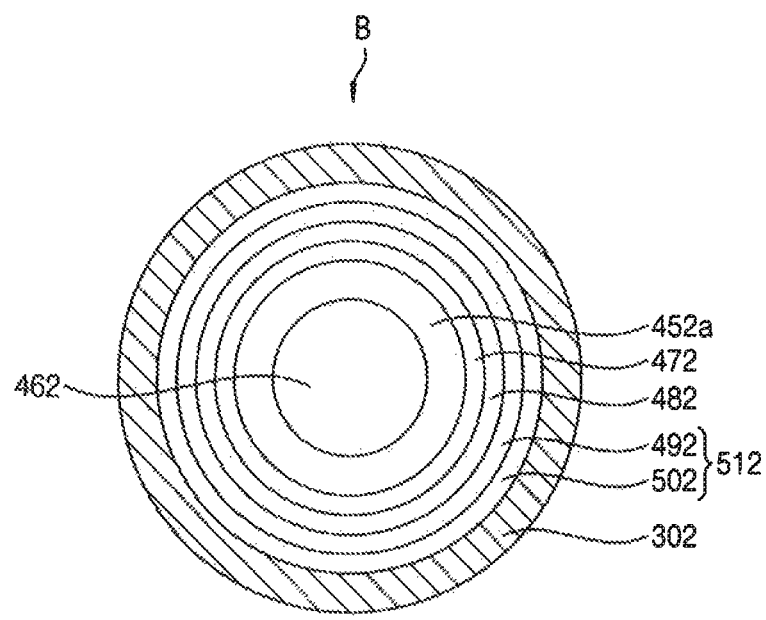
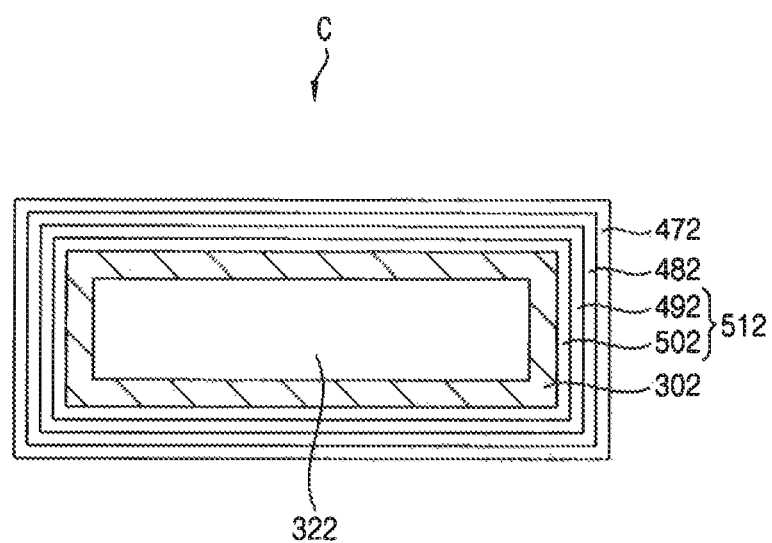

FIG. 98B
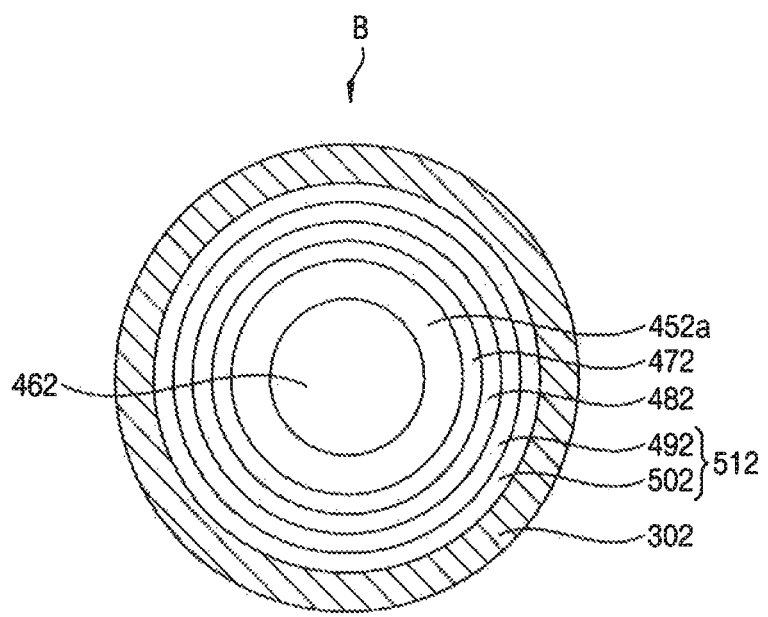
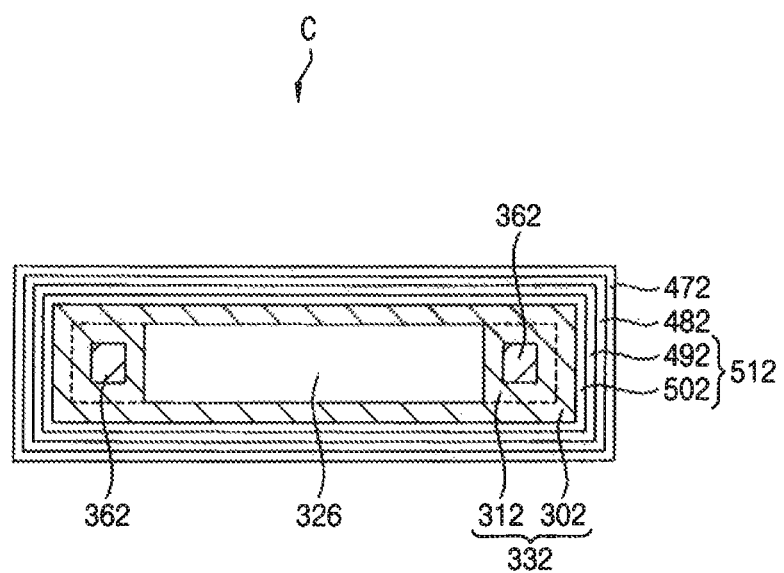

FIG. 99B
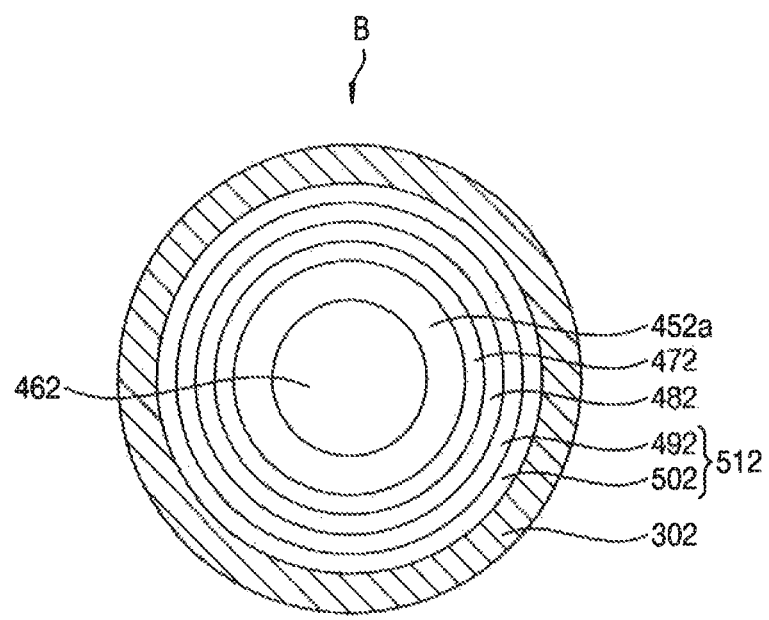
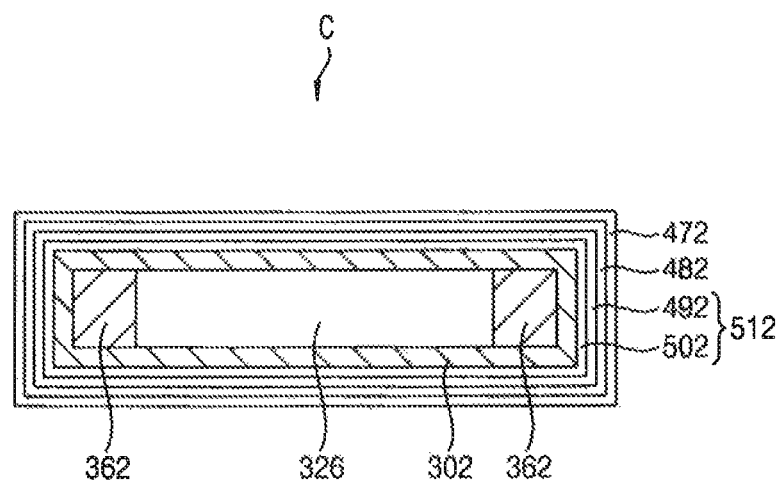

FIG. 100B
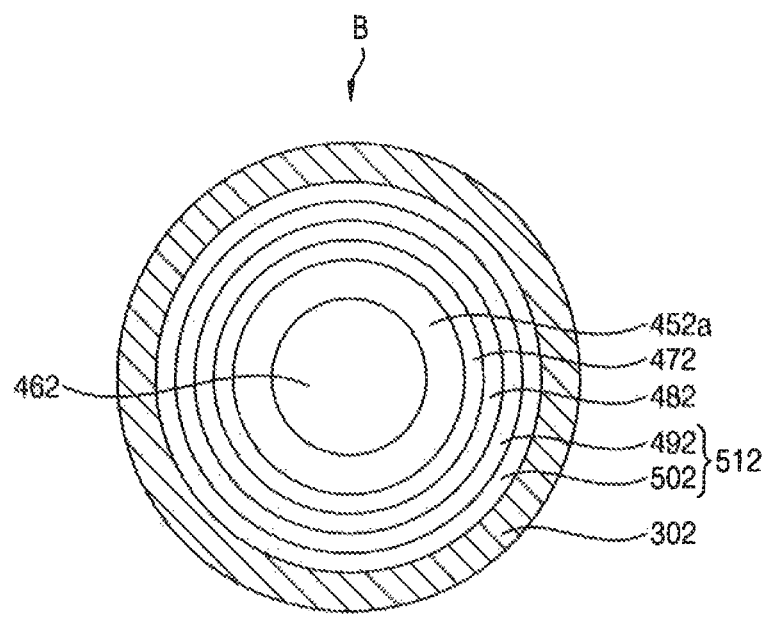
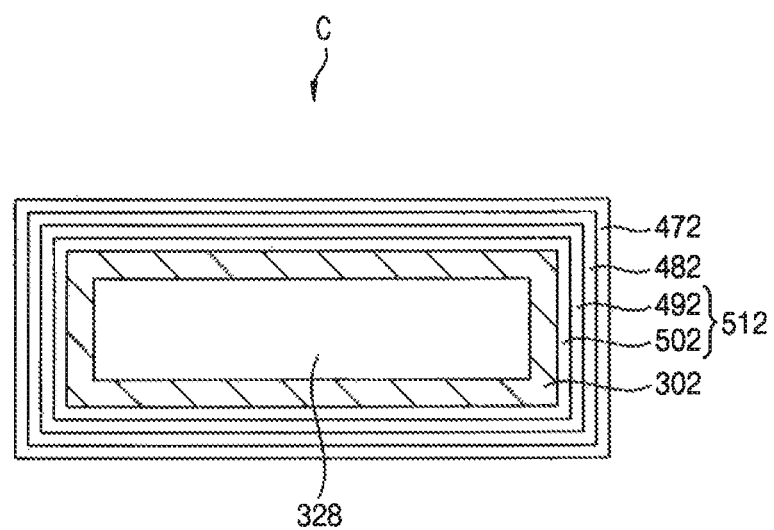

VERTICAL MEMORY DEVICES AND METHODS OF MANUFACTURING THE SAME

CROSS-REFERENCE TO RELATED APPLICATIONS

This application is a divisional of U.S. patent application Ser. No. 13/724,187 filed on Dec. 21, 2012 which claims priority under 35 U.S.C. §119 to Korean Patent Application No. 10-2012-0101471 filed in the Korean Intellectual Property Office on Sep. 13, 2012, the disclosures of which are incorporated by reference herein in their entireties.

TECHNICAL FIELD

The embodiments of the inventive concept relate to vertical memory devices, and methods of manufacturing same, and more particularly, to vertical memory devices including a conductive barrier and a filling layer in an area near a gate electrode.

DISCUSSION OF RELATED ART

Gate electrodes of vertical memory devices may include tungsten and be formed by a deposition process wherein fluorine is included in a source gas. In the deposition process, remaining fluorine gas may move through a moving path to damage adjacent layers, such as, for example, an oxide layer or an oxide-nitride-oxide (ONO) layer.

Accordingly, a need exists for devices and methods wherein damage to adjacent layers can be prevented during formation of gate electrodes, and wherein gate electrodes can be sufficiently formed.

SUMMARY

According to an embodiment of the inventive concept, a semiconductor device comprises a substrate, a plurality of insulating layers vertically stacked on the substrate, a plurality of channels arranged in vertical openings formed through at least some of the plurality of insulating layers, and a plurality of portions alternatingly positioned with the plurality of insulating layers in the vertical direction, wherein at least some of the portions are adjacent corresponding channels of the plurality of channels, wherein each of the portions includes a conductive barrier pattern formed on an inner wall of the portion, a filling layer pattern positioned in the portion on the conductive barrier pattern, and a gate electrode positioned in a remaining area of the portion not occupied by the conductive barrier or filling layer pattern.

The conductive barrier pattern may comprise a barrier layer including a conductive metal nitride, or a first barrier layer and a second barrier layer on the first barrier layer, wherein each of the first and second barrier layers comprises a conductive metal nitride. The conductive barrier pattern may be formed on top and bottom walls of each portion, and on at least one sidewall of each portion adjacent the corresponding channel of the plurality of channels.

The filling layer pattern may comprise polysilicon.

The gate electrode may include tungsten, and an edge of the gate electrode may contact an edge of the filling layer pattern. The conductive barrier pattern may be positioned between an edge of the gate electrode and an edge of the filling layer pattern. The filling layer pattern may include a void therein.

Each of the channels may include an insulation layer pattern, a charge storage layer pattern and a blocking layer pattern. At least some of the channels may be arranged in a zigzag configuration.

The semiconductor device may further comprise a division layer pattern formed between top portions of two lines of channels, wherein the two lines of channels are symmetrically positioned about the division layer pattern.

A semiconductor pattern may be positioned under each channel of the plurality of channels. Each channel may comprise a protrusion portion penetrating a top surface of a corresponding semiconductor pattern positioned under the channel.

Each portion of the plurality of portions alternatingly positioned with the plurality of insulating layers in the vertical direction may further include a blocking layer positioned under the conductive barrier pattern.

According to an embodiment of the inventive concept, a method for manufacturing a semiconductor device comprises alternately stacking a plurality of insulation layers and a plurality of sacrificial layers on a substrate, forming a plurality of holes through the plurality of insulation and sacrificial layers to the substrate, forming a semiconductor pattern in a bottom portion of each of the holes, depositing at least one insulating layer on sidewalls and on the semiconductor pattern in each of the plurality of holes, forming openings at a side of and spaced apart from each of the plurality holes, removing the sacrificial layers through the openings to form a plurality of open portions, depositing a barrier layer on an inner wall of each of the open portions, and forming a filling layer in each open portion on the barrier layer.

The barrier layer may be formed on top and bottom walls of each open portion, and on at least one sidewall of each open portion adjacent a corresponding hole. The method may further comprise forming a second barrier layer on a first barrier layer and on a remaining portion of the filling layer in the open portion.

The method may further comprise removing a portion of the filling layer from each open portion. The method may further comprise forming a gate electrode layer in a remaining area of the open portion not occupied by the barrier layer or the filling layer.

At least some of the holes may be arranged in a zigzag configuration.

The method may further comprise removing a portion of the at least one insulating layer on the semiconductor pattern and forming a recess in the semiconductor pattern corresponding to the removed portion of the at least one insulating layer. The method may also further comprise depositing a blocking layer on an inner wall of each of the open portions prior to depositing the barrier layer.

According to an embodiment of the inventive concept, a semiconductor device may comprise a gate stack including a plurality of gate structures stacked alternately with a plurality of insulating layers in a vertical direction on a substrate, and a plurality of channels positioned in openings vertically formed through the plurality of gate structures and the plurality of insulating layers, wherein each of the gate structures includes at least one conductive barrier layer comprising a conductive metal nitride formed on an inner sidewall of the gate structure, and a polysilicon filling pattern formed on the conductive barrier layer.

Each of the gate structures may further include a gate electrode positioned adjacent the polysilicon filling pattern, wherein the gate electrode is positioned in a remaining area of the gate structure not occupied by the conductive barrier layer or the polysilicon filling pattern.

The conductive barrier layer may be positioned between an edge of the gate electrode and an edge of the polysilicon filling pattern.

Each gate structure may further include a blocking layer positioned under the conductive barrier layer.

An information processing system may comprise a semiconductor memory device of any of the embodiments of the inventive concept, wherein the information processing system is one of a mobile device, a desktop computer, an application chipset, a camera image sensor, a camera image signal processor, and an input/output device.

A system for transmitting or receiving data, according to embodiments of the inventive concept, comprises a memory device of any of the embodiments of the inventive concept, and a processor in communication with the memory device. The system may comprise at least one of a mobile device, a desktop computer, an application chipset, a camera image sensor, a camera image signal processor, an input/output device, or a memory card.

A semiconductor memory card, according to embodiments of the inventive concept, comprises an interface part that interfaces with a host, and a controller that communicates with the interface part and a memory device via a bus, wherein the memory device is a memory device of any of the embodiments of the inventive concept.

A computer system, according to embodiments of the inventive concept, comprises a semiconductor device having a circuit layout manufactured by any of the methods of the embodiments of the inventive concept, wherein the computer system is one of a mobile device, a desktop computer, an application chipset, a camera image sensor, a camera image signal processor, and an input/output device.

A system for transmitting or receiving data, according to embodiments of the inventive concept, comprises a memory device for storing a program, and a processor in communication with the memory device, wherein the memory device comprises a circuit layout manufactured by any of the methods of the embodiments of the inventive concept.

The system may comprise at least one of a mobile device, a desktop computer, an application chipset, a camera image sensor, a camera image signal processor, an input/output device, or a memory card.

A semiconductor memory card, according to embodiments of the inventive concept, comprises an interface part that interfaces with a host, and a controller that communicates with the interface part and a memory device via a bus, wherein the memory device comprises a circuit layout manufactured by any of the methods of the embodiments of the inventive concept.

BRIEF DESCRIPTION OF THE DRAWINGS

Example embodiments will be more clearly understood from the following detailed description taken in conjunction with the accompanying drawings.

FIG. 1 is a perspective diagram illustrating a vertical memory device in accordance with example embodiments, FIG. 5 is a localized perspective diagram of the semiconductor device in FIG. 1;

FIGS. 8B and 12B are plan views illustrating methods of manufacturing the vertical memory device;

FIG. 17 illustrates a vertical memory device including a filling layer having a void therein in accordance with example embodiments;

FIGS. 24 and 25 are horizontal cross-sectional views of the semiconductor device in FIG. 23.

FIGS. 29 and 30 are horizontal cross-sectional views of the semiconductor device in FIG. 28, and FIG. 31 is a localized perspective diagram of the semiconductor device in FIG. 28;

FIGS. 34 and 35 are horizontal cross-sectional views of the semiconductor device in FIG. 33, and FIG. 36 is a localized perspective diagram of the semiconductor device in FIG. 33;

FIGS. 39 and 40 are horizontal cross-sectional views of the semiconductor device in FIG. 38, and FIG. 41 is a localized perspective diagram of the semiconductor device in FIG. 38;

FIGS. 44 and 45 are horizontal cross-sectional views of the semiconductor device in FIG. 43, and FIG. 46 is a localized perspective diagram of the semiconductor device in FIG. 43;

FIGS. 48 and 49 are horizontal cross-sectional views of the semiconductor device in FIG. 47, and FIG. 50 is a localized perspective diagram of the semiconductor device in FIG. 47;

FIGS. 52 to 58 are localized perspective diagrams illustrating semiconductor devices in accordance with example embodiments;

FIGS. 61 and 62 are horizontal cross-sectional views of the semiconductor device of FIG. 60, FIG. 63A is a localized perspective diagram of the semiconductor device of FIG. 60.

FIG. 73B shows enlarged views of portions B and C of FIG. 73A;

FIGS. 75 and 76 are horizontal cross-sectional views of the semiconductor device of FIG. 74, FIG. 77B shows enlarged views of portions B and C of FIG. 77A;

FIGS. 79 and 80 are horizontal cross-sectional views of the semiconductor device of FIG. 78, FIG. 81B shows enlarged views of portions B and C of FIG. 81A;

FIGS. 83 and 84 are horizontal cross-sectional views of the semiconductor device of FIG. 82, FIG. 85A is a localized perspective diagram of the semiconductor device of FIG. 82, and FIG. 85B shows enlarged views of portions B and C of FIG. 85A;

FIGS. 87 and 88 are horizontal cross-sectional views of the semiconductor device of FIG. 86, FIG. 89B shows enlarged views of portions B and C of FIG. 89A;

FIGS. 91 and 92 are horizontal cross-sectional views of the semiconductor device of FIG. 90, FIG. 93B shows enlarged views of portions B and C of FIG. 93A;

FIGS. 94A, 95A, 96A, 97A, 98A, 99A and 100A are localized perspective diagrams illustrating semiconductor devices in accordance with example embodiments, and FIGS. 94B, 95B, 96B, 97B, 98B, 99B and 100B show enlarged views of portions B and C of FIGS. 94A, 95A, 96A, 97A, 98A, 99A and 100A, respectively;

FIG. 101 is a vertical cross-sectional view illustrating a vertical memory device in accordance with example embodiments;

DETAILED DESCRIPTION

Figure 1:
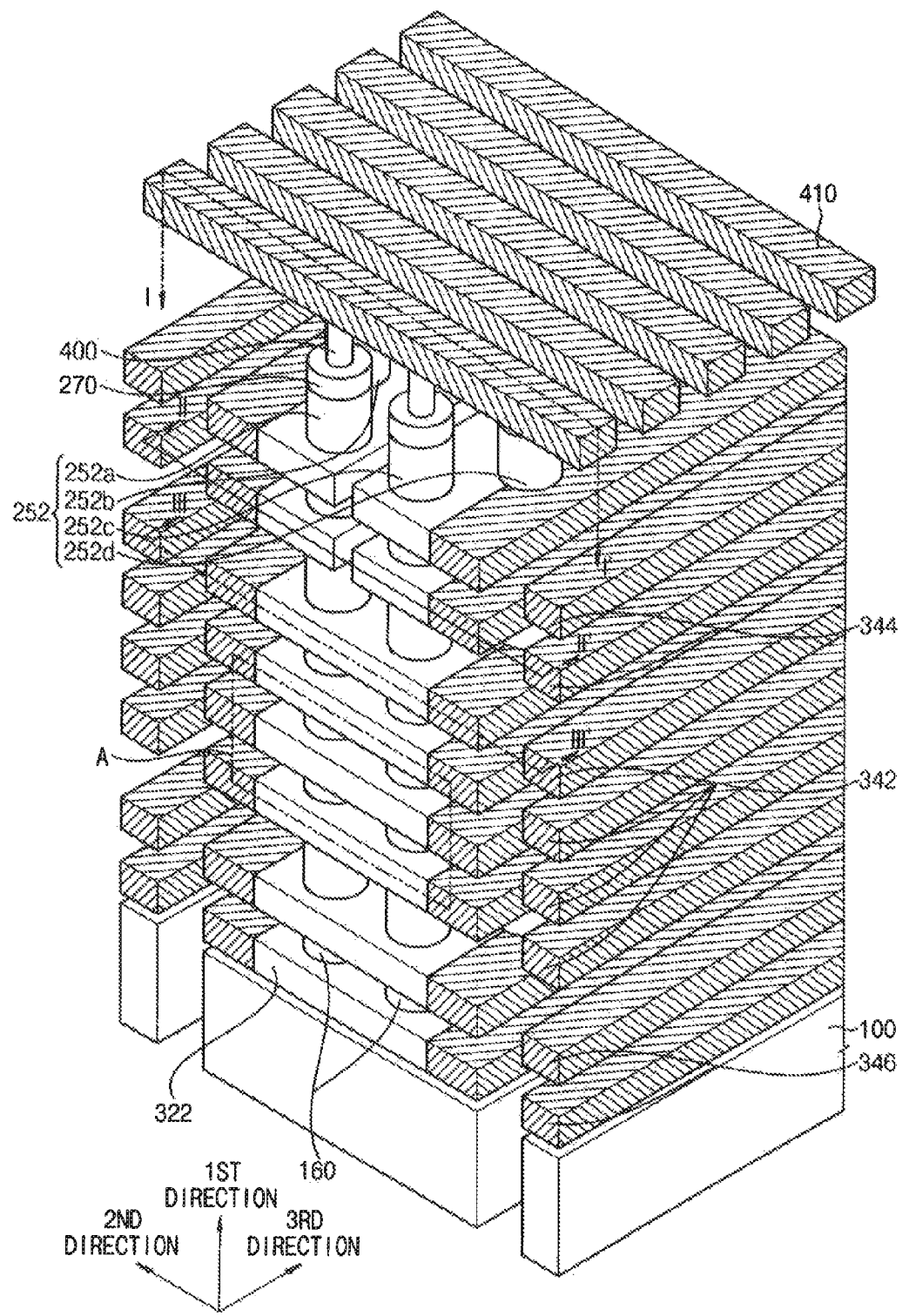
FIGS. 1-101 represent non-limiting, example embodiments as described herein.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions may be exaggerated for clarity. Like reference numerals in the drawings denote like elements.

It will be understood that when an element or layer is referred to as being "on," "connected to" or "coupled to" another element or layer, it can be directly on, connected or coupled to the other element or layer or intervening elements or layers may be present. As used herein, the term "and/or" includes any and all combinations of one or more of the associated listed items. Other words used to describe the relationship between elements or layers can be interpreted similarly to "on", "connected to" or "coupled to" (e.g., "between", and "adjacent".

As used herein, the singular forms "a," "an" and "the" are intended to include the plural forms as well, unless the context clearly indicates otherwise. Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, can occur. Thus, example embodiments should not be construed as limited to the particular shapes of regions illustrated herein but can include deviations in shapes that result, for example, from manufacturing. Thus, the regions illustrated in the figures are schematic in nature and their shapes are not intended to limit the scope of the present disclosure.

Figure 2:
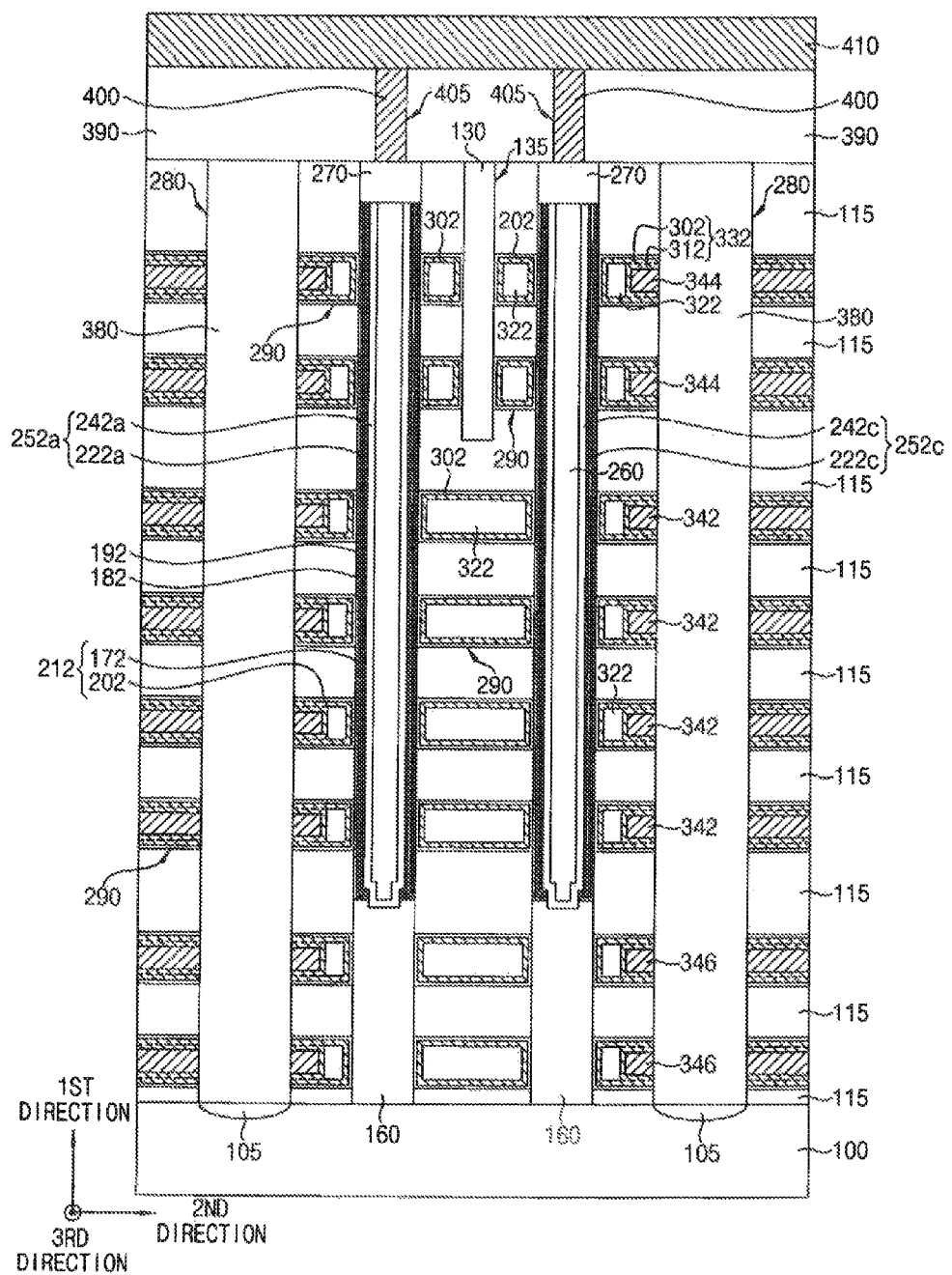
FIG. 2 is a vertical cross-sectional view of the semiconductor device in FIG. 1, FIGS. 3 and 4 are horizontal cross-sectional views of the semiconductor device in FIG. 1.
Figure 4:
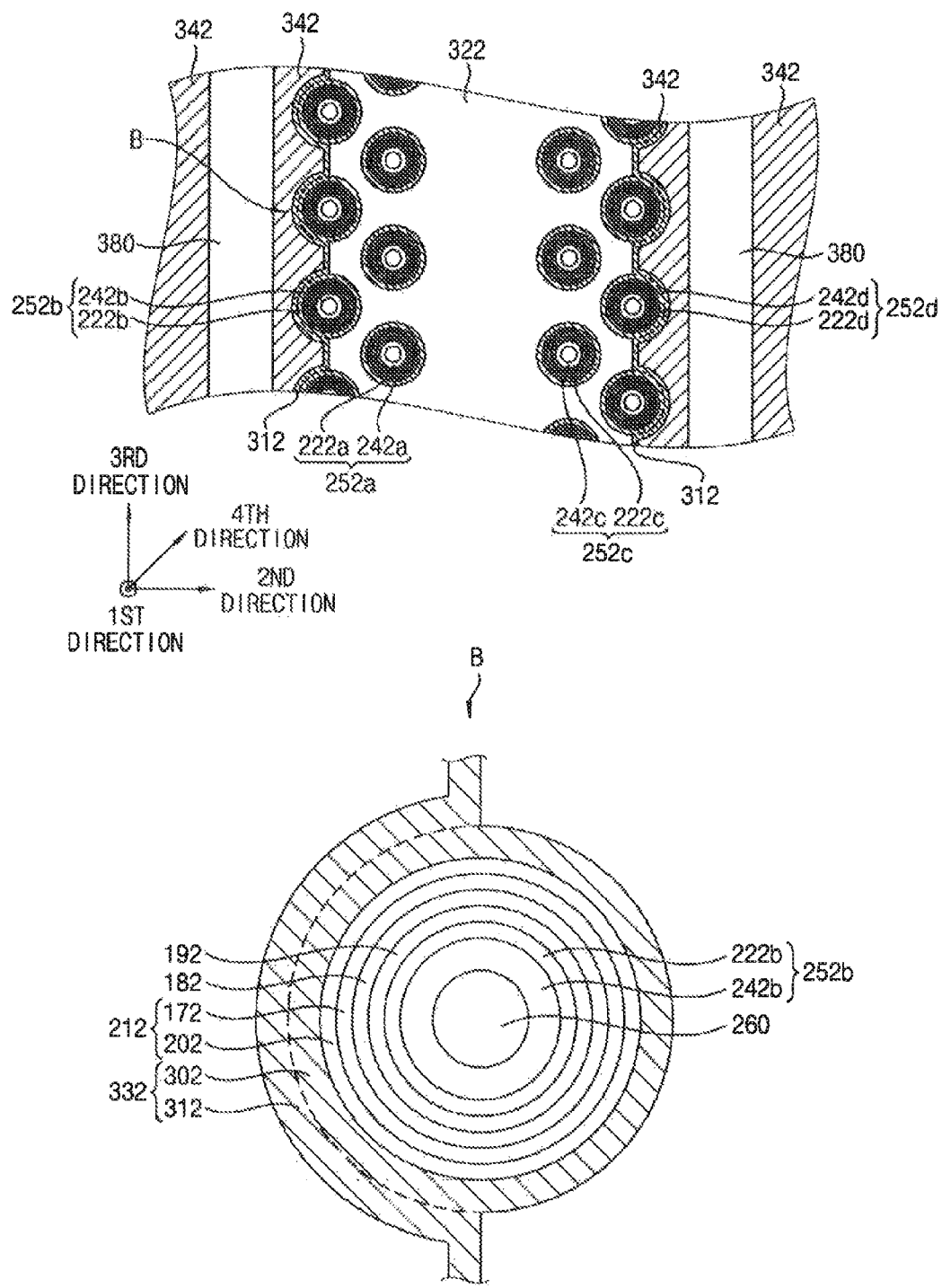

FIG. 1 is a perspective diagram illustrating a vertical memory device in accordance with example embodiments, FIG. 2 is a vertical cross-sectional view of the semiconductor device in FIG. 1, FIGS. 3 and 4 are horizontal cross-sectional views of the semiconductor device in FIG. 1, and FIG. 5 is a localized perspective diagram of the semiconductor device in FIG. 1. Particularly, FIG. 2 is a cross-sectional view of the semiconductor device in FIG. 1 cut along the line I-I', FIGS. 3 and 4 are cross-sectional views of the semiconductor device in FIG. 1 cut along the lines II-I' and III-III', respectively, and FIG. 5 is a localized perspective diagram of a region A of the semiconductor device in FIG. 1.

For the convenience of the explanation, FIG. 1 does not show all elements of the semiconductor device, but only shows some elements thereof, e.g., a substrate, a semiconductor pattern, a filling layer pattern, a gate electrode, a pad, a bit line contact, and a bit line. In figures in this specification, a direction substantially perpendicular to a top surface of the substrate is referred to as a first direction, and two directions substantially parallel to the top surface of the substrate and substantially perpendicular to each other are referred to as a second direction and a third direction. Additionally, a direction indicated by an arrow in the figures and a reverse direction thereto are considered as the same direction.

Referring to FIGS. 1 to 5, the vertical memory device includes a plurality of channels 252 each of which extend in the first direction on a substrate, a first tunnel insulation layer pattern 192, a first charge storage layer pattern 182 and a first blocking layer pattern 172 sequentially stacked on an outer sidewall of each channel 252, and a second blocking layer pattern 202 and a first barrier layer pattern 302 that are sequentially stacked on and surround a portion of the outer sidewall of each channel 252. Additionally, the vertical memory device includes a first filling layer pattern 322 that is formed on a sidewall of the first barrier layer pattern 302 and surrounds the portion of the outer sidewall of each channel 252, a plurality of first gate electrodes 342, 344 and 346 that are formed on an outer sidewall of the first filling layer pattern 322 and at least partially cover outer sidewalls of some channels 252, and a second barrier layer pattern 312 that is formed between each first gate electrode 342, 344 and 346 and the first filling layer pattern 322 and between each first gate electrode 342, 344 and 346 and the first barrier layer pattern 302. The vertical memory device further includes a common source line (CSL) 105 and a bit line 410.

The substrate 100 can include a semiconductor material, e.g., silicon, germanium, etc.

In accordance with an embodiment of the inventive concept, each channel 252 includes a first channel layer pattern 222a, 222b, 222c and 222d extending in the first direction, and a second channel layer pattern 242a, 242b, 242c and 242d extending in the first direction on the first channel layer pattern 222a, 222b, 222c and 222d. In example embodiments, the first channel layer pattern 222a, 222b, 222c and 222d can have a cup shape in which a center bottom portion is open, and the second channel layer pattern 242a, 242b, 242c and 242d can have a cup shape. Particularly, the second channel layer pattern 242a, 242b, 242c and 242d is formed on an inner sidewall and on a bottom of the first channel layer pattern 222a, 222b, 222c and 222d, covers the open center bottom portion of the first channel layer pattern 222a, 222b, 222c and 222d and extends in the first direction toward the top surface of the substrate 100. The second channel layer pattern 242a, 242b, 242c and 242d includes a protrusion portion below the first channel layer pattern 222a, 222b, 222c and 222d.

In accordance with an embodiment of the inventive concept, a space defined by an inner wall of the second channel layer pattern 242a, 242b, 242c and 242d is filled with a second insulation layer pattern 260. The second insulation layer pattern 260 can include an insulating material, e.g., silicon oxide or silicon nitride. Alternatively, the second channel layer pattern 242a, 242b, 242c and 242d can have a pillar shape, and thus the second insulation layer pattern 260 would not be formed.

In example embodiments, the first and second channel layer patterns 222a, 222b, 222c, 222d, 242a, 242b, 242c and 242d can include doped or undoped polysilicon or single crystalline silicon.

In example embodiments, a plurality of channels 252 are formed in both of the second and third directions, and thus a channel array is defined. In example embodiments, the channel array includes a first channel column including a plurality of first channels 252a arranged in the third direction, and a second channel column including a plurality of second channels 252b arranged in the third direction and being spaced apart from the first channel column at a given distance. The first channels 252a can be positioned in a fourth direction, which can be an acute angle to the second or third direction, from the second channels 252b. Accordingly, the first and second channels 252a and 252b can be arranged in a zigzag pattern with respect to the third direction, and, as a result, more channels can be arranged in a given area.

Additionally, in accordance with an embodiment of the inventive concept, the channel array includes third and fourth channel columns that are spaced apart from the first and second channel columns at a given distance. In example embodiments, the third and fourth channel columns are arranged symmetrically from the first and second channel columns, respectively, with respect to an imaginary face defined by the first and third directions, e.g., an elongated face of a division layer pattern 130 along the first direction, and include a plurality of third and fourth channels 252c and 252d, respectively. As a result, a distance between the first and third channel columns is shorter than a distance between the second and fourth channel columns.

The first to fourth channel columns are referred to as a channel set, and a plurality of the channel sets can be repeatedly arranged in the second direction to form the channel array.

In accordance with an embodiment of the inventive concept, each of the first tunnel insulation layer pattern 192, the first charge storage layer pattern 182 and the first blocking layer pattern 172 that can be sequentially stacked on and surround the outer sidewalls of each channel 252 have a cup shape of which a center bottom portion is open corresponding to the shape of the first channel layer pattern 222. Particularly, in accordance with an embodiment of the inventive concept, the first tunnel insulation layer pattern 192, the first charge storage layer pattern 182 and the first blocking layer pattern 172 surround an outer sidewall and a bottom of the first channel layer pattern 222, and further surround a portion of an outer sidewall of the protrusion portion of the second channel layer pattern 242.

In example embodiments, the first tunnel insulation layer pattern 192 can include an oxide, e.g., silicon oxide, the first charge storage layer pattern 182 can include a nitride, e.g., silicon nitride, and the first blocking layer pattern 172 can include an oxide, e.g., silicon oxide.

Each channel 252, the first tunnel insulation layer pattern 192, the first charge storage layer pattern 182 and the first blocking layer pattern 172 surrounding each channel 252, and the second insulation layer pattern 260 define a first structure, and a semiconductor pattern 160 making contact with a top surface of the substrate 100 can be formed beneath the first structure. Due to the second channel layer pattern 242a, 242b, 242c and 242d having the protrusion portion at a bottom thereof, the semiconductor pattern 160 has a corresponding concave portion at a top portion of the semiconductor pattern 160, which receives the protrusion portion. In example embodiments, the semiconductor pattern 160 can include doped or undoped polysilicon, single crystalline polysilicon, doped or undoped polygermanium or single crystalline germanium.

Additionally, in accordance with an embodiment of the inventive concept, a pad 270 is formed on the first structure. In example embodiments, the pad 270 can include doped or undoped polysilicon or single crystalline silicon.

The first structure, the semiconductor pattern 160 and the pad 270 define a second structure, and a plurality of second structures are formed according to the array of the channels 252 included in the first structure. Each second structure can be surrounded by a plurality of first insulation layer patterns 115 that are arranged at a plurality of levels in the first direction. In accordance with an embodiment of the inventive concept, the first insulation layer patterns 115 are divided into a plurality of first insulation layer pattern sets by a first opening 280 extending in the third direction and penetrating the first insulation layer patterns 115. In example embodiments, the first opening 280 is formed between the channel sets, and thus the first insulation layer pattern sets can be formed in accordance with the channel sets.

A space between the first insulation layer patterns 115 at each level can be defined as a gap 290.

In accordance with an embodiment of the inventive concept, the second blocking layer pattern 202 surrounds a sidewall of the second structure exposed by the gap 290, that is, the second blocking layer pattern 202 surrounds an outer sidewall of the first blocking layer pattern 172. As a result, portions of the outer sidewalls of the channels 252 included in the second structure are surrounded by the second blocking layer pattern 202. The second blocking layer pattern 202 can be further formed on an inner wall of the gap 290, and thus top and bottom end portions of the second blocking layer pattern 202 can extend in both of the second and third directions. The second blocking layer pattern 202 can include, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide.

The second blocking layer pattern 202 together with the first blocking layer pattern 172 may form a first blocking layer pattern structure 212.

In accordance with an embodiment of the inventive concept, the first barrier layer pattern 302 is formed on and covers the second blocking layer pattern 202 in the gap 290. As a result, the first barrier layer pattern 302 has a shape similar to that of the second blocking layer pattern 202. That is, in accordance with an embodiment of the inventive concept, the first barrier layer pattern 302 surrounds a sidewall of the second structure exposed by the gap 290, and top and bottom end portions of the first barrier layer pattern 302 extend in both of the second and third directions. The first barrier layer pattern 302 can include a conductive metal nitride, e.g., titanium nitride, tantalum nitride, and the like.

In accordance with an embodiment of the inventive concept, referring to FIG. 2, the first filling layer pattern 322 is formed on a sidewall of the first barrier layer pattern 302 and fills a central portion of the gaps 290 between the first openings 280. In example embodiments, the first filling layer pattern 322 extends in the third direction.

Referring to FIG. 2, in example embodiments, the first filling layer pattern 322 surrounds sidewalls of the second structures including the first and third channels 252a and 252c exposed by the gaps 290, and partially covers sidewalls of the second structures including the second and fourth channels 252b and 252d exposed by the gaps 290. In other words, the first filling layer pattern 322 fills the gaps 290 from a central portion to outside portions of the first and third channels 252a and 252c along the second direction, and further partially covers sidewalls of the second and fourth channels 252b and 252d.

Alternatively, the first filling layer pattern 322 fill the gap 290 from a central portion to outside portions of the second and fourth channels 252b and 252d.

The first filling layer pattern 322 includes doped or undoped polysilicon, a nitride such as silicon nitride or an oxide such as silicon oxide. Alternatively, the first filling layer pattern 322 includes a metal except for, e.g., tungsten, that may be deposited using a source gas including fluorine. In an example embodiment, the first filling layer pattern 322 includes a metal nitride, e.g., titanium nitride, tantalum nitride, etc., and in this case the first filling layer pattern 322 is substantially merged into the first barrier layer pattern 302.

In accordance with an embodiment of the inventive concept, the first gate electrodes 342, 344 and 346 are formed on a sidewall of the first filling layer pattern 322 and fill an edge portion of the gap 290 between the first openings 280. In example embodiments, the first gate electrodes 342, 344 and 346 extend in the third direction.

In accordance with an embodiment of the inventive concept, the first gate electrodes 342, 344 and 346 fill a remaining portion of the gap 290 that is not filled with the first filling layer pattern 322. Thus, the first gate electrodes 342, 344 and 346 partially cover the second structures including the second and fourth channels 252b and 252d.

The first gate electrodes 342, 344 and 346 include a ground selection line (GSL) 346, a word line 342 and a string selection line (SSL) 344 that are spaced apart from each other along the first direction.

Each of the GSL 346, the word line 342 and the SSL 344 can be at a single level (e.g., one of each, each at a different height) or more than one level, and the first insulation layer pattern 115 is interposed between the gate electrodes 342, 344 and 346 at different levels. In an example embodiment, the GSL 346 and the SSL 344 are at 2 levels (e.g., two of each at different heights), respectively, and the word line 342 can be at 4 levels between the GSL 346 and the SSL 344. However, the GSL 346 and the SSL 344 may be at one level, and the word line 342 may formed at 2, 8 or 16 levels.

In example embodiments, the first gate electrodes 342, 344 and 346 include, for example, a metal and/or a metal nitride. For example, the first gate electrodes 342, 344 and 346 include a metal and/or a metal nitride with low electrical resistance (e.g., tungsten, tungsten nitride, titanium, titanium nitride, tantalum, tantalum nitride and/or platinum).

The second barrier layer pattern 312 covers a sidewall and top and bottom surfaces of each first gate electrode 342, 344 and 346, and contacts the first barrier layer pattern 302. The second barrier layer pattern 312 includes a conductive metal nitride, e.g., titanium nitride, tantalum nitride, and the like. Thus, the first gate electrodes 342, 344 and 346 are electrically connected to the first and second barrier layer patterns 302 and 312.

The first and second barrier layer patterns 302 and 312 form a barrier layer pattern structure 332. In example embodiments, the second barrier layer pattern 312 includes a material substantially the same as that of the first barrier layer pattern 302, and thus the barrier layer pattern structure 332 can have a single layer structure.

The first tunnel insulation layer pattern 192, the first charge storage layer pattern 182, the first blocking layer pattern structure 212, the first filling layer pattern 322 and the first gate electrodes 342, 344 and 346 define a gate structure. In example embodiments, a plurality of gate structures are formed in the first direction. In the gate structure, the barrier layer pattern structure 332, the first filling layer pattern 322 and the first gate electrodes 342, 344 and 346 define a gate electrode structure.

The gate structures adjacent to the first and second channels 252a and 252b and those adjacent to the third and fourth channels 252c and 252d can be divided by the division layer pattern 130 extending in the third direction and penetrating a portion of the first insulation layer patterns 115.

More specifically, in accordance with an embodiment of the inventive concept, the division layer pattern 130 is formed through the gate structures including the SSL 344 and the first insulation layer patterns 115 on the gate structures including the SSL 344, and further through a portion of the insulation layer pattern 115 under the gate structures including the SSL 344. As a result, the SSL adjacent to the first and second channels 252a and 252b may be electrically insulated from the SSL adjacent to the third and fourth channels 252c and 252d. In accordance with an embodiment of the inventive concept, the second blocking layer pattern 202 and the first barrier layer pattern 302 extending in the third direction are sequentially stacked on both sidewalls of the division layer pattern 130. The second blocking layer pattern 202 and the first barrier layer pattern 302 are also formed on the inner wall of the gap 290, and top and bottom end portions of the second blocking layer pattern 202 and the first barrier layer pattern 302 extend in the second direction.

The division layer pattern 130 can include an oxide, e.g., silicon oxide.

The first opening 280 is filled with a third insulation layer pattern 380. The third insulation layer pattern 380 can include an oxide, e.g., silicon oxide. An impurity region 105 serving as a common source line (CSL) and extending in the third direction is formed at an upper portion of the substrate 100 beneath the third insulation layer pattern 380. In example embodiments, the impurity region 105 can include n-type impurities, e.g., phosphorus, arsenic, and the like. For example, a cobalt silicide pattern (not shown) or nickel silicide pattern (not shown) may be further formed on the impurity region 105.

The bit line 410 is electrically connected to the pad 270 via a bit line contact 400, and, as a result, is electrically connected to the channels 252. The bit line 410 can include a metal, a metal nitride, doped polysilicon, and the like. In example embodiments, the bit line 410 extends in the second direction, and a plurality of bit lines 410 are formed in the third direction.

The bit line contact 400 fills a second opening 405 through a fourth insulation layer 390, and contacts a top surface of the pad 270. The bit line contact 400 can include a metal, a metal nitride, doped polysilicon, and the like.

The fourth insulation layer 390 is formed on the first and third insulation layer patterns 115 and 380, the pad 270 and the division layer pattern 130. In example embodiments, the fourth insulation layer 390 can include an insulating material, e.g., oxide.

As illustrated above, in accordance with an embodiment of the inventive concept, the first tunnel insulation layer pattern 192, the first charge storage layer pattern 182, the first blocking layer pattern structure 212, the first barrier layer pattern 302, the first filling layer pattern 322, the second barrier layer pattern 312 and the first gate electrodes 342, 344 and 346 are sequentially formed on an outer sidewall of each of the first and third channels 252a and 252c of the vertical memory device toward the edge portion of the gap 290 in the second direction. Additionally, the first tunnel insulation layer pattern 192, the first charge storage layer pattern 182, the first blocking layer pattern structure 212, the first barrier layer pattern 302 and the first filling layer pattern 322 are sequentially formed on an outer sidewall of each of the first and third channels 252a and 252c of the vertical memory device toward the central portion of the gap 290 in the second direction.

The first tunnel insulation layer pattern 192, the first charge storage layer pattern 182, the first blocking layer pattern structure 212, the first barrier layer pattern 302, the second barrier layer pattern 312 and the first gate electrodes 342, 344 and 346 are sequentially formed on an outer sidewall of each of the second and fourth channels 252b and 252d of the vertical memory device toward the edge portion of the gap 290 in the second direction. Additionally, the first tunnel insulation layer pattern 192, the first charge storage layer pattern 182, the first blocking layer pattern structure 212, the first barrier layer pattern 302 and the first filling layer pattern 322 are sequentially formed on an outer sidewall of each of the second and fourth channels 252b and 252d of the vertical memory device toward the central portion of the gap 290 in the second direction.

The vertical memory device including the first gate electrodes 342, 344 and 346 and the first filling layer pattern 322 in accordance with example embodiments can have a space serving as a moving path of fluorine gas included in a source gas for the deposition of tungsten used for forming the first gate electrodes 342, 344 and 346 that is smaller than that of a vertical memory device including only a gate electrode and not a filling layer pattern. Thus, due to the presence of the filling layer pattern, damage to the layer structures of the vertical memory device, e.g., the first tunnel insulation layer pattern 192, the first charge storage layer pattern 182 and the first blocking layer pattern structure 212, due to the fluorine gas can be reduced or prevented, and thus the vertical memory device may have less or no defects and good electrical characteristics. Further, even when the first gate electrodes 342, 344 and 346 include a metal other than tungsten, a space serving as a moving path of another source gas that does not include fluorine gas can be relatively small, and thus damage to the layer structures from the source gas can be reduced or prevented.

In accordance with an embodiment of the inventive concept, the conductive barrier layer pattern structure 332 surrounding the first filling layer pattern 322 is formed on an outer sidewall of the first blocking layer pattern structure 212, and is electrically connected to the first gate electrodes 342, 344 and 346. Thus, even though the first filling layer pattern 322 is formed between the first gate electrodes 342, 344 and 346 and the first blocking layer pattern structure 212 so that the first gate electrodes 342, 344 and 346 do not make direct contact with the first blocking layer pattern structure 212, the first gate electrodes 342, 344 and 346 together with the conductive barrier layer pattern structure 332 can serve as gate electrodes.

Figure 7:
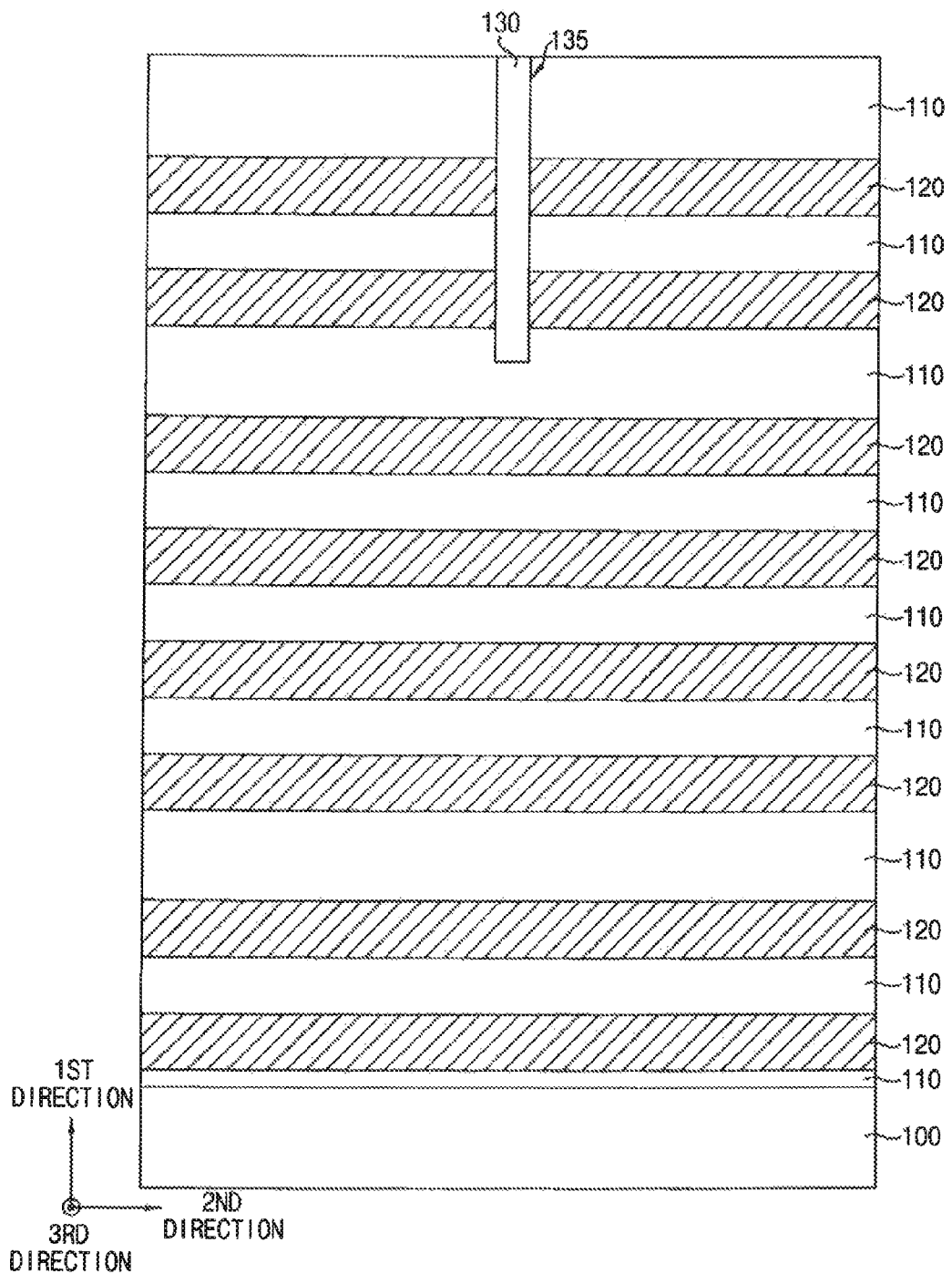
Figure 8A:
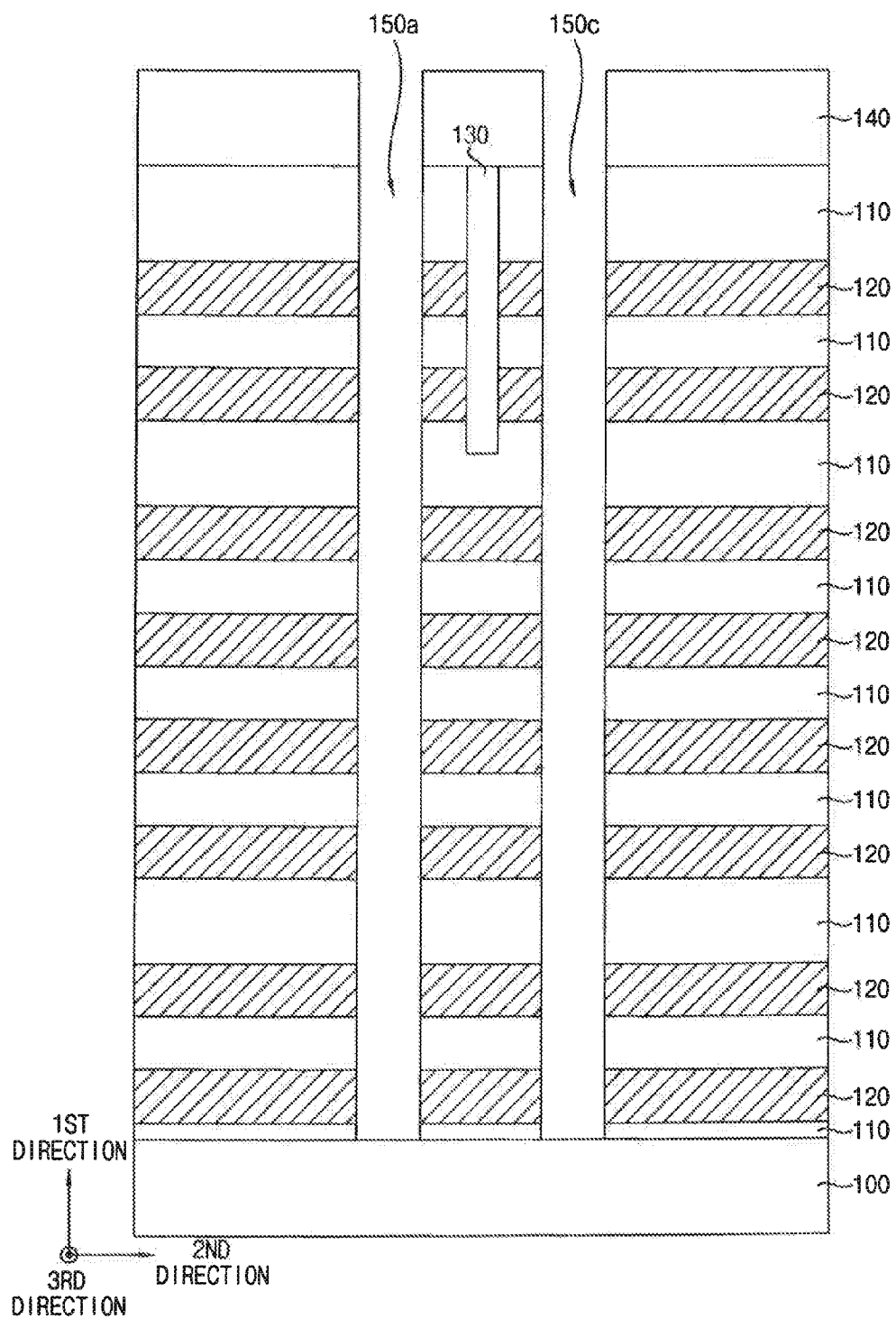
Figure 8B:
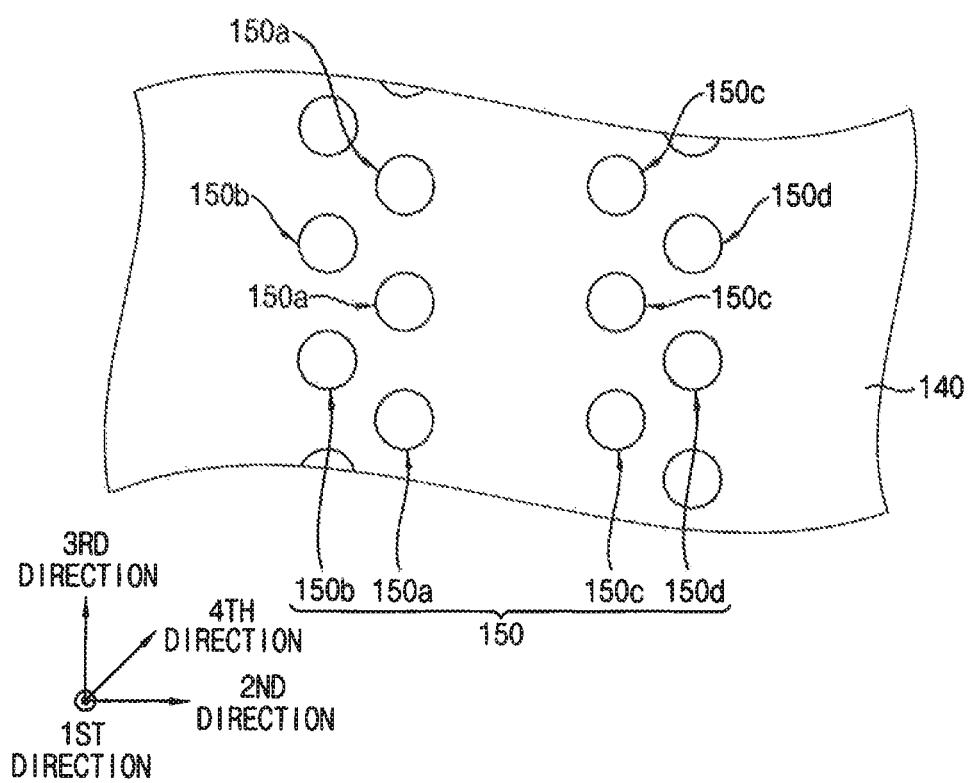
Figure 11:
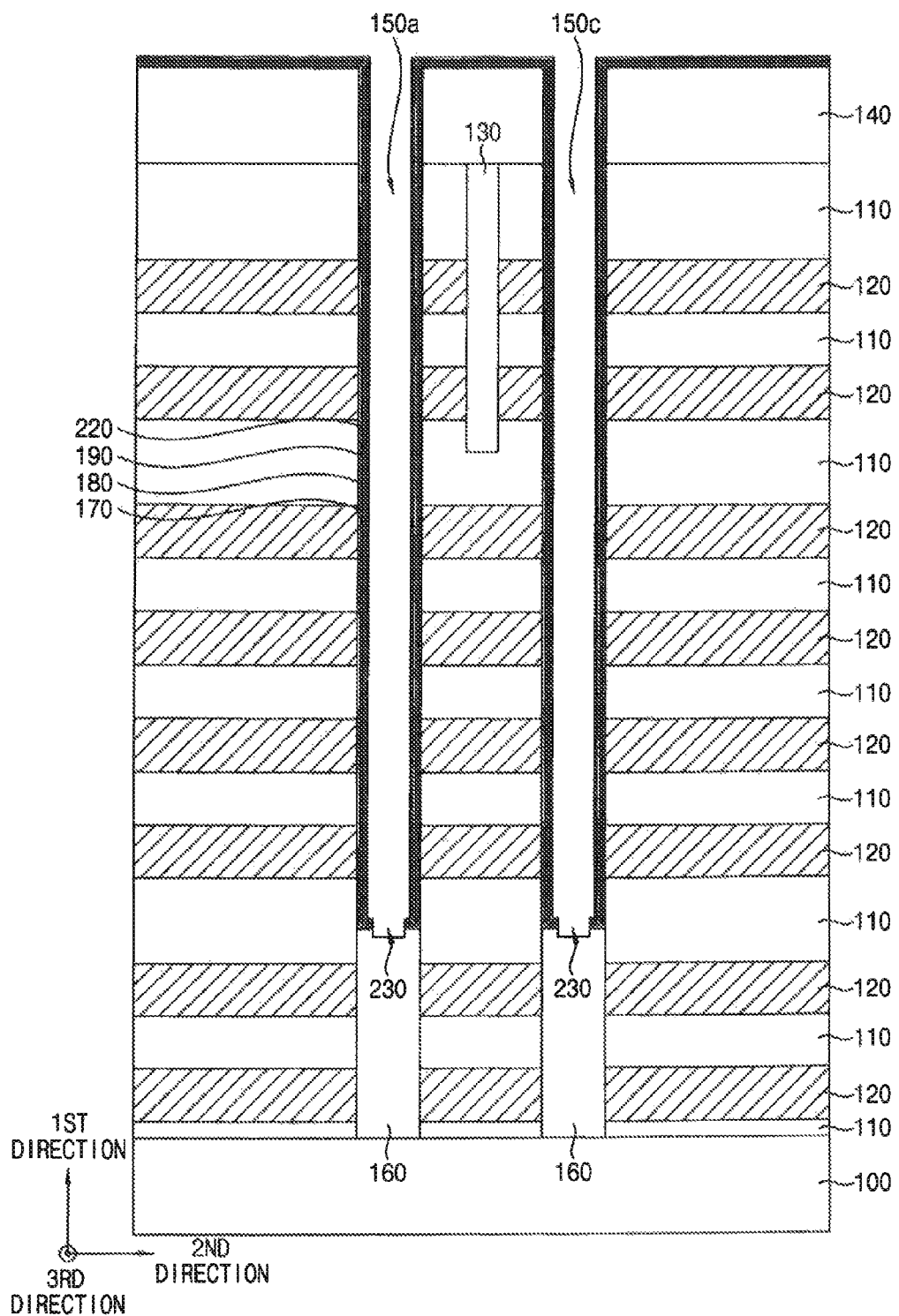
Figure 12A:
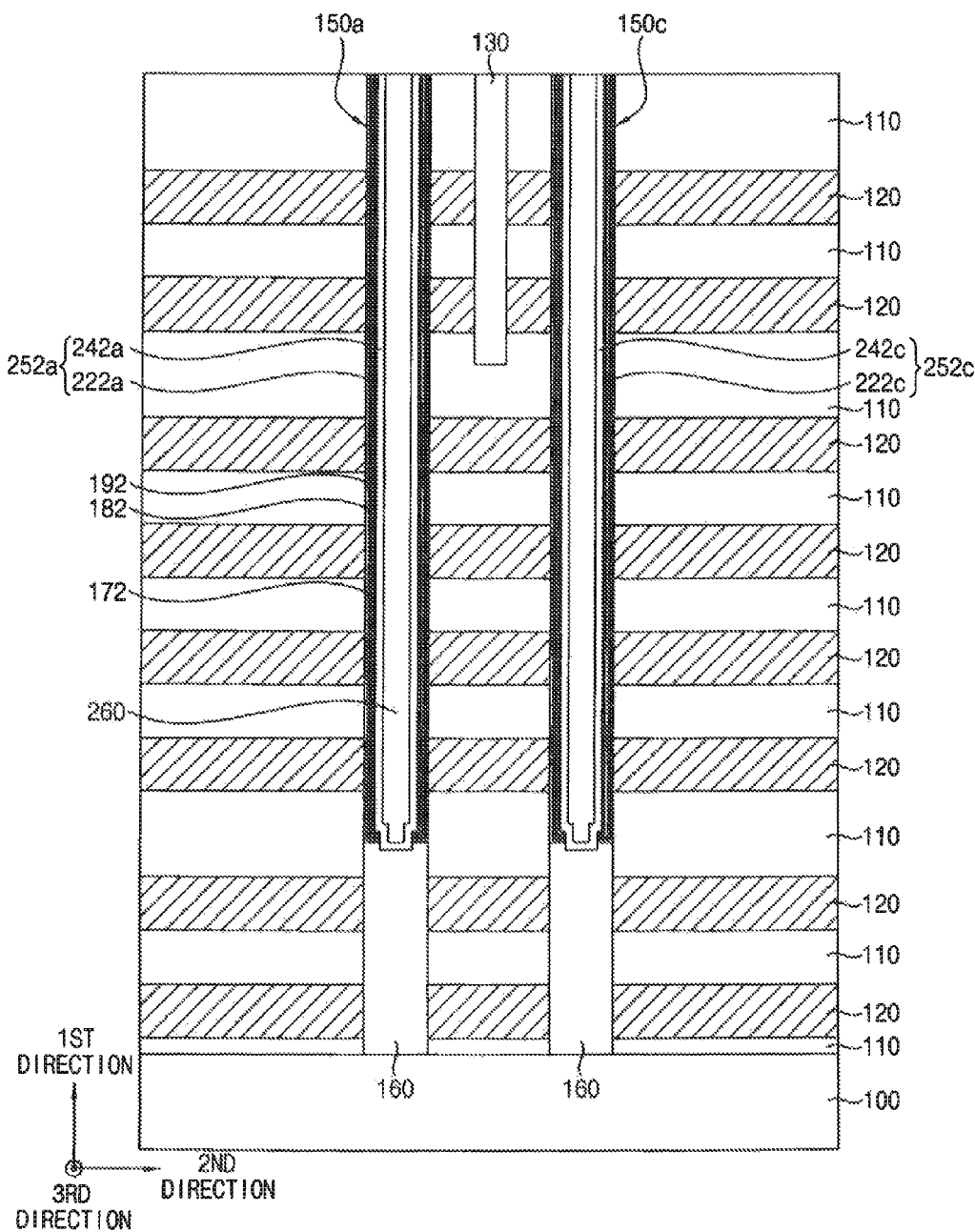

FIGS. 6, 7 and 8A, 9, 10, 11 and 12A, 13 to 16 and 18 to 21 are vertical cross-sectional views illustrating methods of manufacturing a vertical memory device in accordance with example embodiments, and FIGS. 8B and 12B are plan views illustrating methods of manufacturing the vertical memory device. The figures show methods of manufacturing the vertical memory device of FIGS. 1 to 5, but are not limited thereto.

Figure 6:
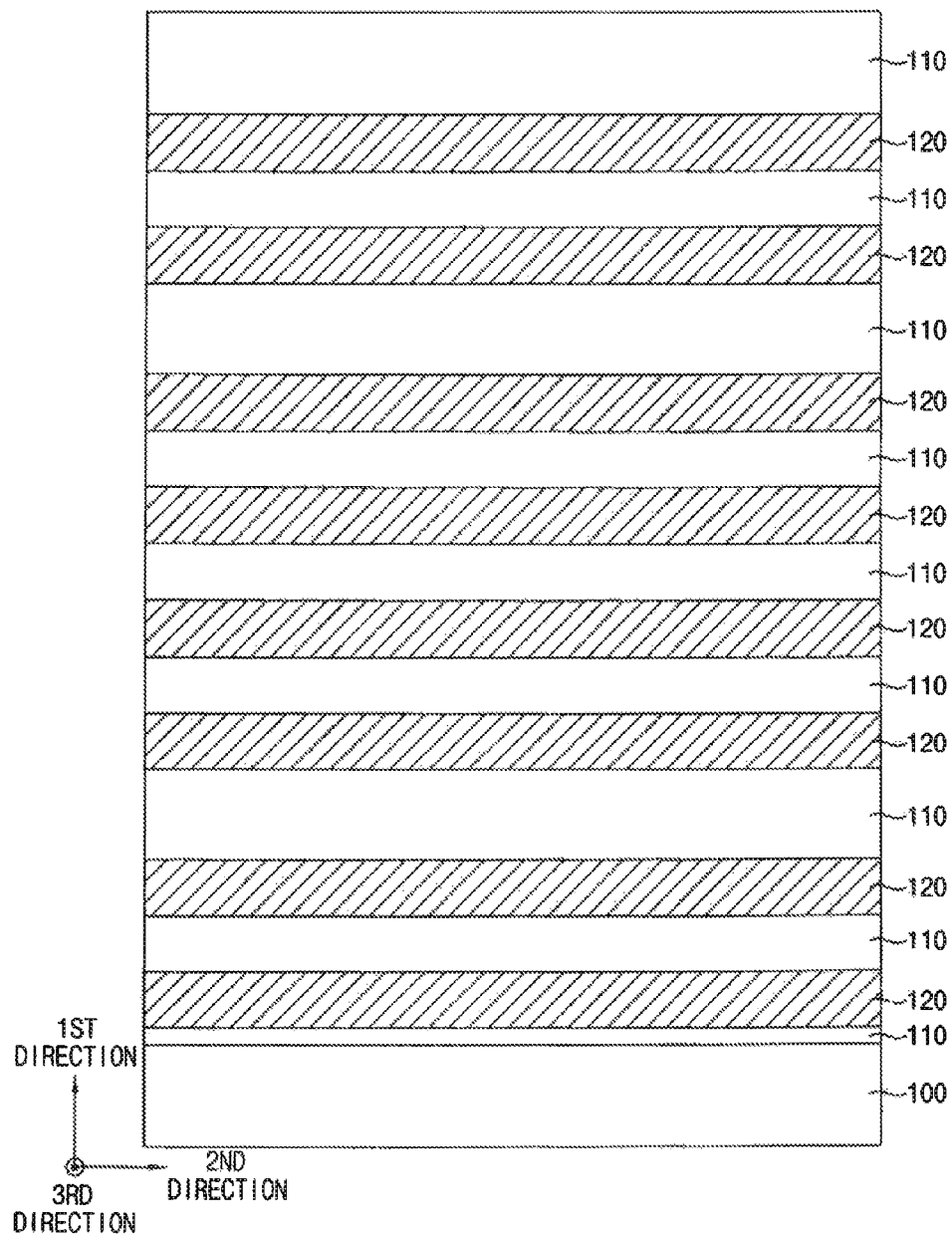
FIGS. 6, 7, 8A, 9, 10, 11, 12A, 13, 14, 15, 16, 17, 18, 19, 20 and 21 are vertical cross-sectional views illustrating methods of manufacturing a vertical memory device in accordance with example embodiments.

Referring to FIG. 6, a first insulation layer 110 and a sacrificial layer 120 are alternately and repeatedly formed on a substrate 100. A plurality of first insulation layers 110 and a plurality of sacrificial layers 120 are alternately formed on each other at a plurality of levels, respectively.

The substrate 100 can include a semiconductor material, for example, silicon and/or germanium. The substrate 100 can be, for example, a bulk semiconductor or a semiconductor layer.

In example embodiments, the first insulation layer 110 and the sacrificial layer 120 can be formed by, for example, a chemical vapor deposition (CVD) process, a plasma enhanced chemical vapor deposition (PECVD) process and/or an atomic layer deposition process (ALD) process. A lowermost first insulation layer 110, which can be formed directly on a top surface of the substrate 100, can be formed by, for example, a thermal oxidation process. In example embodiments, the first insulation layer 110 includes a silicon oxide, for example, silicon dioxide ($SiO_2$), silicon oxycarbide (SiOC) and/or silicon oxyfluoride (SiOF). The sacrificial layer 120 includes, for example, a material with etch selectivity to the first insulation layer 110 (e.g., silicon nitride and/or silicon boronitirde).

Figure 20:
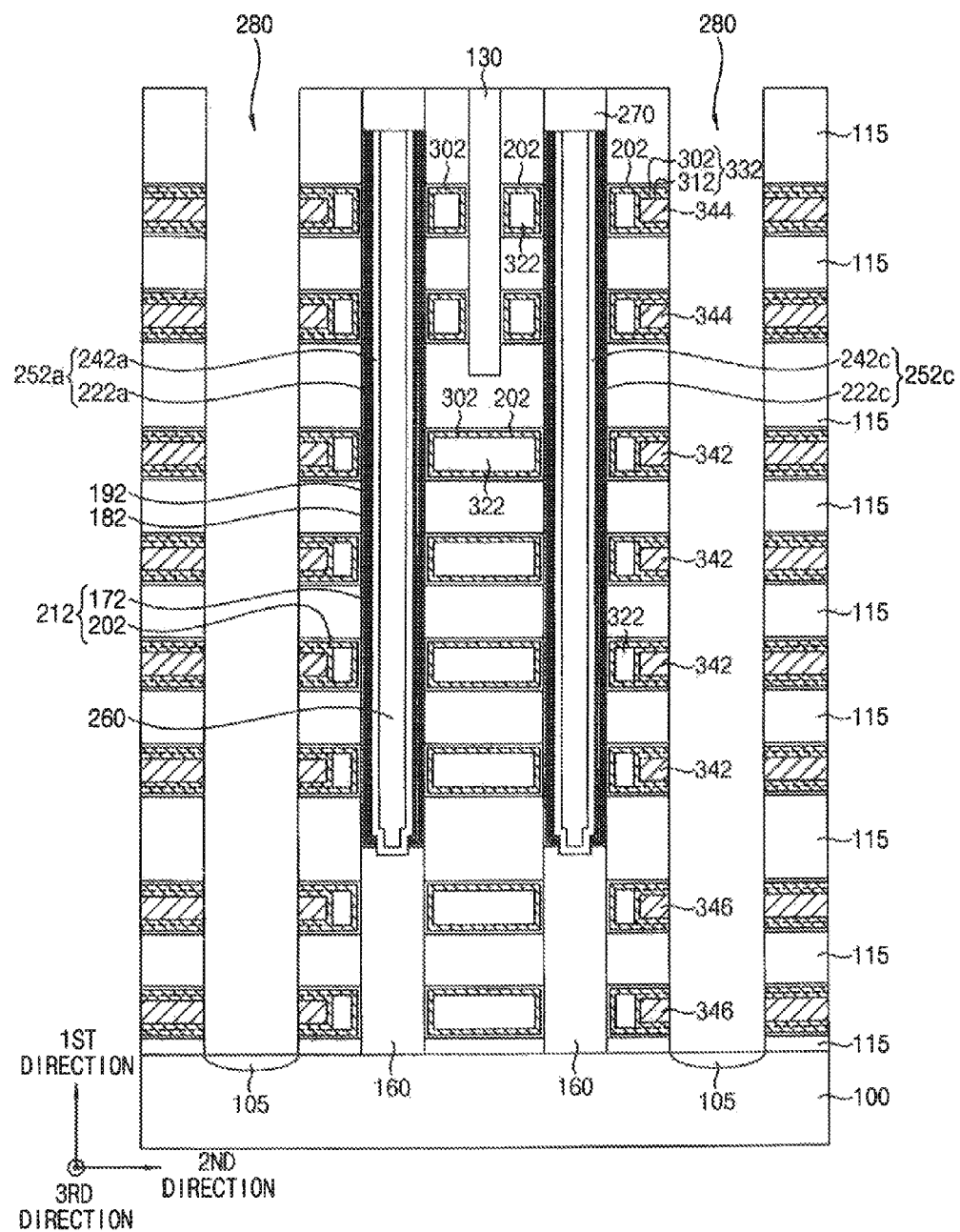

The number of the first insulation layers 110 and the number of the sacrificial layers 120 stacked on the substrate 100 can vary according to the desired number of GSLs 346, word lines 342 and SSLs 344 (refer, e.g., to FIG. 20). According to at least one example embodiment, each of the GSL 346 and the SSL 344 are formed at 2 levels, and the word line 342 is formed at 4 levels. The sacrificial layer 120 is formed at 8 levels, and the first insulation layer 110 is formed at 9 levels. According to at least one example embodiment, each of the GSL 346 and the SSL 344 are formed at a single level, and the word line 342 is formed at 2, 8 or 16 levels. In this case, the sacrificial layer 120 is formed at 4, 10 or 18 levels, and the first insulation layer 110 is formed at 5, 11 or 19 levels. However, the number of GSLs 346, SSLs 344 and word lines 342 is not limited thereto.

Referring to FIG. 7, a trench 135 is partially formed through the first insulation layers 110 and the sacrificial layers 120, and a division layer pattern 130 is formed in the trench 135.

In example embodiments, the trench 135 can be formed by an etching process, thereby penetrating through the sacrificial layers 120 in which the SSLs 344 are formed in a subsequent process and the first insulation layers 110 on the sacrificial layers 120, and further partially penetrating through the first insulation layer 110 under the sacrificial layers 120 in which the SSLs 344 are to be formed. In example embodiments, the trench 135 can be formed to extend in the third direction.

A division layer is formed on the uppermost first insulation layer 110 to sufficiently fill the trench 135, and is planarized until a top surface of the uppermost first insulation layer 110 is exposed to form the division layer pattern 130. The division layer can include a material with etch selectivity to the sacrificial layers 120, e.g., an oxide such as silicon oxide. The planarization process can be performed by a chemical mechanical polishing (CMP) process and/or an etch back process.

Referring to FIGS. 8A and 8B, a plurality of holes 150 are formed through the first insulation layers 110 and the sacrificial layers 120 to expose a top surface of the substrate 100.

In example embodiments, after forming a hard mask 140 on the uppermost first insulation layer 110, the first insulation layers 110 and the sacrificial layers 120 can be dry etched using the hard mask 140 as an etch mask to form the holes 150. The holes 150 extend in the first direction. Due to the characteristics of a dry etch process, the holes 150 can have a width that becomes gradually smaller from a top portion to a bottom portion of the holes 150.

In example embodiments, the hard mask 140 includes a material with etch selectivity to silicon oxide and silicon nitride that may be included in the first insulation layers 110 and the sacrificial layers 120, respectively, e.g., polysilicon or amorphous silicon formed by a chemical vapor deposition (CVD) process, a plasma enhanced chemical vapor deposition (PECVD) process, an atomic layer deposition (ALD) process, and the like.

In example embodiments, the holes 150 are formed in both of the second and third directions to define a hole array. In example embodiments, the hole array has a first hole column including a plurality of first holes 150a arranged in the third direction, and a second hole column including a plurality of second holes 150b arranged in the third direction and being spaced apart from the first hole column at a given distance. The first holes 150a are positioned in a fourth direction, which can be an acute angle to the second or third direction, from the second holes 150b. Accordingly, the first and second holes 150a and 150b can be arranged in a zigzag pattern with respect to the third direction, and thus an increased number of holes may be arranged in a given area than without the zigzag pattern.

Additionally, the hole array can include third and fourth hole columns that are spaced apart from the first and second hole columns at a given distance. In example embodiments, the third and fourth hole columns can be arranged symmetrically from the first and second hole columns, respectively, with respect to an imaginary face defined by the first and third directions, e.g., an elongated face of the division layer pattern 130 along the first direction, and can include a plurality of third and fourth holes 105c and 150d, respectively. As a result, a distance between the first and third hole columns may be shorter than a distance between the second and fourth hole columns.

The first to fourth hole columns are referred to as a hole set, and a plurality of the hole sets are repeatedly arranged in the second direction to form the hole array.

Figure 9:
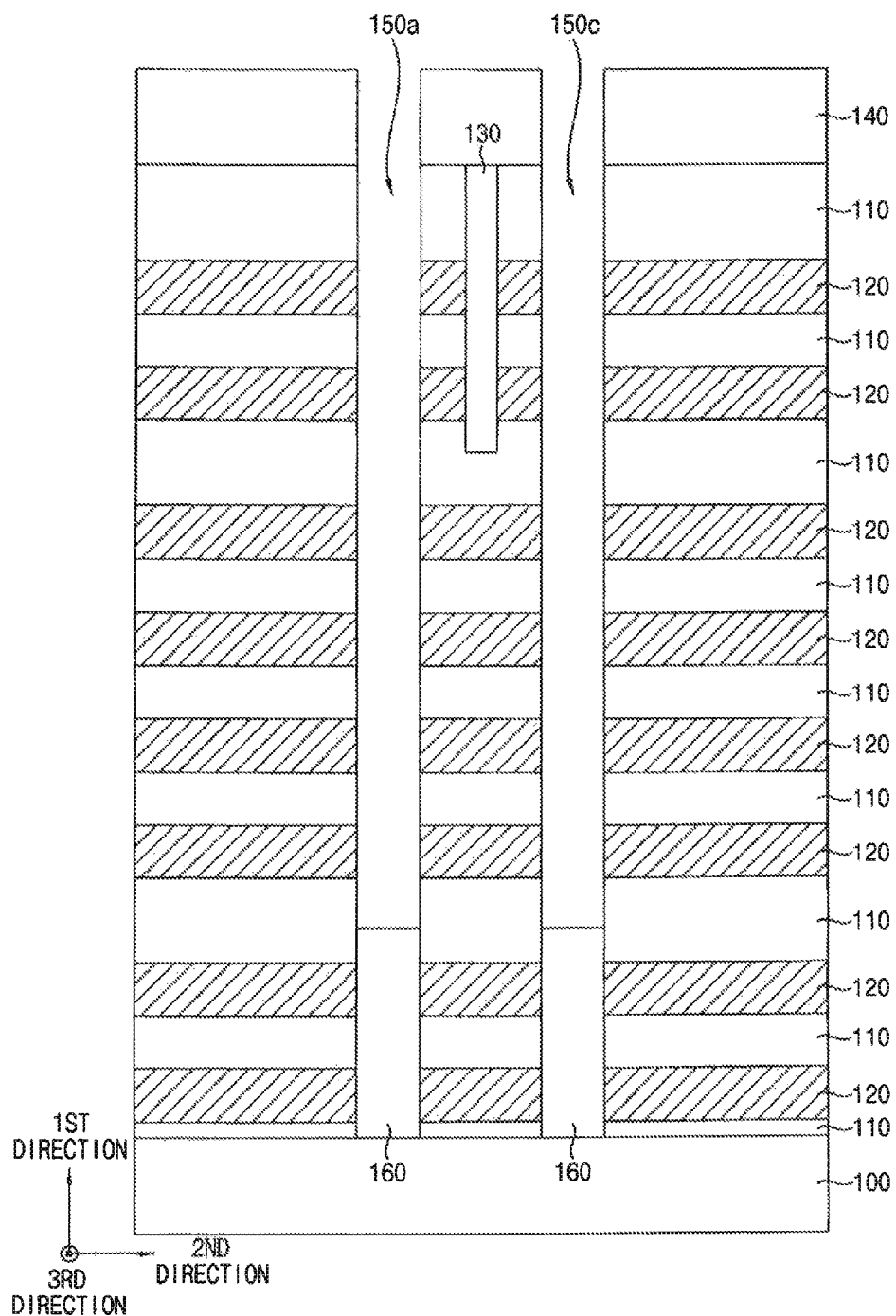

Referring to FIG. 9, a semiconductor pattern 160 is formed to partially fill each hole 150.

In accordance with an embodiment of the inventive concept, a selective epitaxial growth (SEG) process is performed using the exposed top surface of the substrate 100 as a seed to form the semiconductor pattern 160 partially filling the holes 150. The semiconductor pattern 160 is formed to include single crystalline silicon or single crystalline germanium according to the material of the substrate 100, and in some cases, impurities are doped into the semiconductor pattern 160. Alternatively, an amorphous silicon layer is formed to fill the holes 150, and a laser epitaxial growth (LEG) process or a solid phase epitaxy (SPE) process is performed on the amorphous silicon layer to form the semiconductor pattern 160. In example embodiments, the semiconductor pattern 160 is formed to have a top surface higher than that of the sacrificial layer 120 at which the GSL 346 is subsequently formed.

In an example embodiment, an oxide layer is further formed on the hard mask 140 including silicon so that the semiconductor pattern 160 is not formed on the hard mask 140.

Figure 10:
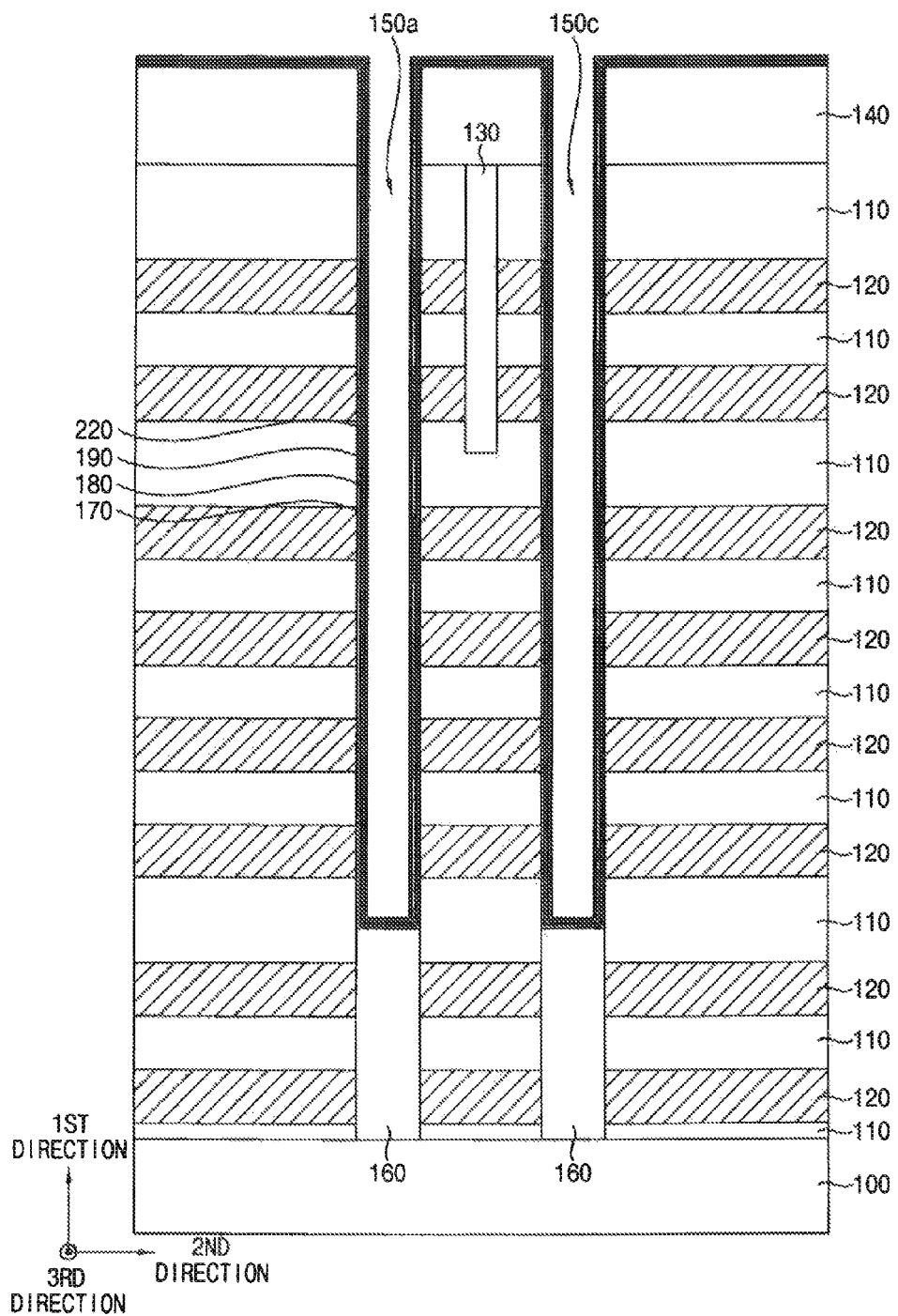

Referring to FIG. 10, a first blocking layer 170, a first charge storage layer 180, a first tunnel insulation layer 190 and a first channel layer 220 are sequentially formed on an inner wall of the holes 150, a top surface of the semiconductor pattern 160, and a top surface of the hard mask 140.

In example embodiments, the first blocking layer 170 includes an oxide, e.g., silicon oxide, the first charge storage layer 180 includes a nitride, e.g., silicon nitride, and the first tunnel insulation layer 190 includes an oxide, e.g., silicon oxide.

In example embodiments, the first channel layer 220 includes doped or undoped polysilicon or amorphous silicon. When the first channel layer 220 includes amorphous silicon, an LEG process or an SPE process is further performed so that the amorphous silicon layer can be changed to a crystalline silicon layer.

Before forming the first blocking layer 170, a protection layer (not shown) can be formed on the inner wall of the holes 150, the top surface of the semiconductor pattern 160 and the top surface of the hard mask 140. The protection layer can include, e.g., silicon oxide, and can prevent the first blocking layer 170 from being damaged during the removal of the sacrificial layers 120 in a subsequent process (refer to FIG. 15).

Referring to FIG. 11, bottoms of the first channel layer 220, the first tunnel insulation layer 190, the first charge storage layer 180 and the first blocking layer 170 are partially removed to expose an upper portion of the semiconductor pattern 160, and the exposed upper portion of the semiconductor pattern 160 is partially removed to form a first recess 230. As a result, a portion of each of the bottom of the first channel layer 220, the first tunnel insulation layer 190, the first charge storage layer 180 and the first blocking layer 170 are open. During the formation of the first recess 230, the first tunnel insulation layer 190 can be covered by the first channel layer 220, so that the first tunnel insulation layer 190 may not be damaged.

Referring to FIGS. 12A and 12B, a second channel layer is formed on the first channel layer 220 and the exposed semiconductor pattern 160, and a second insulation layer is formed on the second channel layer to sufficiently fill remaining portions of the holes 150. The second insulation layer, the second channel layer, the first tunnel insulation layer 190, the first charge storage layer 180, the first blocking layer 170 and the hard mask 140 are planarized until a top surface of the uppermost first insulation layer 110 may be exposed.

As a result, a first blocking layer pattern 172, a first charge storage layer pattern 182, a first tunnel insulation layer pattern 192, a first channel layer pattern 222a, 222b, 222c and 222d, a second channel layer pattern 242a, 242b, 242c and 242d, and a second insulation layer pattern 260 are sequentially formed to fill the holes 150.

In example embodiments, each of the first blocking layer pattern 172, the first charge storage layer pattern 182, the first tunnel insulation layer pattern 192 and the first channel layer pattern 222a, 222b, 222c and 222d are formed to have a cup shape of which a central bottom portion is open, and the second channel layer pattern 242a, 242b, 242c and 242d is formed to have a cup shape having a closed bottom. Particularly, the second channel layer pattern 242a, 242b, 242c and 242d is formed on an inner sidewall and a bottom of the first channel layer pattern 222a, 222b, 222c and 222d, and covers a sidewall of the open central bottom portions of the first channel layer pattern 222, the first blocking layer pattern 172, the first charge storage layer pattern 182 and the first tunnel insulation layer pattern 192. The second channel layer pattern 242a, 242b, 242c and 242d extends in the first direction to the first recess 230 of the semiconductor pattern 160. The second channel layer pattern 242a, 242b, 242c and 242d includes a protrusion portion below the first channel layer pattern 222a, 222b, 222c and 222d.

In example embodiments, the second channel layer includes doped or undoped polysilicon or amorphous silicon. When the second channel layer includes amorphous silicon, a crystallization process can be further performed. The second insulation layer includes an insulating material, e.g., silicon oxide or silicon nitride.

The first and second channel layer patterns 222 and 242 define a channel 252, and the channel 252, the first tunnel insulation layer pattern 192, the first charge storage layer pattern 182, the first blocking layer pattern 172 and the second insulation layer pattern 260 define a first structure.

In example embodiments, the channel 252 can have a cup shape. In an alternative embodiment, the second channel layer pattern 242 fills a remaining portion of each hole 150 instead of forming the second insulation layer pattern 260, and in this case, the channel 252 has a pillar shape.

Accordingly, as the holes 150 in which the channel 252 is formed define a hole set including the first, second, third and fourth holes 150a, 150b, 150c and 150d, and further a hole array including a plurality of hole sets, the channel 252 defines a channel set including first, second, third and fourth channels 252a, 252b, 252c and 252d, and further a channel array including a plurality of channel sets. In other words, the first to fourth channels 252a, 252b, 252c and 252d are formed in the first to fourth holes 150a, 150b, 150c and 150d, respectively, and each of the channels 252a, 252b, 252c and 252d include corresponding first channel layer patterns 222a, 222b, 222c and 222d and corresponding second channel layer patterns 242a, 242b, 242c and 242d.

Figure 13:
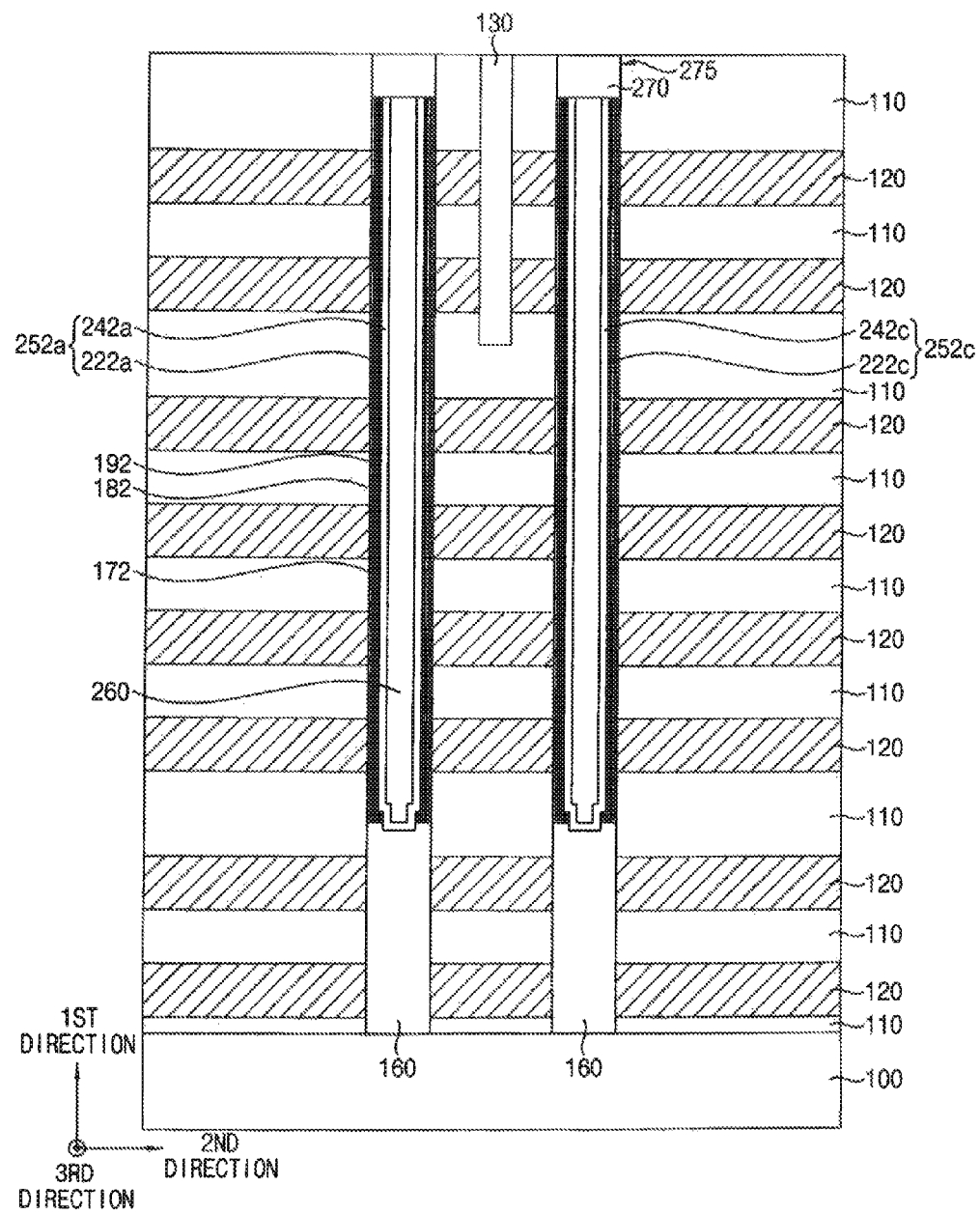

Referring to FIG. 13, an upper portion of the first structure, e.g., upper portions of the second insulation layer pattern 260, the second channel layer pattern 242, the first channel layer pattern 222, the first tunnel insulation layer pattern 192, the first charge storage layer pattern 182 and the first blocking layer pattern 172 are removed to form a second recess 275, and a pad 270 is formed to fill the second recess 275.

Particularly, in accordance with an embodiment of the inventive concept, the upper portion of the first structure is removed by an etch back process to form the second recess 275. A pad layer is formed on the first structure and the uppermost first insulation layer 110 to fill the second recess 275, and the pad layer is planarized until a top surface of the uppermost first insulation layer 110 is exposed to form the pad 270. In example embodiments, the pad layer includes doped or undoped polysilicon or amorphous silicon. When the pad layer includes amorphous silicon, a crystallization process is further performed on the pad layer.

In accordance with an embodiment of the inventive concept, the pad 270 is formed on each channel 252, and a pad array is formed in accordance with the channel array.

The first structure, the semiconductor pattern 160 and the pad 270 in each hole 150 form a second structure.

Figure 14:
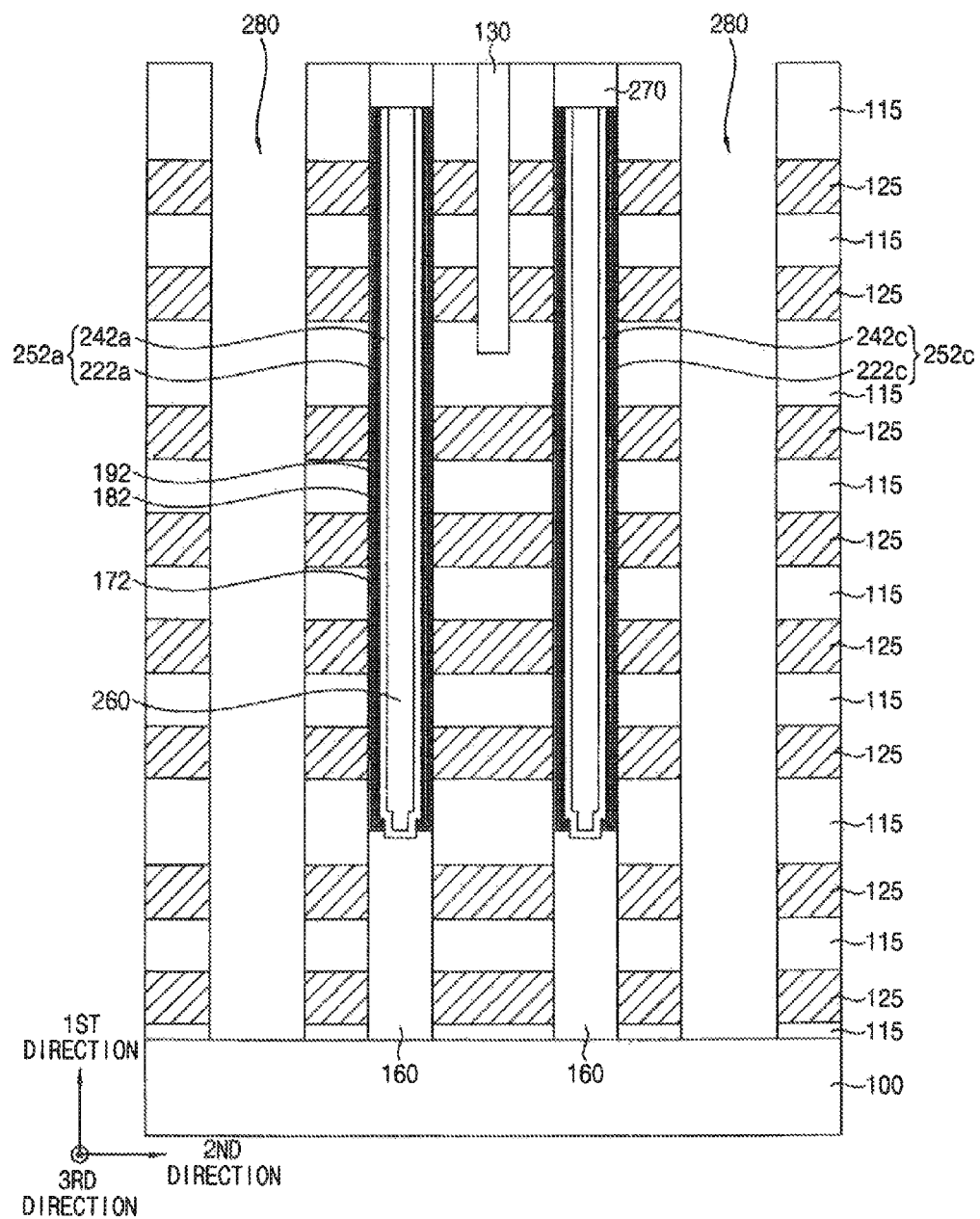

Referring to FIG. 14, a first opening 280 is formed through the first insulation layers 110 and the sacrificial layers 120 to expose a top surface of the substrate 100.

In example embodiments, after forming a hard mask (not shown) on the uppermost first insulation layer 110, the insulation layers 110 and the sacrificial layers 120 are, for example, dry etched using the hard mask as an etch mask to form the first openings 280. The first openings 280 extend in the first direction.

In example embodiments, a plurality of first openings 280 are formed in the second direction, and each first opening 280 extends in the third direction. The first insulation layers 110 and the sacrificial layers 120 are transformed into first insulation layer patterns 115 and sacrificial layer patterns 125, respectively. A plurality of first insulation layer patterns 115 and a plurality of sacrificial layer patterns 125 are formed in the second direction at each level, and each first insulation layer pattern 115 and each sacrificial layer pattern 125 extends in the third direction.

In example embodiments, the first openings 280 are formed between the hole sets, e.g., between the second hole column in a hole set and the fourth hole column in an adjacent hole set.

Figure 15:
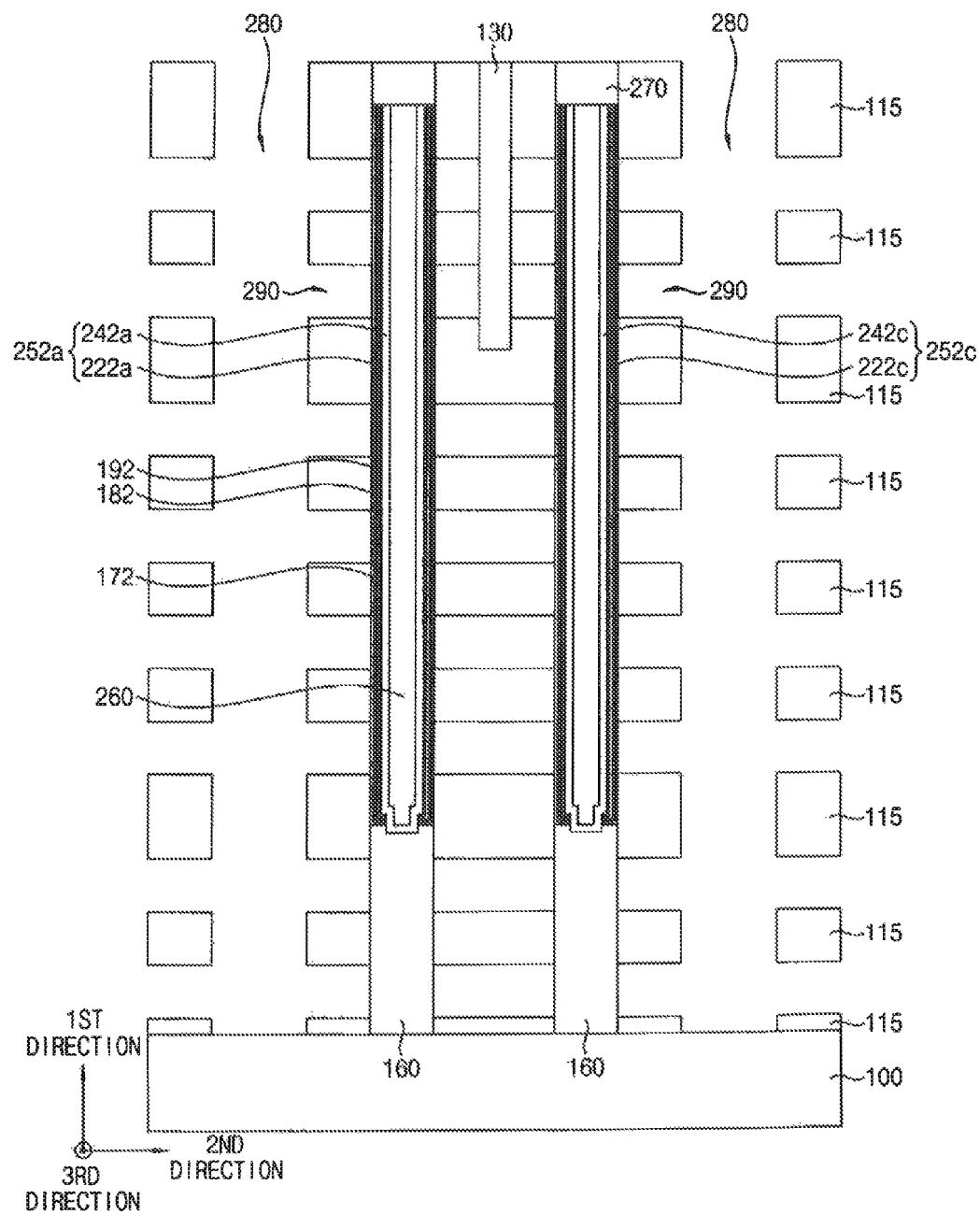

Referring to FIG. 15, the sacrificial layer patterns 125 are removed to form gaps 290 between the first insulation layer patterns 115 at adjacent levels. In example embodiments, a plurality of gaps 290 are formed between the first insulation layer patterns 115, respectively. Portions of an outer sidewall of the first blocking layer pattern 172 and a sidewall of the semiconductor pattern 160 are exposed by the gaps 290. In example embodiments, the sacrificial layer patterns 125 exposed by the first opening 280 are removed by, for example, a wet etch process using an etch solution including phosphoric acid and/or sulfuric acid.

Figure 16:
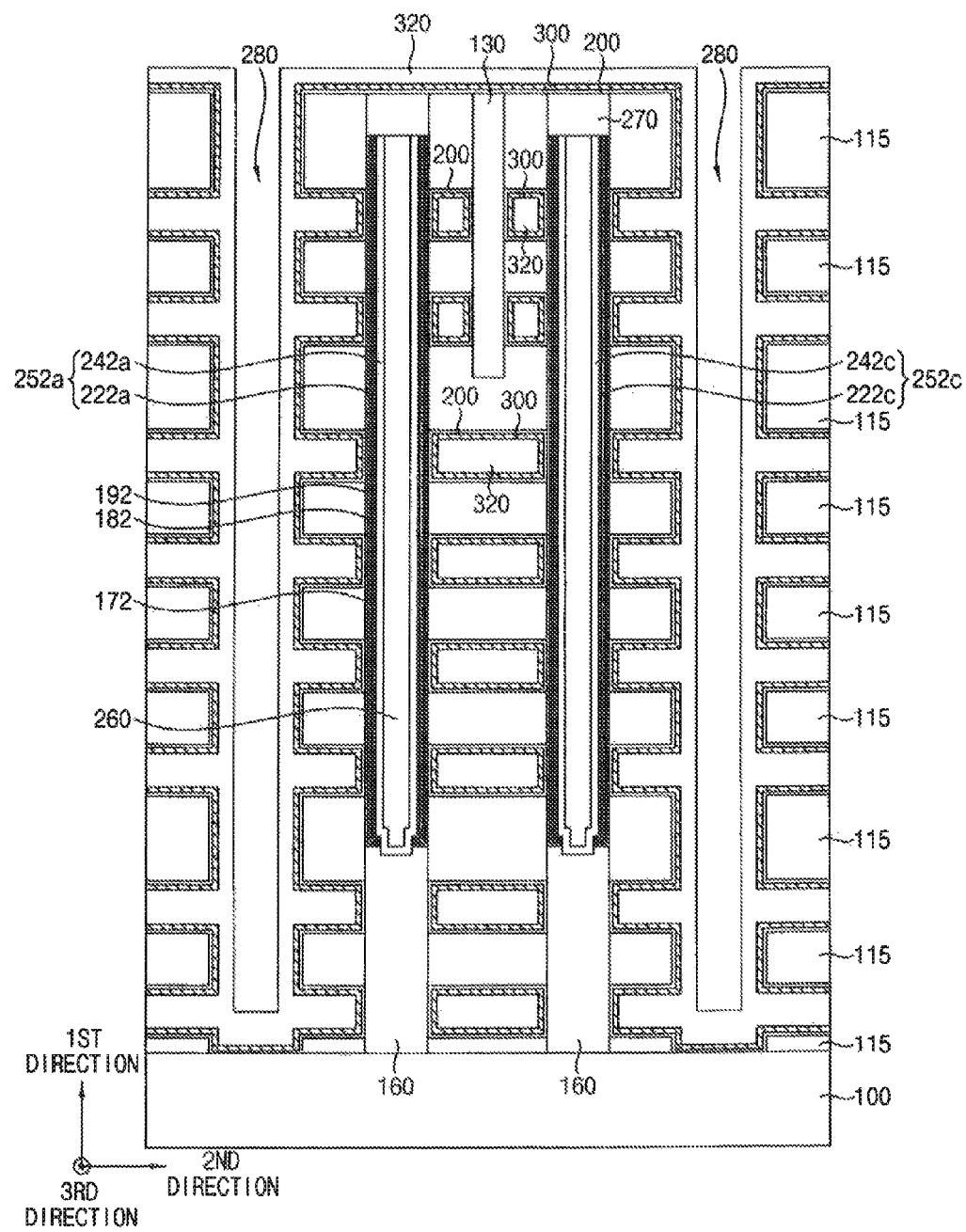

Referring to FIG. 16, a second blocking layer 200 and a first barrier layer 300 are sequentially formed on the exposed portion of the outer sidewall of the first blocking layer pattern 172, the exposed portion of the sidewall of the semiconductor pattern 160, an inner wall of the gap 290, a surface of the first insulation layer pattern 115, the exposed top surface of the substrate 100 and a top surface of the division layer pattern 130. A filling layer 320 is formed on the first barrier layer 300 to sufficiently fill remaining portions of the gaps 290.

In example embodiments, the second blocking layer 200 includes, for example, a metal oxide. For example, the metal oxide can include aluminum oxide, hafnium oxide, lanthanum oxide, lanthanum aluminum oxide, lanthanum hafnium oxide, hafnium aluminum oxide, titanium oxide, tantalum oxide and/or zirconium oxide.

In example embodiments, the first barrier layer 300 includes a metal nitride, e.g., titanium nitride, tantalum nitride, and the like, thereby the first barrier layer 300 is conductive. In an example embodiment, the first barrier layer 300 can be formed by a sequential flow deposition (SFD) process or an ALD process.

The filling layer 320 can include doped or undoped polysilicon, a nitride such as silicon nitride, or an oxide such as silicon oxide. Alternatively, the filling layer 320 can include a metal, except for a metal that is deposited using a source gas including fluorine, e.g., tungsten. In an example embodiment, the filling layer 320 can include a metal nitride, e.g., titanium nitride, tantalum nitride, and the like, and in this case, the filling layer 320 includes the same or substantially the same material as the first barrier layer 300.

Figure 17:
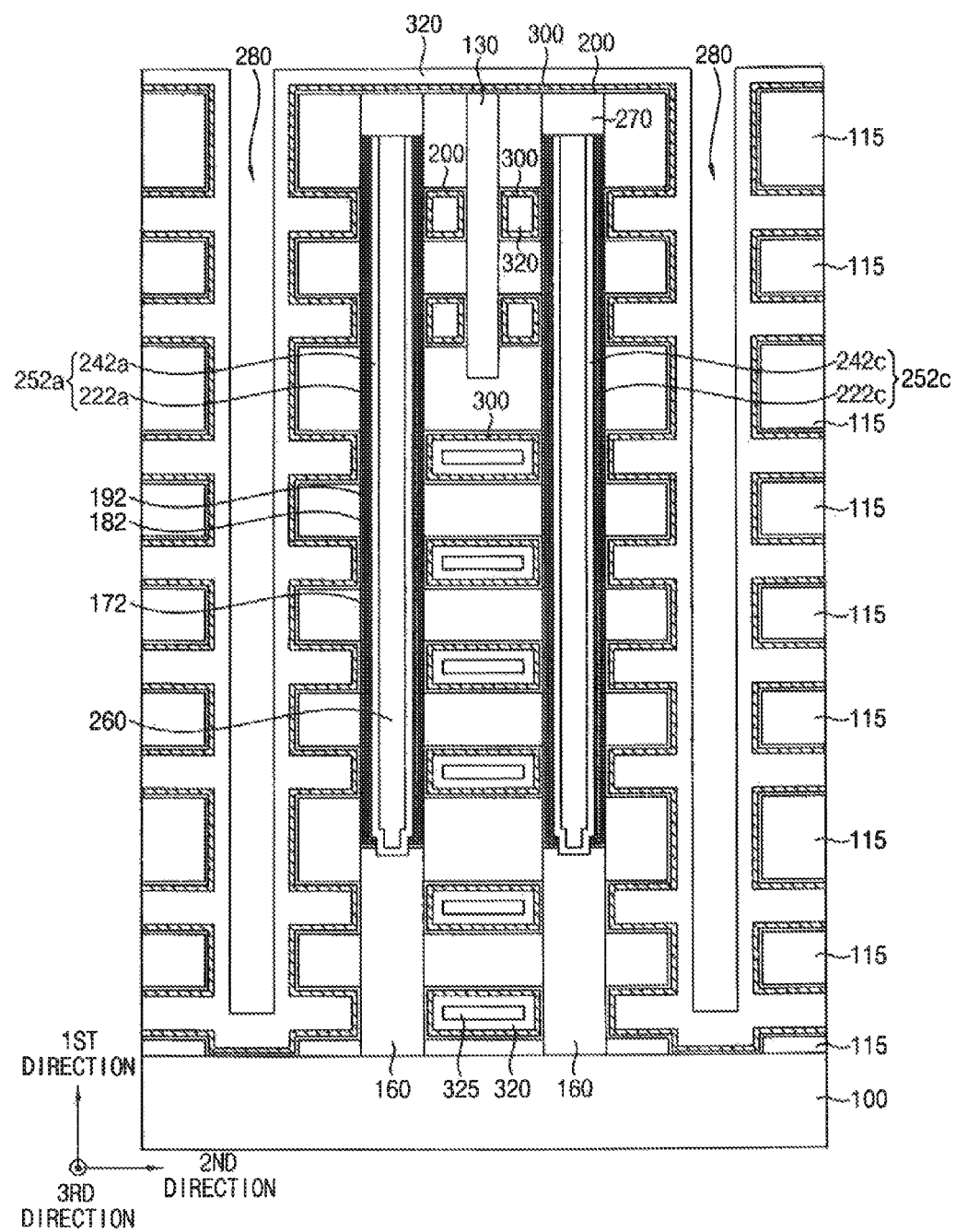

In some embodiments, when the filling layer 320 is formed, the filling layer 320 may not completely fill at least some of the gaps 290 so that a void 325 is formed in those gaps. FIG. 17 illustrates a vertical memory device including a filling layer 320 having voids 325 therein. The voids 325 may be formed at gaps 290 at a central portion that are distant from the first openings 280.

Even though the filling layer 320 may have the voids 325, damage to the layer structures of the vertical memory device, e.g., the first tunnel insulation layer pattern 192, the first charge storage layer pattern 182 and the first blocking layer pattern structure 212, can still be prevented, as explained further below.

Figure 18:
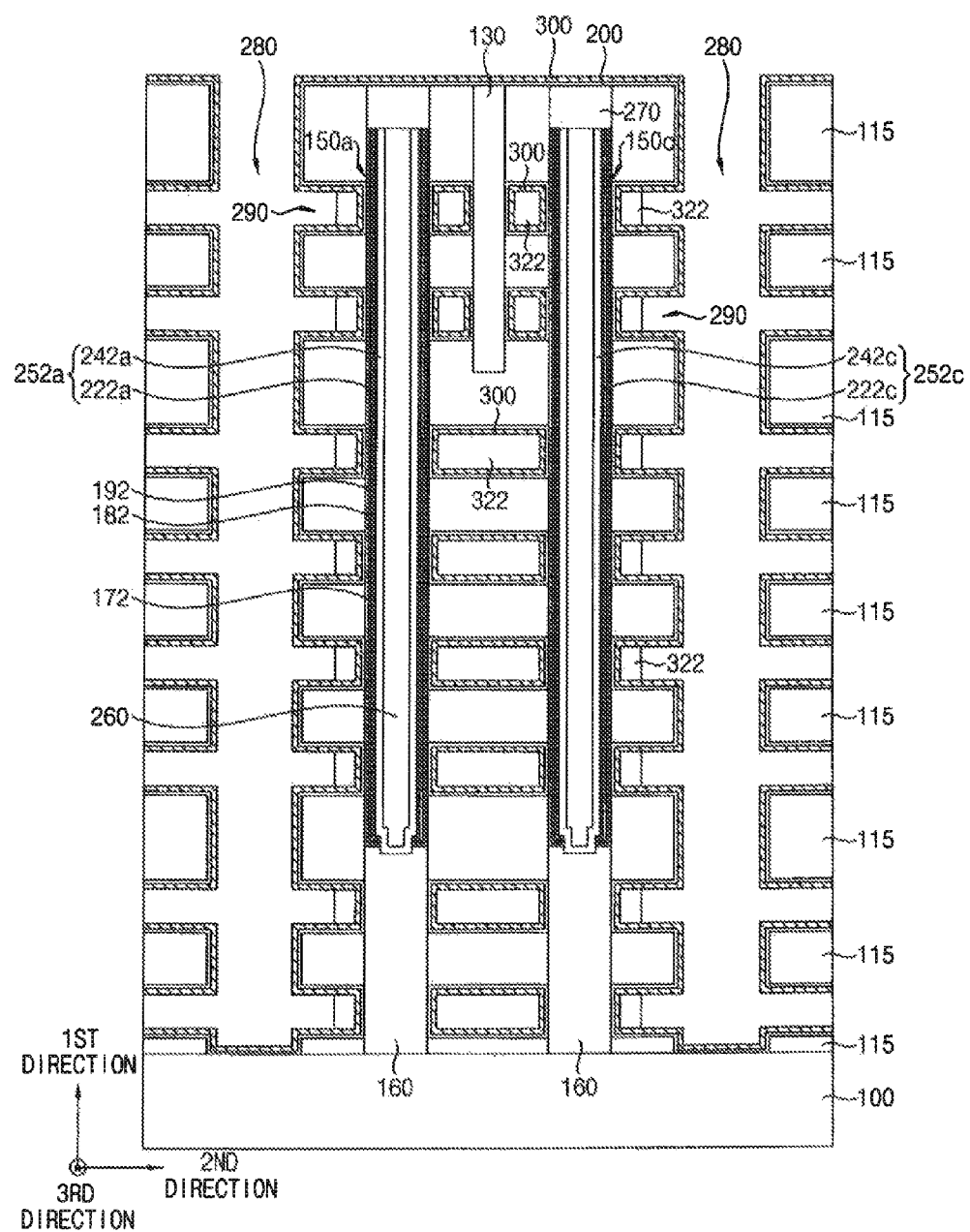

Referring to FIG. 18, the filling layer 320 is partially removed to form the first filling layer pattern 322 partially filling the gaps 290.

In example embodiments, the filling layer 320 is partially removed using aqueous ammonia solution as an etch solution by a wet etch process. The filling layer pattern 322 is formed between adjacent first insulation layer patterns 115 and extends in the third direction.

In example embodiments, the wet etch process is performed to a degree at which portions of the second blocking layer 200 and the first barrier layer 300 on outer sidewalls of the first and third holes 150a and 150c are not exposed, and thus the first filling layer pattern 322 fills the gap 290 from a central portion to a portion outside the first and third holes 150a and 150c. In other words, the first filling layer pattern 322 fills the central portion of the gap 290 and surrounds portions of the sidewalls of the first and third channels 252a and 252c and the semiconductor pattern 160 in the first and third holes 150a and 150c.

The first filling layer pattern 322 is formed to partially cover outer sidewalls of the second and fourth holes 150b and 150d (refer to FIGS. 3 to 5), and thus the first filling layer pattern 322 partially covers outer sidewalls of the second and fourth channels 252b and 252d and the semiconductor pattern 160 in the second and fourth holes 150b and 150d. Alternatively, the wet etch process is performed to a degree at which portions of the second blocking layer 200 and the first barrier layer 300 on outer sidewalls of the second and fourth holes 150b and 150d are not be exposed, and thus the first filling layer pattern 322 fills the gap 290 from a central portion to a portion outside not only the first and third holes 150a and 150c but also outside the second and fourth holes 150b and 150d. In other words, the first filling layer pattern 322 fills the central portion of the gap 290 and surrounds portions of the sidewalls of not only the first and third holes 150a and 150c but also of the second and fourth holes 150b and 150d. Thus, in accordance with an embodiment of the inventive concept, the first filling layer pattern 322 surrounds portions of the sidewalls of the first to fourth channels 252a, 252b, 252c and 252d and the semiconductor pattern 160 in the first to fourth holes 150a, 150b, 150c and 150d.

Figure 19:
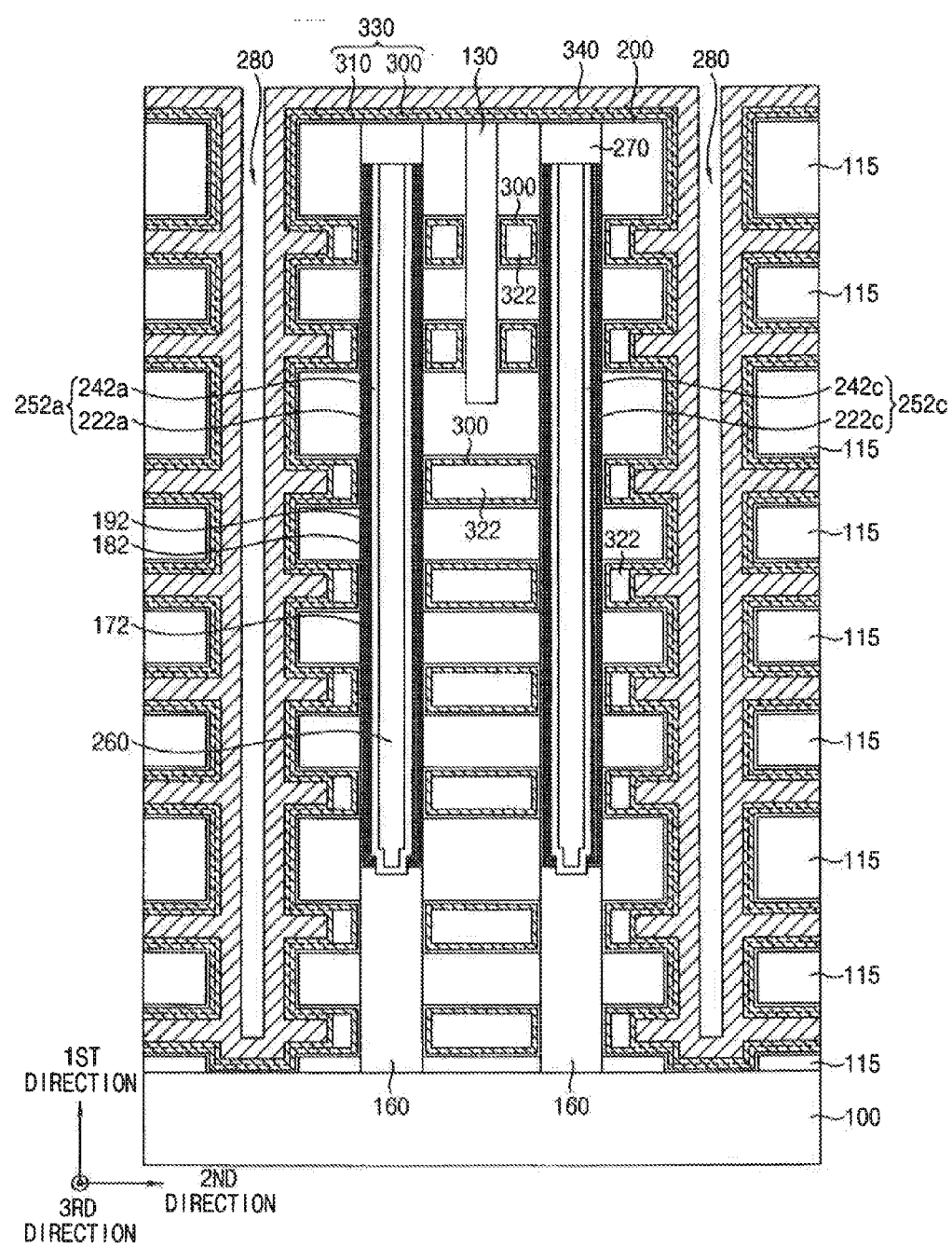

Referring to FIG. 19, a second barrier layer 310 is formed on an outer sidewall of the first filling layer pattern 322 and on the first barrier layer 300, and a gate electrode layer 340 is formed on the second barrier layer 310 to sufficiently fill a remaining portion of the gaps 290.

In example embodiments, the second barrier layer 310 includes a metal nitride, e.g., titanium nitride, tantalum nitride, and the like, thereby the second barrier layer 310 is conductive. In an example embodiment, the second barrier layer 310 can be formed by an SFD process or an ALD process.

In accordance with an embodiment of the inventive concept, the first and second barrier layers 300 and 310 define a barrier layer structure 330. In example embodiments, the second barrier layer 310 includes a material the same or substantially the same as that of the first barrier layer 300.

The first filling layer pattern 322 is surrounded by the barrier layer structure 330.

In example embodiments, the gate electrode layer 340 includes a metal. For example, the gate electrode 340 can include a metal of a low resistance, e.g., tungsten, titanium, tantalum, platinum, and the like. The gate electrode layer 340 is formed on the second barrier layer 310, and thus the gate electrode layer 340 and the second barrier layer 310 are electrically connected to each other.

When the gate electrode layer 340 includes tungsten, the gate electrode layer 340 can be formed by a CVD process or an ALD process using tungsten hexafluoride ($WF_6$) as a source gas, and fluorine gas decoupled from the source gas may remain. However, because the first filling layer pattern 322 is formed at a central portion of the gaps 290, a remaining portion of the gap 290 is easily filled with tungsten, and a space serving as a moving path of remaining fluorine gas is not formed in the gap 290. In other words, fluorine gas remains in a very limited space in the gaps 290, if any, and thus damage to the other layer structures, e.g., the first insulation layer pattern 115, the tunnel insulation layer pattern 192, the charge storage layer pattern 182, the blocking layer pattern 172, due to the remaining fluorine gas is reduced or prevented.

Additionally, the inner walls of the gaps 290 are covered by the barrier layer structure 330, and thus the remaining fluorine gas is prevented from moving to other layer structures by the barrier layer structure 330, and damage to the other layer structures is prevented or reduced. Furthermore, in accordance with an embodiment of the inventive concept, even though the first filling layer pattern 322 may have a void 325

(refer to FIG. 17), the first filling layer pattern 322 is enclosed by the barrier layer structure 330 so that the fluorine gas does not move into the void 325 in the first filling layer pattern 322 and the void 325 does not serve as a moving path of the fluorine gas. Also, if some of the fluorine gas does move into the void 325, the fluorine gas may not attack other layer structures because the first filling layer pattern 322 and the barrier layer structure 330 enclose the void 325. As a result, even though the first filling layer pattern 322 may have the void 325 therein, damage to the layer structures of the vertical memory device, e.g., the first tunnel insulation layer pattern 192, the first charge storage layer pattern 182 and the first blocking layer pattern structure 212, can still be prevented.

In summary, the damage of adjacent layer structures due to fluorine gas generated during the deposition process for forming the gate electrode layer 340 including tungsten may be reduced or prevented, so that the formation of the gate electrode layer 340 may be easily and effectively performed. Further, even when the gate electrode layer 340 is formed to include a metal other than tungsten by a deposition process and a remaining source gas may attack other layer structures, the first filling layer pattern 322 can be formed at the central portion of the gap 290 so that a space serving as a moving path of the remaining source gas may be prevented from being generated, thereby reducing or preventing damage to the layer structures from the remaining source gas.

Referring to FIG. 20, the gate electrode layer 340 is partially removed to form first gate electrodes 342, 344 and 346. In example embodiments, the gate electrode layer 340 is partially removed by, for example, a wet etch process.

The first gate electrodes 342, 344 and 346 are formed on an outer sidewall of the first filling layer pattern 322 to fill edge portions of the gaps 290 between the first openings 280, e.g., side portions of the gaps 290 adjacent to the first openings 280. In example embodiments, the first gate electrodes 342, 344 and 346 extend in the third direction. The first gate electrodes 342, 344 and 346 fill a remaining portion of the gaps 290 that are not filled with the first filling layer pattern 322, and thus the first gate electrodes 342, 344 and 346 partially cover sidewalls of the second structure including the second and fourth channels 252b and 252d.

In accordance with an embodiment of the inventive concept, the first gate electrodes 342, 344 and 346 include GSL 346, the word line 342 and the SSL 344 sequentially located from a top surface of the substrate 100. Each of the GSLs 346, the word lines 342 and the SSLs 344 can be formed at a single level or at a plurality of levels. According to at least one example embodiment, each of the GSLs 346 and the SSLs 344 are formed at 2 levels, and the word lines 342 are formed at 4 levels between the GSLs 346 and the SSLs 344. However, the number of GSLs 346, word lines 342 and SSLs 344 is not limited thereto. In accordance with an embodiment of the inventive concept, the GSLs 346 are formed adjacent to the semiconductor pattern 160, the word lines 342 and the SSLs 344 are formed adjacent to the channels 252, and the SSLs 344 are formed adjacent to the division layer pattern 130.

In accordance with an embodiment of the inventive concept, when the gate electrode layer 340 is partially removed, portions of the second blocking layer 200 and the first and second barrier layers 300 and 310 on a surface of the first insulation layer pattern 115 and on top surfaces of the substrate 100, the pad 270 and the division layer pattern 130 are removed to form a second blocking layer pattern 202 and first and second barrier layer patterns 302 and 312, respectively. The first and second blocking layer patterns 172 and 202 define a barrier layer pattern structure 332.

In a process in which the gate electrode layer 340, the first and second barrier layers 300 and 310 and the second blocking layer 200 are partially removed, the first opening 280 exposing a top surface of the substrate 100 and extending in the third direction is formed again, and, in accordance with an embodiment of the inventive concept, impurities can be implanted into the exposed top surface of the substrate 100 to form an impurity region 105. In example embodiments, the impurities include n-type impurities, for example, phosphorus and/or arsenic. In example embodiments, the impurity region 105 extends in the third direction and serves as a CSL.

A metal silicide pattern (not shown), e.g., a cobalt silicide pattern or a nickel silicide pattern can be further formed on the impurity region 105.

Figure 21:
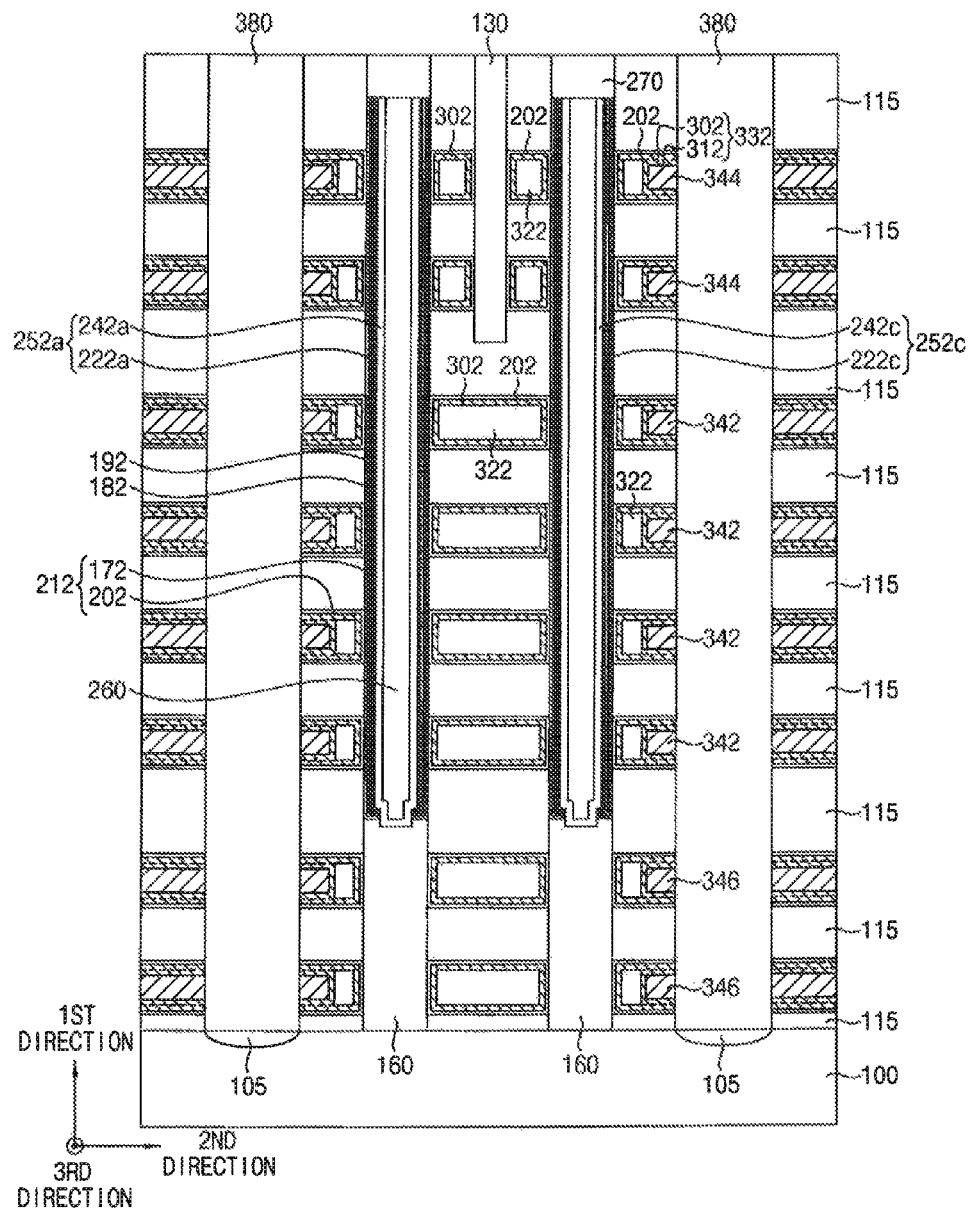

Referring to FIG. 21, a third insulation layer pattern 380 filling the first opening 280 is formed. In example embodiments, after a third insulation layer filling the first opening 280 is formed on the substrate 100 and the uppermost first insulation layer pattern 115, the third insulation layer is planarized until a top surface of the uppermost first insulation layer pattern 115 is exposed to form the third insulation layer pattern 380.

Referring to FIG. 2 again, a fourth insulation layer 390 is formed on the first and third insulation layer patterns 115 and 380, the pad 270 and the division layer pattern 130, and a second opening 405 is formed to expose a top surface of the pad 270. In example embodiments, a plurality of second openings 405 corresponding to the pads 270 are formed to define a second opening array.

A bit line contact 400 is formed on the pad 270 to fill the second opening 405. The bit line contact 400 includes, for example, a metal, a metal nitride and/or doped polysilicon. A bit line 410 electrically connected to the bit line contact 400 is formed on the fourth insulation layer 390. The bit line 410 includes, for example, a metal, a metal nitride and/or doped polysilicon. In example embodiments, a plurality of bit lines 410 are formed in the third direction, and each bit line 410 extends in the second direction.

As described above, a moving path of a remaining portion of the source gas used for forming the first gate electrodes 342, 344 and 346 is prevented from being formed or reduced because of the first filling layer pattern 322, so that damage to adjacent layer structures by the remaining source gas may be prevented or reduced.

In accordance with an embodiment of the inventive concept, the conductive barrier layer structure 332 surrounding or covering the first filling layer pattern 322 is formed on the channel 252, the first tunnel insulation layer pattern 192, the first charge storage layer pattern 182 and the first blocking layer pattern 212, and is electrically connected to the first gate electrodes 342, 344 and 346. Thus, the conductive barrier layer structure 332 and the first gate electrodes 342, 344 and 346 together can serve as gate electrodes. When the filling layer 320 is etched to form the first filling layer pattern 322, the etching process is performed to leave the first filling layer adjacent the first barrier layer pattern 302 so that the first gate electrodes 342, 344 and 346 do not make direct contact with the first blocking layer pattern 172. However, the first gate electrodes 342, 344 and 346 function as gate electrodes together with the conductive barrier layer structure 332, and thus the filling layer 320 is able to not be excessively etched and the formation of the gate electrode structure can be facilitated. The conductive barrier layer structure 332, the first filling layer pattern 322 and the first gate electrodes 342, 344 and 346 may be referred to as a gate electrode structure.

Figure 22:
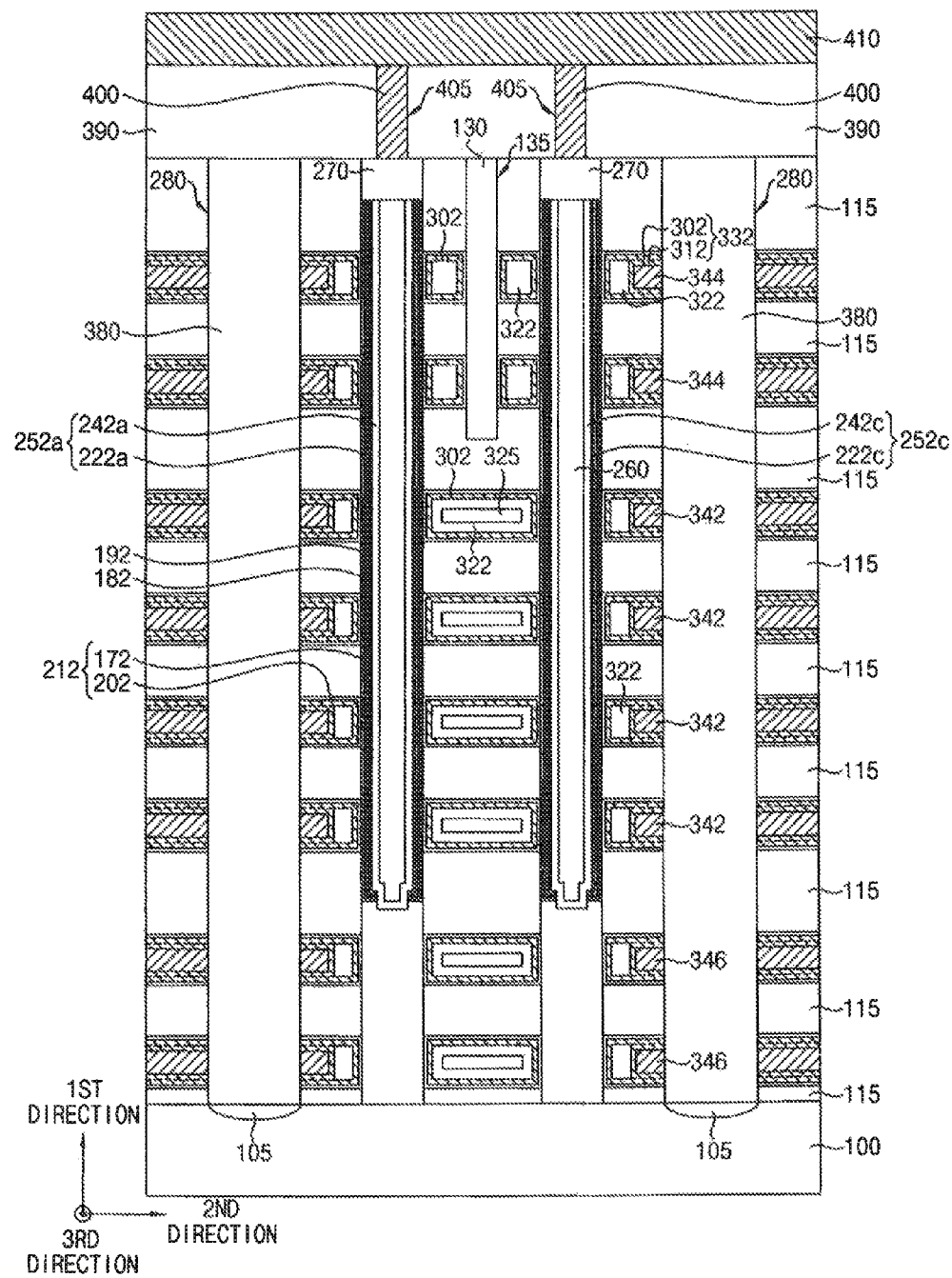
FIG. 22 is a vertical cross-sectional view illustrating a vertical memory device in accordance with example embodiments.

FIG. 22 is a vertical cross-sectional view illustrating a vertical memory device in accordance with example embodiments. The vertical memory device may be substantially the same as that of FIGS. 1 to 5, except for a void.

Referring to FIG. 22, the vertical memory device includes channels 252, a first tunnel insulation layer pattern 192, a first charge storage layer pattern 182, a first blocking layer pattern 172, a second blocking layer pattern 202, a first barrier layer pattern 302, a second barrier layer pattern 312, a first filling layer pattern 322 and first gate electrodes 342, 344 and 346. The first filling layer pattern 322 includes voids 325 therein.

The voids 325 are formed at a central portion of the gaps 290 relatively distant (with respect to gaps 290 that are closer to the first openings 280) from the first openings 280.

In accordance with an embodiment of the inventive concept, the voids 325 are formed at portions of the gaps 290 that are relatively distant from the first openings 280 when a filling layer 320 (refer to FIGS. 16 and 17) for forming the first filling layer pattern 322 is formed. Although a first filling layer pattern 322 may include the void 325 therein, the first filling layer pattern 322 is enclosed by the barrier layer structure 332, and thus a remaining portion of a source gas for forming a gate electrode layer 340 (refer to FIG. 19) including tungsten does not move into the void 325 and the void 325 does not serve as moving path of the remaining source gas. Additionally, even if some of the remaining source gas moves into the void 325, the remaining source gas does not easily attack adjacent layer structures because of the first filling layer pattern 322 and the barrier layer structure 332 enclosing the void 325.

Figure 23:
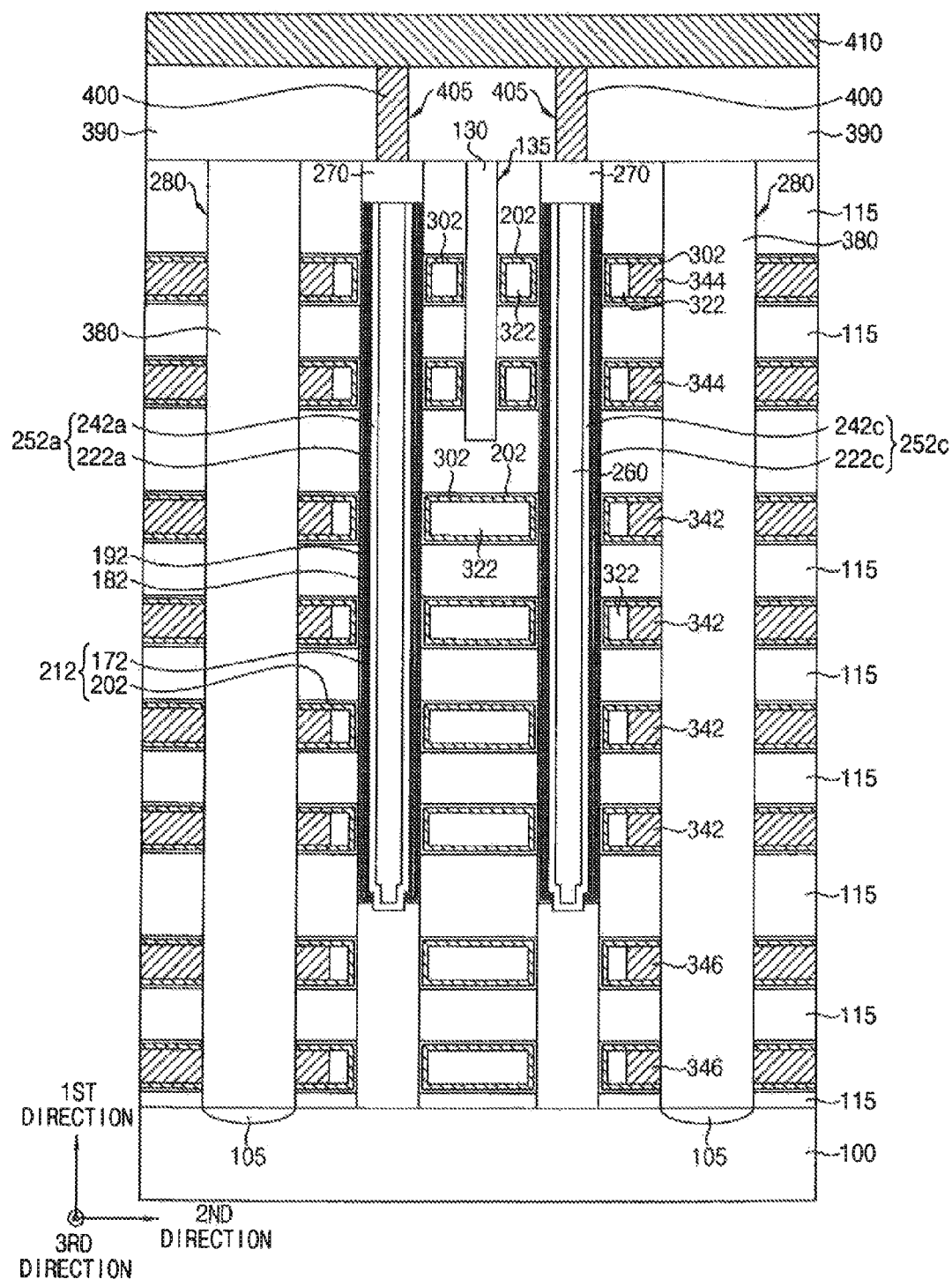
FIG. 23 is a vertical cross-sectional view illustrating a vertical memory device in accordance with example embodiments.
Figure 24:
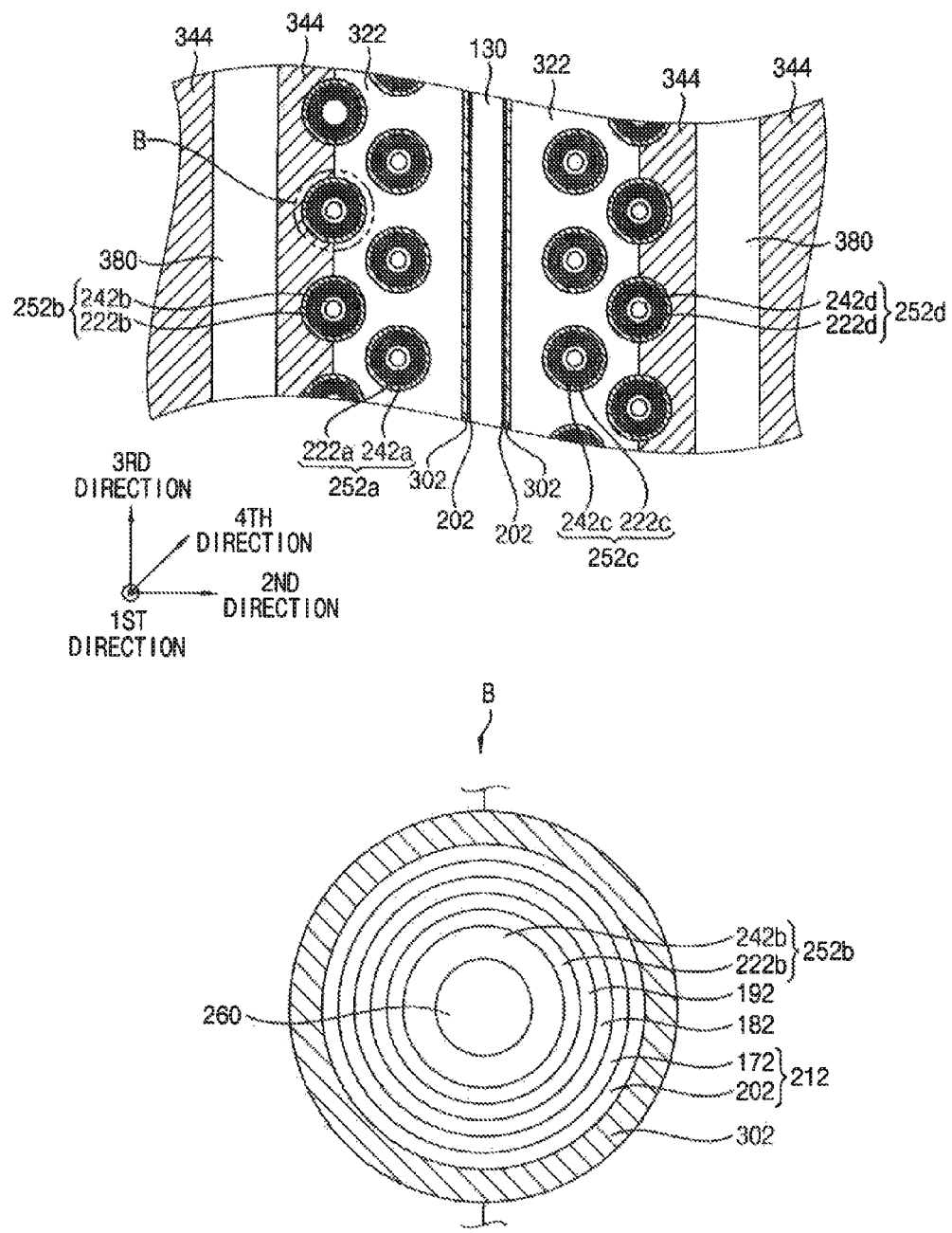
Figure 26:
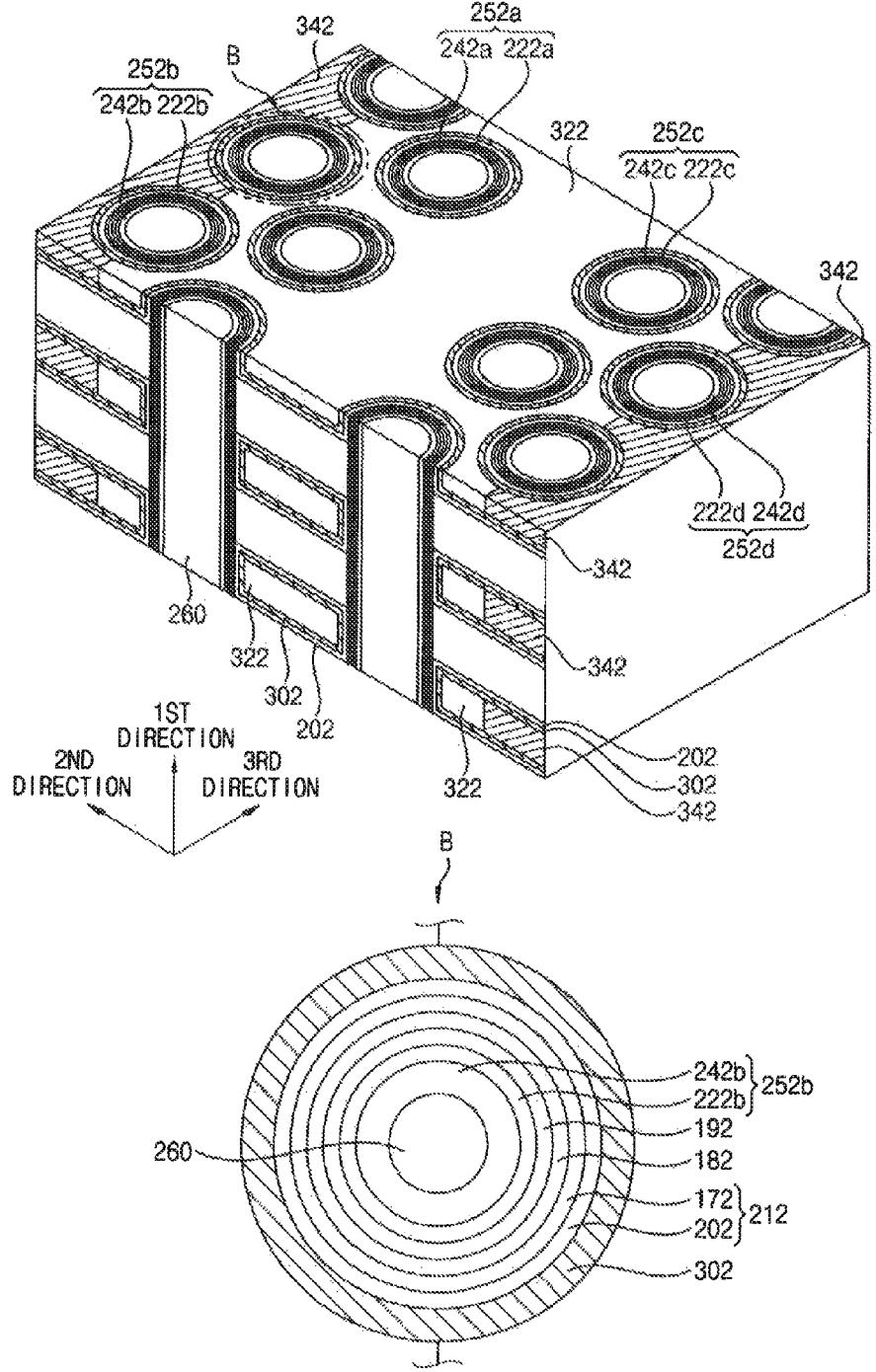
FIG. 26 is a localized perspective diagram of the semiconductor device in FIG. 23.

FIG. 23 is a vertical cross-sectional view illustrating a vertical memory device in accordance with example embodiments, FIGS. 24 and 25 are horizontal cross-sectional views of the semiconductor device in FIG. 23, and FIG. 26 is a localized perspective diagram of the semiconductor device in FIG. 23. The vertical memory device may be substantially the same as that of FIGS. 1 to 5, except for a barrier layer pattern.

Referring to FIGS. 23 to 26, the vertical memory device includes channels 252, a first tunnel insulation layer pattern 192, a first charge storage layer pattern 182, a first blocking layer pattern 172, a second blocking layer pattern 202, a first barrier layer pattern 302, a first filling layer pattern 322 and first gate electrodes 342, 344 and 346.

That is, in accordance with an embodiment of the inventive concept, the vertical memory device includes the first barrier layer pattern 302 as a barrier layer pattern structure, and does not include a second barrier layer pattern.

Thus, an outer sidewall of the first filling layer pattern 322 makes direct contact with a corresponding first gate electrode of the first gate electrodes 342, 344 and 346. Additionally, upper and lower surfaces of the first gate electrodes 342, 344 and 346 are at least partially covered by the first barrier layer pattern 302 so that the first barrier layer pattern 302 makes direct contact with a corresponding first gate electrode of the first gate electrodes 342, 344 and 346.

In the vertical memory device, the first gate electrodes 342, 344 and 346 are electrically connected to the first barrier layer pattern 302, the first barrier layer pattern 302 making contact with the second blocking layer pattern 202 without the second barrier layer pattern 312.

Figure 27:
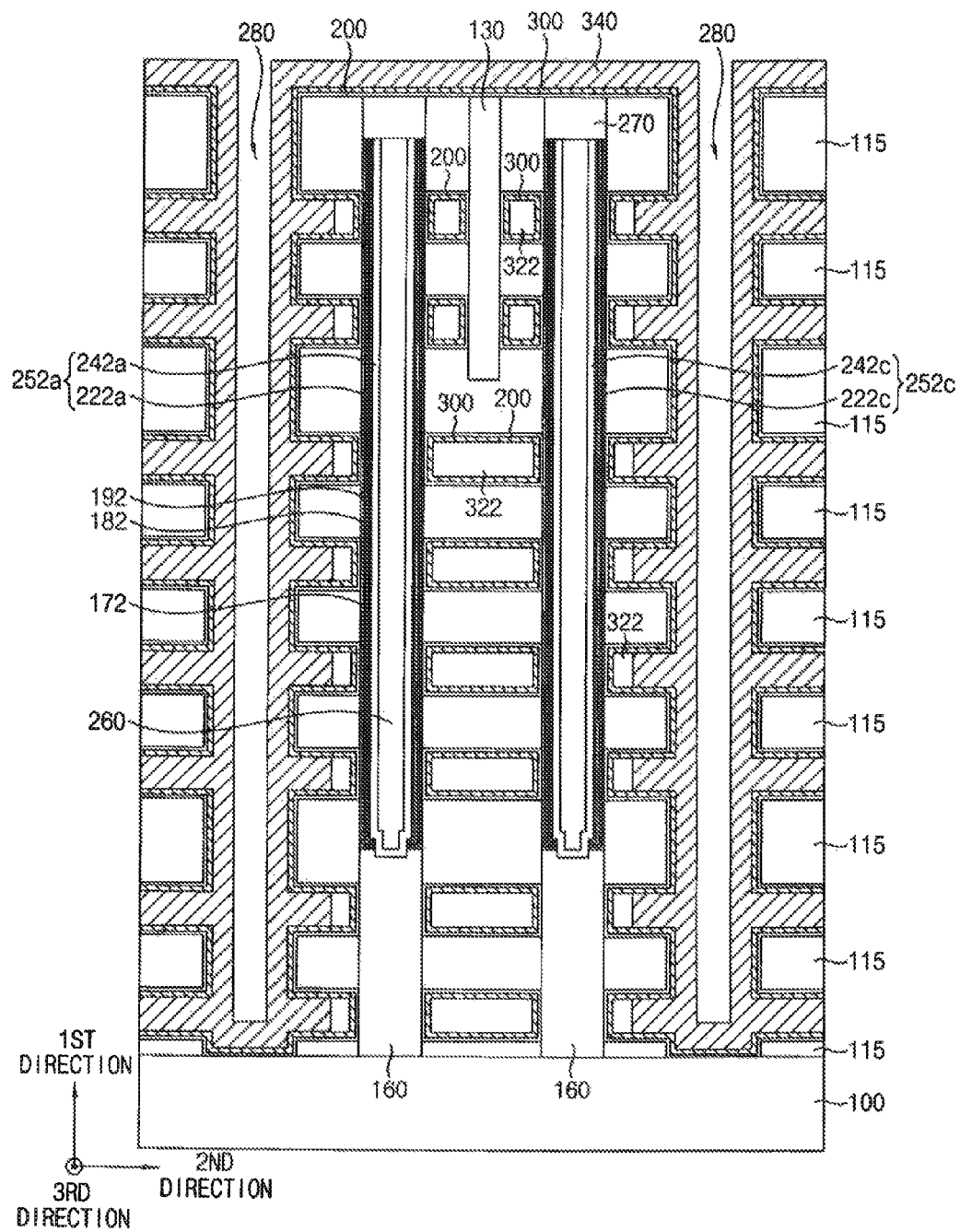
FIG. 27 is a cross-sectional view illustrating a method of manufacturing the vertical memory device of FIGS. 23 to 26 in accordance with example embodiments.

FIG. 27 is a cross-sectional view illustrating a method of manufacturing the vertical memory device of FIGS. 23 to 26.

Processes substantially the same as or similar to those illustrated with reference to FIGS. 6 to 18 may be performed to form a first filling layer pattern 322.

Referring to FIG. 27, a gate electrode layer 340 is formed on an outer sidewall of the first filling layer pattern 322 and the first barrier layer 300 to sufficiently fill remaining portions of the gaps 290.

Processes substantially the same as or similar to those illustrated with reference to FIGS. 20, 21 and 2 may then be performed to manufacture the vertical memory device.

Figure 28:
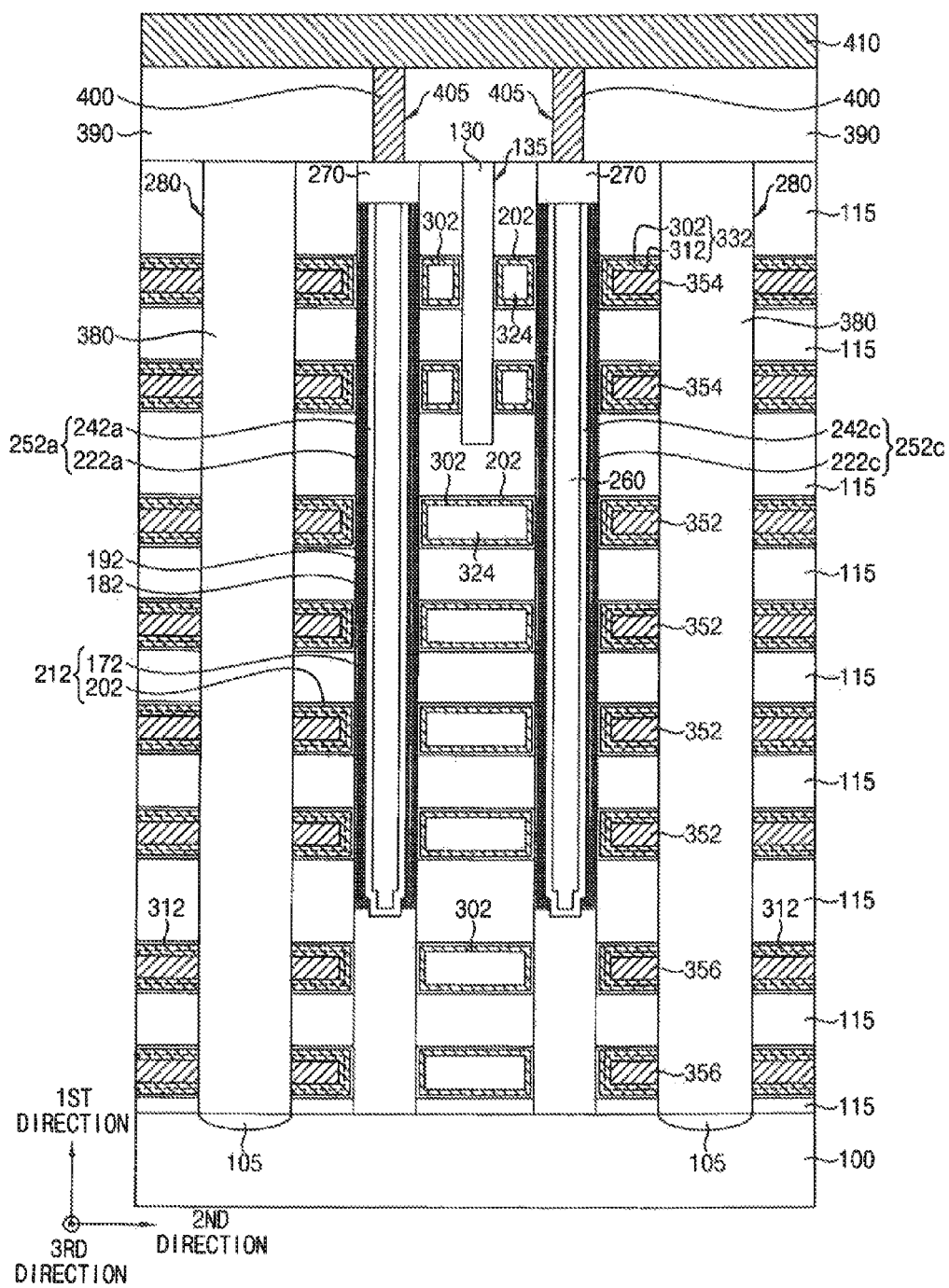
FIG. 28 is a vertical cross-sectional view illustrating a vertical memory device in accordance with example embodiments.
Figure 29:
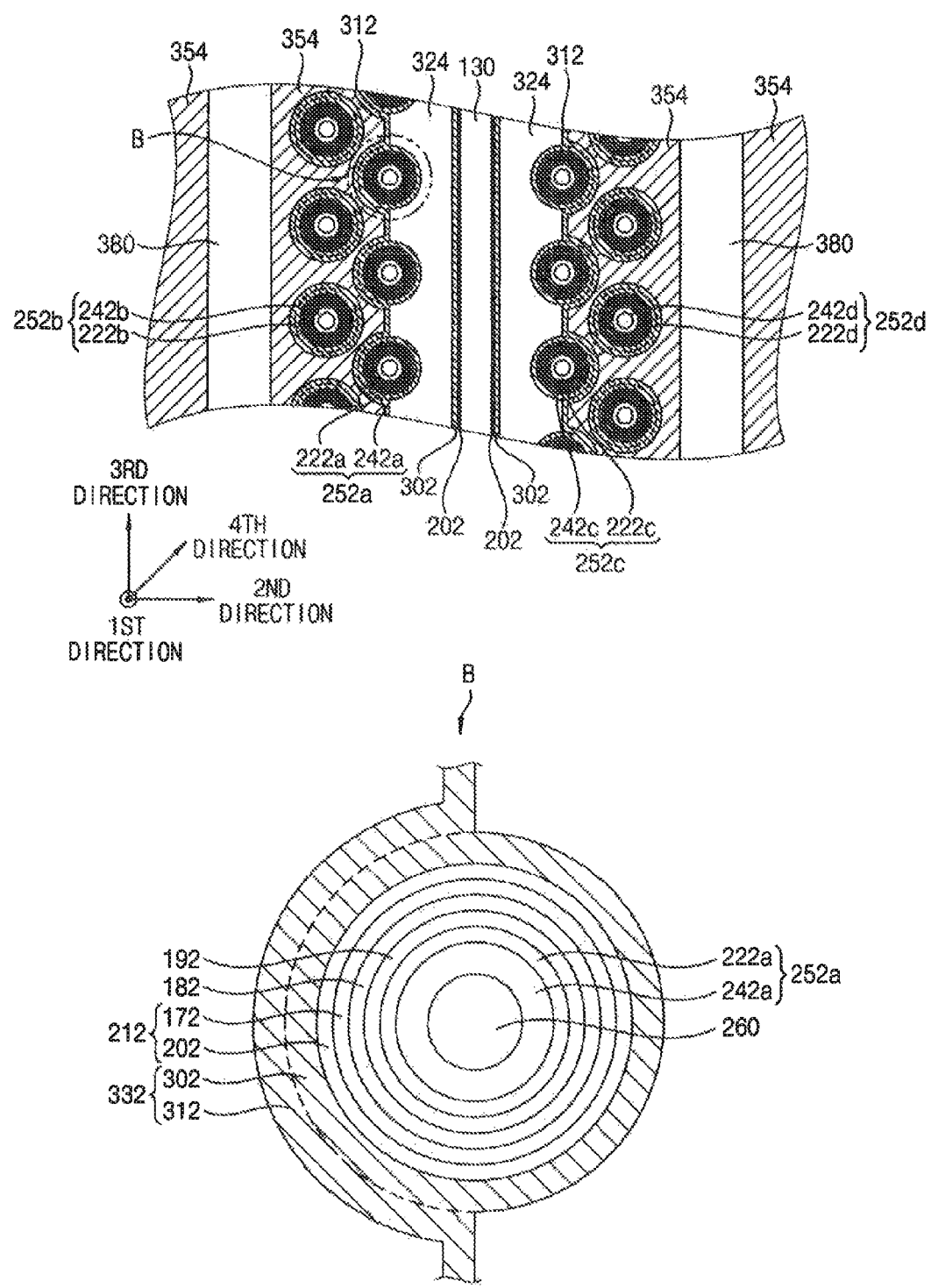

FIG. 28 is a vertical cross-sectional view illustrating a vertical memory device in accordance with example embodiments, FIGS. 29 and 30 are horizontal cross-sectional views of the semiconductor device in FIG. 28, and FIG. 31 is a localized perspective diagram of the semiconductor device in FIG. 28. The vertical memory device may be substantially the same as that of FIGS. 1 to 5, except for a filling layer pattern and a gate electrode.

Referring to FIGS. 28 to 31, the vertical memory device includes channels 252, a first tunnel insulation layer pattern 192, a first charge storage layer pattern 182, a first blocking layer pattern 172, a second blocking layer pattern 202, a first barrier layer pattern 302, a second barrier layer pattern 312, a second filling layer pattern 324 and second gate electrodes 352, 354 and 356.

The second filling layer pattern 324 is formed on the first barrier layer pattern 302 to fill portions of the centrally located gaps 290 between the first openings 280. In example embodiments, the second filling layer pattern 324 extends in the third direction.

In example embodiments, the second filling layer pattern 324 partially covers sidewalls of the second structures including the first and third channels 252a and 252c, respectively, exposed by the gaps 290. That is, the second filling layer pattern 324 cover the gaps 290 from a central portion to portions of the sidewalls of the first and third channels 252a and 252c along the second direction.

The second gate electrodes 352, 354 and 356 are formed on an outer sidewall of the second filling layer pattern 324 to fill edge portions of the gaps 290 between the first openings 280, e.g., portions of the gap 290 adjacent to the first openings 280. In example embodiments, the second gate electrodes 352, 354 and 356 extend in the third direction.

The second gate electrodes 352, 354 and 356 fill remaining portions of the gaps 290 that are not be filled with the second filling layer pattern 324. As a result, the second gate electrodes 352, 354 and 356 partially cover a sidewall of the second structures including the first and third channels 252a and 252c, respectively, and surround portions of the sidewalls of the second structure including the second and fourth channels 252b and 252d, respectively.

The second barrier layer pattern 312 covers a sidewall, an upper surface and a lower surface of the second gate electrodes 352, 354 and 356, and contacts the first barrier layer pattern 302.

As described above, the first tunnel insulation layer pattern 192, the first charge storage layer pattern 182, the first blocking layer pattern structure 212, the first barrier layer pattern 302, the second barrier layer pattern 312 and a corresponding second gate electrode of the second gate electrodes 352, 354 and 356 are sequentially stacked on the outer sidewall of each of the first and third channels 252a and 252c toward the edge portions of the gaps 290 in the second direction. Additionally, the first tunnel insulation layer pattern 192, the first charge storage layer pattern 182, the first blocking layer pattern structure 212, the first barrier layer pattern 302 and the second filling layer pattern 324 are sequentially stacked on the outer sidewall of each of the first and third channels 252a and 252c toward the interior gaps 290 in the second direction.

The first tunnel insulation layer pattern 192, the first charge storage layer pattern 182, the first blocking layer pattern structure 212, the first barrier layer pattern 302, the second barrier layer pattern 312 and a corresponding second gate electrode of the second gate electrodes 352, 354 and 356 are sequentially stacked on the outer sidewall of each of the second and fourth channels 252b and 252d toward the edge portions of the gaps 290 in the second direction (the gaps 290 on exterior sides of the channels in FIG. 28). Additionally, the first tunnel insulation layer pattern 192, the first charge storage layer pattern 182, the first blocking layer pattern structure 212, the first barrier layer pattern 302, the second gate electrodes 352, 354 and 356, and the second filling layer pattern 324 are sequentially stacked on the outer sidewalls of each of the second and fourth channels 252b and 252d toward the central portion of the gaps 290 in the second direction (the gaps 290 on interior sides of the channels in FIG. 28).

Figure 32:
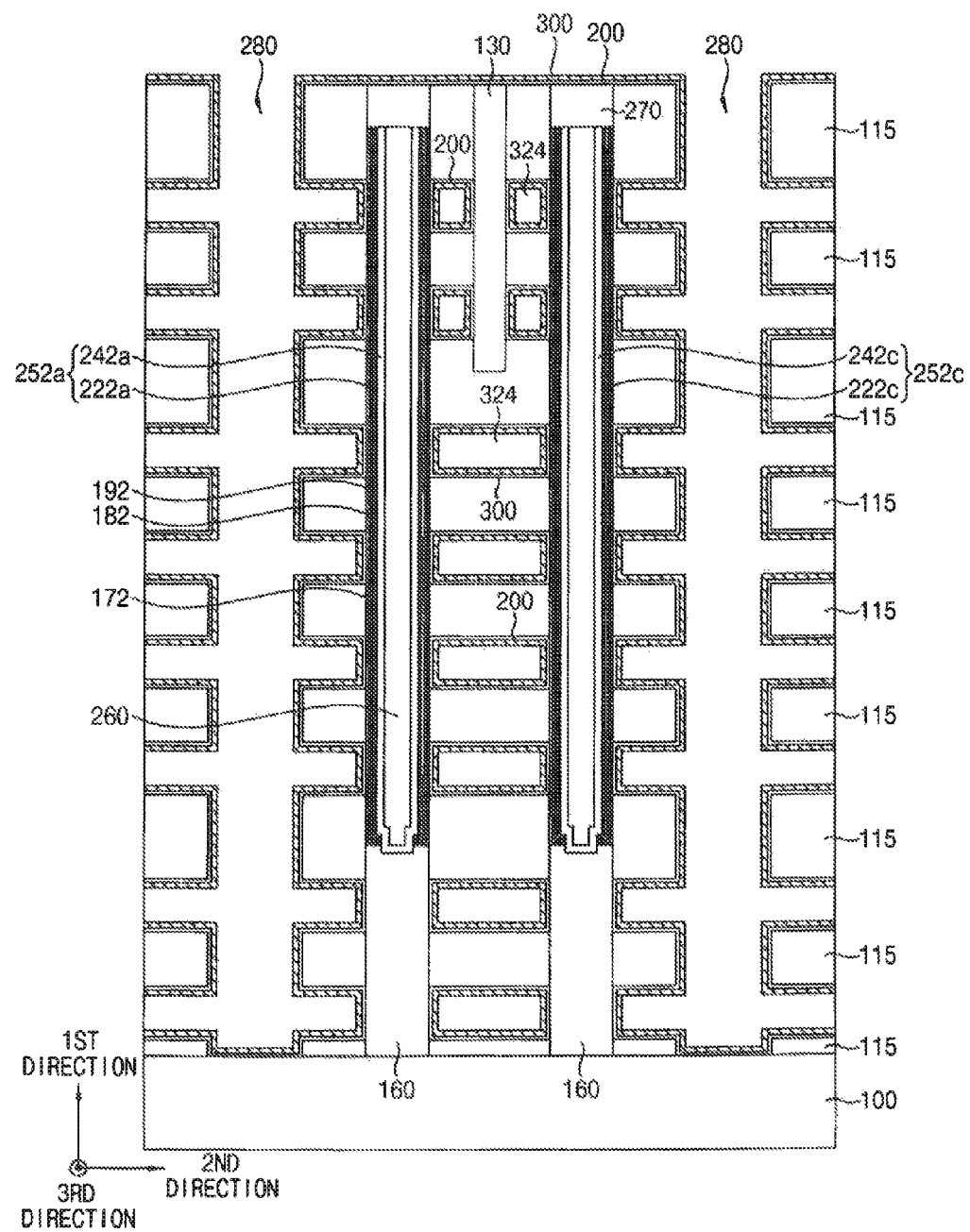
FIG. 32 is a cross-sectional view illustrating a method of manufacturing the vertical memory device of FIGS. 28 to 31 in accordance with example embodiments.

FIG. 32 is a cross-sectional view illustrating a method of manufacturing the vertical memory device of FIGS. 28 to 31.

Processes substantially the same as or similar to those illustrated with reference to FIGS. 6 to 16 can be performed to form a filling layer 320.

Referring to FIG. 32, the filling layer 320 is removed to form a second filling layer pattern 324 partially filling the gaps 290.

In example embodiments, the filling layer 320 is partially removed using an aqueous ammonia solution as an etch solution by a wet etch process to form the second filling layer pattern 324 extending in the third direction.

In example embodiments, the wet etch process is performed to a degree at which portions of the second blocking layer 200 and the first barrier layer 300 on outer sidewalls of the second and fourth holes 150b and 150d are exposed and portions of the second blocking layer 200 and the first barrier layer 300 on outer sidewalls of the first and third holes 150a and 150c are partially exposed.

Processes substantially the same as or similar to those illustrated with reference to FIGS. 19 to 21 and 2 may then be performed.

Figure 33:
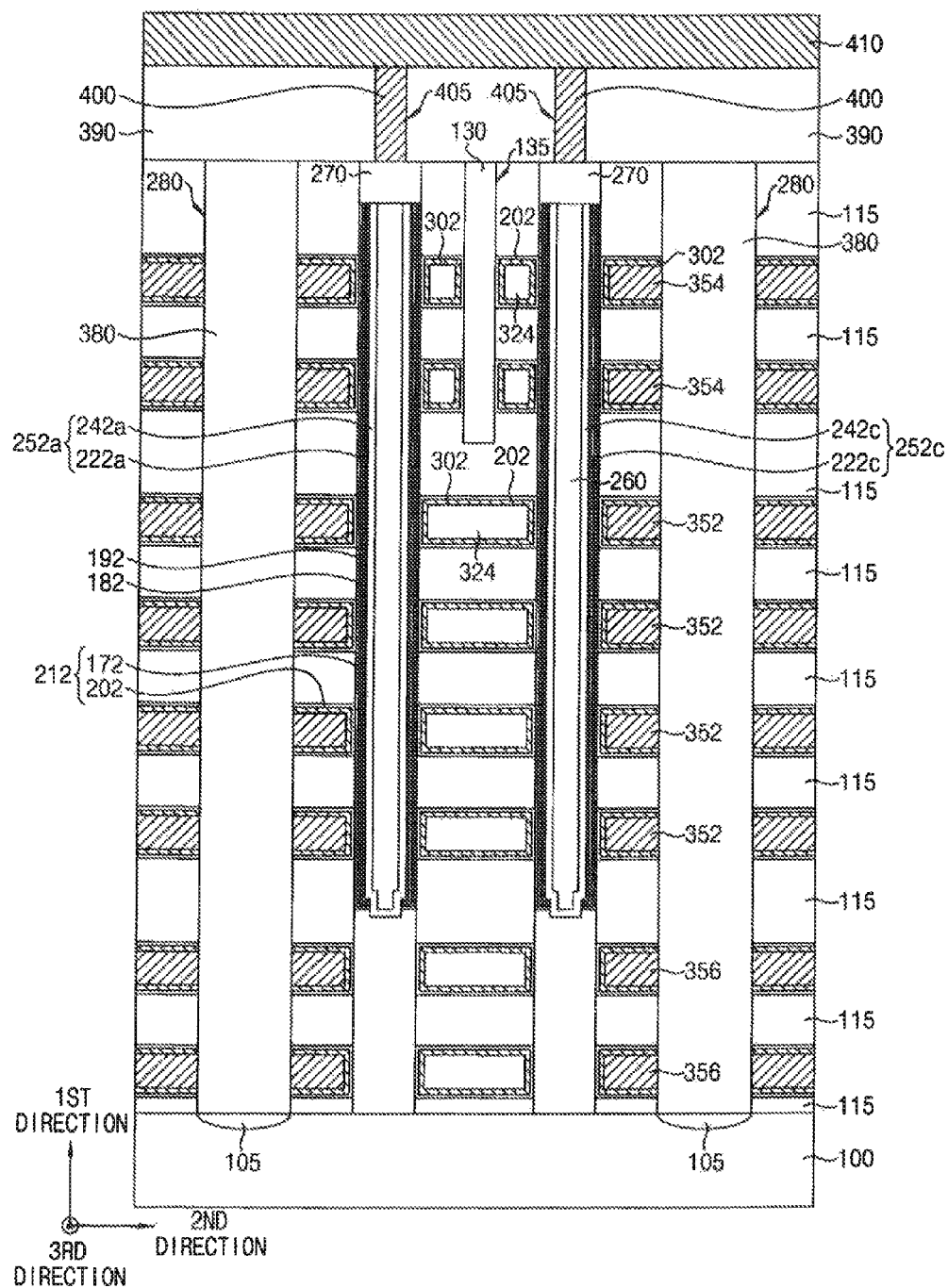
FIG. 33 is a vertical cross-sectional view illustrating a vertical memory device in accordance with example embodiments.
Figure 34:
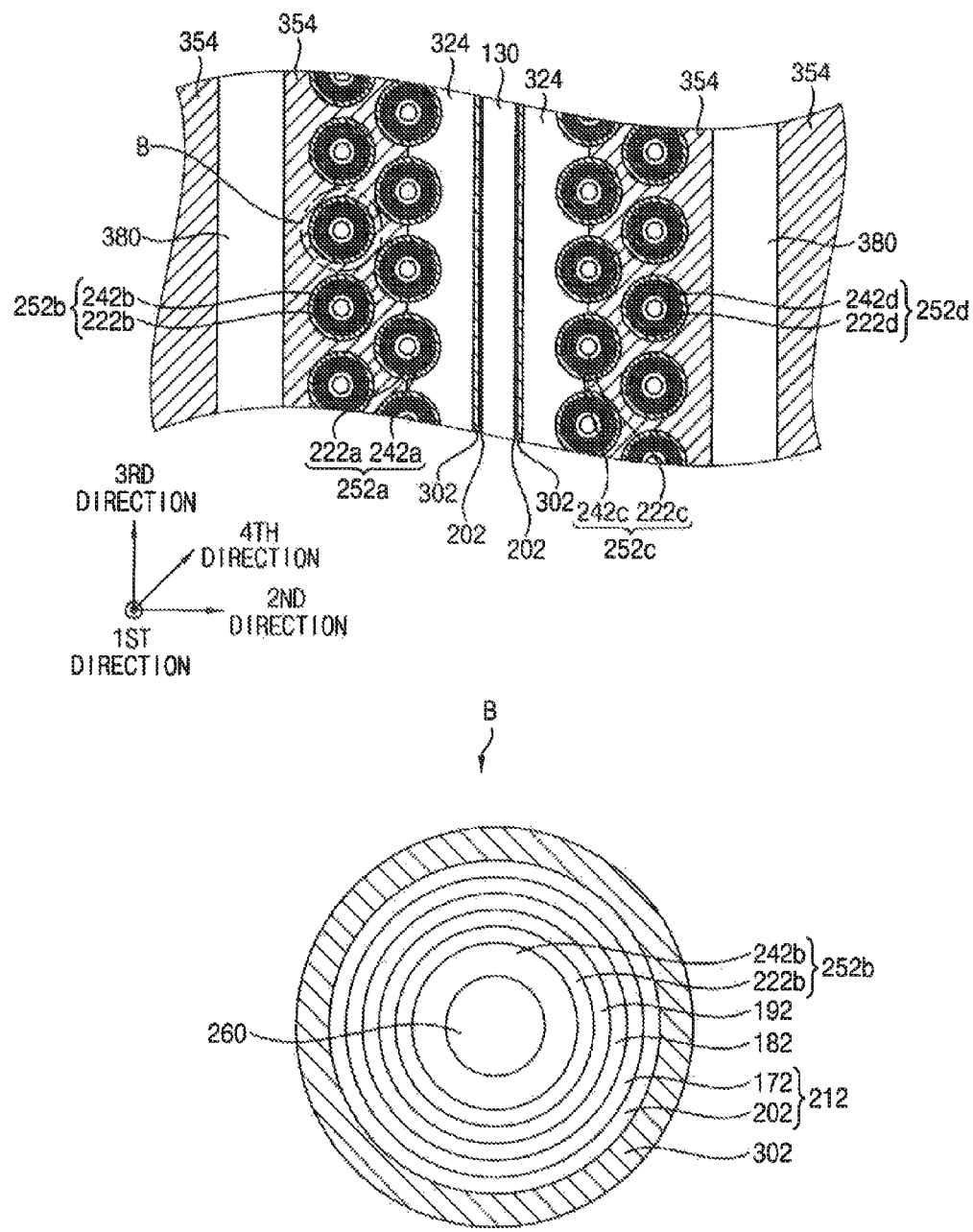

FIG. 33 is a vertical cross-sectional view illustrating a vertical memory device in accordance with example embodiments, FIGS. 34 and 35 are horizontal cross-sectional views of the semiconductor device in FIG. 33, and FIG. 36 is a localized perspective diagram of the semiconductor device in FIG. 33. The vertical memory device may be substantially the same as that of FIGS. 28 to 31, except for a barrier layer pattern.

Referring to FIGS. 33 to 36, the vertical memory device includes channels 252, a first tunnel insulation layer pattern 192, a first charge storage layer pattern 182, a first blocking layer pattern 172, a second blocking layer pattern 202, a first barrier layer pattern 302, a second filling layer pattern 324 and second gate electrodes 352, 354 and 356.

The vertical memory device includes the first barrier layer pattern 302 as a barrier layer pattern structure, and does not include a second barrier layer pattern.

In accordance with an embodiment of the inventive concept, an outer sidewall of the second filling layer pattern 324 makes direct contact with a corresponding second gate electrode of the second gate electrodes 352, 354 and 356. Additionally, upper and lower surfaces of the second gate electrodes 352, 354 and 356 are at least partially covered by the first barrier layer pattern 302 so that the first barrier layer pattern 302 makes direct contact with a corresponding second gate electrode of the second gate electrodes 352, 354 and 356.

Figure 37:
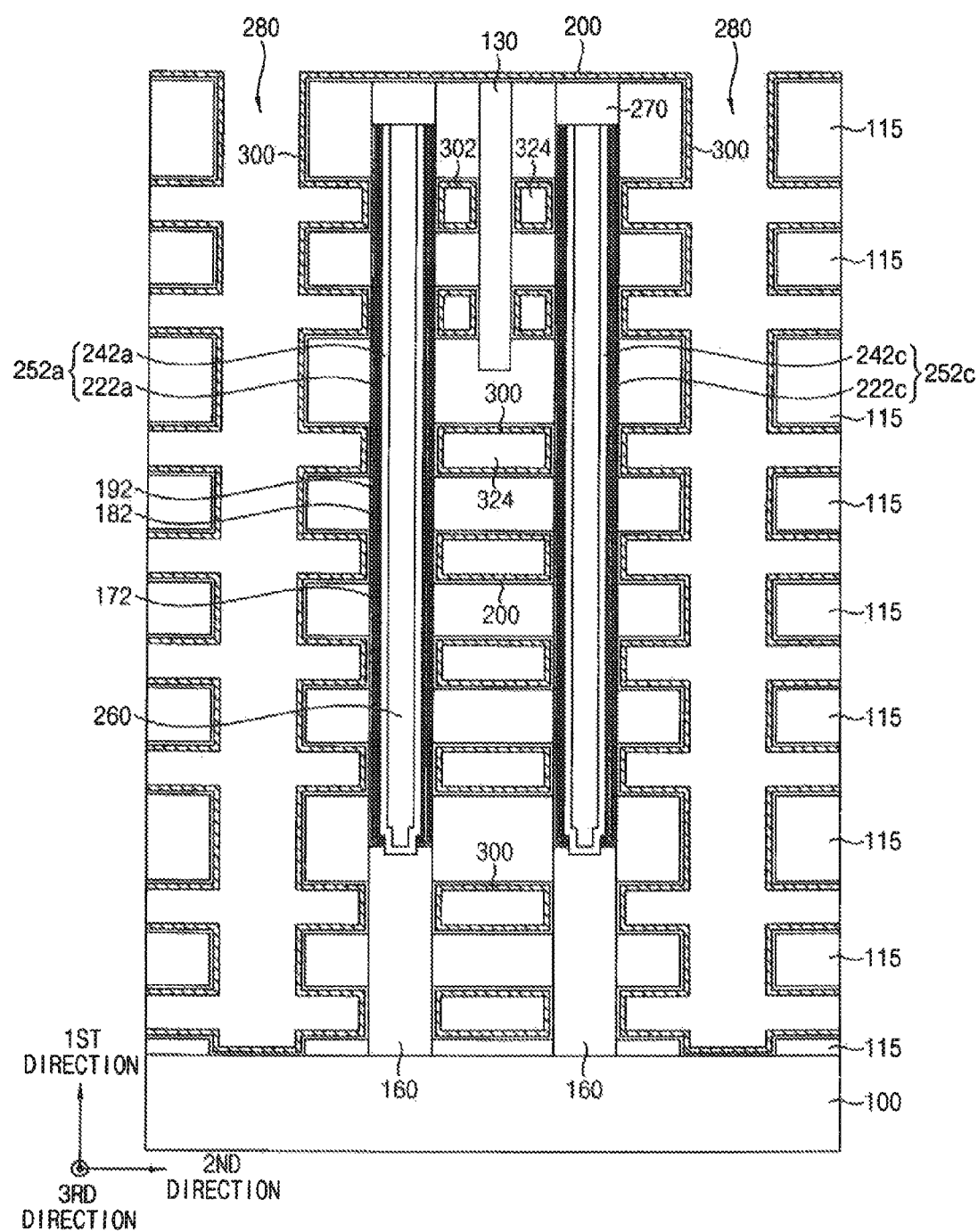
FIG. 37 is a cross-sectional view illustrating a method of manufacturing the vertical memory device of FIGS. 33 to 36 in accordance with example embodiments.

FIG. 37 is a cross-sectional view illustrating a method of manufacturing the vertical memory device of FIGS. 33 to 36.

Processes substantially the same as or similar to those illustrated with reference to FIGS. 6 to 16 can be performed to form a filling layer 320.

Referring to FIG. 37, a process substantially the same as or similar to that illustrated with reference to FIG. 32 can be performed to form a second filling layer pattern 324.

Then, a process substantially the same as or similar to that illustrated with reference to FIG. 27 can be performed to form a gate electrode layer 340.

Processes substantially the same as or similar to that illustrated with reference to FIGS. 20, 21 and 2 can then be performed.

Figure 38:
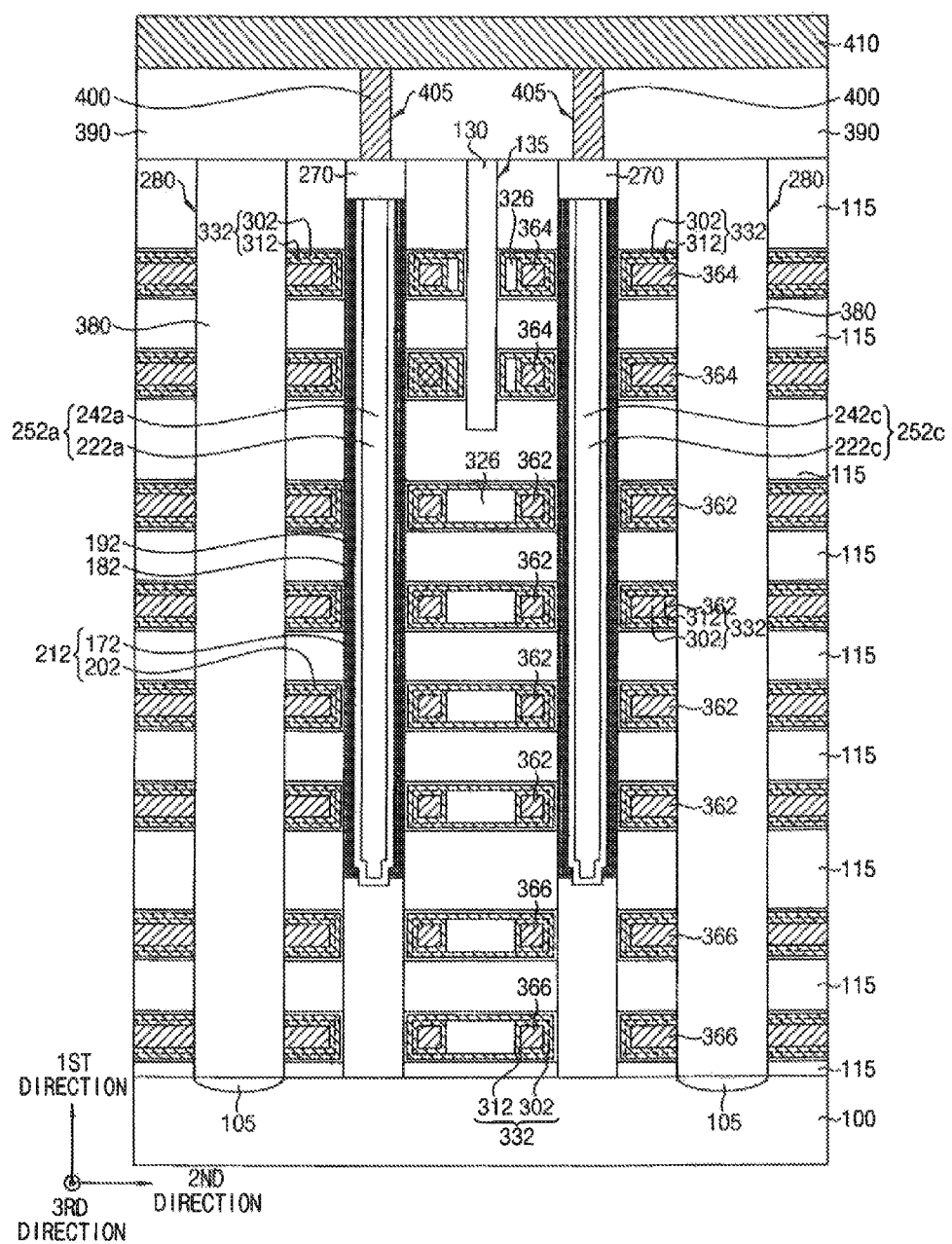
FIG. 38 is a vertical cross-sectional view illustrating a vertical memory device in accordance with example embodiments.

FIG. 38 is a vertical cross-sectional view illustrating a vertical memory device in accordance with example embodiments, FIGS. 39 and 40 are horizontal cross-sectional views of the semiconductor device in FIG. 38, and FIG. 41 is a localized perspective diagram of the semiconductor device in FIG. 38. The vertical memory device may be substantially the same as that of FIGS. 1 to 5, except for a filling layer pattern and a gate electrode.

Referring to FIGS. 38 to 41, the vertical memory device includes channels 252, a first tunnel insulation layer pattern 192, a first charge storage layer pattern 182, a first blocking layer pattern 172, a second blocking layer pattern 202, a first barrier layer pattern 302, a second barrier layer pattern 312, a third filling layer pattern 326 and third gate electrodes 362, 364 and 366.

The third filling layer pattern 326 is formed on the first barrier layer pattern 302 to fill the gaps 290 located at a central portion between the first openings 280. In example embodiments, the third filling layer pattern 326 extends in the third direction.

In example embodiments, the third filling layer pattern 326 does not cover any of the sidewalls of the second structures including the first to fourth channels 252a, 252b, 252c and 252d, respectively, exposed by the gaps 290. That is, as can be seen in FIGS. 38-41, the third filling layer pattern 326 is formed only at central portions of the interior gaps 290 between the first and third channels 252a and 252c.

The third gate electrodes 362, 364 and 366 are formed on an outer sidewall of the third filling layer pattern 326 to fill edge portions of the gaps 290 between the first openings 280, e.g., portions of the gaps 290 adjacent to the first openings 280. In example embodiments, the third gate electrodes 362, 364 and 366 extend in the third direction.

The third gate electrodes 362, 364 and 366 fill remaining portions of the gaps 290 that are not filled with the third filling layer pattern 326. As shown in FIGS. 38-41, the third gate electrodes 362, 364 and 366 surround portions of sidewalls of the second structures including the first to fourth channels 252a, 252b, 252c and 252d, respectively.

The second barrier layer pattern 312 covers a sidewall, an upper surface and a lower surface of the third gate electrodes 362, 364 and 366, and makes contact with the first barrier layer pattern 302.

As described above, the first tunnel insulation layer pattern 192, the first charge storage layer pattern 182, the first blocking layer pattern structure 212, the first barrier layer pattern 302, the second barrier layer pattern 312 and a corresponding third gate electrode of the third gate electrodes 362, 364 and 366 are sequentially stacked on the outer sidewall of each of the first to fourth channels 252a, 252b, 252c and 252d toward the edge portions of the gaps 290 in the second direction (gaps 290 adjacent the openings 280). Additionally, the first tunnel insulation layer pattern 192, the first charge storage layer pattern 182, the first blocking layer pattern structure 212, the first barrier layer pattern 302, the second barrier layer pattern 312, the third gate electrodes 362, 364 and 366, the second barrier layer pattern 312 and the third filling layer pattern 326 are sequentially stacked on the outer sidewall of each of the first to fourth channels 252a, 252b, 252c and 252d toward the gaps 290 located at an interior portion away from the openings 280, in the second direction.

Figure 42:
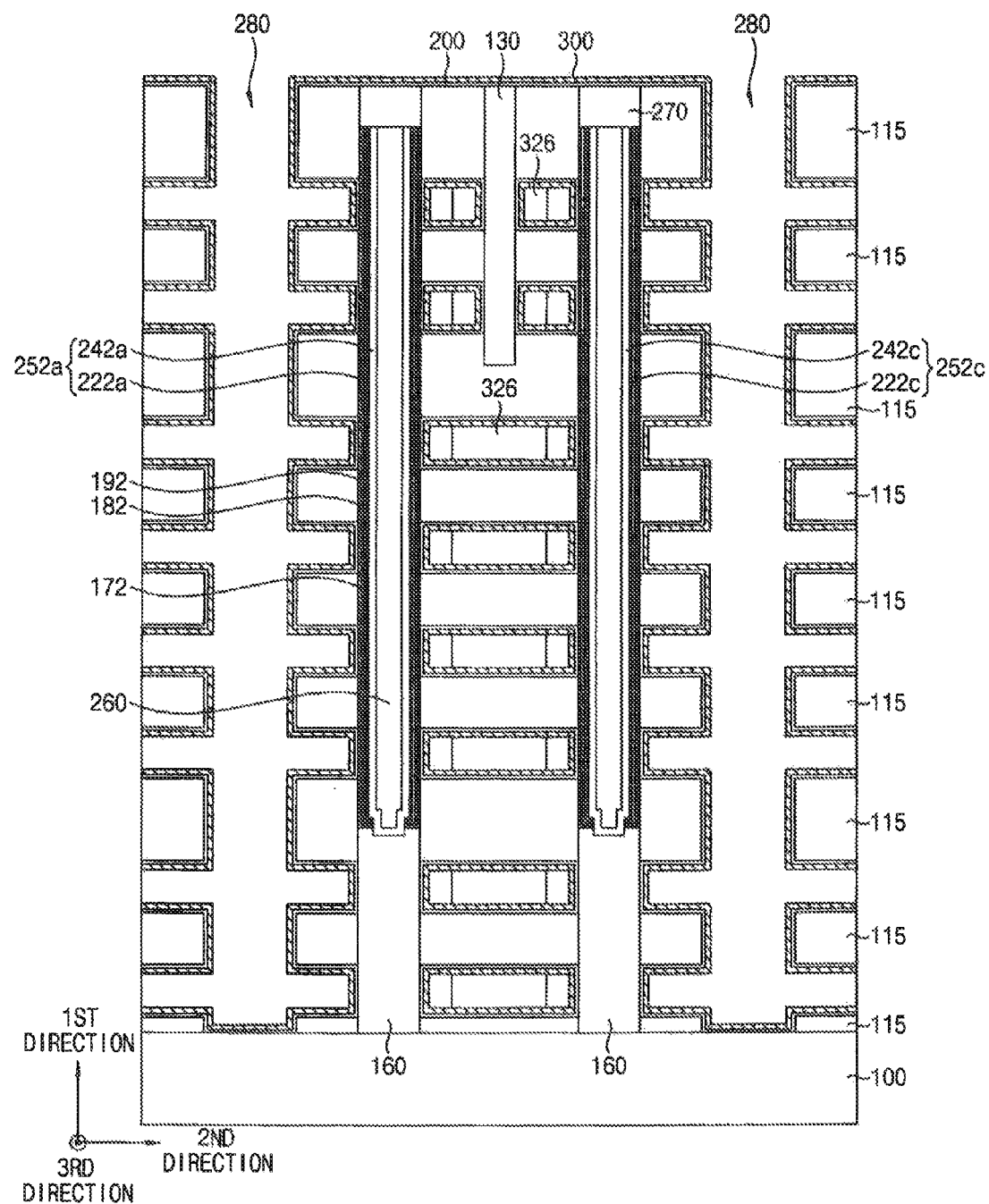
FIG. 42 is a cross-sectional view illustrating a method of manufacturing the vertical memory device of FIGS. 38 to 41 in accordance with example embodiments.

FIG. 42 is a cross-sectional view illustrating a method of manufacturing the vertical memory device of FIGS. 38 to 41.

Processes substantially the same as or similar to those illustrated with reference to FIGS. 6 to 16 can be performed to form a filling layer 320.

Referring to FIG. 42, the filling layer 320 is partially removed to form a third filling layer pattern 326 partially filling the gaps 290 located at an interior portion away from the openings 280.

In example embodiments, the filling layer 320 can be partially removed using aqueous ammonia solution as an etch solution by a wet etch process to form the third filling layer pattern 326 extending in the third direction.

In example embodiments, the wet etch process can be performed to a degree at which portions of the second blocking layer 200 and the first barrier layer 300 on outer sidewalls of the first to fourth holes 150a, 150b, 150c and 150d are exposed.

Processes substantially the same as or similar to those illustrated with reference to FIGS. 19 to 21 and 2 can then be performed.

Figure 43:
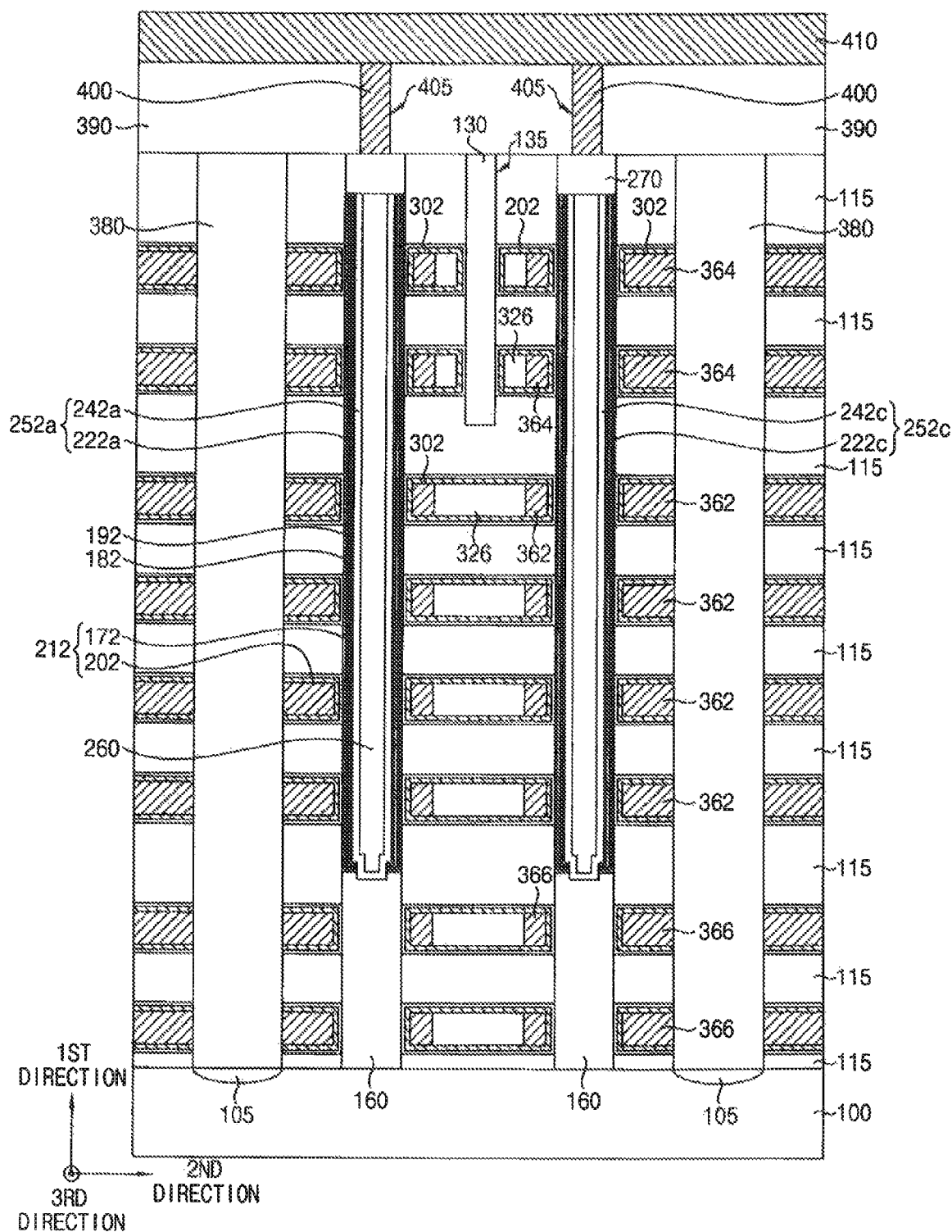
FIG. 43 is a vertical cross-sectional view illustrating a vertical memory device in accordance with example embodiments.

FIG. 43 is a vertical cross-sectional view illustrating a vertical memory device in accordance with example embodiments, FIGS. 44 and 45 are horizontal cross-sectional views of the semiconductor device in FIG. 43, and FIG. 46 is a localized perspective diagram of the semiconductor device in FIG. 43. The vertical memory device may be substantially the same as that of FIGS. 38 to 41, except for a barrier layer pattern.

Referring to FIGS. 43 to 46, the vertical memory device includes channels 252, a first tunnel insulation layer pattern 192, a first charge storage layer pattern 182, a first blocking layer pattern 172, a second blocking layer pattern 202, a first barrier layer pattern 302, a third filling layer pattern 326 and third gate electrodes 362, 364 and 366.

The vertical memory device includes the first barrier layer pattern 302 as a barrier layer pattern structure, and does not include a second barrier layer pattern.

An outer sidewall of the third filling layer pattern 326 makes direct contact with a corresponding third gate electrode of the third gate electrodes 362, 364 and 366. Additionally, upper and lower surfaces of the third gate electrodes 362, 364 and 366 are at least partially covered by the first barrier layer pattern 302 so that the first barrier layer pattern 302 makes direct contact with a corresponding third gate electrode of the third gate electrodes 362, 364 and 366.

Figure 47:
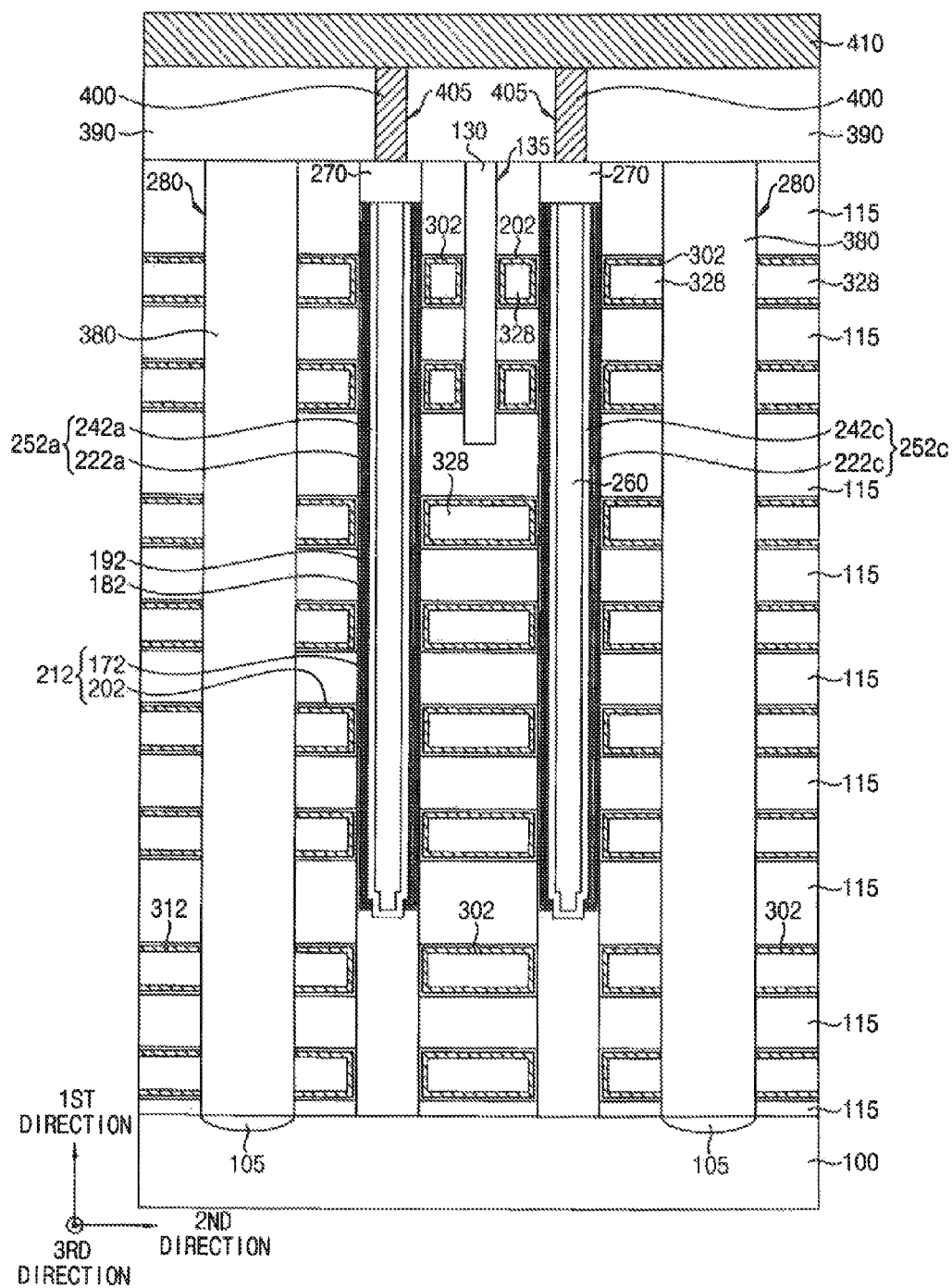
FIG. 47 is a vertical cross-sectional view illustrating a vertical memory device in accordance with example embodiments.
Figure 49:
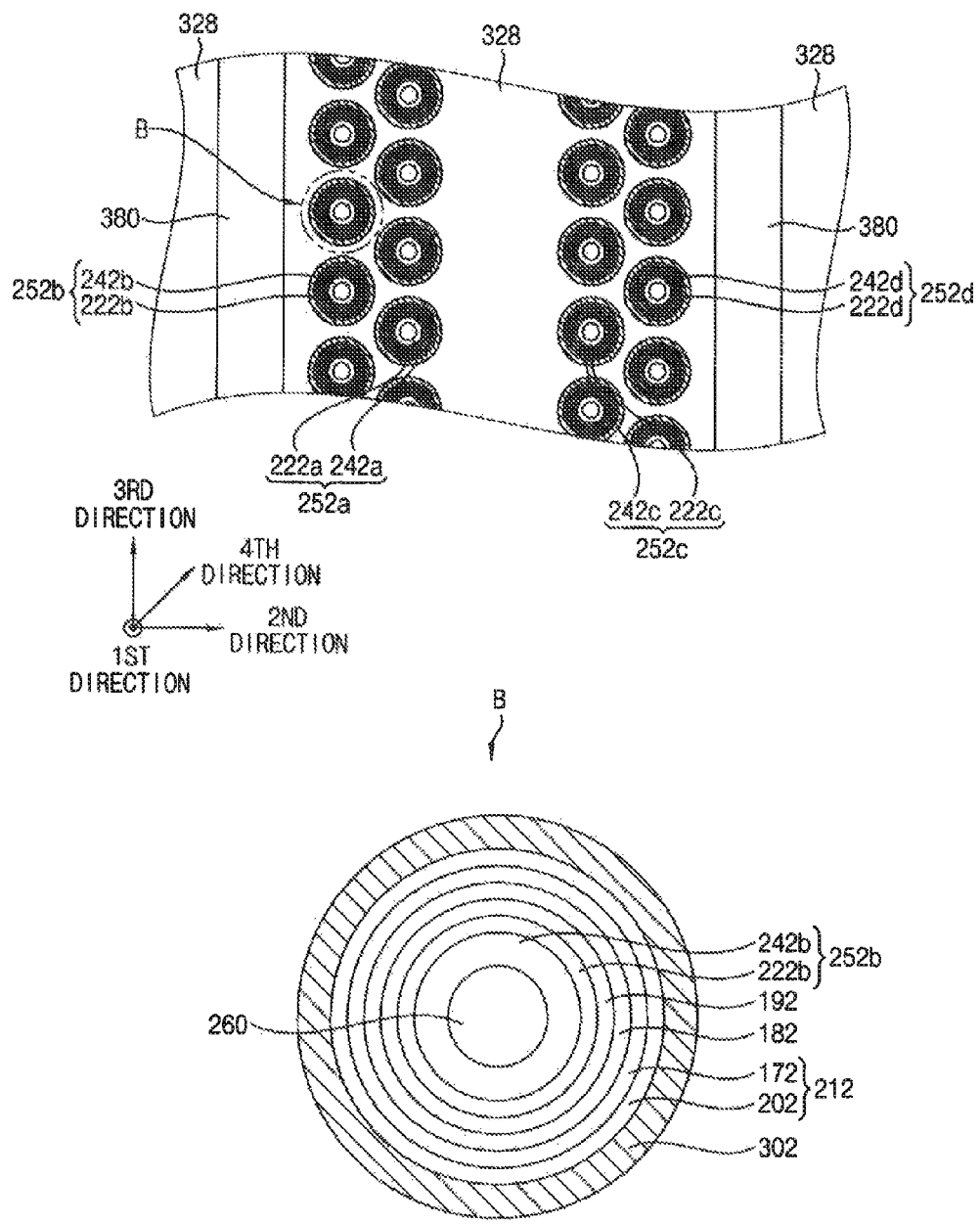

FIG. 47 is a vertical cross-sectional view illustrating a vertical memory device in accordance with example embodiments, FIGS. 48 and 49 are horizontal cross-sectional views of the semiconductor device in FIG. 47, and FIG. 50 is a localized perspective diagram of the semiconductor device in FIG. 47. The vertical memory device may be substantially the same as that of FIGS. 1 to 5, except for a filling layer pattern and a gate electrode.

Referring to FIGS. 47 to 50, the vertical memory device includes channels 252, a first tunnel insulation layer pattern 192, a first charge storage layer pattern 182, a first blocking layer pattern 172, a second blocking layer pattern 202, a first barrier layer pattern 302 and a fourth filling layer pattern 328.

The fourth filling layer pattern 328 is formed on the first barrier layer pattern 302 to fill the gaps 290 between the first openings 280. In example embodiments, the fourth filling layer pattern 328 extends in the third direction.

In example embodiments, the fourth filling layer pattern 328 surrounds portions of sidewalls of the second structures including the first to fourth channels 252a, 252b, 252c and 252d, respectively.

The first tunnel insulation layer pattern 192, the first charge storage layer pattern 182, the first blocking layer pattern structure 212, the first barrier layer pattern 302 and the fourth filling layer pattern 328 are sequentially stacked on the outer sidewall of each of the first to fourth channels 252a, 252b, 252c and 252d in the second direction.

In accordance with an embodiment of the inventive concept, the vertical memory device does not include a metal gate electrode, and the conductive first barrier layer pattern 302 serves as a gate electrode.

Figure 51:
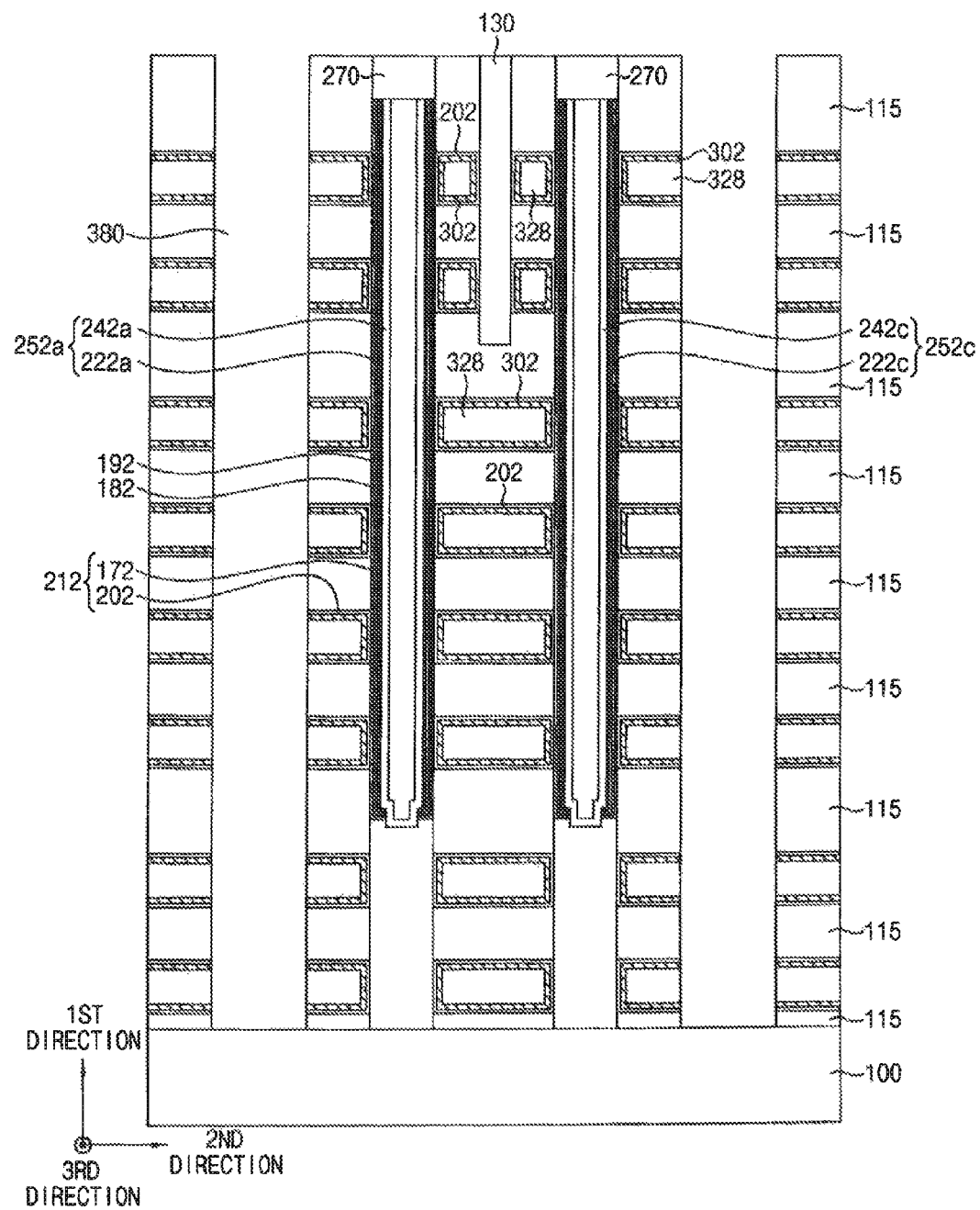
FIG. 51 is a cross-sectional view illustrating a method of manufacturing the vertical memory device of FIGS. 47 to 50 in accordance with example embodiments.
Figure 54:
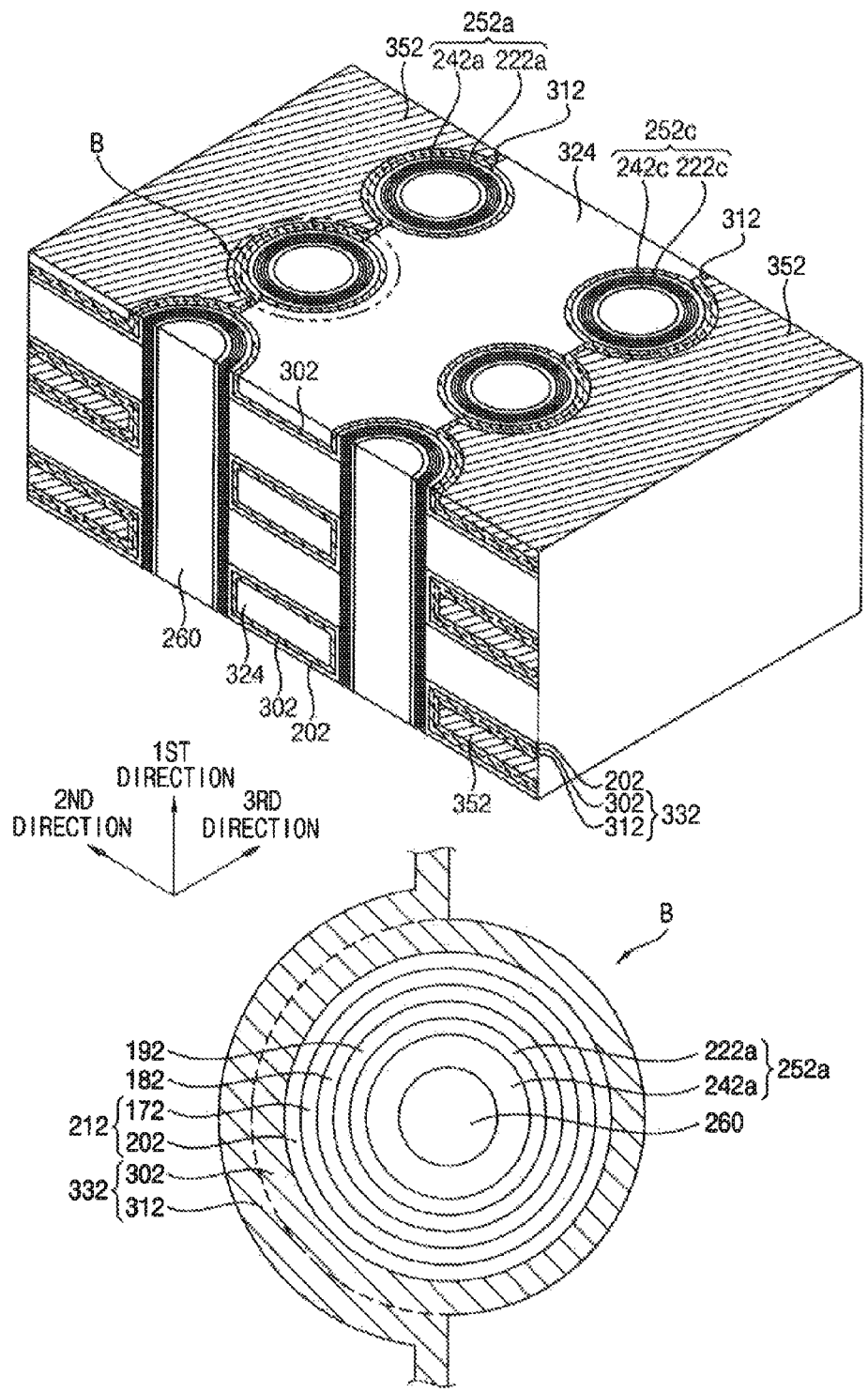

FIG. 51 is a cross-sectional view illustrating a method of manufacturing the vertical memory device of FIGS. 47 to 50.

Processes substantially the same as or similar to those illustrated with reference to FIGS. 6 to 16 can be performed to form a filling layer 320.

Referring to FIG. 51, the filling layer 320 is partially removed to form a fourth filling layer pattern 328 filling the gaps 290.

In example embodiments, the filling layer 320 can be partially removed using aqueous ammonia solution as an etch solution by a wet etch process to form the fourth filling layer pattern 328 extending in the third direction.

In example embodiments, the wet etch process is performed to a degree at which a sidewall of the first insulation layer pattern 115 may be exposed.

Then, processes substantially the same as or similar to that illustrated with reference to FIGS. 20, 21 and 2 may be performed.

FIGS. 52 to 58 are localized perspective diagrams illustrating semiconductor devices in accordance with example embodiments. The vertical memory devices may be substantially the same as those of FIGS. 5, 26, 31, 36, 41 and 46, respectively, except for a layout of channels.

Each of the vertical memory devices of FIGS. 52 to 58 includes a channel array including first and third channels 252a and 252c. That is, the channel array includes a first channel column having a plurality of first channels 252a arranged in the third direction and a third channel column being spaced apart from the first channel column in the second direction and having a plurality of third channels 252c arranged in the third direction, and does not include the second and fourth channel columns (refer to FIG. 5), unlike the vertical memory device of FIG. 5. In this case, the channel array does not have channels arranged in a zigzag pattern, and the channels 252a and 252c are spaced apart from each other in the second direction.

Accordingly, referring to FIGS. 52-58, the channels 252a and 252c in the same channel set are covered by or surrounded with to substantially the same degree as each other by the corresponding first to fourth filling layer patterns 322, 324, 326 or 328 and the corresponding first to third gate electrodes 342, 344, 346, 352, 354, 356, 362, 364 and/or 366.

Figure 59:
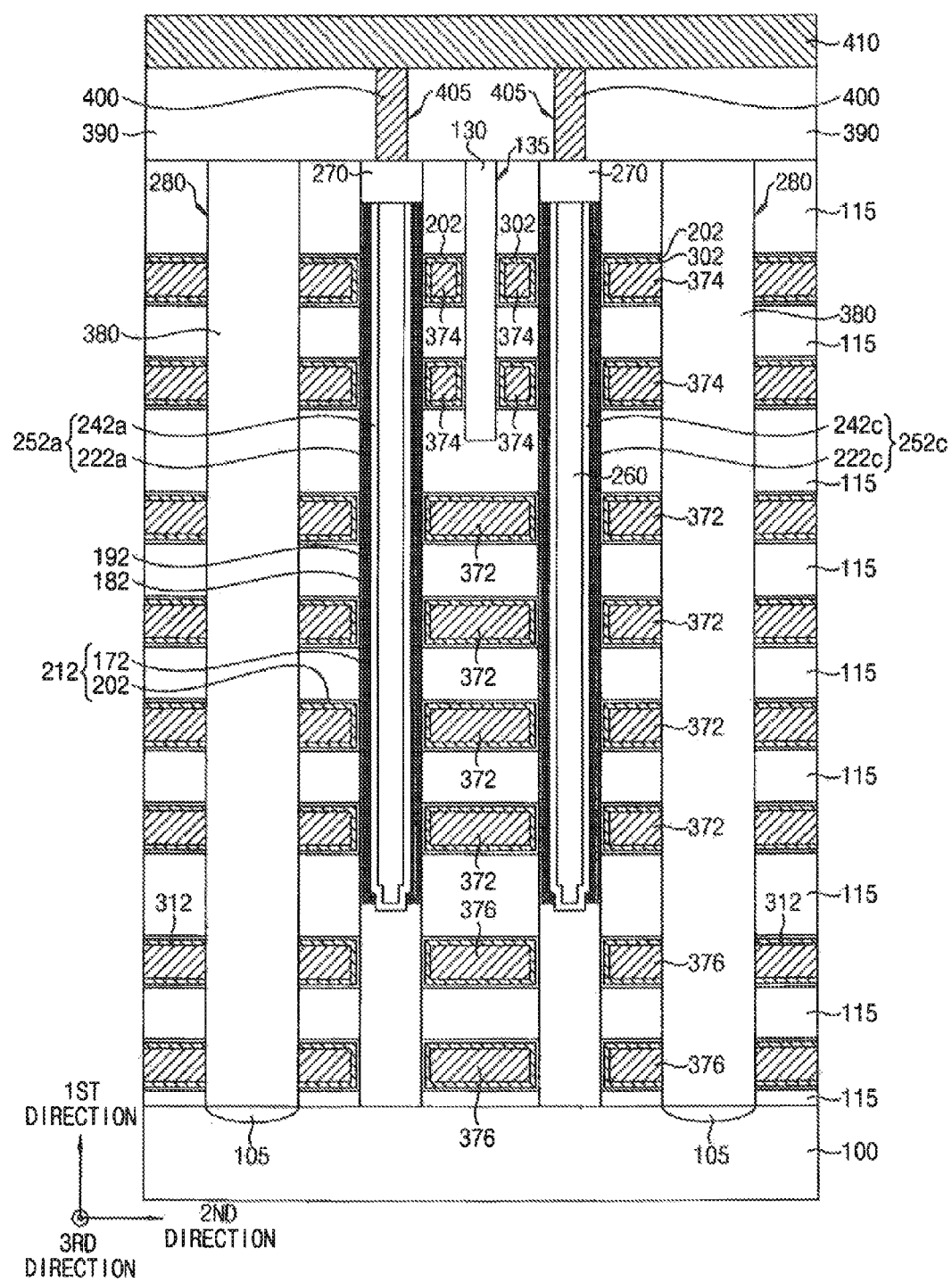
FIG. 59 is a vertical cross-sectional view illustrating a vertical memory device in accordance with example embodiments.

FIG. 59 is a vertical cross-sectional view illustrating a vertical memory device in accordance with example embodiments. The vertical memory device may be substantially the same as that of FIGS. 1 to 5, except for a filling layer pattern and a gate electrode.

Referring to FIG. 59, the vertical memory device includes channels 252, a first tunnel insulation layer pattern 192, a first charge storage layer pattern 182, a first blocking layer pattern 172, a second blocking layer pattern 202, a first barrier layer pattern 302 and fourth gate electrodes 372, 374 and 376.

The fourth gate electrodes 372, 374 and 376 are formed on the first barrier layer pattern 302 to fill the gaps 290 between the first openings 280. In example embodiments, the fourth gate electrodes 372, 374 and 376 extend in the third direction.

In example embodiments, the fourth gate electrodes 372, 374 and 376 surround portions of sidewalls of the second structures including the first to fourth channels 252a, 252b, 252c and 252d, respectively.

In example embodiments, the fourth gate electrodes 372, 374 and 376 can include a metal silicide, e.g., nickel silicide, cobalt silicide, and the like The first tunnel insulation layer pattern 192, the first charge storage layer pattern 182, the first blocking layer pattern structure 212, the first barrier layer pattern 302 and a corresponding fourth gate electrode of the fourth gate electrodes 372, 374 and 376 are sequentially stacked on the outer sidewall of each of the first to fourth channels 252a, 252b, 252c and 252d in the second direction.

In accordance with an embodiment of the inventive concept, the vertical memory device does not have a filling layer pattern, and has the fourth gate electrodes 372, 374 and 376 including a metal silicide, wherein the metal of the fourth gate electrodes 372, 374 and 376 does not include tungsten. As a result, no fluorine gas remains after the formation of the fourth gate electrodes 372, 374 and 376, so that other layer structures are not damaged by the source gas.

The vertical memory device of FIG. 59 can be manufactured as follows.

Processes substantially the same as or similar to those illustrated with reference to FIGS. 6 to 16 can be performed to form a filling layer 320. A process substantially the same as or similar to those illustrated with reference to FIG. 18, FIG. 32 or FIG. 42 can be performed to form a first filling layer pattern 322, a second filling layer pattern 324 or a third filling layer pattern 326. A process substantially the same as or similar to those illustrated with reference to FIG. 27 can be performed to form a gate electrode layer 340 making contact with one of the first, second and third filling layer patterns 322, 324 and 326. The gate electrode layer 340 may be formed to include a metal, e.g., nickel, cobalt, and the like. A heat treatment may be performed so that the gate electrode layer 340 and one of the first, second and third filling layer patterns 322, 324 and 326 are reacted with each other to form a metal silicide layer. Processes substantially the same as or similar to that illustrated with reference to FIGS. 20, 21 and 2 may then be performed to manufacture the vertical memory device.

Figure 60:
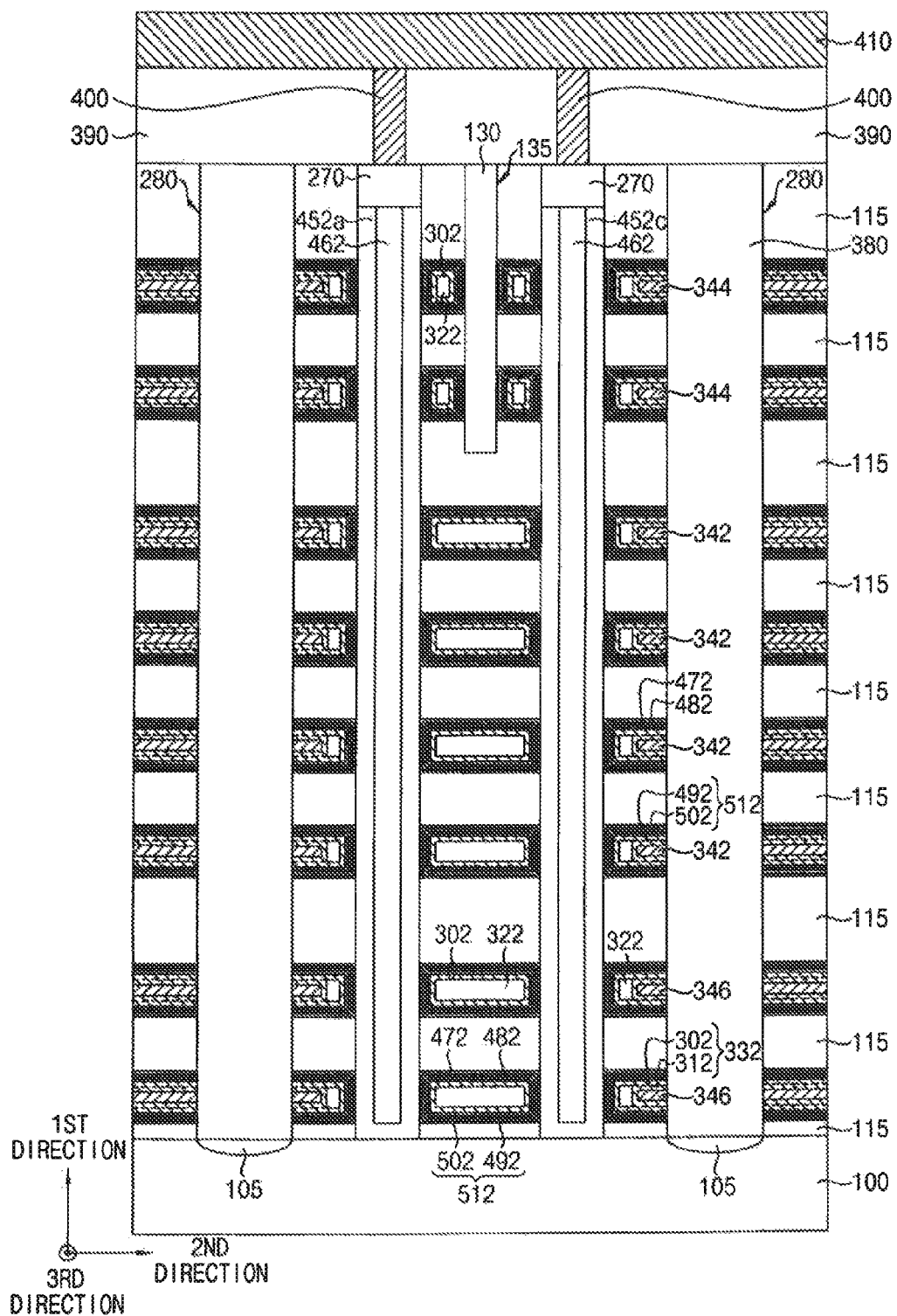
FIG. 60 is a vertical cross-sectional view of a semiconductor device in accordance with example embodiments.
Figure 63B:
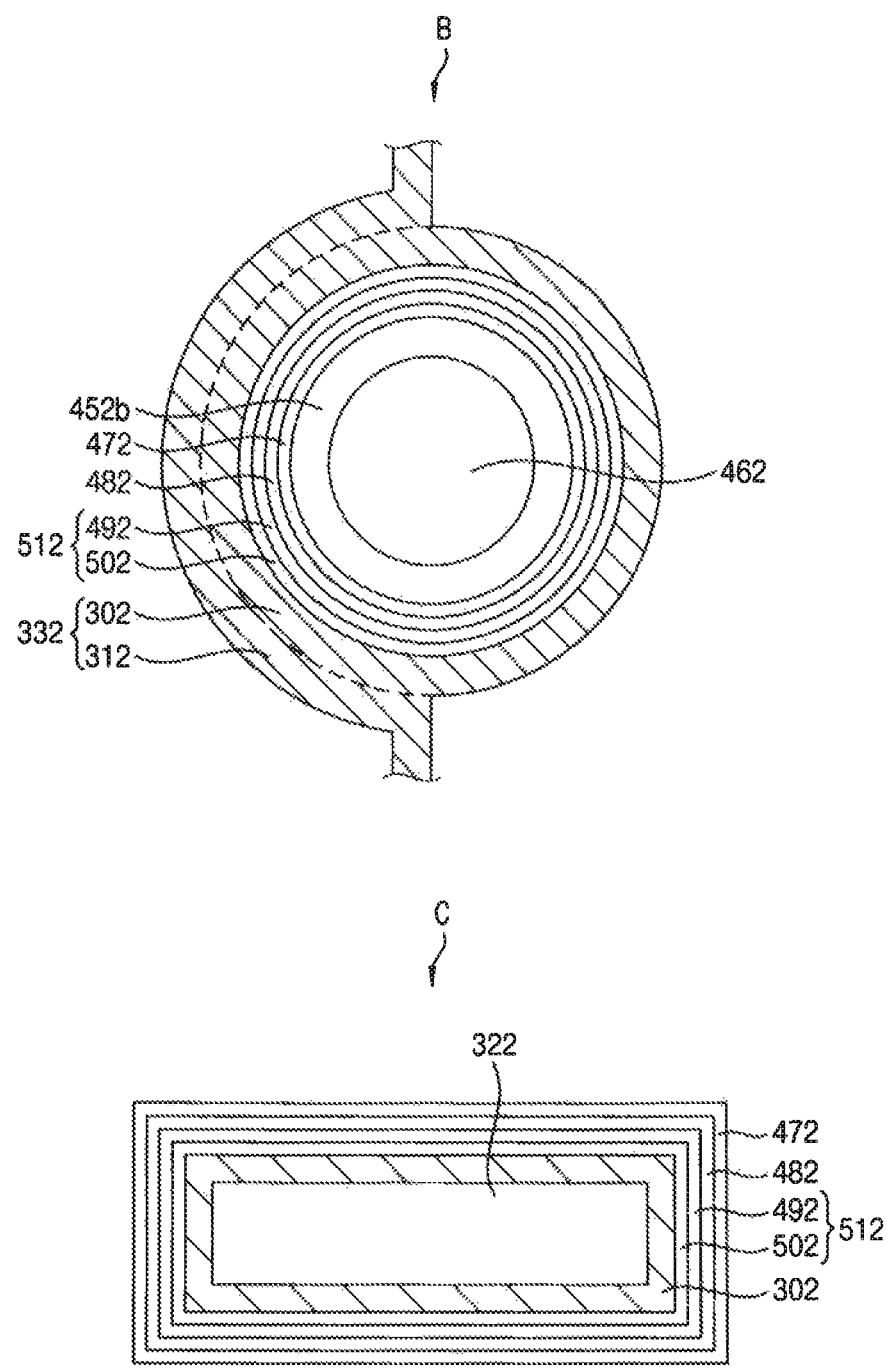
FIG. 63B shows enlarged views of portions B and C of FIG. 63A.

FIG. 60 is a vertical cross-sectional view of a semiconductor device in accordance with example embodiments, FIGS. 61 and 62 are horizontal cross-sectional views of the semiconductor device, and FIG. 63 is a localized perspective diagram of the semiconductor device. Particularly, FIG. 63B is an enlarged view of regions B and C of FIG. 63A. The vertical memory device may be substantially the same as that of FIGS. 1 to 5, except for a tunnel insulation layer pattern, a charge storage layer pattern and a blocking layer pattern.

Referring to FIGS. 60 to 63, the vertical memory device includes channels 452, a second tunnel insulation layer pattern 472, a second charge storage layer pattern 482, a third blocking layer pattern 492, a fourth blocking layer pattern 502, a first barrier layer pattern 302, a second barrier layer pattern 312, a first filling layer pattern 322 and first gate electrodes 342, 344 and 346.

Each of the channels 452 extend in the first direction. In example embodiments, each channel 452 can have a cup shape.

A space defined by an inner wall of each channel 452 can be filled with a fifth insulation layer pattern 462. The fifth insulation layer pattern 462 can include, for example, an insulating material, e.g., silicon oxide, silicon nitride, and the like. Alternatively, each channel 452 can have a pillar shape, and thus the fifth insulation layer pattern 462 is not formed.

In example embodiments, each channel 452 can include, for example, doped or undoped polysilicon or single crystalline silicon.

In example embodiments, channels 452 define a channel array substantially the same as or similar to that of the channels 252 illustrated with reference to FIGS. 1 to 5. The channel array may have first, second, third and fourth channel columns including first, second, third and fourth channels 452a, 452b, 452c and 452d, respectively.

Each channel 452 and the fifth insulation layer pattern 462 are referred to as a third structure, and a pad 270 is formed on the third structure. The third structure and the pad 270 are referred to as a fourth structure, and a plurality of fourth structures are formed in accordance with the arrangement of the channels 452 included in the fourth structure. Each fourth structure is surrounded by a plurality of first insulation layer patterns 115 disposed at a plurality of levels in the first direction. The first insulation layer patterns 115 are divided into a plurality of first insulation layer pattern sets by a first opening 280 extending in the third direction and penetrating through the first insulation layer patterns 115. A space between the first insulation layer patterns 115 disposed at adjacent levels is referred to as a gap 290.

The second tunnel insulation layer pattern 472, the second charge storage layer pattern 482, the third blocking layer pattern 492 and the fourth blocking layer pattern 502 are sequentially stacked on and surround a portion of a sidewall of the fourth structure, e.g., a portion of an outer sidewall of each channel 452. The second tunnel insulation layer pattern 472, the second charge storage layer pattern 482, the third blocking layer pattern 492 and the fourth blocking layer pattern 502 can also be formed on an inner wall of the gap 290, and thus can extend in both of the second and third directions.

In example embodiments, the second tunnel insulation layer pattern 472 includes an oxide, e.g. silicon oxide, the second charge storage layer pattern 482 includes a nitride, e.g., silicon nitride, the third blocking layer pattern 492 includes an oxide, e.g., silicon oxide, and the fourth blocking layer pattern 502 included a metal oxide, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, and the like.

The third and fourth blocking layer patterns 492 and 502 are referred to as a second blocking layer pattern structure 512.

The first barrier layer pattern 302 is formed on and covers the fourth blocking layer pattern 502 in the gaps 290. As a result, the first barrier layer pattern 302 has a shape similar to that of the fourth blocking layer pattern 502. The first barrier layer pattern 302 surrounds a sidewall of the fourth structure exposed by the gap 290, and top and bottom end portions of the first barrier layer pattern 302 extend in both of the second and third directions.

The second tunnel insulation layer pattern 472, the second charge storage layer pattern 482, the second blocking layer pattern structure 512, the first barrier layer pattern 302, the first filling layer pattern 322, the second barrier layer pattern 312 and the first gate electrodes 342, 344 and 346 can be sequentially formed on an outer sidewall of each of the first and third channels 452a and 452c of the vertical memory device toward the edge portions of the gaps 290 (adjacent the openings 280) in the second direction. Additionally, the second tunnel insulation layer pattern 472, the second charge storage layer pattern 482, the second blocking layer pattern structure 512, the first barrier layer pattern 302 and the first filling layer pattern 322 can be sequentially formed on an outer sidewall of each of the first and third channels 452a and 452c of the vertical memory device toward the central portions of the gaps 290 (interior portion away from the openings 280) in the second direction.

The second tunnel insulation layer pattern 472, the second charge storage layer pattern 482, the second blocking layer pattern structure 512, the first barrier layer pattern 302, the second barrier layer pattern 312 and the first gate electrodes 342, 344 and 346 can be sequentially formed on an outer sidewall of each of the second and fourth channels 452b and 452d of the vertical memory device toward the edge portions of the gaps 290 in the second direction. Additionally, the second tunnel insulation layer pattern 472, the second charge storage layer pattern 482, the second blocking layer pattern structure 512, the first barrier layer pattern 302 and the first filling layer pattern 322 can be sequentially formed on an outer sidewall of each of the second and fourth channels 452b and 452d of the vertical memory device toward the central portions of the gap 290 in the second direction.

The second tunnel insulation layer pattern 472, the second charge storage layer pattern 482, the second blocking layer pattern structure 512 and the first barrier layer pattern 302 extending in the third direction can be sequentially stacked on both sidewalls of the division layer pattern 130. The second tunnel insulation layer pattern 472, the second charge storage layer pattern 482, the second blocking layer pattern structure 512 and the first barrier layer pattern 302 can also be formed on the inner wall of the gap 290. As a result, top and bottom end portions of the second tunnel insulation layer pattern 472, the second charge storage layer pattern 482, the second blocking layer pattern structure 512 and the first barrier layer pattern 302 can extend in the second direction.

Like the vertical memory device described in connection with FIGS. 1-5, the vertical memory device of the embodiment described in connection with FIGS. 60-63 can have reduced defects caused by the remaining fluorine gas.

FIGS. 64 to 68 are vertical cross-sectional views illustrating methods of manufacturing a vertical memory device in accordance with example embodiments. The figures show methods of manufacturing the vertical memory device of FIGS. 60 to 63. However, the illustrated methods are not limited thereto, and may be applied to various vertical memory devices. This method can include processes substantially the same as or similar to those illustrated with reference to FIGS. 6 to 16 and 18 to 21.

Processes substantially the same as or similar to those illustrated with reference to FIGS. 6 to 8 can be performed to form a plurality of holes 150 and expose a top surface of the substrate 100.

Figure 64:
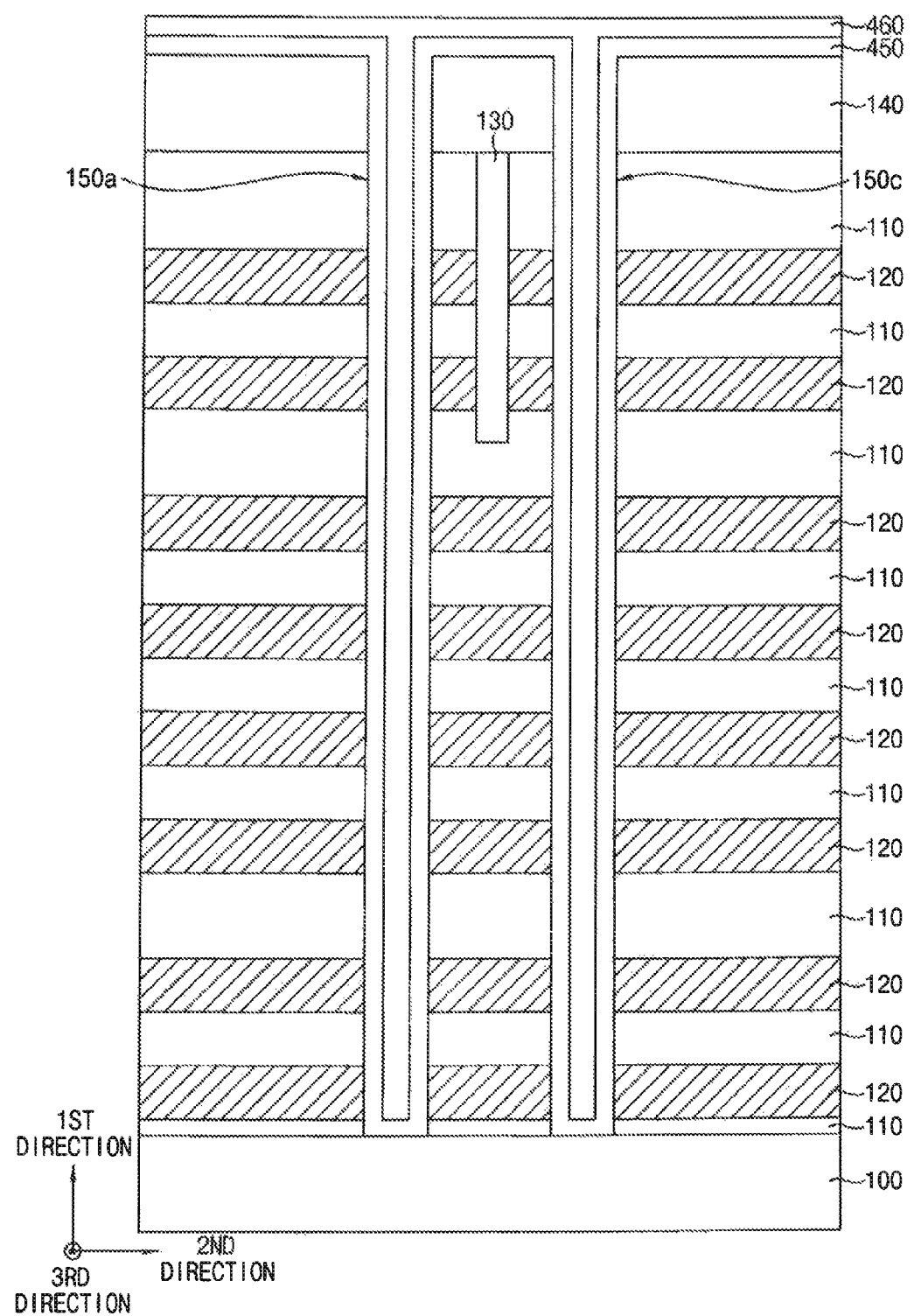
FIGS. 64 to 68 are vertical cross-sectional views illustrating methods of manufacturing a vertical memory device in accordance with example embodiments.

Referring to FIG. 64, a third channel layer 450 is formed on the exposed top surface of the substrate 100, a sidewall of each hole 150 and the hard mask 140.

In example embodiments, the fifth insulation layer 460 includes an insulating material, e.g., silicon oxide, silicon nitride, and the like.

Figure 65:
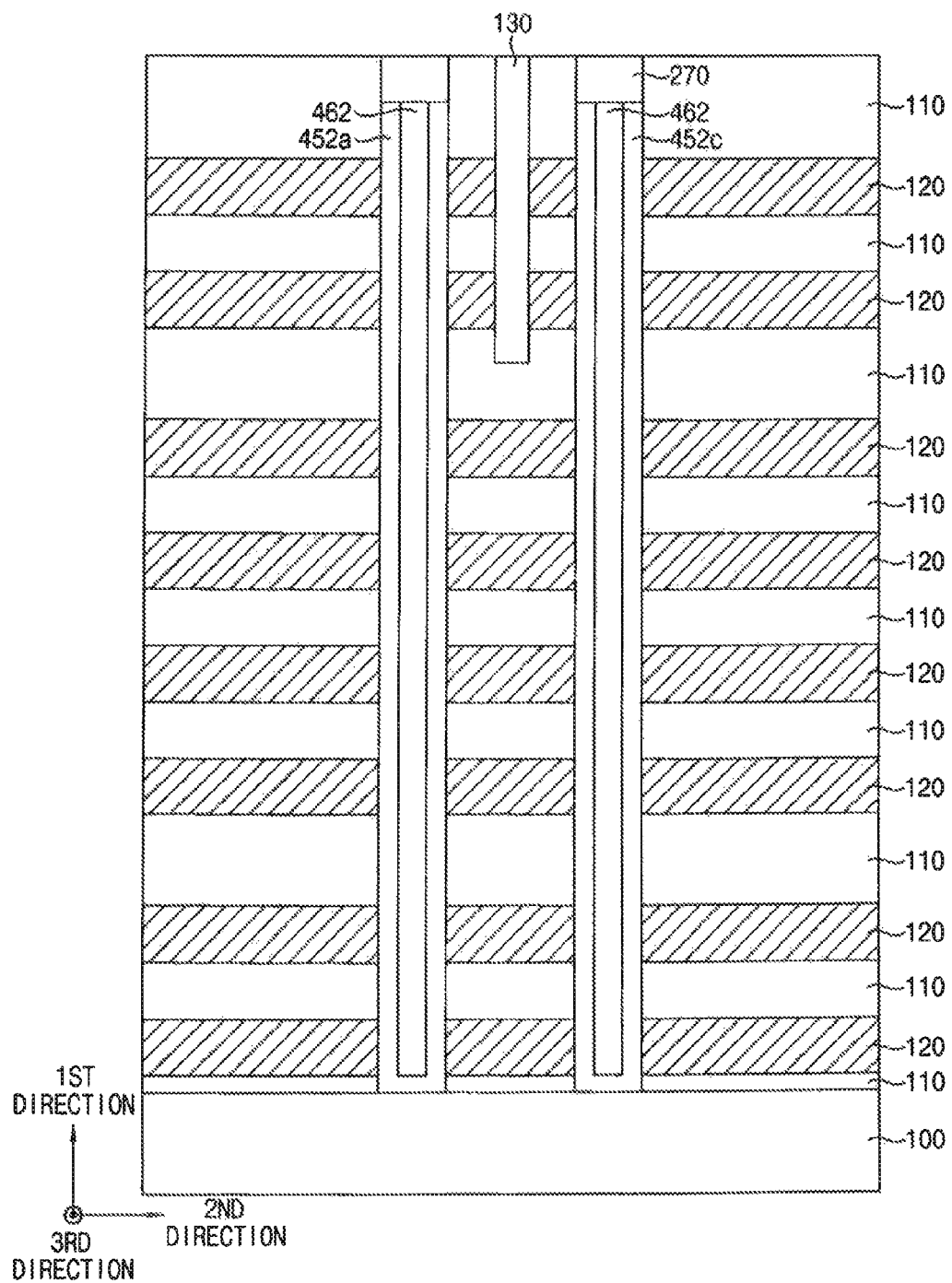

Referring to FIG. 65, the fifth insulation layer 460, the third channel layer 450 and the hard mask 140 are planarized until a top surface of an uppermost first insulation layer 110 is exposed. As a result, a channel 452 (refer to FIGS. 61 to 63) and a fifth insulation layer pattern 462 are formed in each hole 150.

A process substantially the same as or similar to that illustrated with reference to FIG. 13 can be performed to form a pad 270 at an upper portion of each hole 150.

Figure 66:
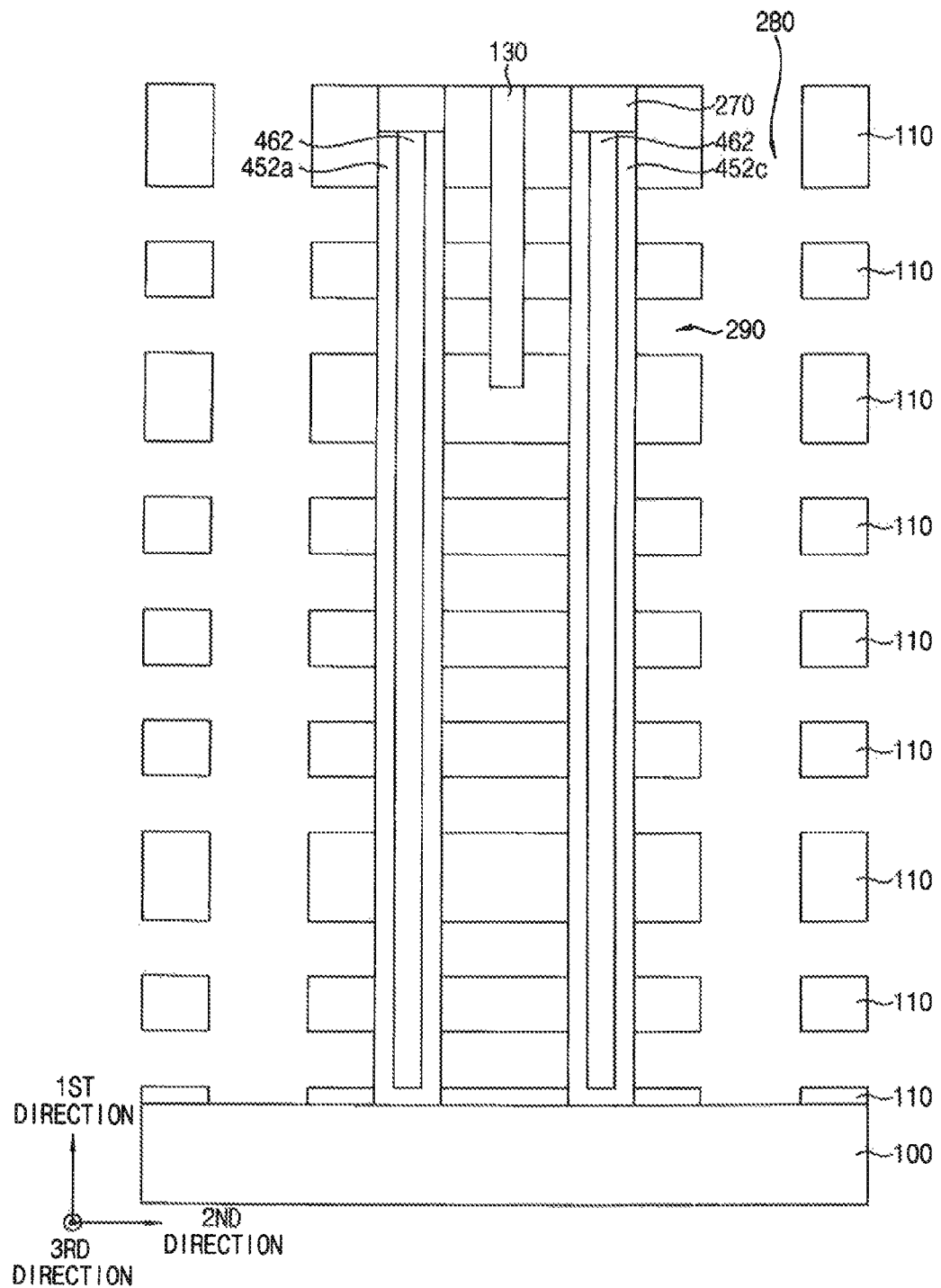

Referring to FIG. 66, processes substantially the same as or similar to those illustrated with reference to FIGS. 14 to 15 can be performed so that first openings 280 exposing a top surface of the substrate 100 and gaps 290 exposing an outer sidewall of each channel 452 can be formed.

Figure 67:
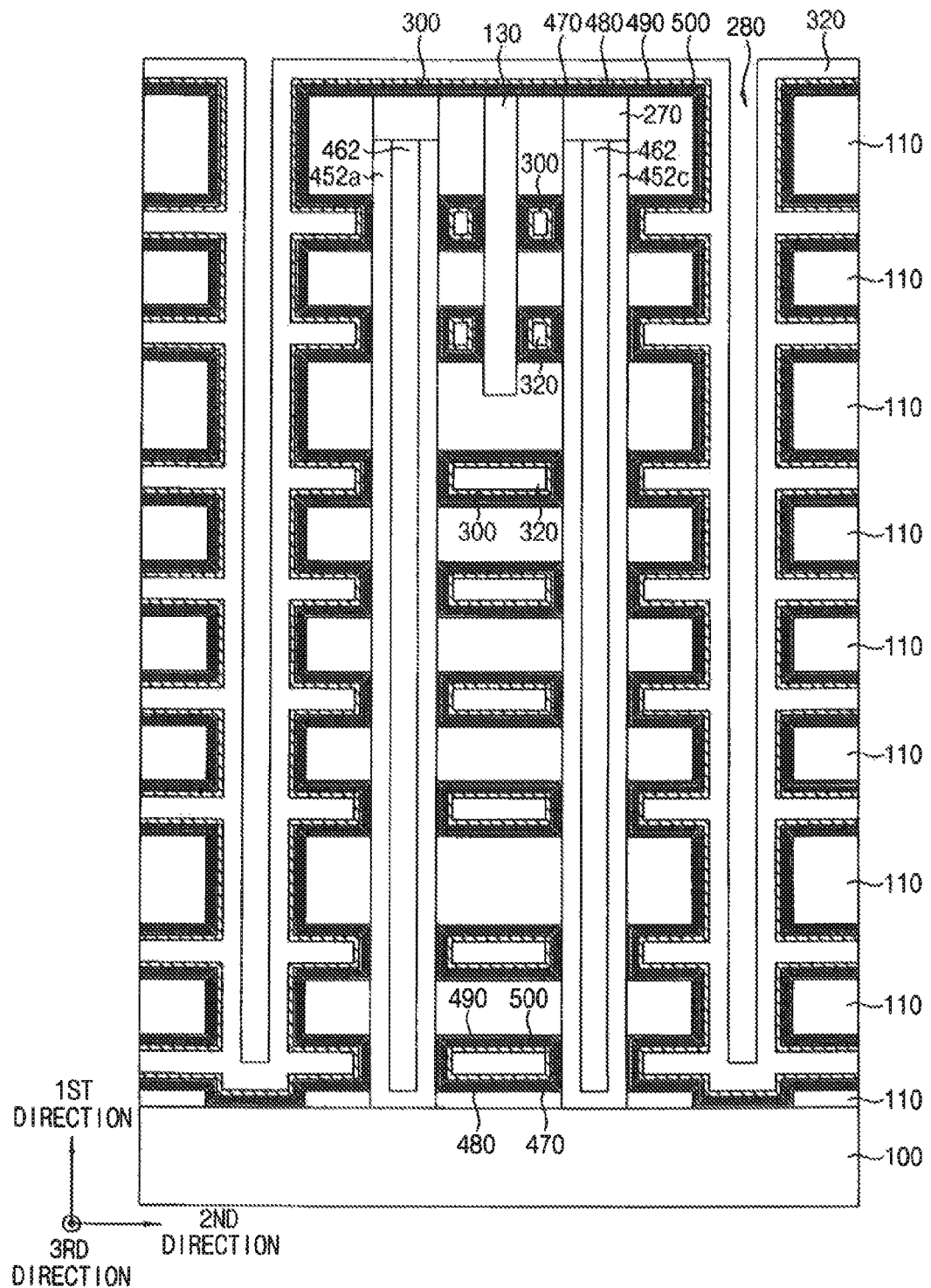

Referring to FIG. 67, a process similar to that illustrated with reference to FIG. 16 can be performed.

Particularly, a second tunnel insulation layer 470, a second charge storage layer 480, a third blocking layer 490, a fourth blocking layer 500 and a first barrier layer 300 are sequentially formed on the exposed outer sidewall of each channel 452, inner walls of the gaps 290, surfaces of the first insulation layer patterns 115, the exposed top surface of the substrate 100, a top surface of the pad 270 and a top surface of the division layer pattern 130. A filling layer 320 is formed on the first barrier layer 300 to sufficiently fill remaining portions of the gaps 290.

In example embodiments, the second tunnel insulation layer 470 includes an oxide, e.g., silicon oxide, the second charge storage layer 480 includes a nitride, e.g., silicon nitride, the third blocking layer 490 includes an oxide, e.g., silicon oxide, and the fourth blocking layer 500 includes a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide.

Figure 68:
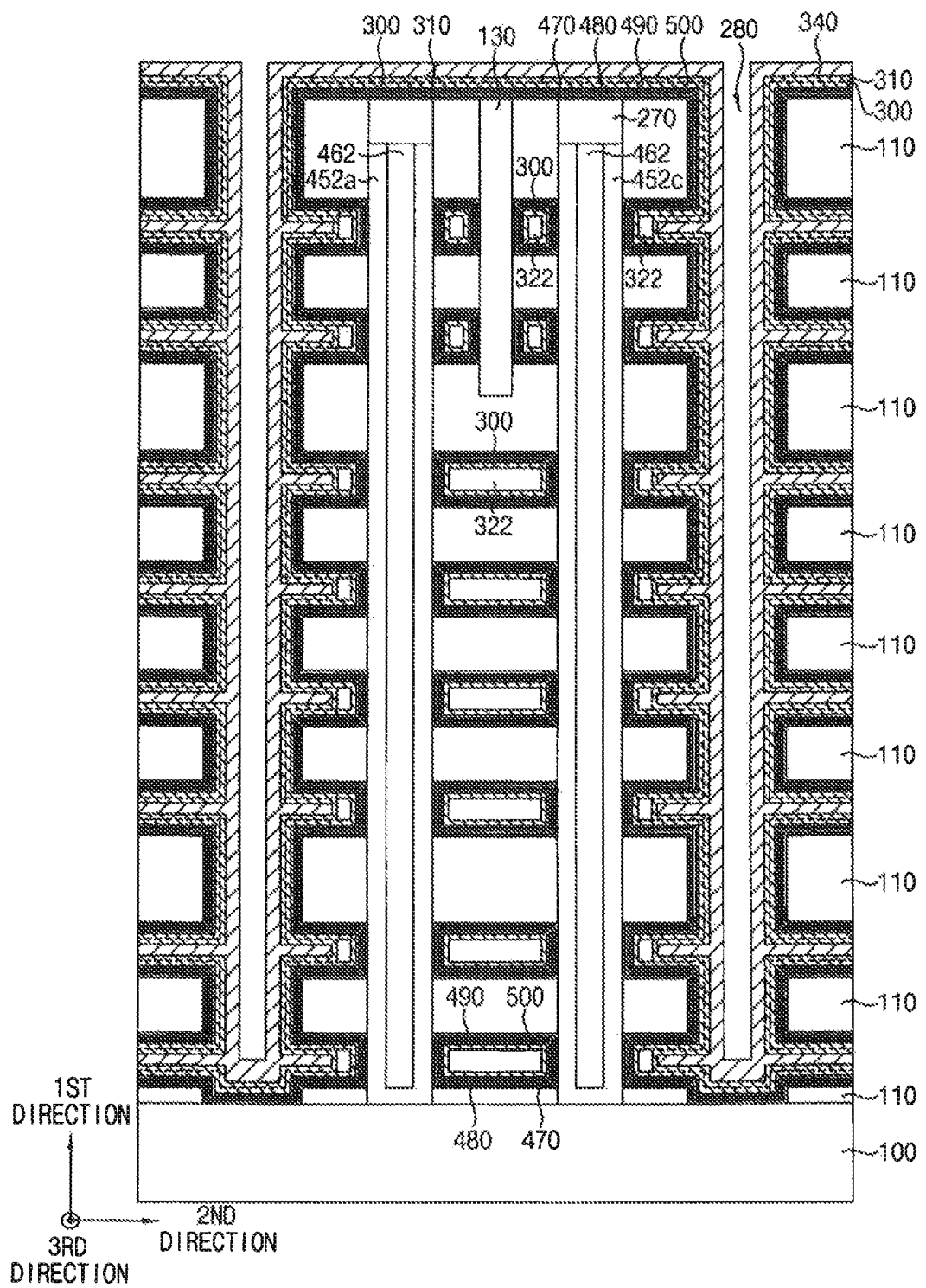

Referring to FIG. 68, processes substantially the same as or similar to those illustrated with reference to FIGS. 18 and 19 can be performed.

As a result, first filling layer patterns 322 filling portions of the gaps 290 are formed and a gate electrode layer 340 sufficiently filling remaining portions of some of the gaps 290 is formed. Additionally, first and second barrier layers 300 and 310 surrounding the first filling layer pattern 322 are formed on the fourth blocking layer 500.

Referring to FIG. 60 again, processes substantially the same as or similar to those illustrated with reference to FIGS. 20, 21 and 2 may then be performed.

Figure 69:
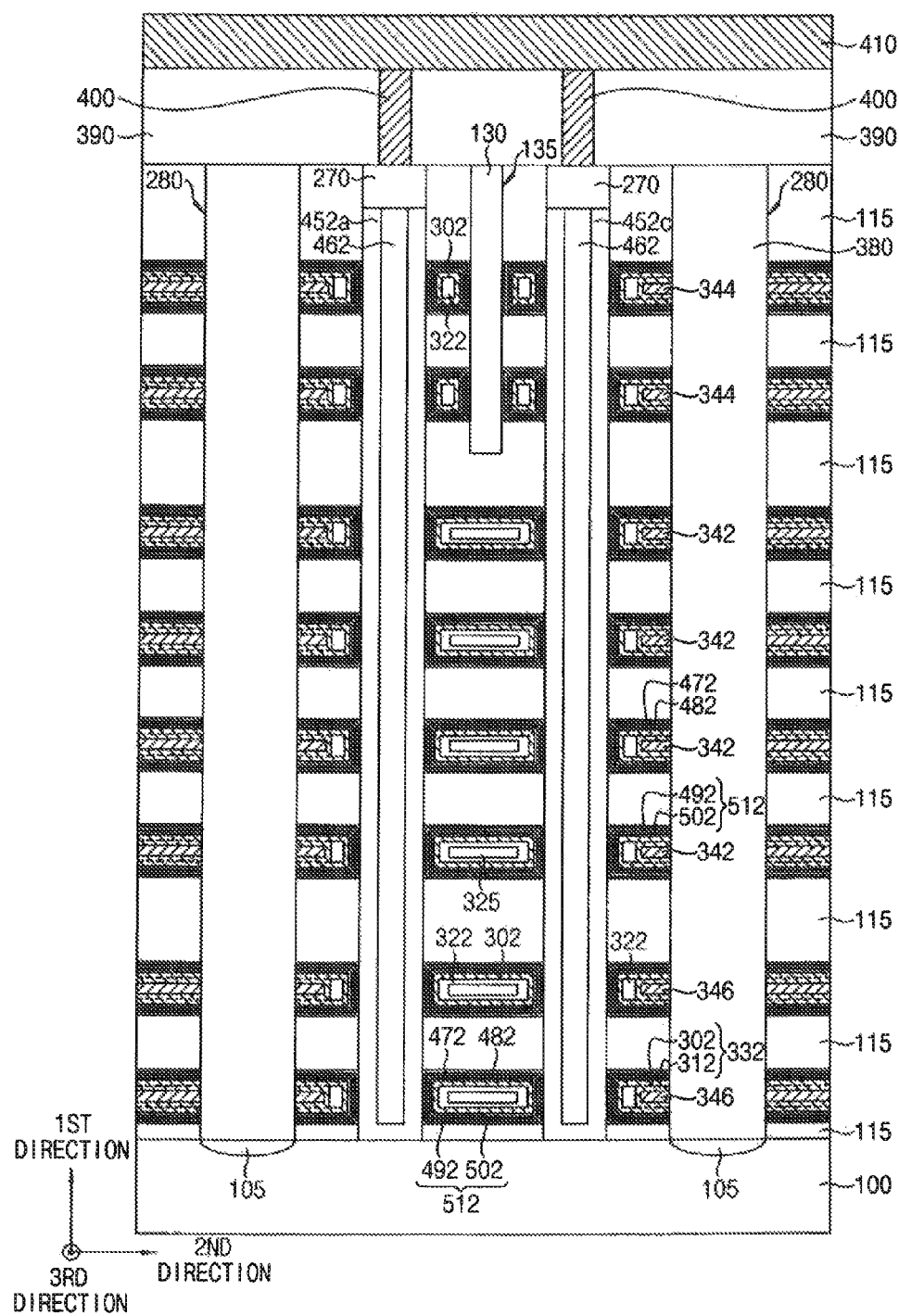
FIG. 69 is a vertical cross-sectional view illustrating a vertical memory device in accordance with example embodiments.

FIG. 69 is a vertical cross-sectional view illustrating a vertical memory device in accordance with example embodiments. The vertical memory device can be substantially the same as that of FIGS. 60 to 63, except for a void.

Referring to FIG. 69, the vertical memory device includes channels 452, a second tunnel insulation layer pattern 472, a second charge storage layer pattern 482, a third blocking layer pattern 492, a fourth blocking layer pattern 502, a first barrier layer pattern 302, a second barrier layer pattern 312, a first filling layer pattern 322 and first gate electrodes 342, 344 and 346. At certain portions, the first filling layer pattern 322 includes a void 325 therein. The first and second barrier layer patterns 302 and 312 are referred to as a barrier layer structure, and the third and fourth blocking layer patterns 492 and 502 are referred to as a second blocking layer pattern structure 512.

The void 325 is formed at central portions of the gaps 290 relatively distant from the first openings 280.

Like the previous embodiments, the vertical memory device including the first filling layer patterns 322 having the voids 325 therein has reduced or no defects caused by the source gas.

Figure 70:
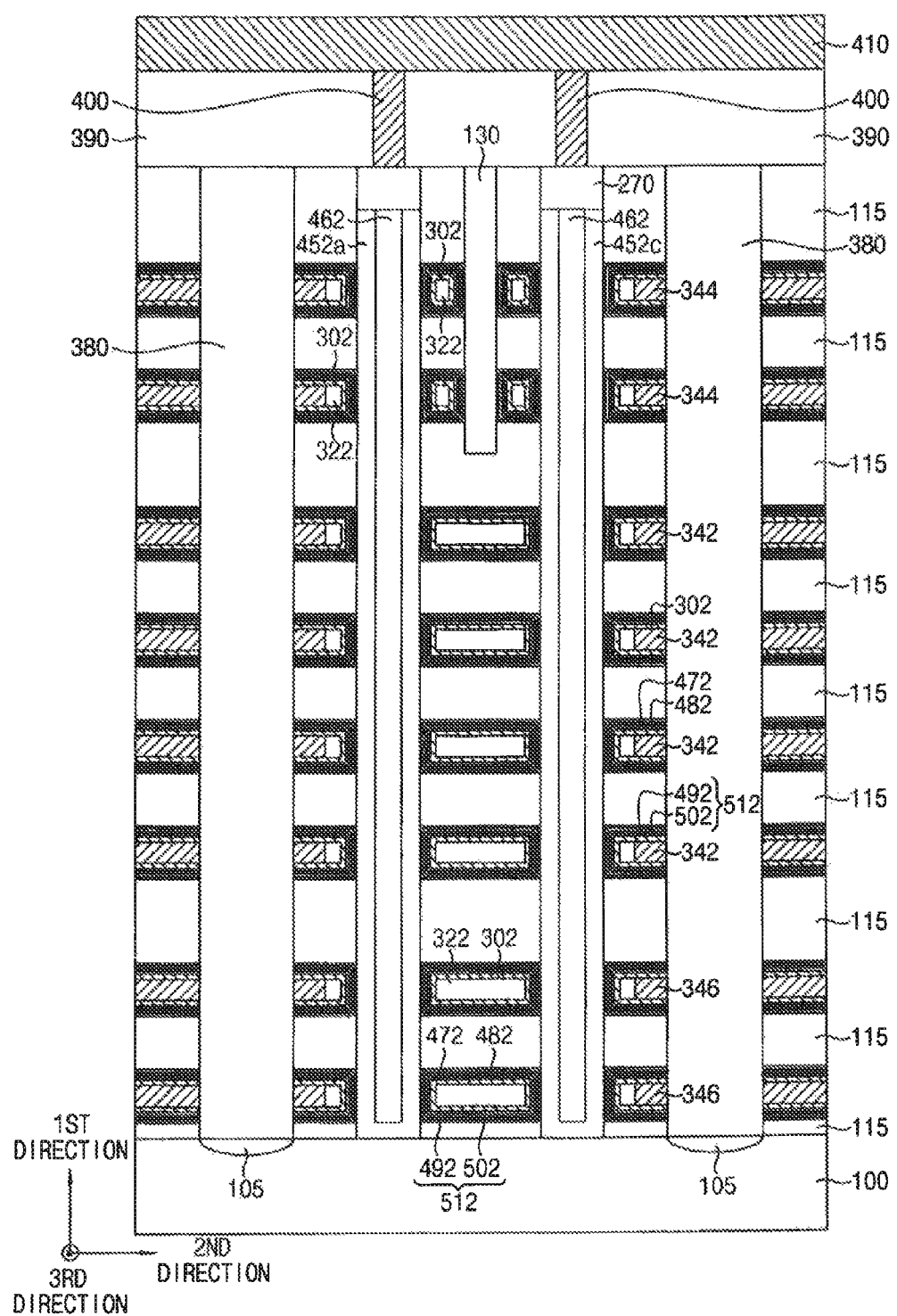
FIG. 70 is a vertical cross-sectional view illustrating a vertical memory device in accordance with example embodiments.
Figure 71:
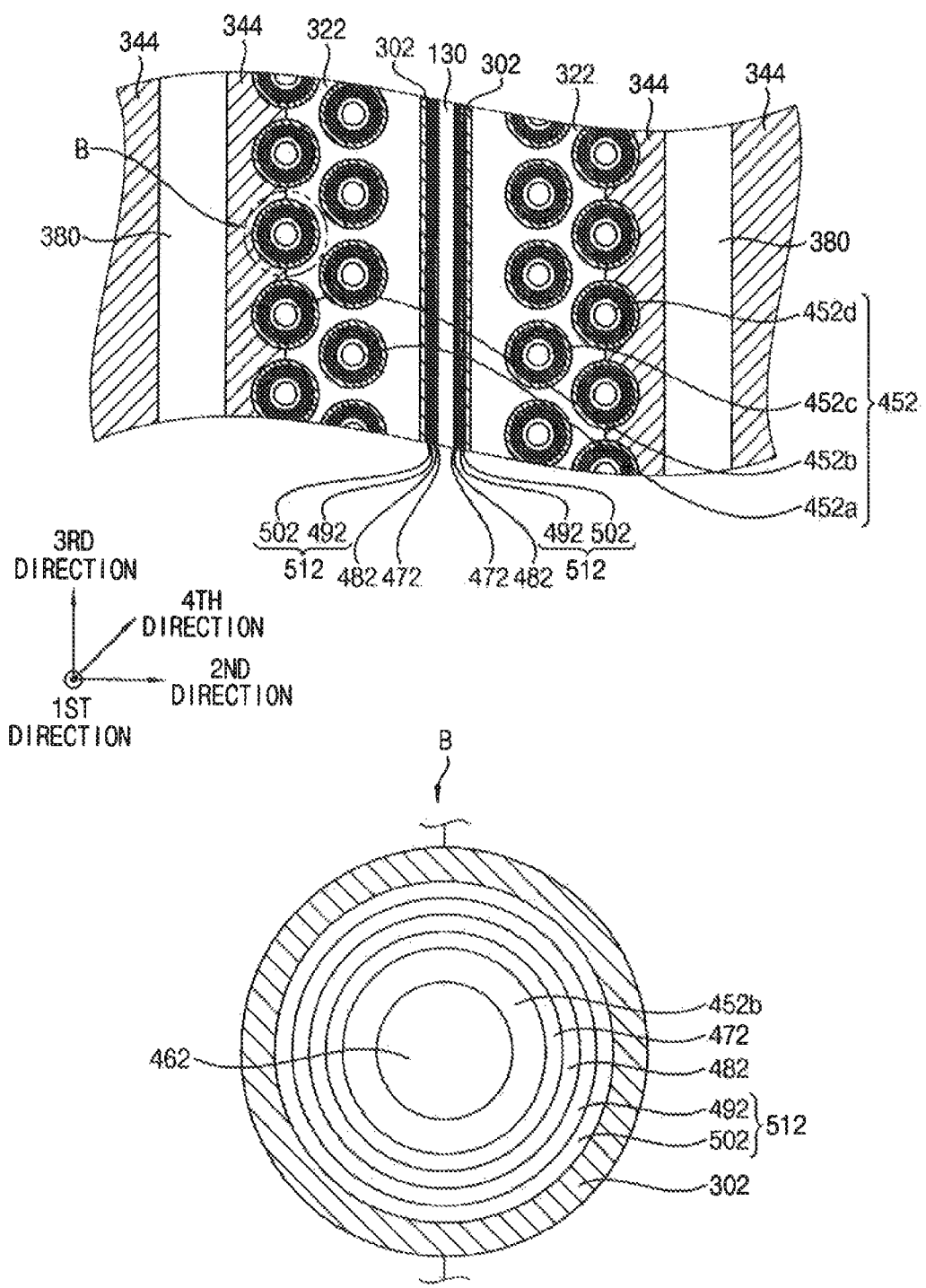
FIGS. 71 and 72 are horizontal cross-sectional views of the semiconductor device of FIG. 70.
Figure 72:
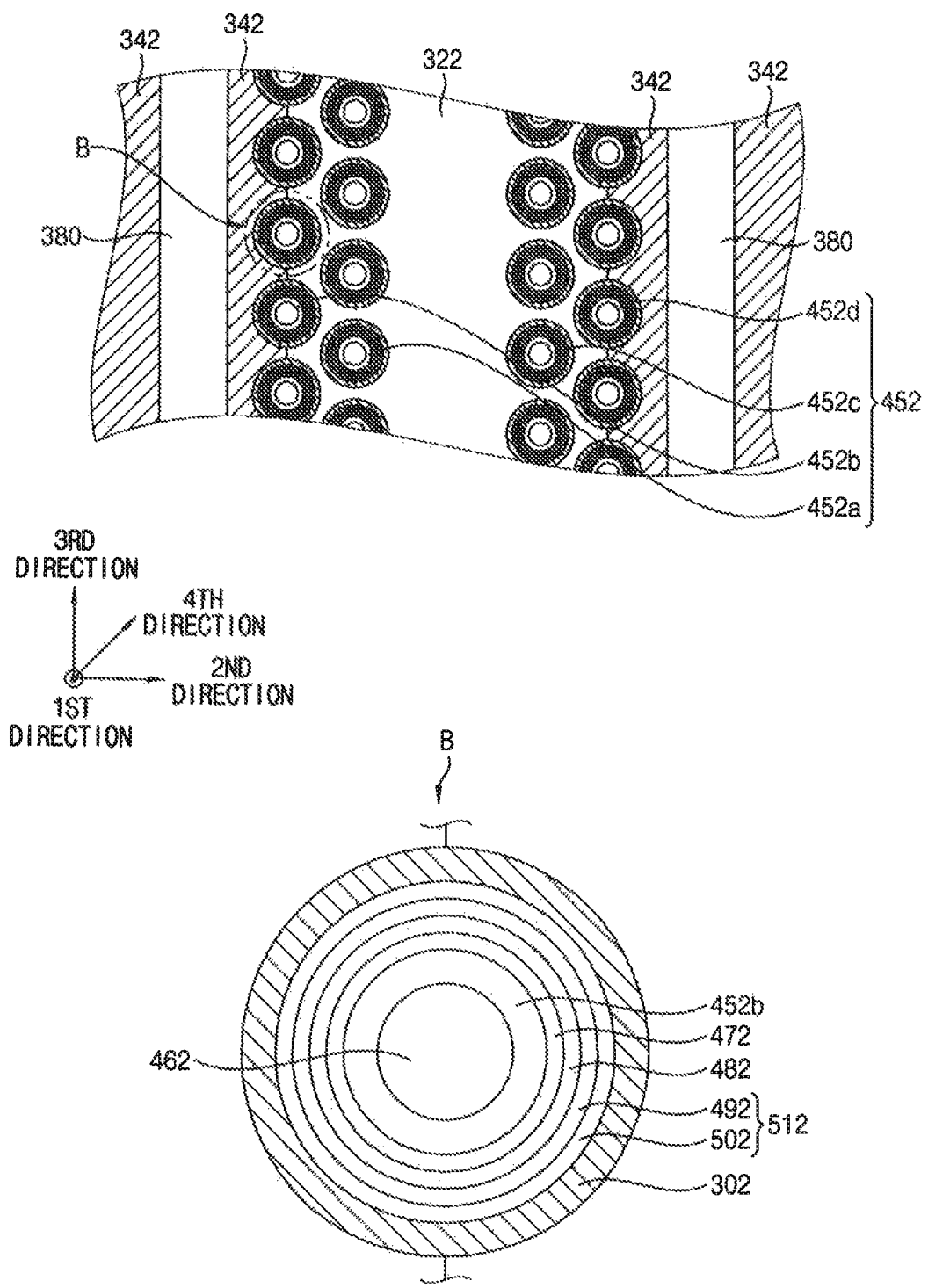
Figure 73A:
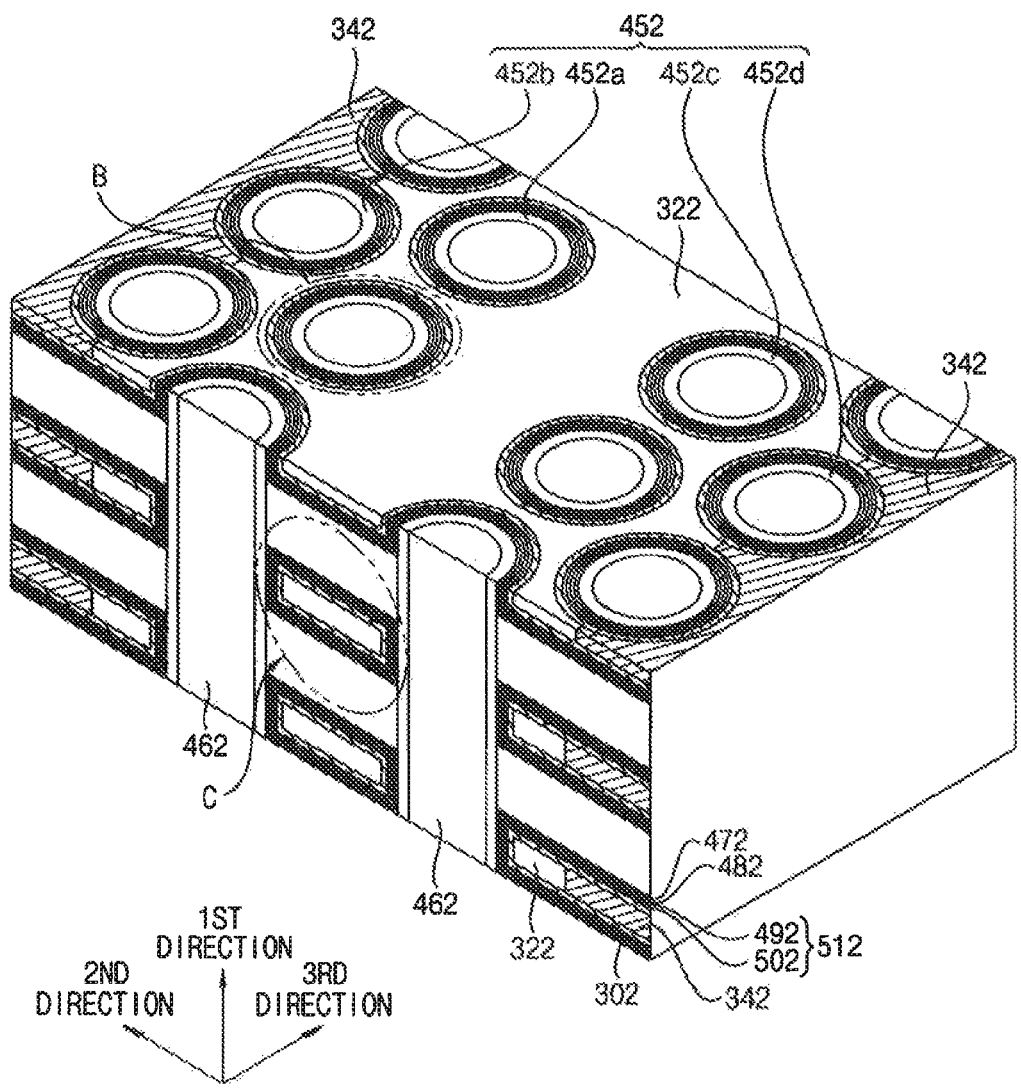
FIG. 73A is a localized perspective diagram of the semiconductor device of FIG. 70.

FIG. 70 is a vertical cross-sectional view illustrating a vertical memory device in accordance with example embodiments, FIGS. 71 and 72 are horizontal cross-sectional views of the semiconductor device, and FIG. 73 is a localized perspective diagram of the semiconductor device. Particularly, FIG. 73B is an enlarged view of regions B and C of FIG. 73A. The vertical memory device may be substantially the same as that of FIGS. 60 to 63, except for a barrier layer pattern.

Referring to FIGS. 70 to 73, the vertical memory device may include channels 452, a second tunnel insulation layer pattern 472, a second charge storage layer pattern 482, a third blocking layer pattern 492, a fourth blocking layer pattern 502, a first barrier layer pattern 302, a first filling layer pattern 322 and first gate electrodes 342, 344 and 346. The third and fourth blocking layer patterns 492 and 502 are referred to as a second blocking layer pattern structure 512.

In accordance with an embodiment of the inventive concept, the vertical memory device includes the first barrier layer pattern 302 as a barrier layer pattern structure, and does not include a second barrier layer pattern.

As a result, an outer sidewall of the first filling layer pattern 322 makes direct contact with a corresponding first gate electrode of the first gate electrodes 342, 344 and 346. Additionally, upper and lower surfaces of the first gate electrodes 342, 344 and 346 are at least partially covered by the first barrier layer pattern 302 so that the first barrier layer pattern 302 makes direct contact with a corresponding first gate electrode of the first gate electrodes 342, 344 and 346.

In the vertical memory device, the first gate electrodes 342, 344 and 346 are electrically connected to the first barrier layer pattern 302 making contact with the fourth blocking layer pattern 502 even without the second barrier layer pattern 312.

Figure 74:
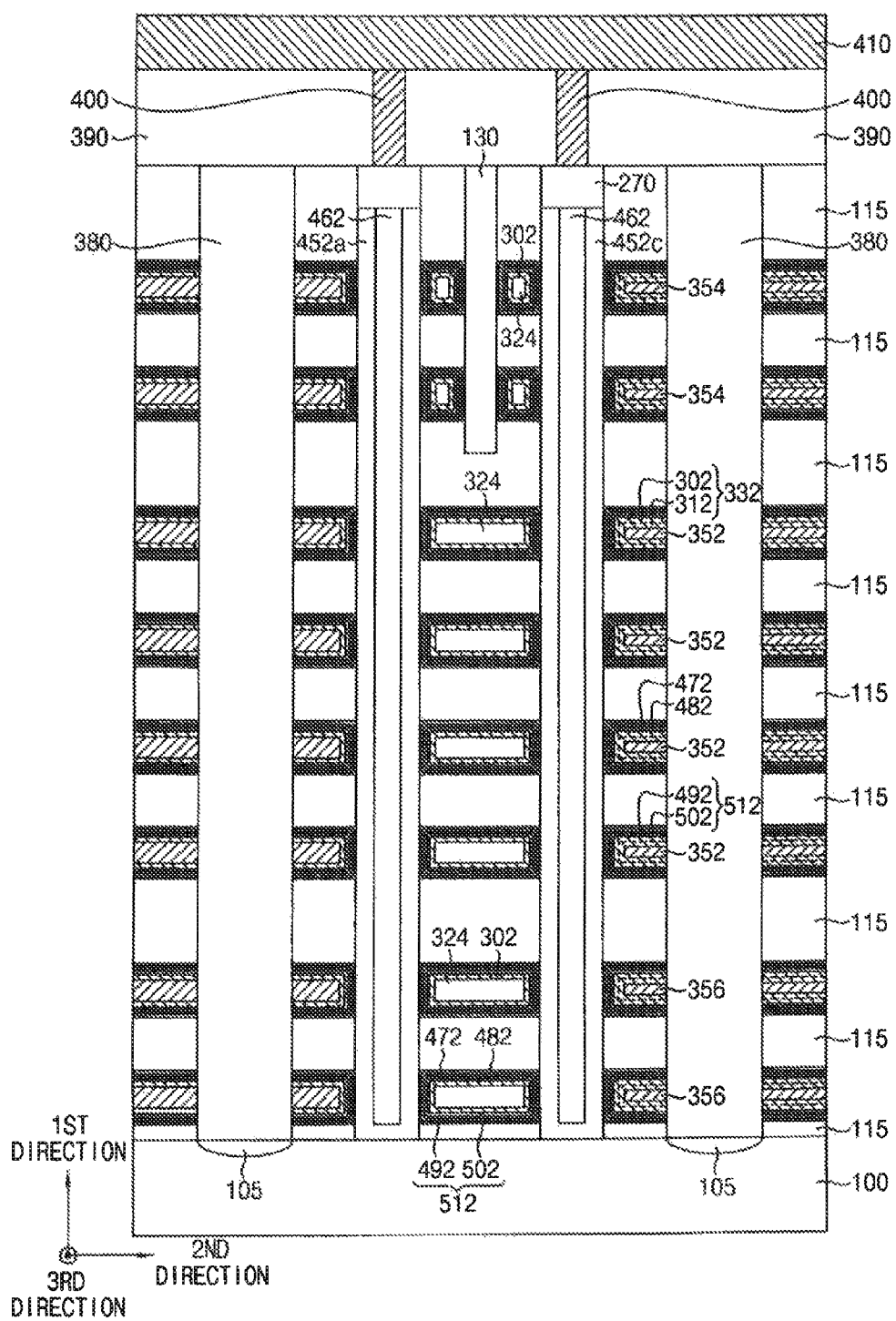
FIG. 74 is a vertical cross-sectional view illustrating a vertical memory device in accordance with example embodiments.
Figure 76:
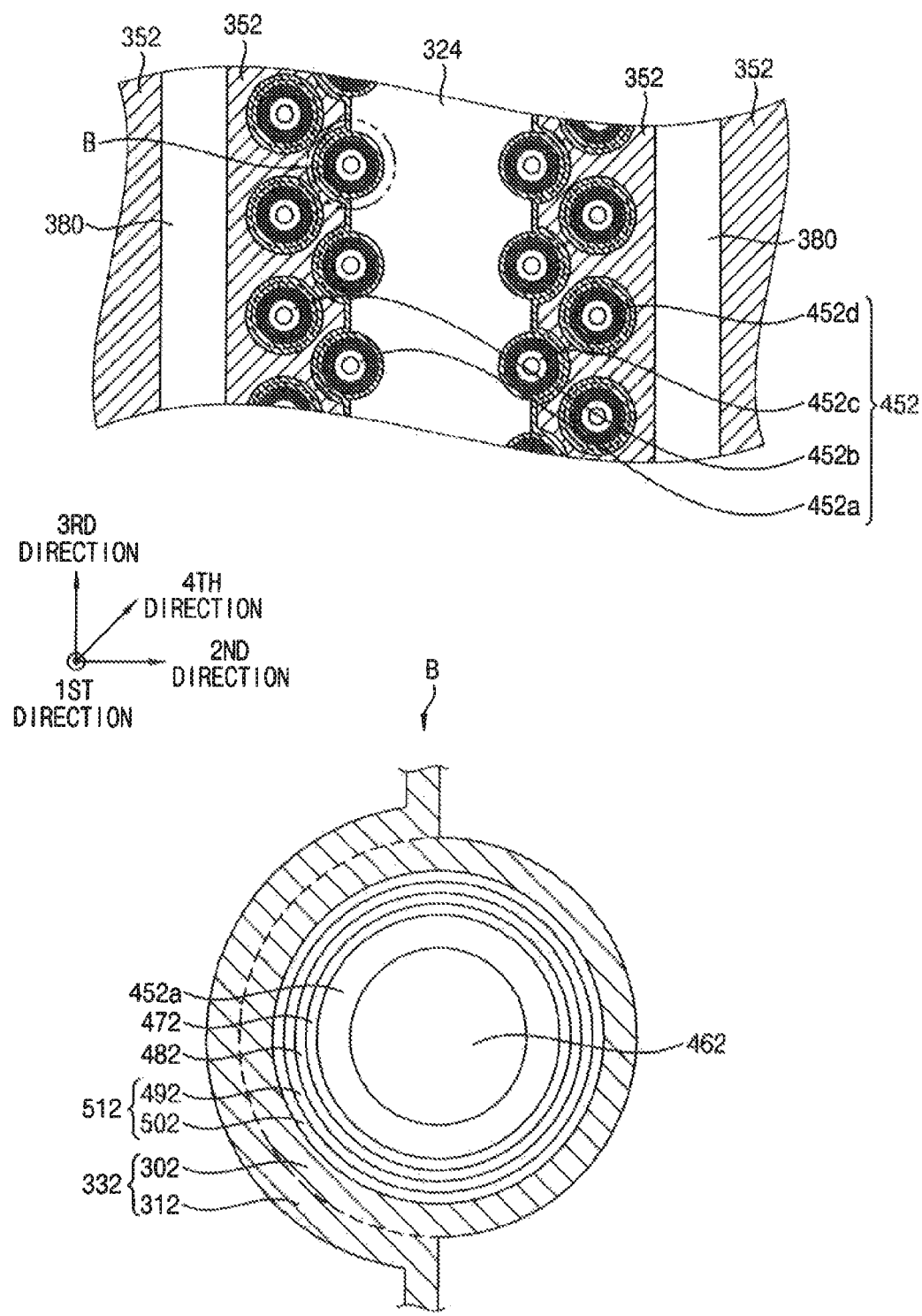
Figure 77A:
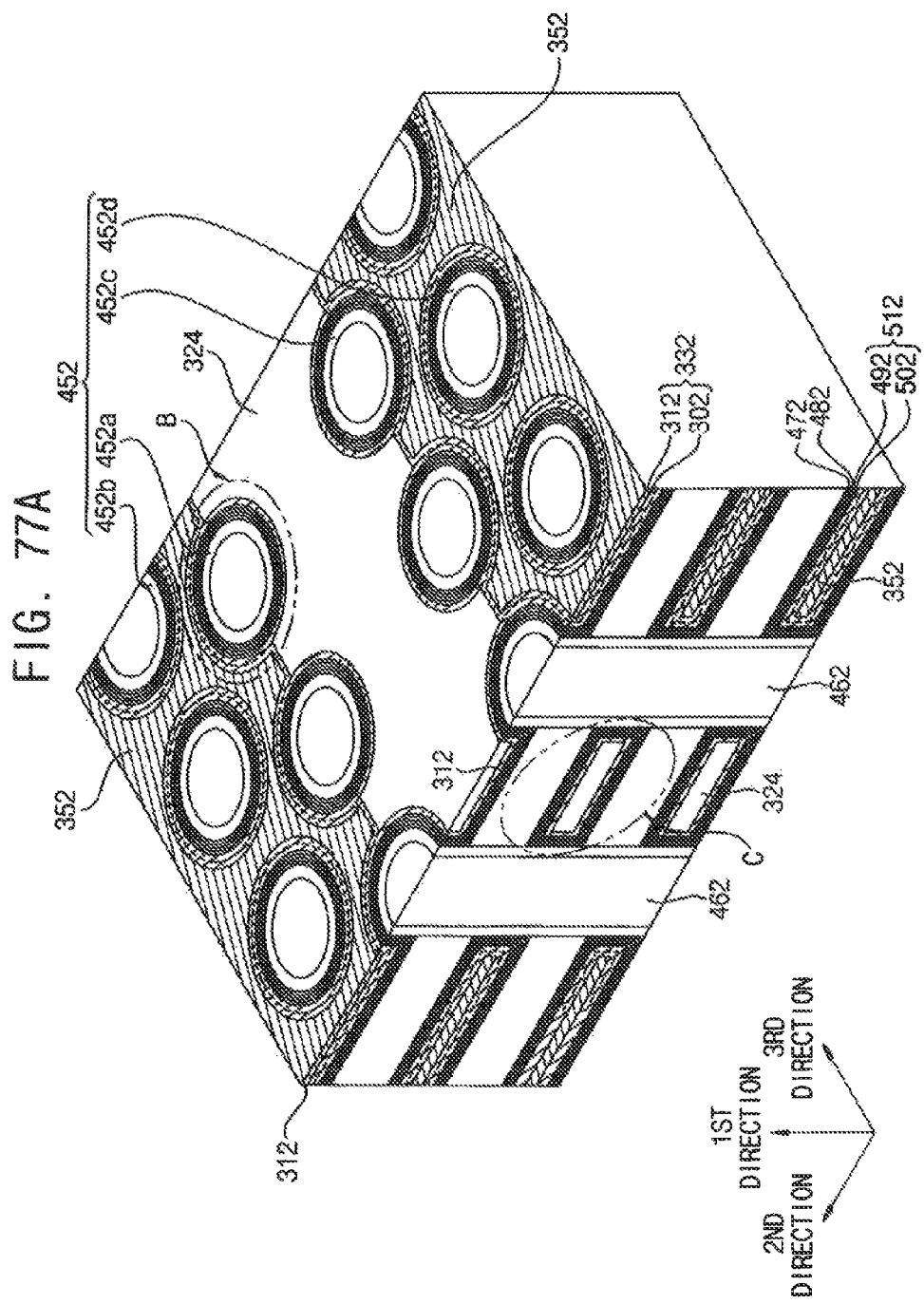
FIG. 77A is a localized perspective diagram of the semiconductor device of FIG. 74.

FIG. 74 is a vertical cross-sectional view illustrating a vertical memory device in accordance with example embodiments, FIGS. 75 and 76 are horizontal cross-sectional views of the semiconductor device, and FIG. 77 is a localized perspective diagram of the semiconductor device. Particularly, FIG. 77B is an enlarged view of regions B and C of FIG. 77A. The vertical memory device of FIG. 74 may be substantially the same as that of FIGS. 60 to 63, except for a filling layer pattern and a gate electrode.

Referring to FIGS. 74 to 77, the vertical memory device includes channels 452, a second tunnel insulation layer pattern 472, a second charge storage layer pattern 482, a third blocking layer pattern 492, a fourth blocking layer pattern 502, a first barrier layer pattern 302, a second barrier layer pattern 312, a second filling layer pattern 324 and second gate electrodes 352, 354 and 356. The first and second barrier layer patterns 302 and 312 are referred to as a barrier layer pattern structure 332, and the third and fourth blocking layer patterns 492 and 502 are referred to as a second blocking layer pattern structure 512.

The second filling layer pattern 324 is formed on the first barrier layer pattern 302 to fill centrally located gaps 290 between the first openings 280. In example embodiments, the second filling layer pattern 324 extends in the third direction.

In example embodiments, the second filling layer pattern 324 partially covers sidewalls of the fourth structures including the first and third channels 452a and 452c, respectively, exposed by the gaps 290. In other words, the second filling layer pattern 324 covers some of the gaps 290 from the central portion thereof to portions of the sidewalls of the first and third channels 452a and 452c along the second direction.

The second gate electrodes 352, 354 and 356 are formed on outer sidewalls of the first and third channels 452a and 452c to fill edge portions of the gaps adjacent to the first openings 280. In example embodiments, the second gate electrodes 352, 354 and 356 extend in the third direction.

The second gate electrodes 352, 354 and 356 fill portions of the gaps 290 that are not filled with the second filling layer pattern 324. The second gate electrodes 352, 354 and 356 partially cover sidewalls of the fourth structures including the first and third channels 452a and 452c, respectively, and surround portions of the sidewalls of the fourth structures including the second and fourth channels 452b and 452d, respectively.

The second barrier layer pattern 312 covers a sidewall, an upper surface and a lower surface of the second gate electrodes 352, 354 and 356, and makes contact with the first barrier layer pattern 302.

The second tunnel insulation layer pattern 472, the second charge storage layer pattern 482, the second blocking layer pattern structure 512, the first barrier layer pattern 302, the second barrier layer pattern 312 and a corresponding second gate electrode of the second gate electrodes 352, 354 and 356 are sequentially stacked on the outer sidewall of each of the first and third channels 452a and 452c toward the edge portions of the gaps 290 adjacent to the first openings 280 in the second direction. Additionally, the second tunnel insulation layer pattern 472, the second charge storage layer pattern 482, the second blocking layer pattern structure 512, the first barrier layer pattern 302 and the second filling layer pattern 324 are sequentially stacked on the outer sidewall of each of the first and third channels 452a and 452c toward the central portions of the gaps 290 in the second direction.

The second tunnel insulation layer pattern 472, the second charge storage layer pattern 482, the second blocking layer pattern structure 512, the first barrier layer pattern 302, the second barrier layer pattern 312 and a corresponding second gate electrode of the second gate electrodes 352, 354 and 356 are sequentially stacked on the outer sidewall of each of the second and fourth channels 452b and 452d toward the edge portions of the gaps 290 in the second direction. Additionally, the second tunnel insulation layer pattern 472, the second charge storage layer pattern 482, the second blocking layer pattern structure 512, the first barrier layer pattern 302, the second gate electrodes 352, 354 and 356, and the second filling layer pattern 324 are sequentially stacked on the outer sidewall of each of the second and fourth channels 452b and 452d toward the central portions of the gaps 290 in the second direction.

Figure 78:
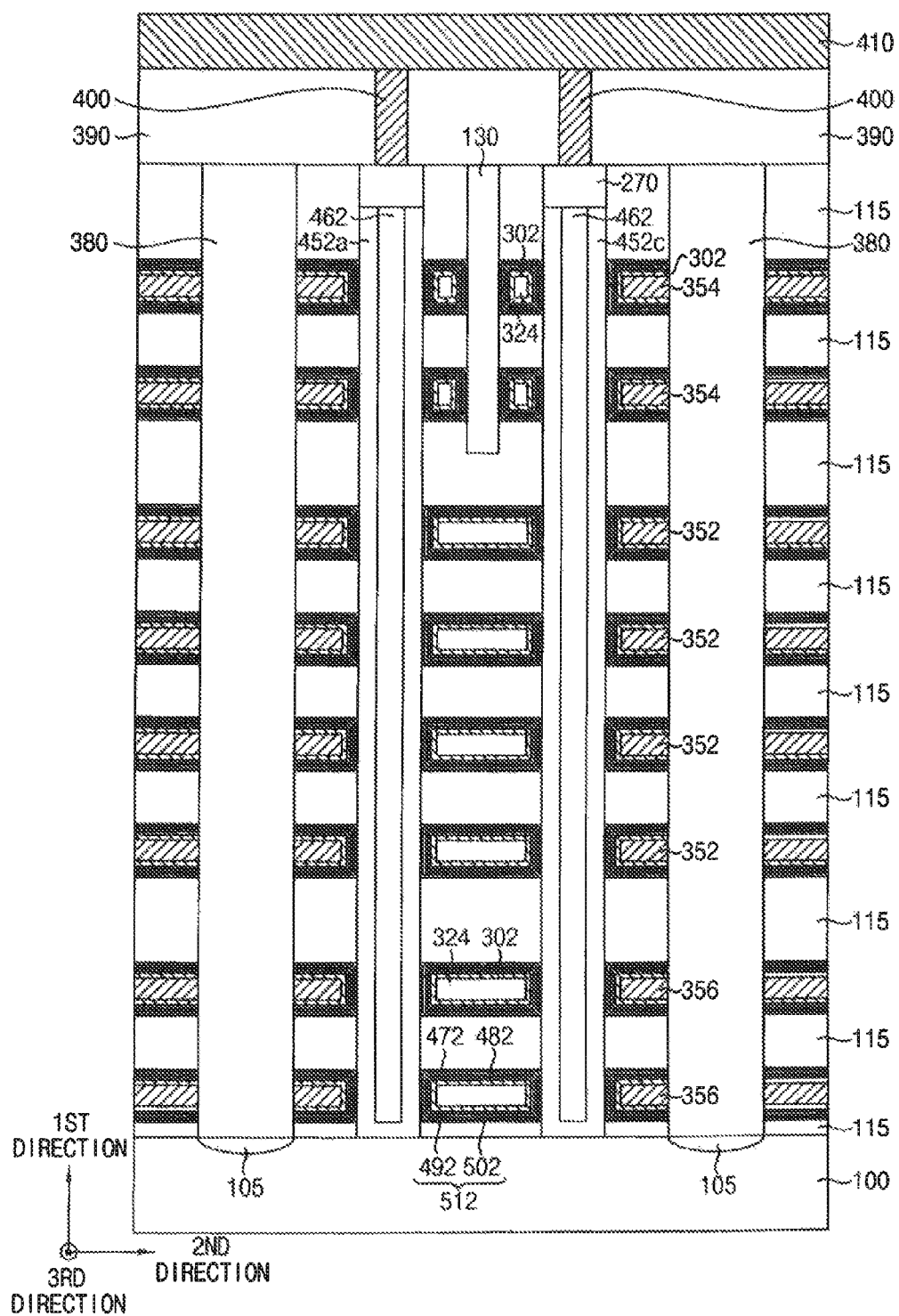
FIG. 78 is a vertical cross-sectional view illustrating a vertical memory device in accordance with example embodiments.
Figure 79:
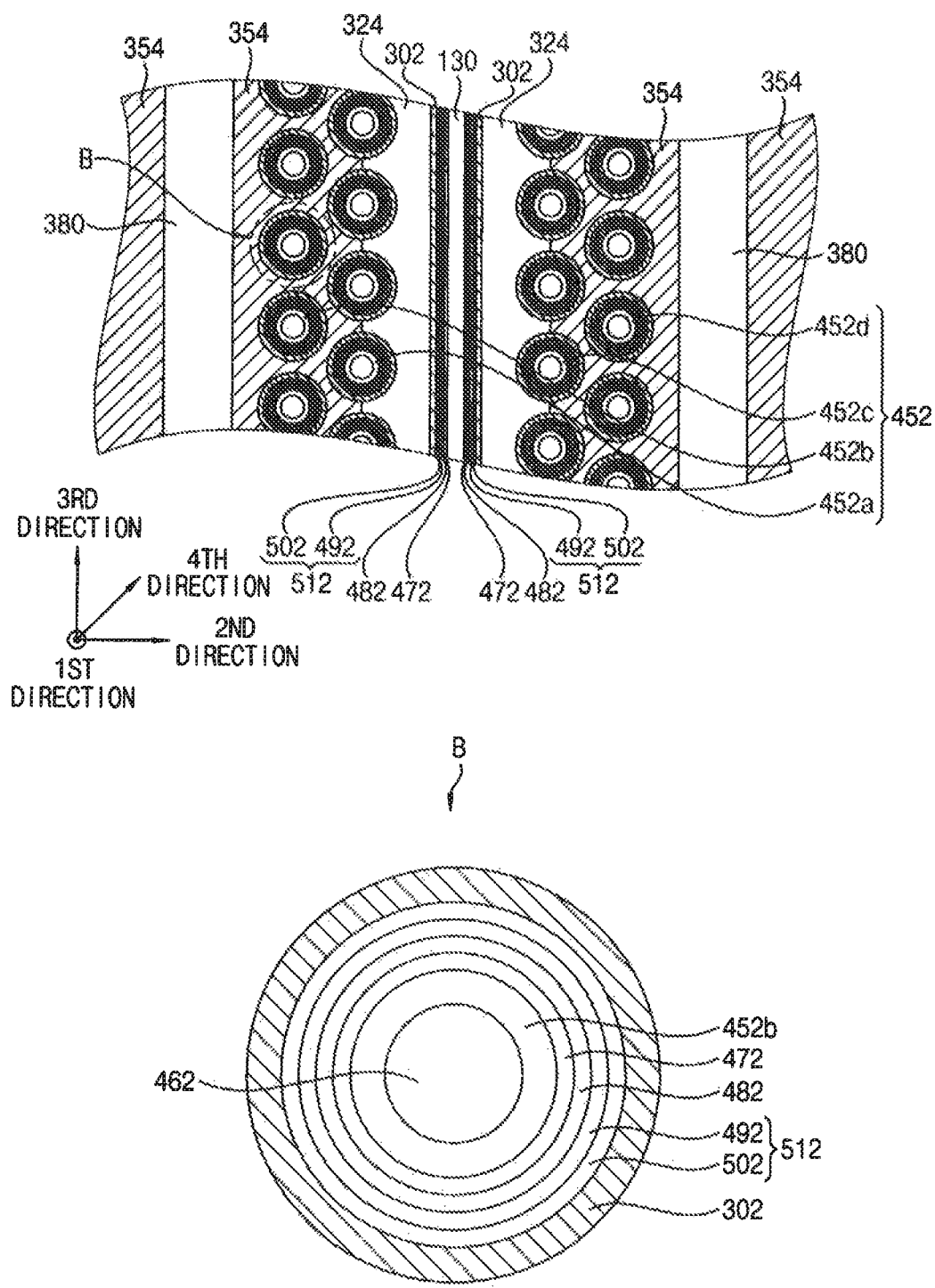
Figure 81A:
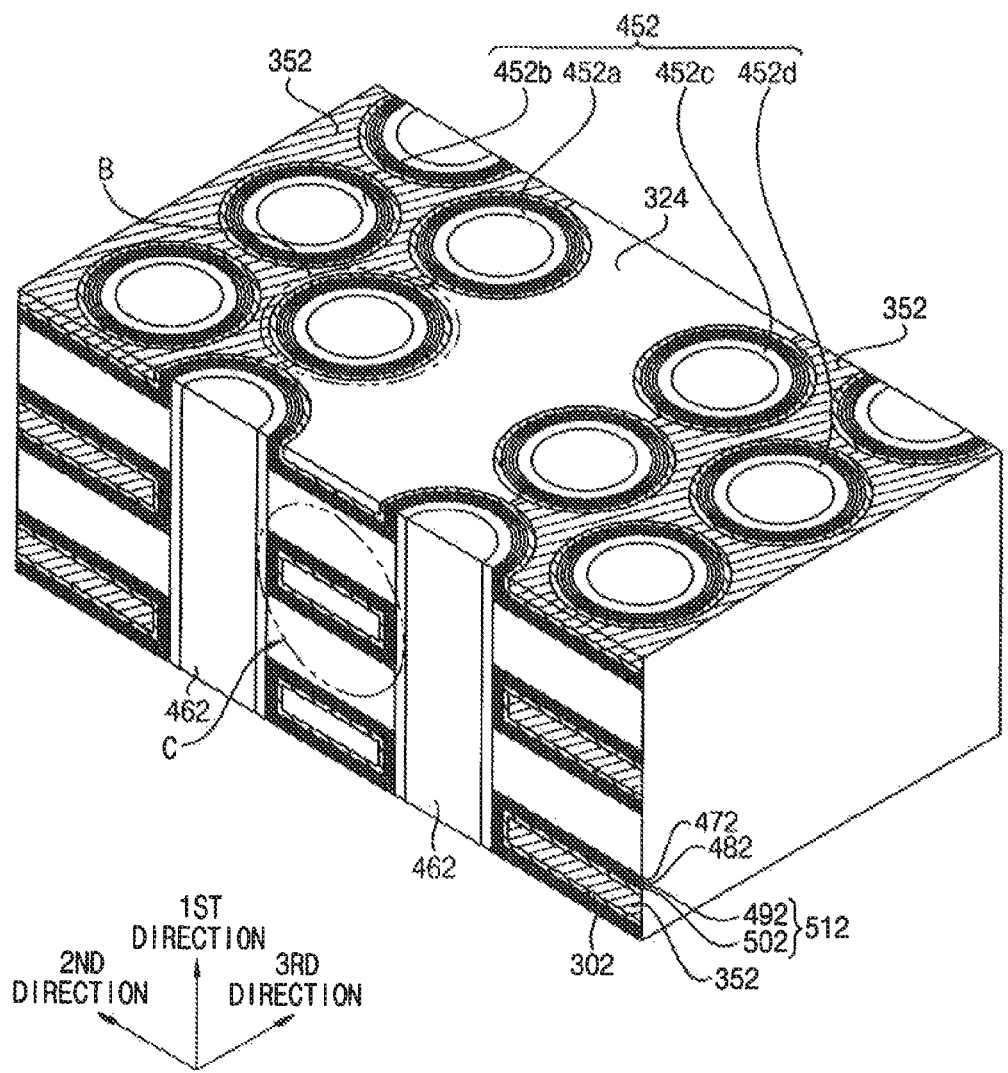
FIG. 81A is a localized perspective diagram of the semiconductor device of FIG. 78.

FIG. 78 is a vertical cross-sectional view illustrating a vertical memory device in accordance with example embodiments, FIGS. 79 and 80 are horizontal cross-sectional views of the semiconductor device, and FIG. 81 is a localized perspective diagram of the semiconductor device. Particularly, FIG. 81B is an enlarged view of regions B and C of FIG. 81A. The vertical memory device of FIG. 78 may be substantially the same as that of FIGS. 74 to 77, except for a barrier layer pattern.

Referring to FIGS. 78 to 81, the vertical memory device includes channels 452, a second tunnel insulation layer pattern 472, a second charge storage layer pattern 482, a third blocking layer pattern 492, a fourth blocking layer pattern 502, a first barrier layer pattern 302, a second filling layer pattern 324 and second gate electrodes 352, 354 and 356. The third and fourth blocking layer patterns 492 and 502 are referred to as a second blocking layer pattern structure 512.

The vertical memory device of FIGS. 78-81 includes the first barrier layer pattern 302 as a barrier layer pattern structure, and does not include a second barrier layer pattern.

As a result, an outer sidewall of the second filling layer pattern 324 makes direct contact with a corresponding second gate electrode of the second gate electrodes 352, 354 and 356. Additionally, upper and lower surfaces of the second gate electrodes 352, 354 and 356 are at least partially covered by the first barrier layer pattern 302 so that the first barrier layer pattern 302 makes direct contact with a corresponding second gate electrode of the second gate electrode 352, 354 and 356.

Figure 82:
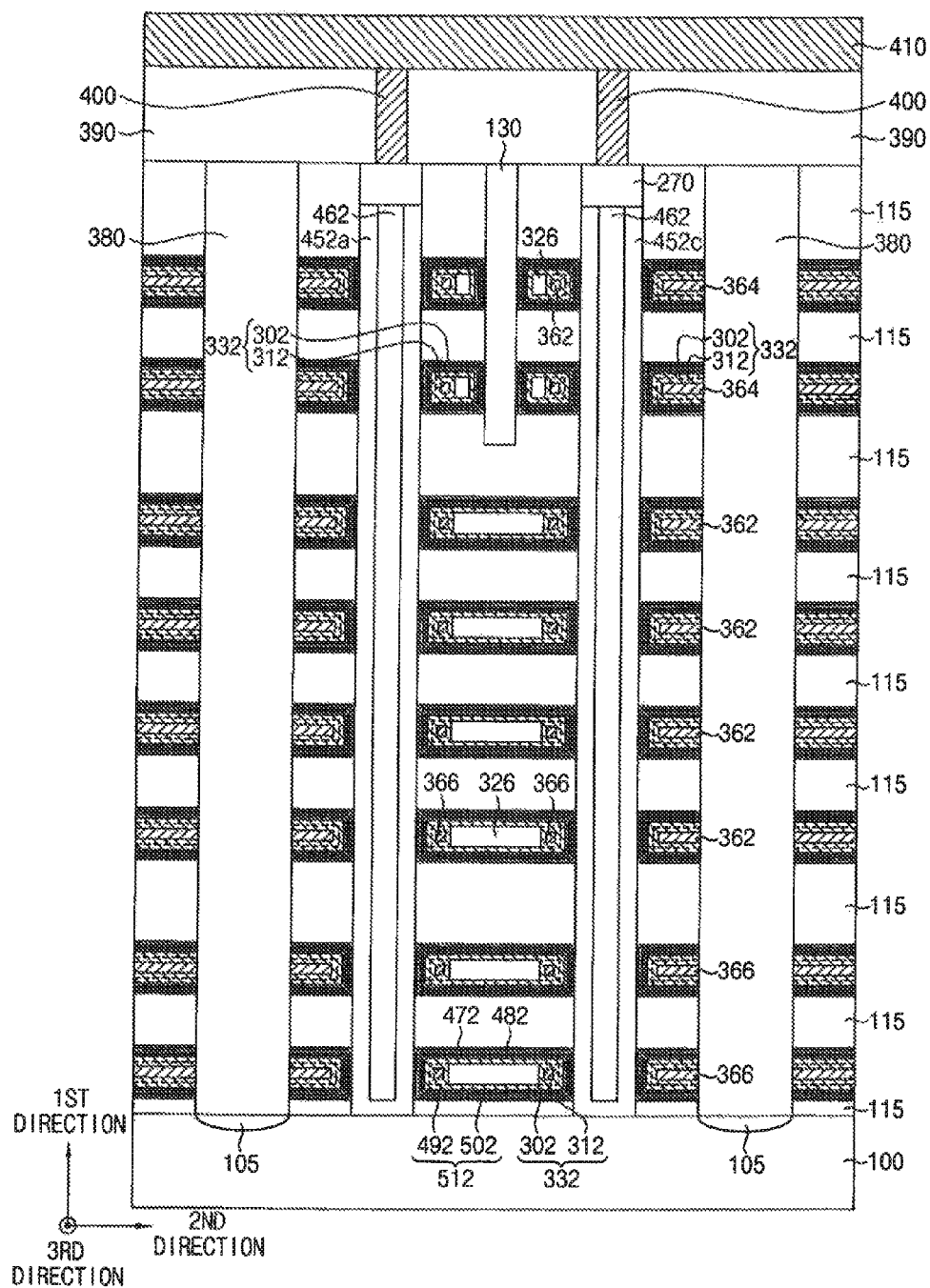
FIG. 82 is a vertical cross-sectional view illustrating a vertical memory device in accordance with example embodiments.

FIG. 82 is a vertical cross-sectional view illustrating a vertical memory device in accordance with example embodiments, FIGS. 83 and 84 are horizontal cross-sectional views of the semiconductor device, and FIG. 85 is a localized perspective diagram of the semiconductor device. Particularly, FIG. 85B is an enlarged view of regions B and C of FIG. 85A. The vertical memory device of FIG. 82 may be substantially the same as that of FIGS. 60 to 63, except for a filling layer pattern and a gate electrode.

Referring to FIGS. 82 to 85, the vertical memory device includes channels 452, a second tunnel insulation layer pattern 472, a second charge storage layer pattern 482, a third blocking layer pattern 492, a fourth blocking layer pattern 502, a first barrier layer pattern 302, a second barrier layer pattern 312, a third filling layer pattern 326 and third gate electrodes 362, 364 and 366. The third and fourth blocking layer patterns 492 and 502 are referred to as a second blocking layer pattern structure 512.

The third filling layer pattern 326 is formed on the first barrier layer pattern 302 to fill centrally located gaps 290 between the first openings 280. In example embodiments, the third filling layer pattern 326 extends in the third direction.

In example embodiments, the third filling layer pattern 326 does not cover any of the sidewalls of the fourth structures including the first to fourth channels 452a, 452b, 452c and 452d, respectively, exposed by the gaps 290. In other words, the third filling layer pattern 326 is formed only at central portions of the gaps 290 between the first and third channels 452a and 452c.

The third gate electrodes 362, 364 and 366 are formed on outer sidewalls of the third filling layer patterns 326 to fill remaining portions of the gaps 290 between the between the first and third channels 452a and 452c. The third gate electrodes also fill portions of the gaps 290 adjacent to the first openings 280. In example embodiments, the third gate electrodes 362, 364 and 366 extend in the third direction.

The third gate electrodes 362, 364 and 366 fill remaining portions of the gaps 290 that are not be filled with the third filling layer pattern 326. The third gate electrodes 362, 364 and 366 surround portions of sidewalls of the fourth structures including the first to fourth channels 452a, 452b, 452c and 452d, respectively.

The second barrier layer pattern 312 covers a sidewall, an upper surface and a lower surface of the third gate electrodes 362, 364 and 366, and makes contact with the first barrier layer pattern 302.

As described above, the second tunnel insulation layer pattern 472, the second charge storage layer pattern 482, the second blocking layer pattern structure 512, the first barrier layer pattern 302, the second barrier layer pattern 312 and a corresponding third gate electrode of the third gate electrodes 362, 364 and 366 are sequentially stacked on the outer sidewall of each of the first to fourth channels 452a, 452b, 452c and 452d toward the edge portions of the gaps 290 in the second direction. Additionally, the second tunnel insulation layer pattern 472, the second charge storage layer pattern 482, the second blocking layer pattern structure 512, the first barrier layer pattern 302, the second barrier layer pattern 312, a corresponding third gate electrode of the third gate electrodes 362, 364 and 366, the second barrier layer pattern 312 and the third filling layer pattern 326 are sequentially stacked on the outer sidewall of each of the first to fourth channels 452a, 452b, 452c and 452d toward the central portions of the gaps 290 in the second direction.

Figure 86:
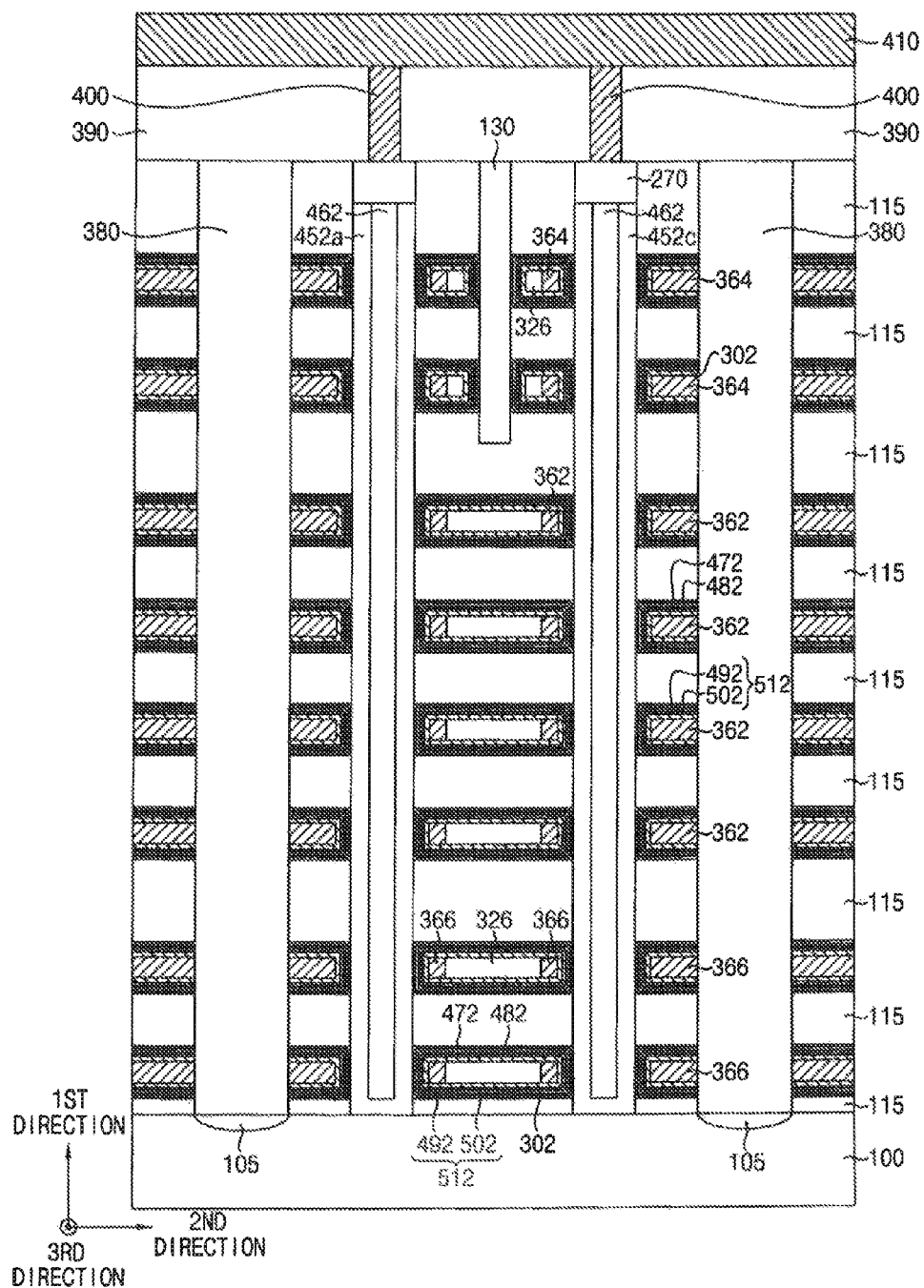
FIG. 86 is a vertical cross-sectional view illustrating a vertical memory device in accordance with example embodiments.
Figure 89A:
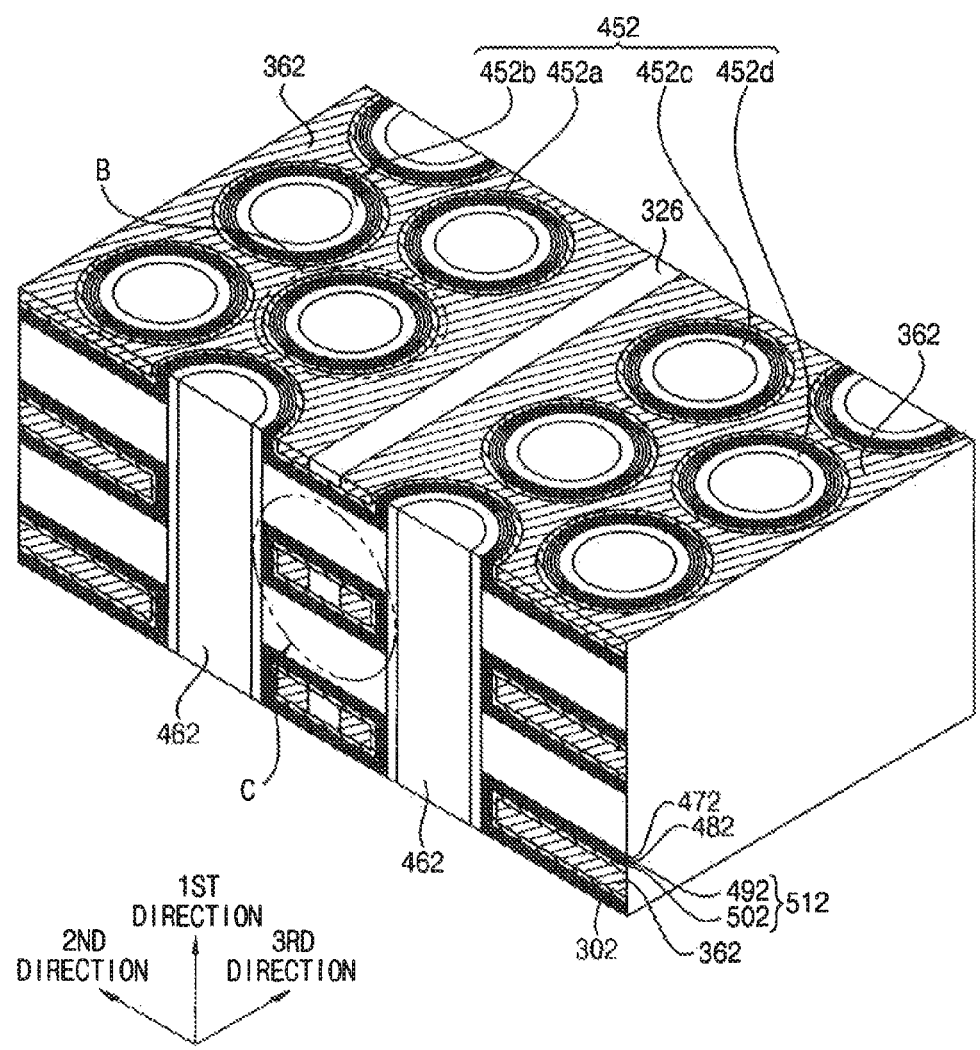
FIG. 89A is a localized perspective diagram of the semiconductor device of FIG. 86.

FIG. 86 is a vertical cross-sectional view illustrating a vertical memory device in accordance with example embodiments, FIGS. 87 and 88 are horizontal cross-sectional views of the semiconductor device, and FIG. 89 is a localized perspective diagram of the semiconductor device. Particularly, FIG. 89B is an enlarged view of regions B and C of FIG. 89A. The vertical memory device of FIG. 86 may be substantially the same as that of FIGS. 82 to 85, except for a barrier layer pattern.

Referring to FIGS. 86 to 89, the vertical memory device includes channels 452, a second tunnel insulation layer pattern 472, a second charge storage layer pattern 482, a third blocking layer pattern 492, a fourth blocking layer pattern 502, a first barrier layer pattern 302, a third filling layer pattern 326 and third gate electrodes 362, 364 and 366. The third and fourth blocking layer patterns 492 and 502 are referred to as a second blocking layer pattern structure 512.

The vertical memory device of FIG. 86 includes the first barrier layer pattern 302 as a barrier layer pattern structure, and does not include a second barrier layer pattern.

An outer sidewall of the third filling layer pattern 326 makes direct contact with a corresponding third gate electrode of the third gate electrodes 362, 364 and 366. Additionally, upper and lower surfaces of the third gate electrodes 362, 364 and 366 are at least partially covered by the first barrier layer pattern 302 so that the first barrier layer pattern 302 makes direct contact with the third gate electrodes 362, 364 and 366.

Figure 90:
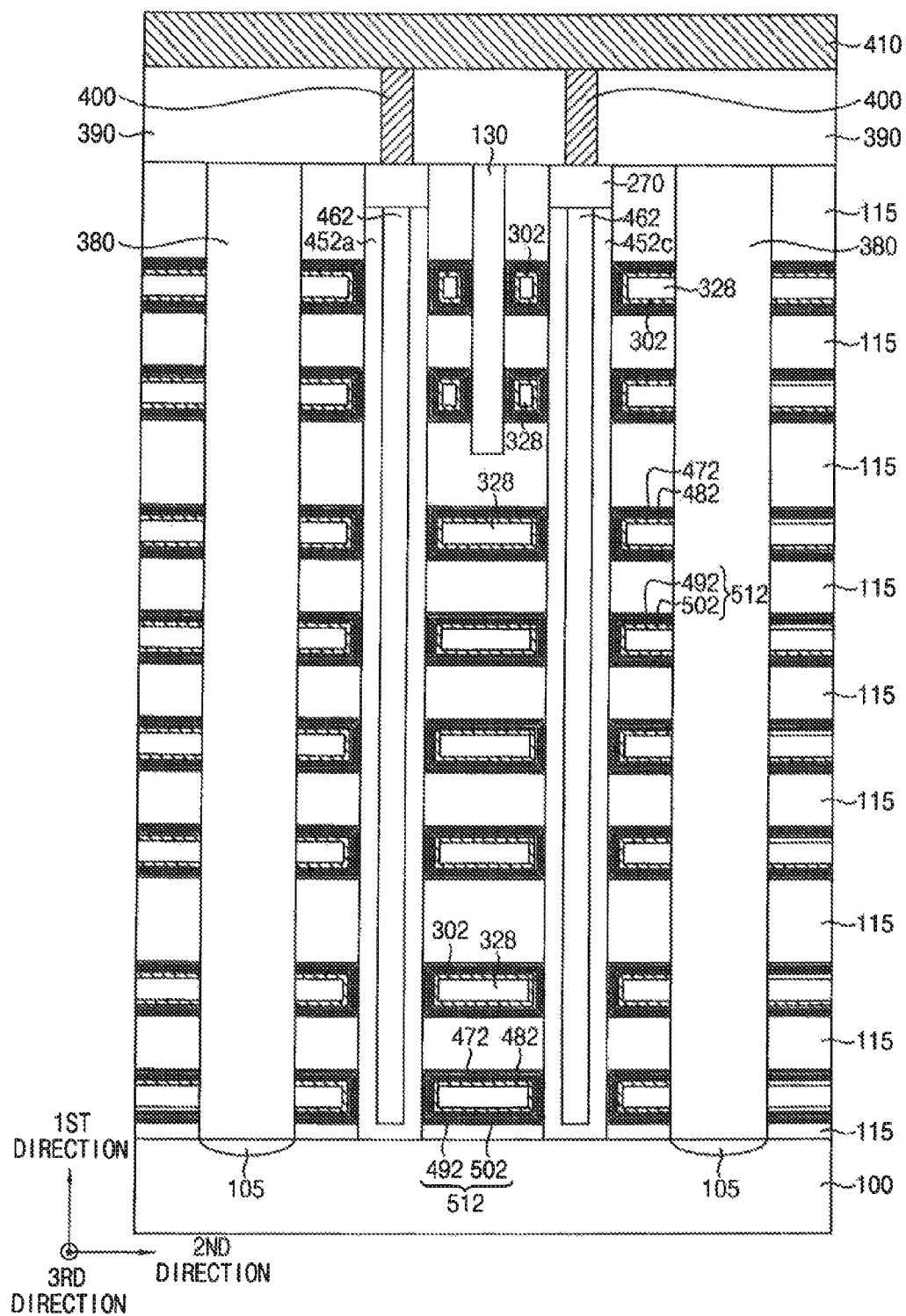
FIG. 90 is a vertical cross-sectional view illustrating a vertical memory device in accordance with example embodiments.
Figure 92:
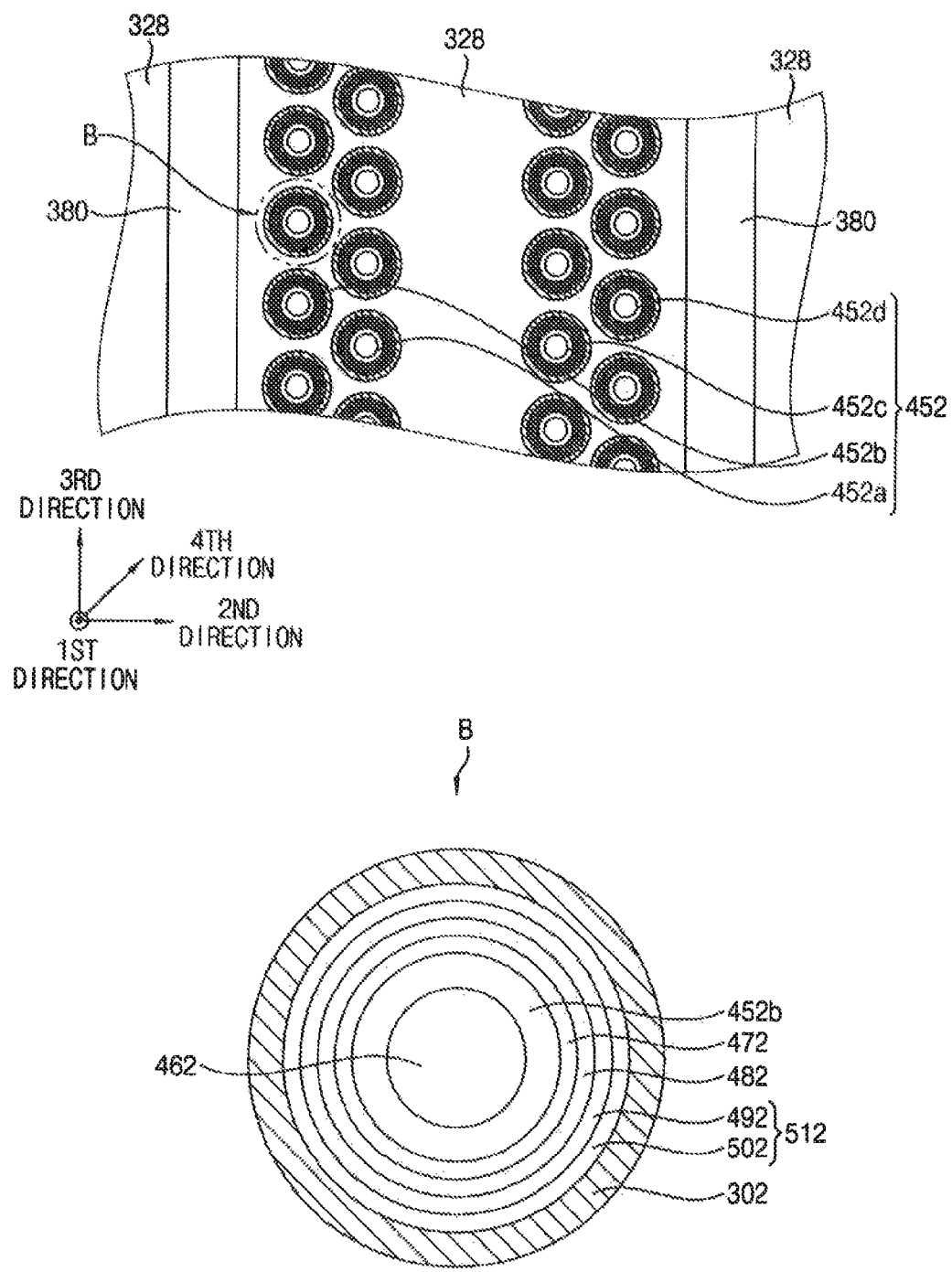
Figure 93A:
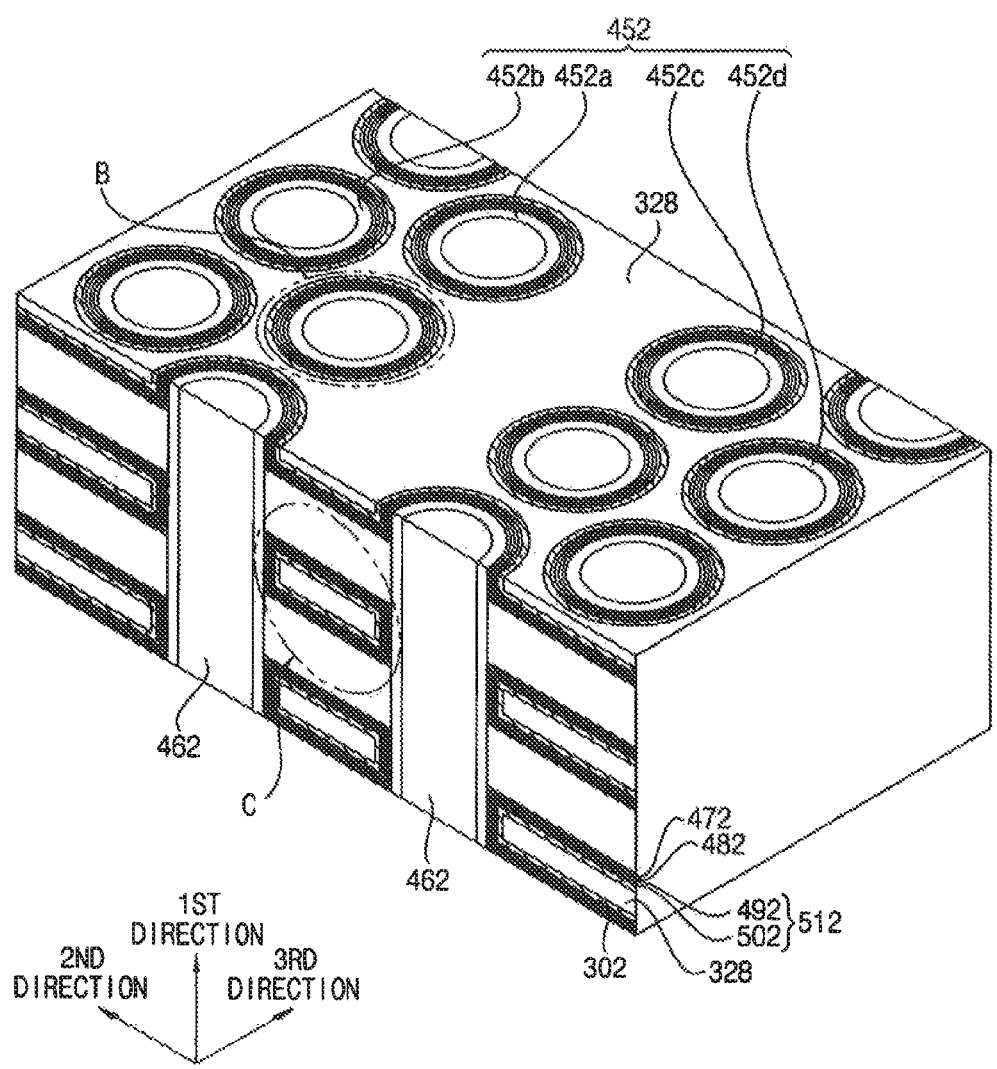
FIG. 93A is a localized perspective diagram of the semiconductor device of FIG. 90.
Figure 94A:
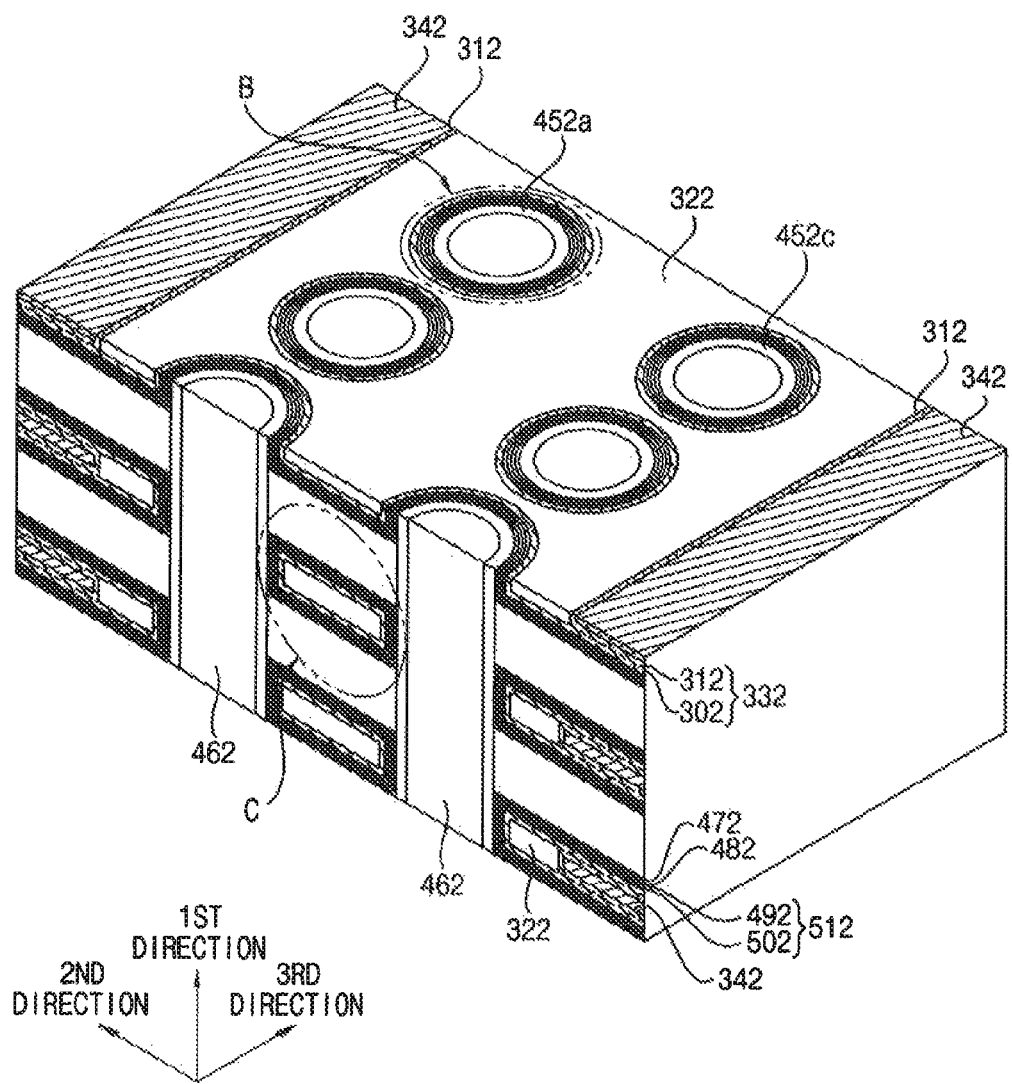
Figure 94B:
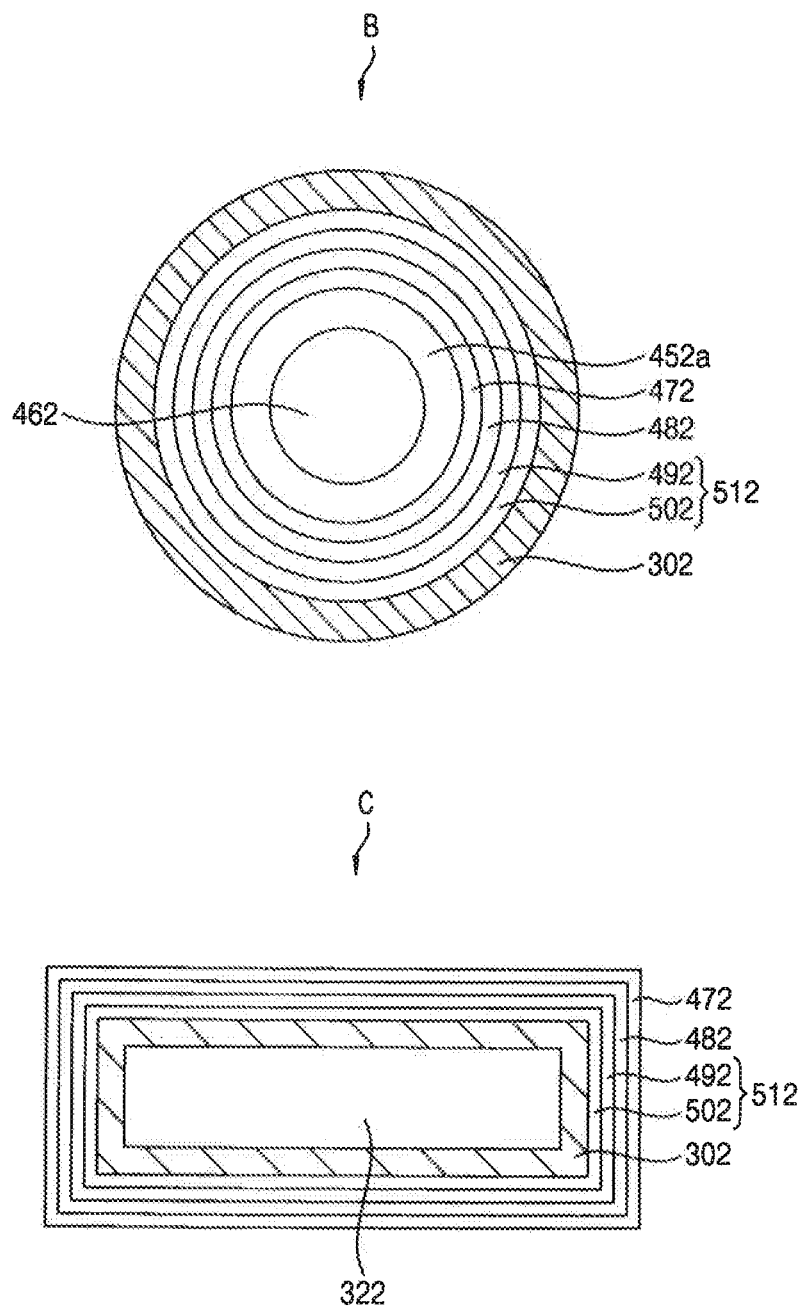
Figure 95A:
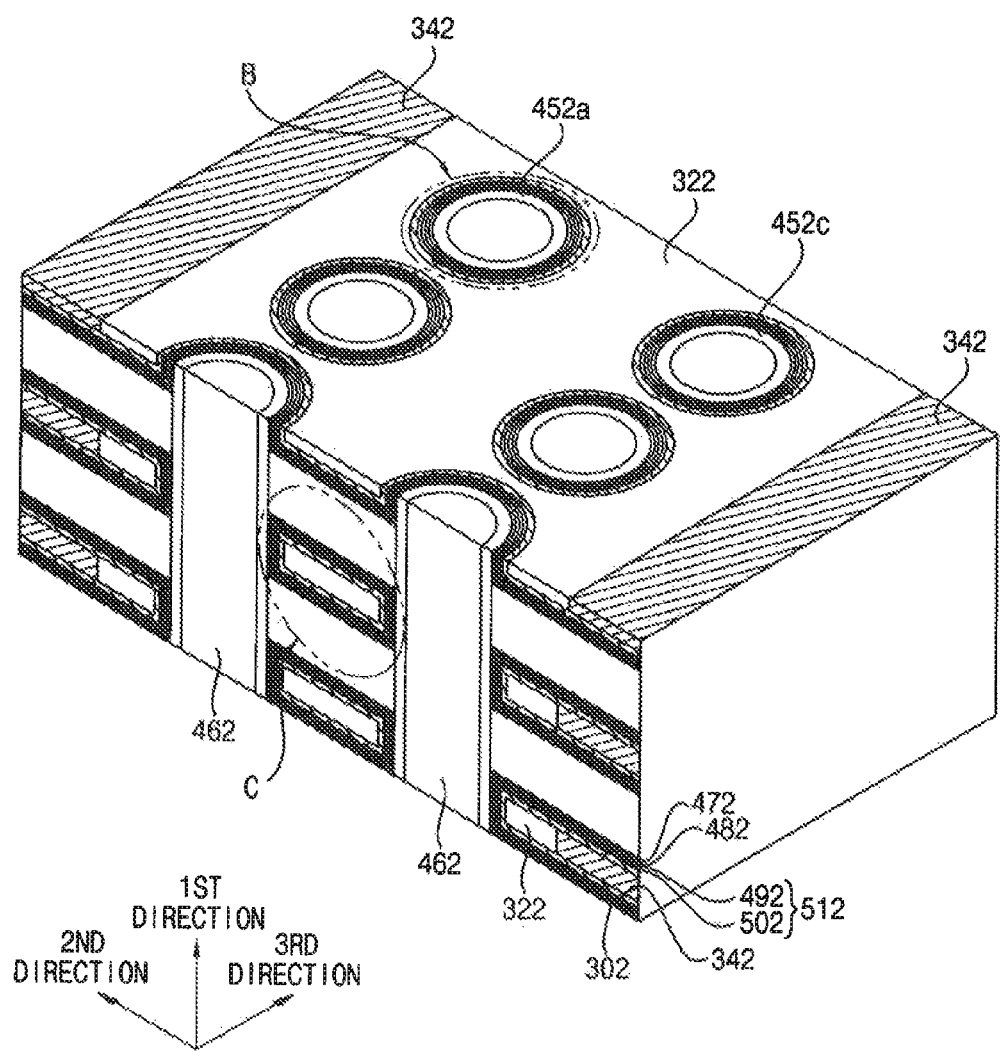
Figure 97A:
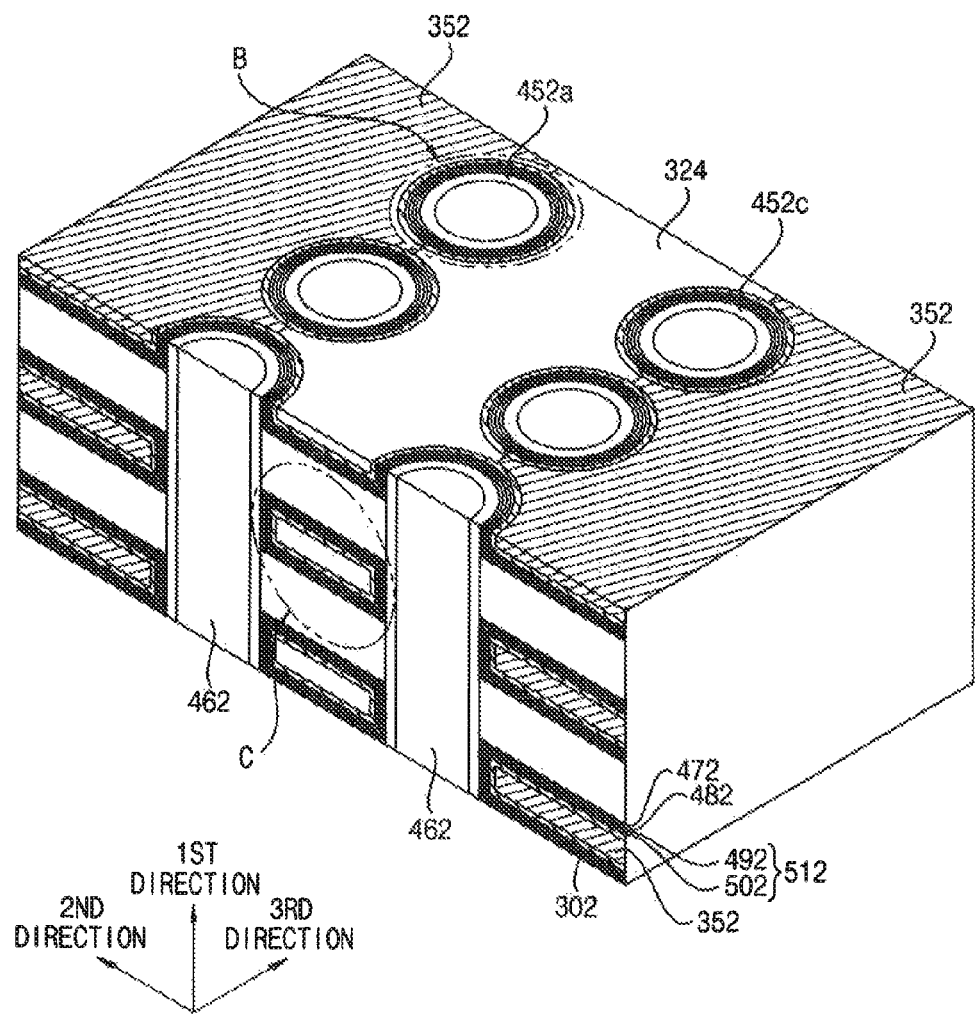
Figure 98A:
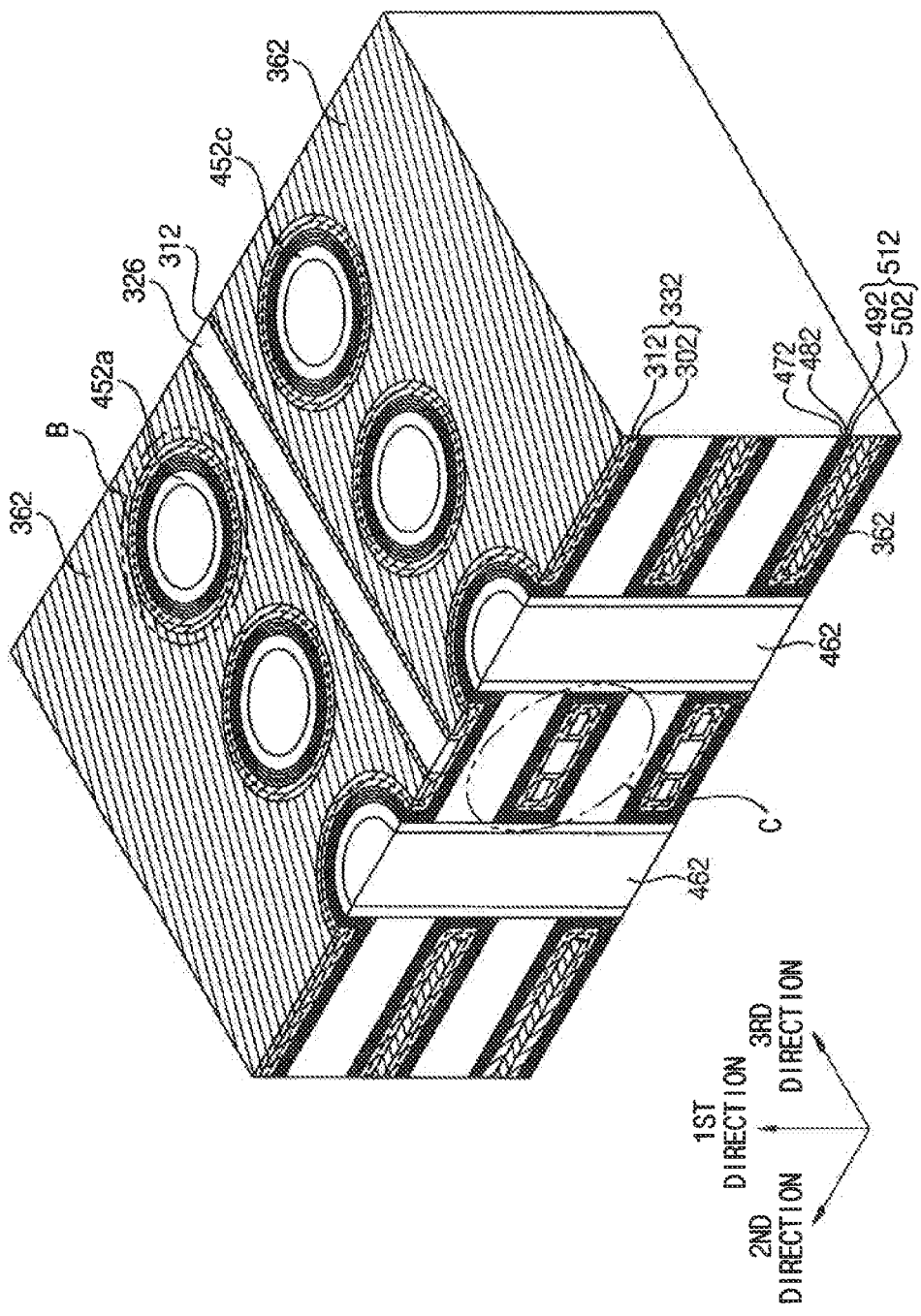
Figure 99A:
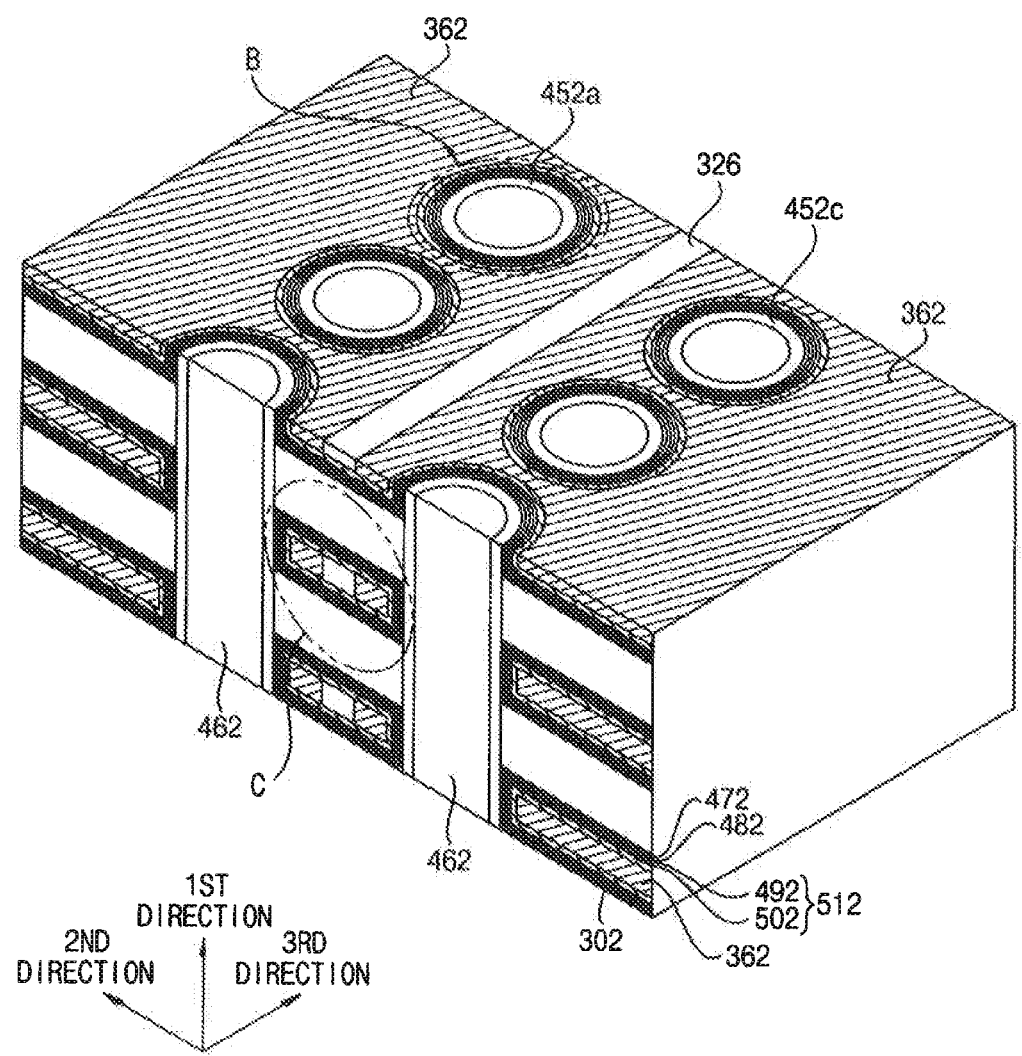
Figure 100A:
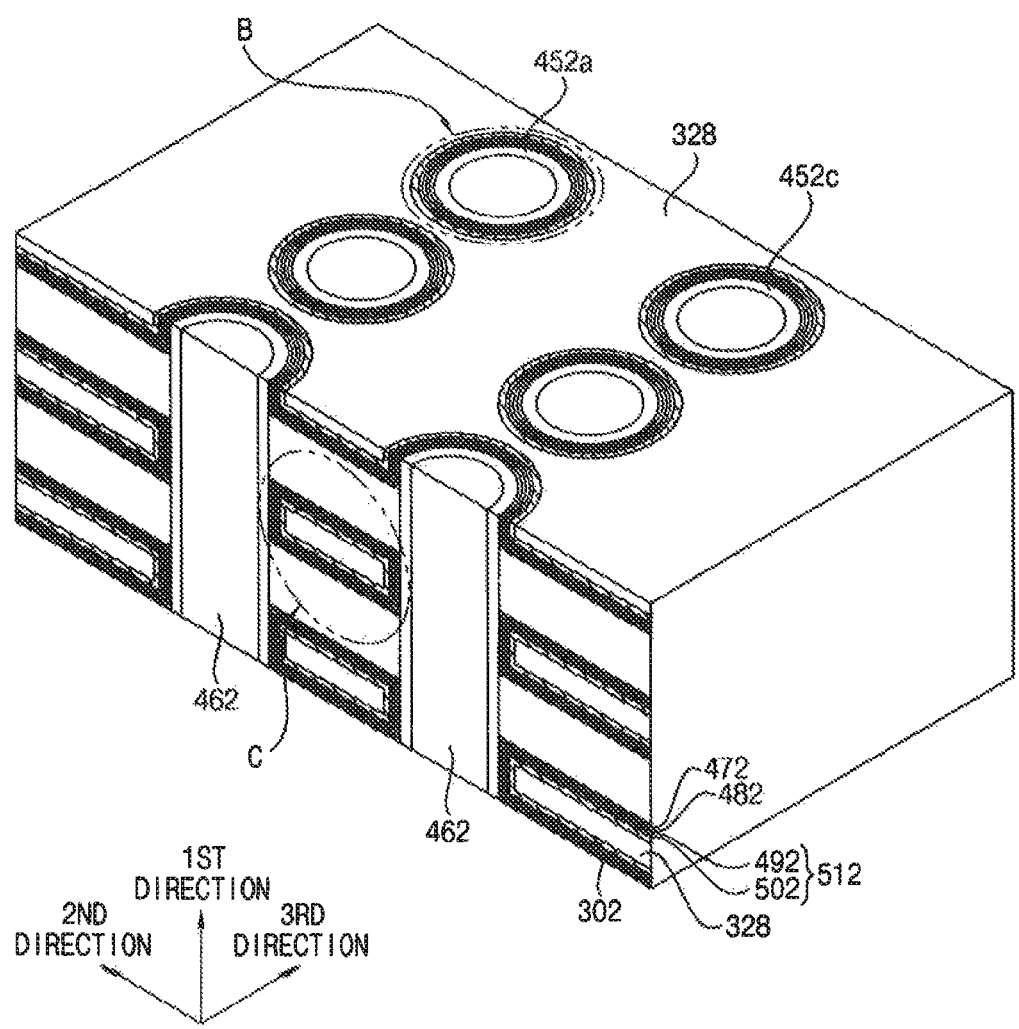

FIG. 90 is a vertical cross-sectional view illustrating a vertical memory device in accordance with example embodiments, FIGS. 91 and 92 are horizontal cross-sectional views of the semiconductor device, and FIG. 93 is a localized perspective diagram of the semiconductor device. Particularly, FIG. 93B is an enlarged view of regions B and C of FIG. 93A. The vertical memory device of FIG. 90 may be substantially the same as that of FIGS. 60 to 63, except for a filling layer pattern and a gate electrode.

Referring to FIGS. 90 to 93, the vertical memory device includes channels 452, a second tunnel insulation layer pattern 472, a second charge storage layer pattern 482, a third blocking layer pattern 492, a fourth blocking layer pattern 502, a first barrier layer pattern 302 and a fourth filling layer pattern 328.

The fourth filling layer pattern 328 is formed on the first barrier layer pattern 302 to fill the gaps 290 between the first openings 280. In example embodiments, the fourth filling layer pattern 328 extend in the third direction.

In example embodiments, the fourth filling layer pattern 328 surrounds portions of sidewalls of the fourth structures including the first to fourth channels 452a, 452b, 452c and 452d, respectively.

The second tunnel insulation layer pattern 472, the second charge storage layer pattern 482, the second blocking layer pattern structure 512, the first barrier layer pattern 302 and the fourth filling layer pattern 328 are sequentially stacked on the outer sidewalls of each of the first to fourth channels 452a, 452b, 452c and 452d in the second direction.

The vertical memory device of FIG. 90 does not include a metal gate electrode, and the conductive first barrier layer pattern 302 serves as a gate electrode.

FIGS. 94A, 94B, 95A, 95B, 96A, 96B, 97A, 97B, 98A, 98B, 99A, 99B, 100A, and 100B are localized perspective diagrams illustrating semiconductor devices in accordance with example embodiments. Particularly, FIGS. 94B, 95B, 96B, 97B, 98B, 99B and 100B are enlarged views of regions B and C of FIGS. 94A, 95A, 96A, 97A, 98A, 99A and 100A, respectively. The vertical memory devices of FIGS. 94A, 95A, 96A, 97A, 98A, 99A and 100A may be substantially the same as those of FIGS. 63, 73, 77, 81, 85, 89 and 93, respectively, except for a layout of channels.

Each of the vertical memory devices of FIGS. 94A, 94B, 95A, 95B, 96A, 96B, 97A, 97B, 98A, 98B, 99A, 99B, 100A, and 100B includes a channel array including first and third channels 452a and 452c. That is, the channel array include a first channel column having a plurality of first channels 452a arranged in the third direction and a third channel column being spaced apart from the first channel column in the second direction and having a plurality of third channels 452c arranged in the third direction, and does not include the second and fourth channel columns (refer, for example, to FIG. 63). Thus, in accordance with an embodiment of the inventive concept, the channel array does not have channels arranged in a zigzag pattern, and the channels 452a and 452c are spaced apart from each other at a given distance in the second direction.

Accordingly, the channels 452a and 452c in the same channel set are covered by or surrounded with to substantially the same degree as each other by the corresponding first to fourth filling layer patterns 322, 324, 326 or 328 and the corresponding first to third gate electrodes 342, 344, 346, 352, 354, 356, 362, 364 or 366.

Figure 101:
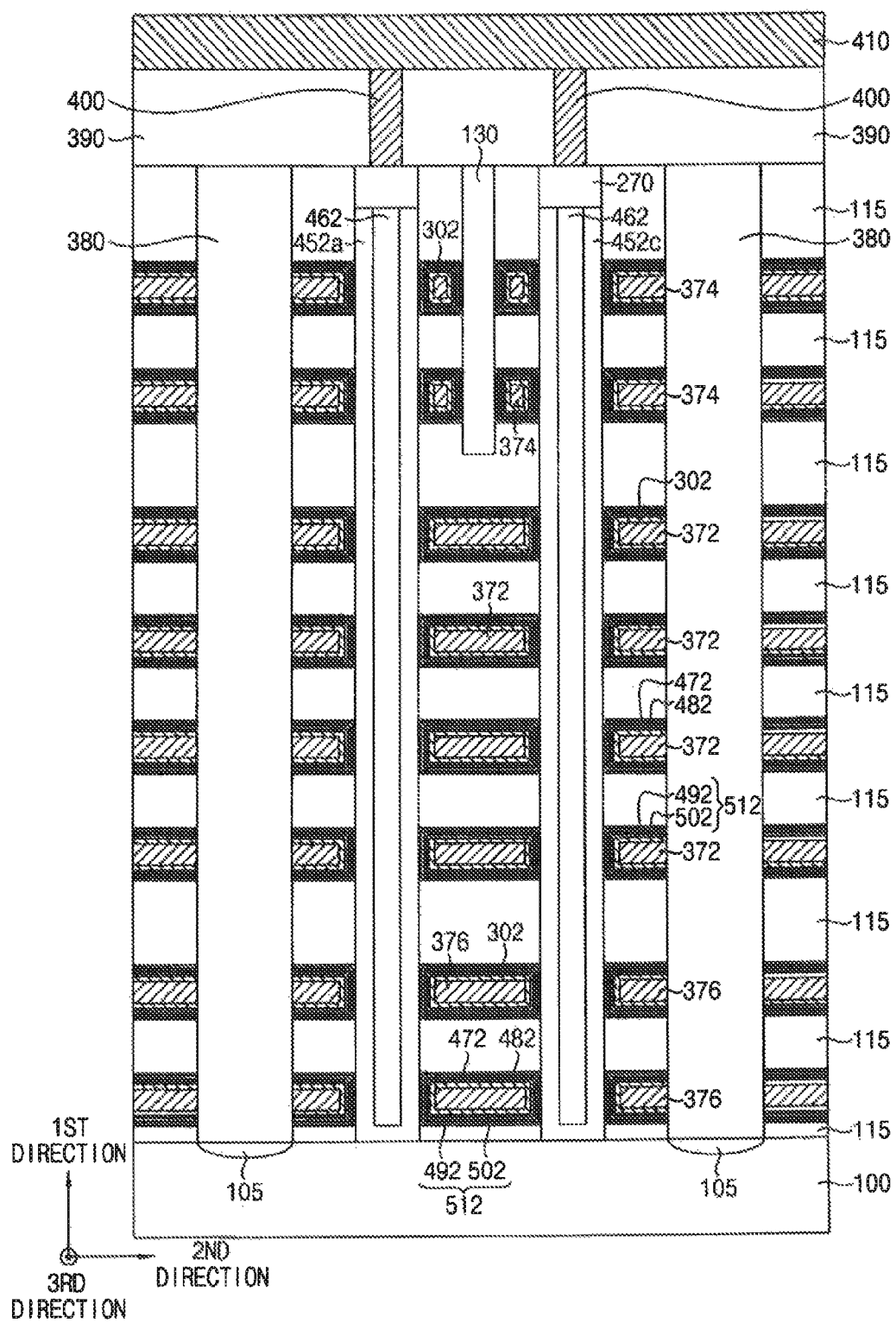

FIG. 101 is a vertical cross-sectional view illustrating a vertical memory device in accordance with example embodiments. The vertical memory device may be substantially the same as that of FIGS. 60 to 63, except for a filling layer pattern and a gate electrode.

Referring to FIG. 101, the vertical memory device include channels 452, a second tunnel insulation layer pattern 472, a second charge storage layer pattern 482, a third blocking layer pattern 492, a fourth blocking layer pattern 502, a first barrier layer pattern 302 and fourth gate electrodes 372, 374 and 376.

The fourth gate electrodes 372, 374 and 376 are formed on the first barrier layer pattern 302 to fill the gaps 290 between the first openings 280. In example embodiments, the fourth gate electrodes 372, 374 and 376 extend in the third direction.

In example embodiments, the fourth gate electrodes 372, 374 and 376 surround portions of sidewalls of the fourth structures including the first to fourth channels 452a, 452b, 452c and 452d, respectively.

In example embodiments, the fourth gate electrodes 372, 374 and 376 include a metal silicide, e.g., nickel silicide, cobalt silicide, and the like.

As described above, the second tunnel insulation layer pattern 472, the second charge storage layer pattern 482, the second blocking layer pattern structure 512, the first barrier layer pattern 302 and a corresponding fourth gate electrode of the fourth gate electrode 372, 374 and 376 are sequentially stacked on the outer sidewalls of each of the first to fourth channels 452a, 452b, 452c and 452d in the second direction.

The vertical memory device of FIG. 101 does not have a filling layer pattern, and the fourth gate electrodes 372, 374 and 376 include a metal silicide, wherein the metal is not tungsten. As a result, no fluorine gas remains after the formation of the fourth gate electrodes 372, 374 and 376, so that other layer structures are not damaged by remaining fluorine gas.

Figure 102A:
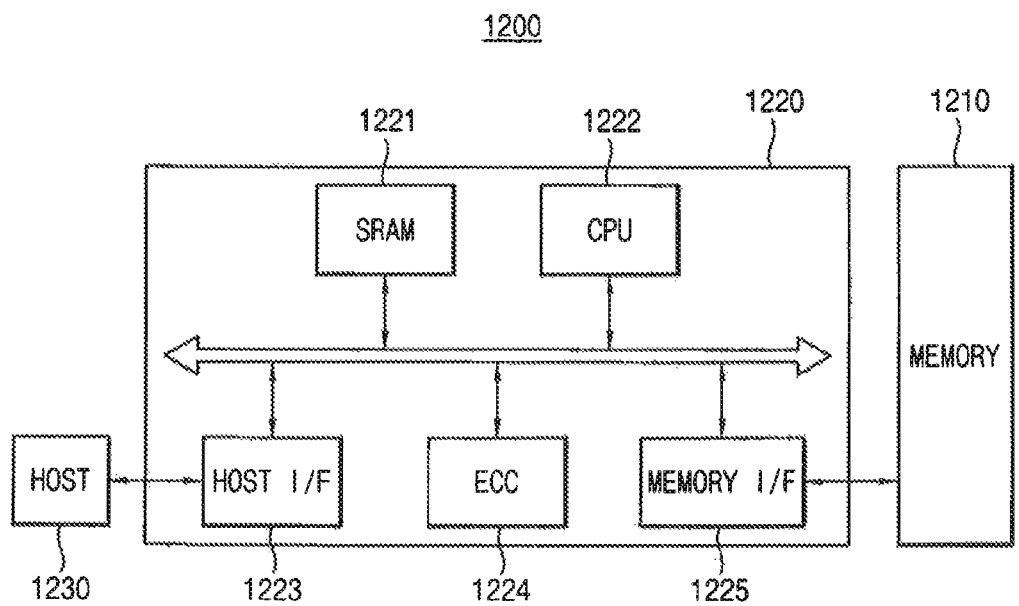
FIG. 102A is a block diagram illustrating a memory card including a semiconductor memory device according example embodiments of the inventive concept.

FIG. 102A is a block diagram illustrating a memory card including a semiconductor memory device according to example embodiments of the inventive concept.

Referring to FIG. 102A, a memory card 1200 includes a memory controller 1220 controlling general data exchanges between a host and the memory device 1210. A static random access memory (SRAM) 1221 can be used as an operating memory of a processing unit 1222. A host interface 1223 can include a data exchange protocol of a host connected to a memory card 1200. An error correction block 1224 can detect and correct errors included in data read from a multi-bit memory device 1210. A memory interface 1225 interfaces with the memory device 1210. A processing unit 1222 performs general control operations for data exchange of the memory controller 1220. In accordance with an embodiment of the inventive concept, the memory card 1200 can be formed using a memory device 1210 including at least one of the vertical memory devices according to example embodiments of the inventive concept.

Figure 102B:
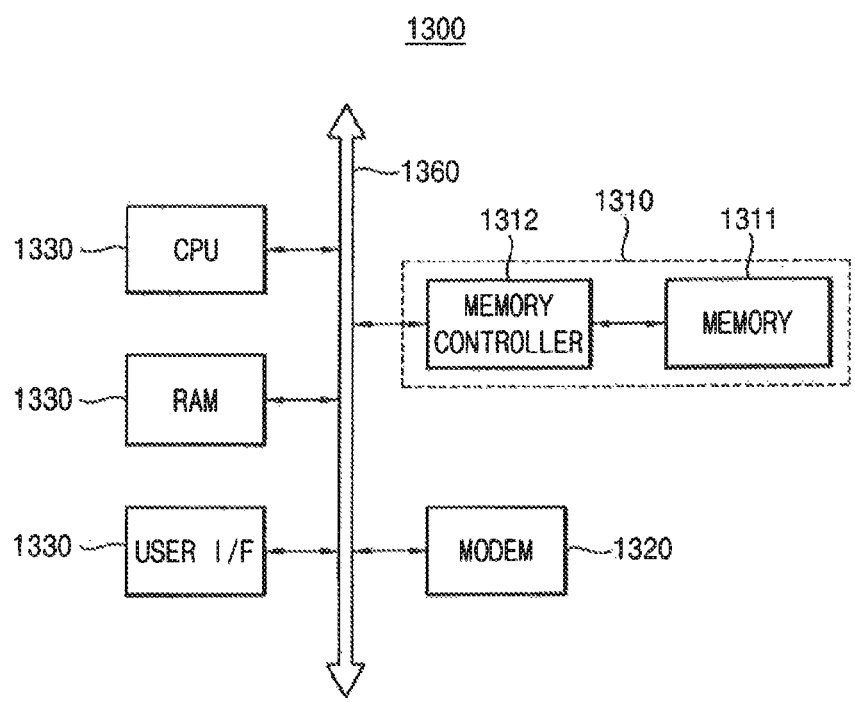
FIG. 102B is a block diagram illustrating an information processing system including a semiconductor memory device according to example embodiments of the inventive concept.

FIG. 102B is a block diagram illustrating an information processing system including a semiconductor memory device according to example embodiments of the inventive concept.

Referring to FIG. 102B, an information processing system 1300 uses a memory system 1310 including at least one of the vertical memory devices according to example embodiments of the inventive concept. The information processing system 1300 can be a mobile device and/or a desktop computer. In some embodiments, the information processing system 1300 further includes a modem 1320, a central processing unit (CPU) 1330, a random access memory (RAM) 1340, and a user interface 1350, which are electrically connected to a system bus 1360, in addition to the memory system 1310. The memory system 1310 can include a memory device 1311 and a memory controller 1312. In some embodiments, the memory system 1310 can be configured identical or substantially identical to the memory card 1200 described with respect to FIG. 102A. Data processed by the CPU 1330 and/or input from an outside source may be stored in the memory system 1310. In some embodiments, the memory system 1310 can be used as a portion of a solid state drive (SSD). When used as a portion of a solid state drive (SSD), the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to embodiments of the inventive concept.

The vertical memory devices and the methods of manufacturing the same in accordance with example embodiments may be applied to vertical memory devices having gate electrodes including tungsten. Additionally, these devices and methods in accordance with example embodiments may be applied to vertical memory devices having a gate electrode including other metals instead of tungsten, where some of the source gas used in the deposition of the gate electrodes may remain and damage adjacent layer structures.

Furthermore, these devices and methods in accordance with example embodiments may be applied to vertical memory devices having gate electrodes of a thin conductive metal nitride layer, and vertical memory devices having gate electrodes including a metal silicide surrounded by a conductive metal nitride layer.

While example embodiments have been particularly shown and described, it will be understood by one of ordinary skill in the art that variations in form and detail may be made therein without departing from the spirit and scope of the claims.

What is claimed is:

1. A method for manufacturing a semiconductor device, the method comprising:

alternately stacking a plurality of insulation layers and a plurality of sacrificial layers on a substrate;

forming a plurality of holes through the plurality of insulation and sacrificial layers to the substrate;

forming a semiconductor pattern in a bottom portion of each of the plurality of holes;

depositing at least one insulating layer on sidewalls and on the semiconductor pattern in each of the plurality of holes;

forming openings at a side of and spaced apart from each of the plurality of holes;

removing the sacrificial layers through the openings to form a plurality of open portions;

depositing a barrier layer on an inner wall of each of the open portions; and forming a filling layer in each open portion on the barrier layer.

2. The method of claim 1, wherein the barrier layer comprises a conductive metal nitride.

3. The method of claim 1, wherein the barrier layer is formed on top and bottom walls of each open portion, and on at least one sidewall of each open portion adjacent a corresponding hole.

4. The method of claim 1, wherein the filling layer comprises polysilicon.

5. The method of claim 1, further comprising removing a portion of the filling layer from each open portion.

6. The method of claim 5, wherein the barrier layer is a first barrier layer, and the method further comprises forming a second barrier layer on the first barrier layer and on a remaining portion of the filling layer in the open portion.

7. The method of claim 5, further comprising forming a gate electrode layer in a remaining area of the open portion not occupied by the barrier layer or the filling layer.

8. The method of claim 6, further comprising forming a gate electrode layer in a remaining area of the open portion not occupied by the first and second barrier layers or the filling layer.

9. The method of claim 7, wherein the gate electrode layer includes tungsten.

10. The method of claim 1, wherein at least some of the holes are arranged in a zigzag configuration.

11. The method of claim 1, further comprising forming a division layer pattern between top portions of two lines of holes, wherein the two lines of holes are symmetrically positioned about the division layer pattern.

12. The method of claim 1, further comprising removing a portion of the at least one insulating layer on the semiconductor pattern and forming a recess in the semiconductor pattern corresponding to the removed portion of the at least one insulating layer.

13. The method of claim 1, further comprising depositing a blocking layer on an inner wall of each of the open portions prior to depositing the barrier layer.

14. A computer system comprising a semiconductor device having a circuit layout manufactured by the method of claim 1, wherein the computer system is one of a mobile device, a desktop computer, an application chipset, a camera image sensor, a camera image signal processor, and an input/output device.

15. A system for transmitting or receiving data, the system comprising:

a memory device for storing a program; and a processor in communication with the memory device, wherein the memory device comprises a circuit layout manufactured by the method of claim 1.

16. The system according to claim 15, wherein the system comprises at least one of a mobile device, a desktop computer, an application chipset, a camera image sensor, a camera image signal processor, an input/output device, or a memory card.

17. A semiconductor memory card, comprising:

an interface part that interfaces with a host; and a controller that communicates with the interface part and a memory device via a bus, wherein the memory device comprises a circuit layout manufactured by the method of claim 1.

* * * * *